(12) United States Patent
Yamazaki

(10) Patent No.: US 9,099,560 B2
(45) Date of Patent: Aug. 4, 2015

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 4 days.

(21) Appl. No.: 13/738,471

(22) Filed: Jan. 10, 2013

(65) Prior Publication Data

US 2013/0187161 A1 Jul. 25, 2013

(30) Foreign Application Priority Data

Jan. 20, 2012 (JP) ................................. 2012-010421
Jan. 20, 2012 (JP) ................................. 2012-010422
Jan. 20, 2012 (JP) ................................. 2012-010427

(51) Int. Cl.
*H01L 29/12* (2006.01)
*H01L 27/12* (2006.01)
(Continued)

(52) U.S. Cl.
CPC .......... *H01L 29/786* (2013.01); *H01L 29/4908* (2013.01); *H01L 29/6675* (2013.01);
(Continued)

(58) Field of Classification Search
CPC . H01L 29/7869; H01L 29/785; H01L 29/786; H01L 29/04; H01L 29/4908; H01L 29/78696; H01L 27/1225; H01L 27/1255; H01L 21/02414; H01L 27/1214; H01L 27/1262; H01L 27/10852; H01L 27/10894; H01L 27/10814; H01L 27/10885; H01L 27/10888; H01L 27/10855

USPC ............................................ 257/43; 438/158
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.
(Continued)

*Primary Examiner* — Julio J Maldonado
*Assistant Examiner* — Moazzam Hossain
(74) *Attorney, Agent, or Firm* — Eric J. Robinson; Robinson Intellectual Property Law Office, P.C.

(57) ABSTRACT

A photolithography process for forming an island-shaped semiconductor layer is omitted, and a transistor is formed by at least two photolithography processes: a photolithography process for forming a gate electrode (including a wiring or the like formed from the same layer as the gate electrode) and a photolithography process for forming a source electrode and a drain electrode (including a wiring or the like formed from the same layer as the source electrode and the drain electrode). By using electron beam exposure, a transistor in which a distance between the source electrode and the drain electrode (channel length) is short can be formed. For example, a transistor whose channel length is less than 50 nm can be obtained.

9 Claims, 55 Drawing Sheets

(51) Int. Cl.
  *H01L 29/786* (2006.01)
  *H01L 29/66* (2006.01)
  *H01L 29/49* (2006.01)

(52) U.S. Cl.
  CPC ...... *H01L29/66969* (2013.01); *H01L 29/7869* (2013.01); *H01L 29/78606* (2013.01); *H01L 29/78609* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,910,490 B2 | 3/2011 | Akimoto et al. |
| 7,932,521 B2 | 4/2011 | Akimoto et al. |
| 8,237,166 B2 | 8/2012 | Kumomi et al. |
| 8,274,077 B2 | 9/2012 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0024884 A1* | 2/2006 | Kim et al. .................... 438/253 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065841 A1* | 3/2010 | Lee et al. .................... 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2011/0006299 A1* | 1/2011 | Abe et al. .................... 257/43 |
| 2011/0068852 A1 | 3/2011 | Yamazaki et al. |
| 2011/0101351 A1 | 5/2011 | Yamazaki |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |
| 2011/0175087 A1 | 7/2011 | Yamazaki et al. |
| 2012/0052606 A1 | 3/2012 | Yamazaki |
| 2012/0052625 A1 | 3/2012 | Yamazaki |
| 2012/0061664 A1 | 3/2012 | Yamazaki et al. |
| 2012/0061665 A1 | 3/2012 | Miyake et al. |
| 2012/0061673 A1 | 3/2012 | Yamazaki et al. |
| 2012/0062813 A1 | 3/2012 | Koyama |
| 2012/0062814 A1 | 3/2012 | Yamazaki et al. |
| 2012/0064650 A1 | 3/2012 | Yamazaki et al. |
| 2013/0009144 A1* | 1/2013 | Cheng et al. .................... 257/43 |
| 2013/0075732 A1 | 3/2013 | Saito et al. |
| 2013/0075733 A1 | 3/2013 | Saito et al. |
| 2013/0105792 A1 | 5/2013 | Yamazaki et al. |
| 2013/0120701 A1 | 5/2013 | Yamazaki et al. |
| 2013/0120702 A1 | 5/2013 | Yamazaki et al. |
| 2013/0134414 A1 | 5/2013 | Yamazaki et al. |
| 2013/0140554 A1 | 6/2013 | Yamazaki et al. |
| 2013/0161609 A1 | 6/2013 | Koyama |
| 2013/0187151 A1 | 7/2013 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |

(56) References Cited

FOREIGN PATENT DOCUMENTS

| | | |
|---|---|---|
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2007-123861 A | 5/2007 |
| JP | 2011-171702 A | 9/2011 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08: Proceedings of the 15th International Display Workshops, Dec. 3, 2008, pp. 1637-1640.

Hayashi.R et al., "42.1: Invited Paper: Improved Amorphous In-Ga-Zn-O TFTs,", SID Digest '08: SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350°C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08: SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02: Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase", ", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09: SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09: SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09: SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09: Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

(56) References Cited

OTHER PUBLICATIONS

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, p. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and SC2O3-A2O3-BO Systems [A; Fe, Ga, or Al; B: Mg, Mn, Fe, Ni, Cu, or Zn] at Temperatures over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Song.I et al., "Short Channel Characteristics of Gallium-Indium-Zinc-Oxide Thin Film Transistors for Three-Dimensional Stacking Memory,", IEEE Electron Device Letters, Jun. 1, 2008, vol. 29, No. 6, pp. 549-552.

* cited by examiner

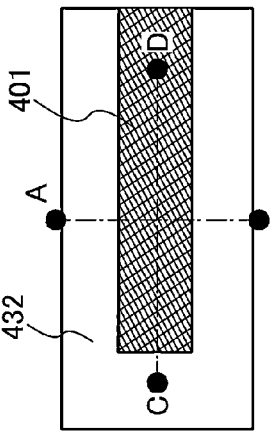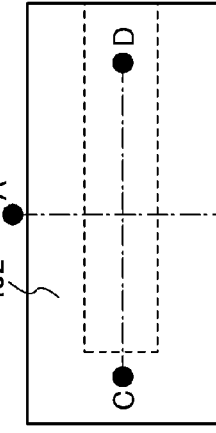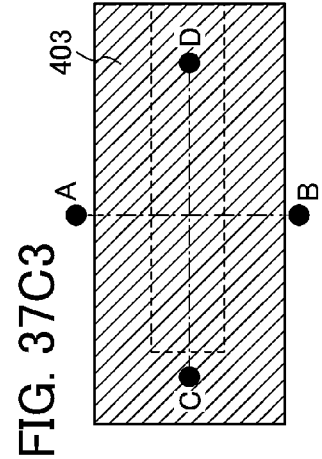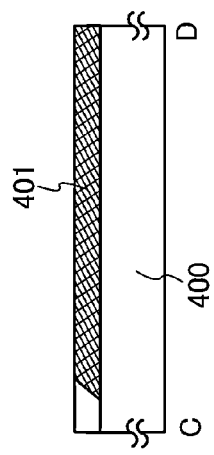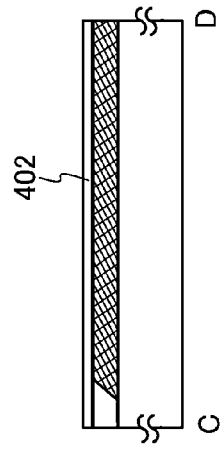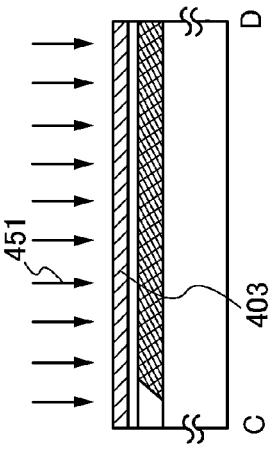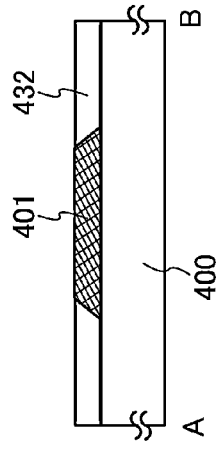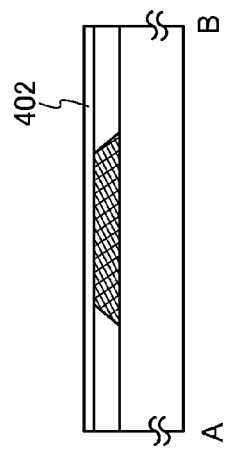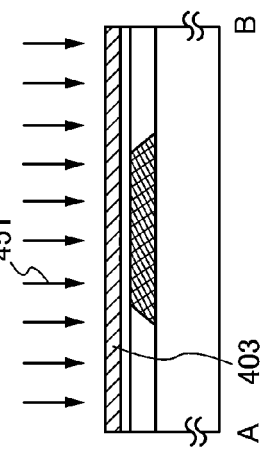

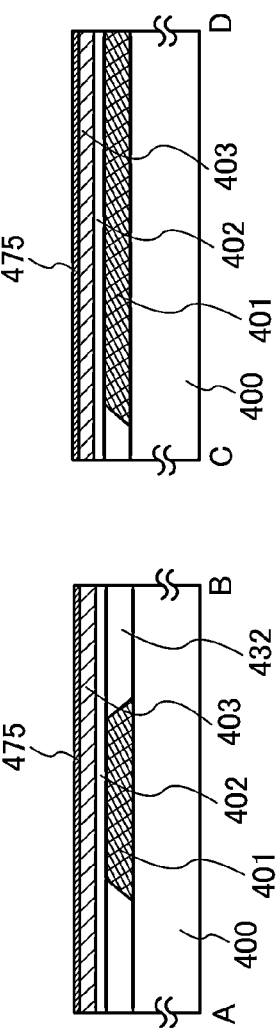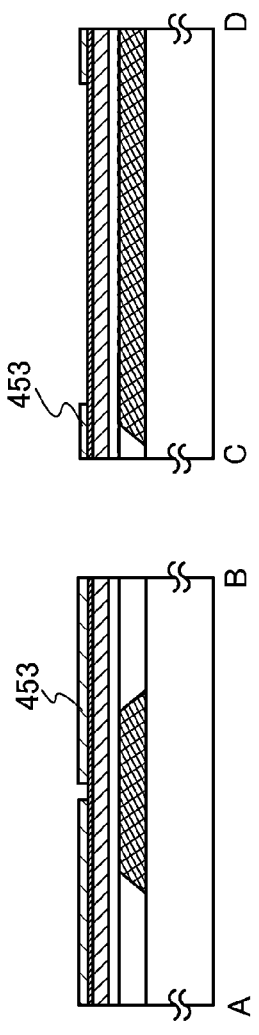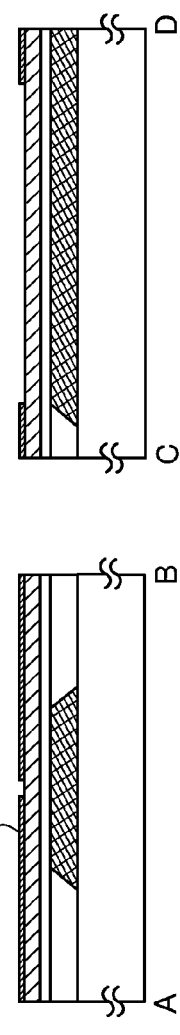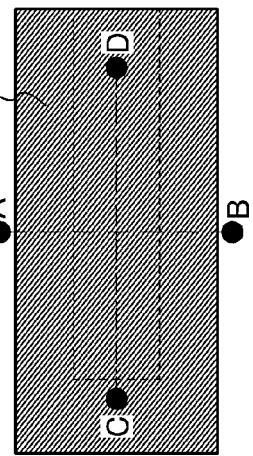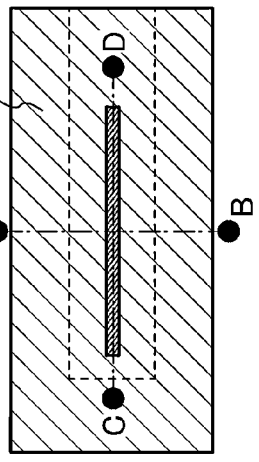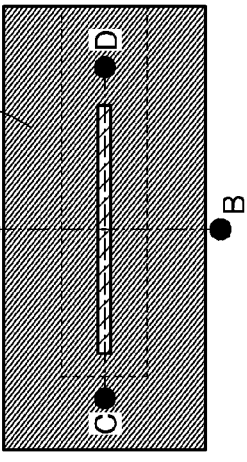

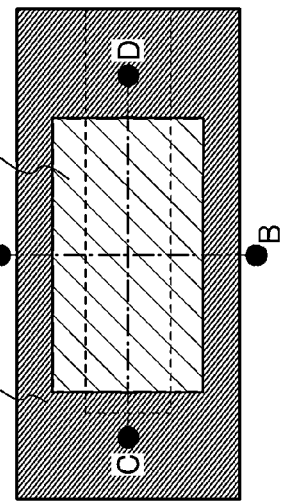
FIG. 39A1
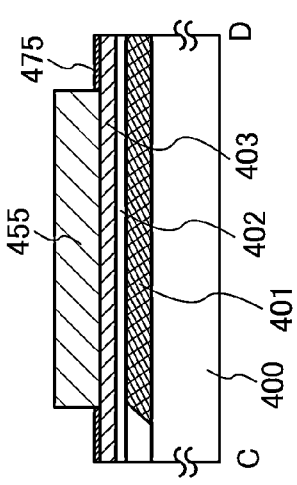
FIG. 39A2
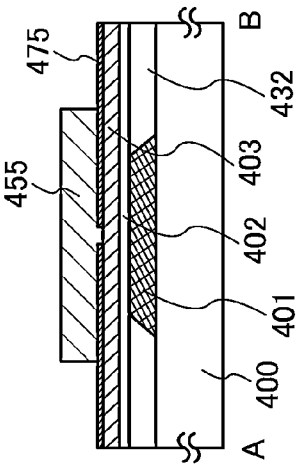
FIG. 39A3
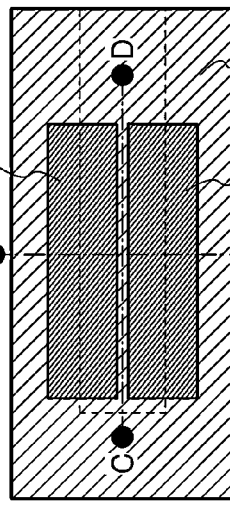
FIG. 39B1
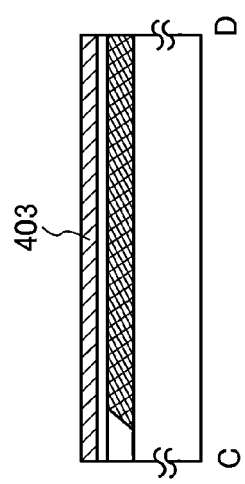
FIG. 39B2
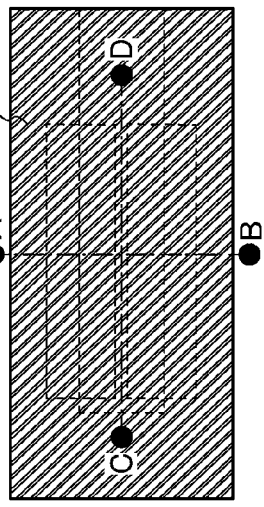
FIG. 39B3
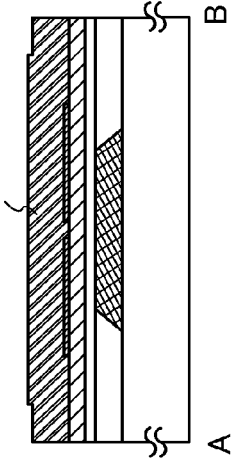
FIG. 39C1
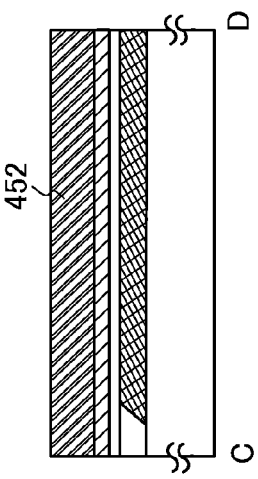
FIG. 39C2
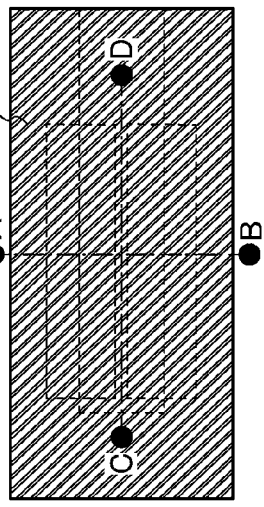
FIG. 39C3

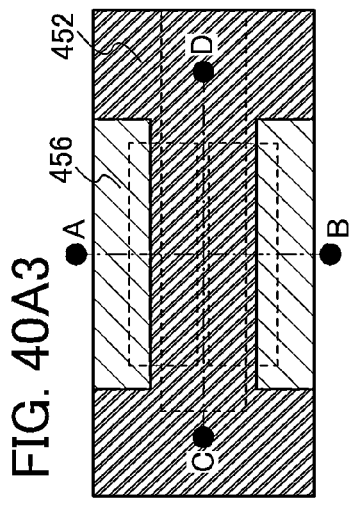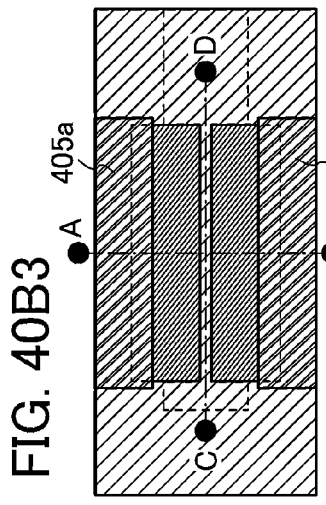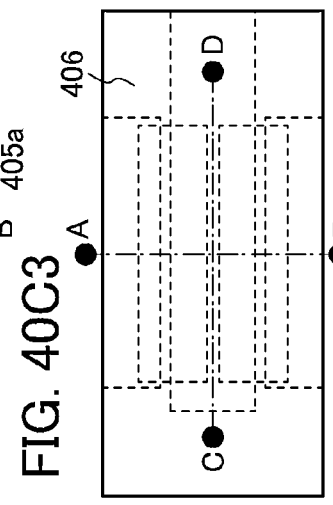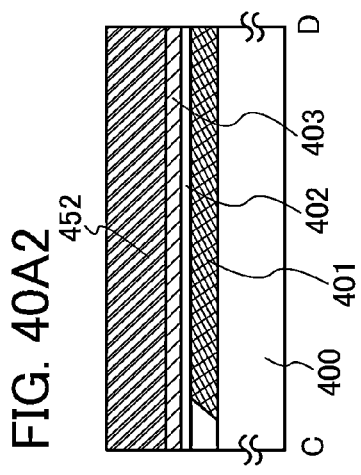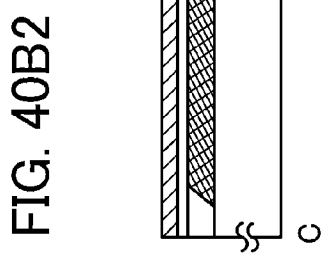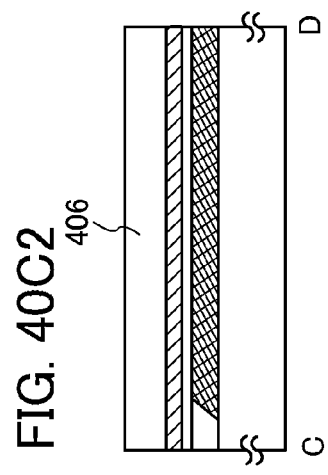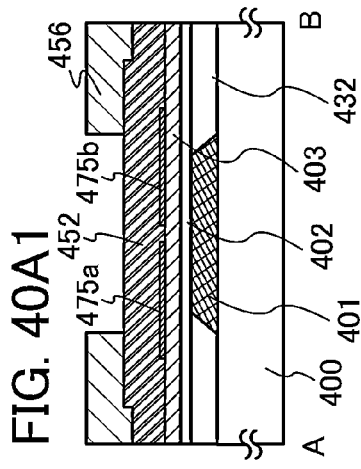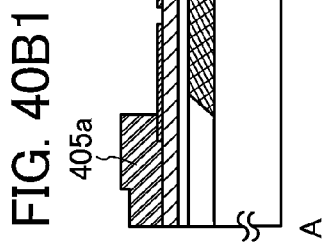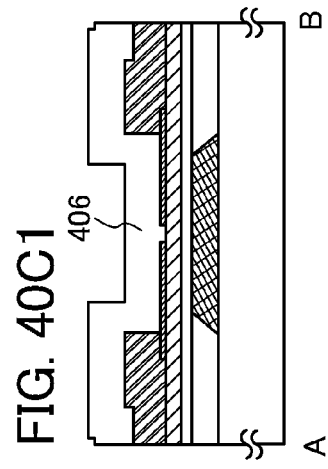

FIG. 52A
model A
FIG. 52B
model B
FIG. 52C
model C
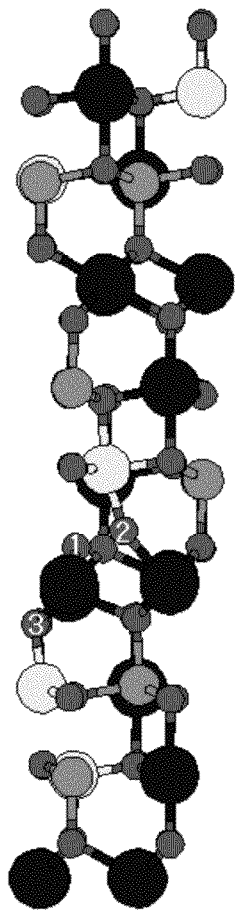
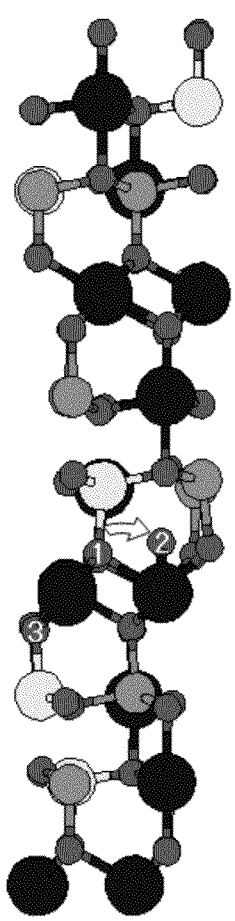
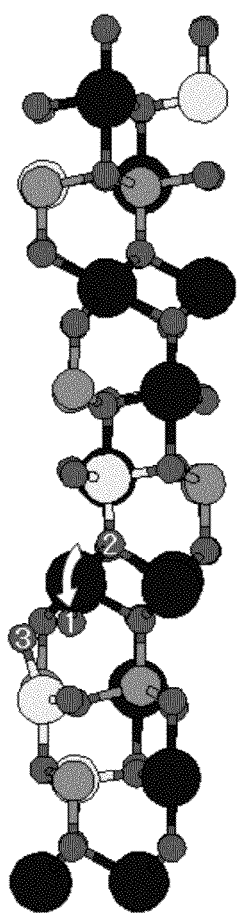
In: ● Ga: ○ Zn: ● O: ●

FIG. 54A
model A
FIG. 54B
model B
FIG. 54C
model C
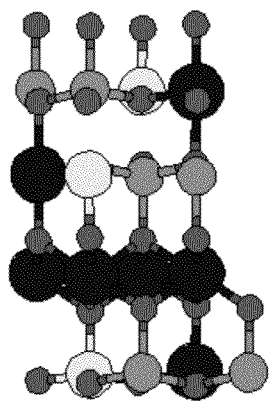 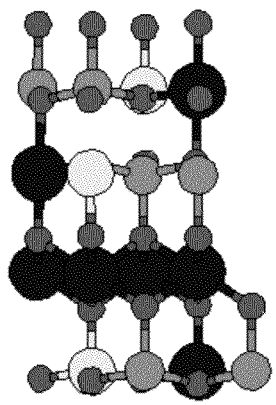 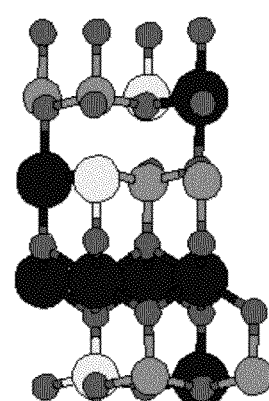
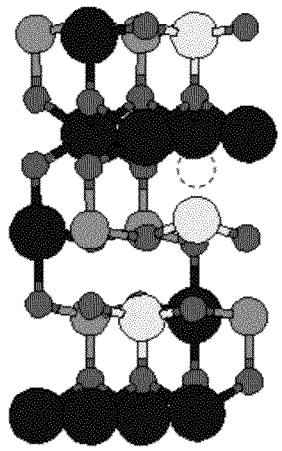 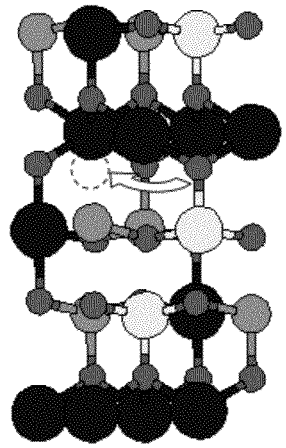 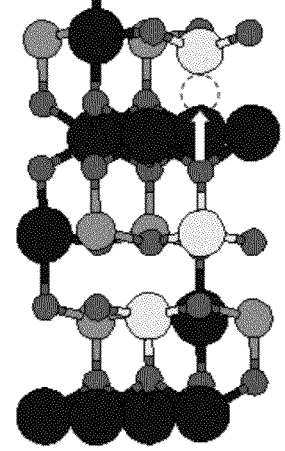
In: ● Ga: ○ Zn: ● O: ●

SEMICONDUCTOR DEVICE AND MANUFACTURING METHOD THEREOF

BACKGROUND OF THE INVENTION

1. Field of the Invention

The disclosed invention relates to a semiconductor device and a method for manufacturing the semiconductor device.

The disclosed invention relates to a technique for miniaturizing a semiconductor integrated circuit. The invention disclosed in this specification includes in its scope an element formed using a compound semiconductor, in addition to that formed using a silicon semiconductor, as a component of a semiconductor integrated circuit, and discloses an element formed using a wide-gap semiconductor as an example.

In this specification and the like, a semiconductor device refers to all types of devices which can function by utilizing semiconductor characteristics; an electro-optical device, a light-emitting display device, a semiconductor circuit, and an electronic device are all semiconductor devices.

2. Description of the Related Art

Attention has been focused on a technique for forming a transistor using a semiconductor thin film formed over a substrate having an insulating surface (also referred to as a thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has attracted attention.

For example, Patent Document 1 discloses a transistor whose active layer includes an amorphous oxide containing indium (In), gallium (Ga), and zinc (Zn) is disclosed. Further, Patent Document 2 and Patent Document 3 disclose a transistor whose channel is formed in a metal oxide layer having semiconductor characteristics.

As semiconductor memory devices, dynamic RAMs (DRAMs) formed using a silicon substrate are well-known products and currently used in a variety of electronic devices. A memory cell which is a key component in a DRAM includes a reading and writing transistor and a capacitor.

DRAMs are an example of volatile memory devices, and another example of volatile memory devices is static random access memories (SRAMs). An SRAM holds stored data by using a circuit such as a flip-flop and thus does not need refresh operation, which is an advantage over a DRAM. However, cost per storage capacity is high because a circuit such as a flip-flop is used. Moreover, as in a DRAM, stored data in an SRAM is lost when power supply stops.

An example of nonvolatile memory devices is flash memories. A flash memory includes a floating gate between a gate electrode and a channel formation region in a transistor and stores data by holding charge in the floating gate. Therefore, a flash memory has advantages in that the data holding period is extremely long (semi-permanent) and refresh operation which is necessary to volatile memory devices is not needed.

However, in a flash memory, there is a problem in that a memory element becomes incapable of functioning after a large number of repeated write operations because a gate insulating layer included in the memory element deteriorates due to tunneling current generated in the write operations. In order to avoid this problem, a method in which the number of write operations is equalized among memory elements can be employed, for example, but a complex peripheral circuit is needed to realize this method. Moreover, even when such a method is employed, the fundamental problem of lifetime cannot be resolved. In other words, a flash memory is not suitable for applications in which data is frequently rewritten.

In addition, high voltage is necessary in order to inject charge into the floating gate or remove the charge. Moreover, it takes a relatively long time to inject or remove charge, and it is not easy to increase the speed of writing or erasing data.

Volatile memory devices typified by DRAMs are formed using a silicon substrate, and their circuit patterns, like those for other semiconductor integrated circuits, have been miniaturized in accordance with the scaling law. There was a time when it was considered difficult to achieve a design rule of 100 nm or less. One of the reasons is that in a transistor having a channel length of 100 nm or less, a punch-through current is likely to flow due to a short-channel effect and the transistor becomes incapable of functioning as a switching element, which has been considered to be a problem. In order to prevent a punch-through current, a silicon substrate may be doped with an impurity at high concentration. However, this is not an appropriate solution to the problem because it makes a junction leakage current likely to flow between a source and the substrate or between a drain and the substrate and eventually causes a deterioration of memory retention characteristics.

Patent Document 4 discloses a technique in which a transistor formed using an oxide semiconductor layer is used as a memory.

Non-Patent Document 1 discloses a transistor formed using amorphous IGZO and having a channel length of 50 nm.

REFERENCE

Patent Document

[Patent Document 1] Japanese Published Patent Application No. 2006-165528
[Patent Document 2] Japanese Published Patent Application No. 2007-123861
[Patent Document 3] Japanese Published Patent Application No. 2007-096055
[Patent Document 4] Japanese Published Patent Application No. 2011-171702

Non-Patent Document

[Non-Patent Document 1] Ihun Song et al., "Short Channel Characteristics of Gallium-Indium-Zinc-Oxide Thin Film Transistors for Three-Dimensional Stacking Memory", IEEE ELECTRON DEVICE LETTERS, Vol. 29, No. 6, June 2008, pp. 549-552

SUMMARY OF THE INVENTION

In order to achieve high-speed operation, low power consumption, cost reduction, or the like of a transistor, it is necessary to miniaturize a transistor.

However, as transistors are miniaturized, deterioration in electric characteristics of the transistors, such as lowering in the threshold voltage, an increase of variation in the threshold voltages, and an increase in the amount of off-state current, is likely to Occur.

In addition, as transistors are miniaturized, the transistors are likely to be damaged due to dry etching or affected by diffusion of an impurity element into a semiconductor layer. As a result, a yield or reliability is likely to be reduced.

In particular, in an island-shaped semiconductor layer in which a channel of a transistor is formed, a defect is likely to be generated on its side surface, and a parasitic channel due to oxygen vacancies is likely to be generated. When a parasitic channel is generated on a side surface of an island-shaped semiconductor layer, unintentional current (also referred to as leakage current) flows between a source and a drain through the parasitic channel, which becomes factors of deterioration of electric characteristics of a transistor, for example, an increase in off-state current or an increase in threshold voltage variation of the transistor. In particular, in a transistor whose channel length is less than or equal to 100 nm, deterioration of electric characteristics due to a parasitic channel generated on a side surface of an island-shaped semiconductor layer is a major problem.

It is demanded that a transistor has high reliability and that a manufacturing method achieves high productivity and reduction in production cost. Simplification of a process is one way for increasing productivity and reducing production cost.

In general, in manufacturing transistors, at least three photolithography processes are used: a photolithography process for forming a gate electrode; a photolithography process for forming an island-shaped semiconductor layer; and a photolithography process for forming a source electrode and a drain electrode.

In manufacturing transistors, reduction in the number of photolithography processes or simplification of the photolithography process is important for simplification of the whole process. For example, when one photolithography process is added, the following steps are further needed: resist application, prebaking, light exposure, development, postbaking, and the like and, moreover, steps before and after the aforementioned steps, such as film formation, etching, resist removal, cleaning, drying, and the like. Accordingly, the number of steps is significantly increased by addition of one photolithography process in the manufacturing process of the transistor, which lead to reduction in productivity or an increase in production cost. In other words, reduction of the number of photolithography processes can increase productivity and achieve reduction in production cost.

An object of one embodiment of the present invention is to provide a structure of a semiconductor device which achieves high-speed operation by improving electric characteristics of a miniaturized transistor, and to provide a manufacturing method thereof, in order to obtain a high-performance semiconductor device.

Another object of one embodiment of the present invention is to provide a highly reliable transistor with less variation and favorable electric characteristics.

Further, another object of one embodiment of the present invention is to manufacture a transistor by a smaller number of photolithography processes than the conventional one to increase productivity of the transistor.

Furthermore, another object of one embodiment of the present invention is to achieve high performance, high reliability, and high productivity of a semiconductor device including the transistor.

Electric characteristics of a transistor in which a channel is formed in an island-shaped oxide semiconductor layer might change due to processing conditions or heat treatment conditions. This change is caused by entry of a resistance-reducing element (chlorine (Cl), fluorine (F), boron (B), hydrogen (H), or the like) in a formation step of the island-shaped oxide semiconductor layer, release of oxygen (O) from the island-shaped oxide semiconductor layer, or the like. This change is likely to be obvious on a side surface of the island-shaped oxide semiconductor layer. In other words, in the transistor in which the channel is formed in the island-shaped oxide semiconductor layer, the side surface of the island-shaped oxide semiconductor layer and a region in the vicinity of the side surface become a low-resistance region, and a parasitic channel of the transistor is likely to be formed in the low-resistance region. Note that the transistor has a possibility that two kinds of channels are formed: a channel (also referred to as a first channel) and the parasitic channel (also referred to as a second channel) formed depending on a voltage between a gate and a source.

In the transistor having a possibility that two kinds of channels are formed, the threshold voltage between the gate and the source at which the channel is formed differs between the two channels in many cases. Typically, the threshold voltage at which the first channel is formed is higher than the threshold voltage at which the second channel is formed. The current drive capability of the first channel is higher than that of the second channel. Thus, in the case where the voltage between the gate and the source of the transistor in an off state is increased, a current between the source and the drain changes in two stages. Specifically, a change in the first stage (an increase in the current between the source and the drain) is found in the vicinity of the threshold voltage at which the second channel is formed, and further, a change in the second stage (an increase in the current between the source and the drain) is found in the vicinity of the threshold voltage at which the first channel is formed.

When such a transistor is used as a switch of a digital circuit, for example, the switch might change in two stages. Needless to say, this change is not preferable for a switch.

When a parasitic channel is generated on a side surface of an island-shaped oxide semiconductor layer, unintentional current (also referred to as leakage current) flows between a source and a drain through the parasitic channel, which becomes factors of deterioration of electric characteristics of a transistor, for example, an increase in off-state current or an increase in threshold voltage variation of the transistor. In particular, in a transistor whose channel length is less than or equal to 100 nm, deterioration of electric characteristics due to a parasitic channel generated on a side surface of an island-shaped oxide semiconductor layer is a major problem.

Electric characteristics of a transistor in which a channel is formed in an oxide semiconductor layer might change owing to processing conditions or heat treatment conditions. This change is considered to be due to release of oxygen (O) from the oxide semiconductor layer during a step for forming the oxide semiconductor layer, for example. Oxygen (O) has been found to be likely to release from a side surface (end surface) of the oxide semiconductor layer. In other words, it has been found that in the transistor in which the channel is formed in the oxide semiconductor layer, a region in the vicinity of the side surface of the oxide semiconductor layer becomes a low-resistance region, and a parasitic channel of the transistor is likely to be formed in the region. Thus, an object of one embodiment of the present invention is to provide a transistor in which a parasitic channel is not easily formed.

Another object of one embodiment of the present invention is to suppress formation of a parasitic channel of a transistor on a side surface of an oxide semiconductor layer.

Another object of one embodiment of the present invention is to obtain a transistor with favorable electric characteristics by suppressing formation of a parasitic channel.

Another object of one embodiment of the present invention is to provide a semiconductor device including a transistor which is formed using an oxide semiconductor layer and has a channel length of less than 50 nm, and to provide a method for manufacturing the semiconductor device.

A photolithography process for processing a semiconductor into an island shape can be omitted by using an oxide semiconductor which is i-type (intrinsic) or substantially i-type (intrinsic) for a semiconductor layer of a transistor. The i-type (intrinsic) or substantially i-type oxide semiconductor has high resistance and a high insulating property. Therefore, even when the semiconductor layer is not processed into an island-shaped semiconductor layer, channel formation regions of a plurality of transistors can be electrically isolated from each other.

In other words, a transistor can be manufactured by a smaller number of photolithography processes than the conventional one; thus, productivity of the transistor can be increased. Further, also high productivity of a semiconductor device including the transistor can be achieved.

Since the semiconductor layer is not processed into an island shape, a side surface of the semiconductor layer where a parasitic channel, which might be a transmission path of leakage current, is easily generated is not formed. Thus, electric characteristics of the transistor become favorable, and high performance and high reliability of the transistor can be achieved. Further, also high performance and high reliability of a semiconductor device including the transistor can be achieved.

A photolithography process and an etching step for forming an island-shaped semiconductor layer are omitted, and a transistor is manufactured by two photolithography processes: one for forming a gate electrode (including a wiring or the like formed from the same layer as the gate electrode) and the other for forming a conductive layer to be a source electrode and a drain electrode (including a wiring or the like formed from the same layer as the conductive layer).

In addition to the above photolithography processes, a photolithography process for forming an opening in a semiconductor layer or an insulating layer, a photolithography process for forming a wiring for electrical connection to another transistor, or the like may be performed as needed.

According to one embodiment of the present invention, a semiconductor device includes an insulating layer, a single oxide semiconductor layer formed over the insulating layer, and at least a first transistor and a second transistor. The first transistor includes a first gate insulating layer formed over the oxide semiconductor layer, a first gate electrode formed over the first gate insulating layer, a first sidewall insulating layer formed over the first gate insulating layer to cover a side surface of the first gate electrode, and a first source electrode and a first drain electrode in contact with the oxide semiconductor layer and the first sidewall insulating layer. The second transistor includes a second gate insulating layer formed over the oxide semiconductor layer, a second gate electrode formed over the second gate insulating layer, a second sidewall insulating layer formed over the second gate insulating layer to cover a side surface of the second gate electrode, and a second source electrode and a second drain electrode in contact with the oxide semiconductor layer and the second sidewall insulating layer. A channel formation region of the first transistor and a channel formation region of the second transistor are formed in respective regions of the oxide semiconductor layer.

Since the semiconductor layer is not processed into an island shape for each transistor, a channel formation region of the first transistor and a channel formation region of the second transistor are formed in respective regions of the same (single) oxide semiconductor layer.

According to one embodiment of the present invention, a semiconductor device includes an insulating layer, a single oxide semiconductor layer formed over the insulating layer, and at least a first transistor and a second transistor. The first transistor includes a first gate insulating layer formed over the oxide semiconductor layer, a first gate electrode formed over the first gate insulating layer, a first sidewall insulating layer formed over the first gate insulating layer to cover a side surface of the first gate electrode, and a first source electrode and a first drain electrode in contact with the oxide semiconductor layer and the first sidewall insulating layer. The second transistor includes a second gate insulating layer formed over the oxide semiconductor layer, a second gate electrode formed over the second gate insulating layer, a second sidewall insulating layer formed over the second gate insulating layer to cover a side surface of the second gate electrode, and a second source electrode and a second drain electrode in contact with the oxide semiconductor layer and the second sidewall insulating layer. The first source electrode and the first drain electrode are electrically isolated from the second source electrode and the second drain electrode.

Since the semiconductor layer is not processed into an island shape for each transistor, the first source electrode, the first drain electrode, the second source electrode, and the second drain electrode are formed in contact with the same (single) oxide semiconductor layer.

According to one embodiment of the present invention, an oxide insulating layer is formed; an oxide semiconductor layer is formed over the oxide insulating layer; a gate insulating layer is formed over the oxide semiconductor layer; a stack of a gate electrode and an insulating layer is formed over the gate insulating layer by a first photolithography process; a sidewall insulating layer covering a side surface of the gate electrode and a side surface of the insulating layer are formed over the gate insulating layer; part of the oxide semiconductor layer is exposed by selective removal of part of the gate insulating layer using the gate electrode, the insulating layer, and the sidewall insulating layer as masks; a conductive layer is formed over the gate electrode, the insulating layer, and the sidewall insulating layer by a second photolithography process so as to be in contact with part of the oxide semiconductor layer; an interlayer insulating layer is formed over the conductive layer; and a source electrode and a drain electrode are formed by removal of the interlayer insulating layer and the conductive layer by a chemical mechanical polishing method so that the insulating layer over the gate electrode is exposed.

According to one embodiment of the present invention, a first insulating layer is formed; a second insulating layer is formed over the first insulating layer; an oxide semiconductor layer is formed over the second insulating layer; a third insulating layer is formed over the oxide semiconductor layer; a fourth insulating layer is formed over the third insulating layer; a stack of a gate electrode and a fifth insulating layer is formed over the fourth insulating layer by a first photolithography process; a sixth insulating layer covering side surfaces of the gate electrode and side surfaces of the fifth insulating layer is formed over the fourth insulating layer; part of the oxide semiconductor layer is exposed by selective removal of part of the third insulating layer and part of the fourth insulating layer using the gate electrode, the fifth insulating layer, and the sixth insulating layer as masks; a conductive layer is formed over the gate electrode, the fifth insulating layer, and the sixth insulating layer by a second photolithography process so as to be in contact with the exposed oxide semiconductor layer; a seventh insulating layer is formed over the conductive layer; an eighth insulating layer is formed over the seventh insulating layer; and a source electrode and a drain electrode are formed by removal of the seventh insulating layer, the eighth insulating layer, and the conductive layer by a chemical mechanical polishing method so that the fifth insulating layer is exposed.

According to one embodiment of the present invention, a transistor can be manufactured by at least two photolithography processes.

Cleaning treatment is preferably performed after the conductive layer is formed by the second photolithography process.

As the treatment for removing impurities, plasma treatment or treatment using a solution can be used. As the plasma treatment, oxygen plasma treatment, dinitrogen monoxide plasma treatment, or the like can be used. Further, a rare gas (typically argon) can be used for the plasma treatment.

Further, for the cleaning treatment using a solution, an alkaline solution such as a tetramethylammonium hydroxide (TMAH) solution, an acidic solution such as diluted hydrofluoric acid or oxalic acid, or water can be used. For example, when diluted hydrofluoric acid is used, 50 wt % hydrofluoric acid is diluted with water to approximately $1/10^2$ to $1/10^5$, preferably approximately $1/10^3$ to $1/10^5$. That is, diluted hydrofluoric acid having a concentration of 0.5 wt % to $5 \times 10^{-4}$ wt %, preferably $5 \times 10^{-2}$ wt % to $5 \times 10^{-4}$ wt %, is used for the cleaning treatment. By the cleaning treatment, impurities attached to the surface of the oxide semiconductor layer can be removed.

The first insulating layer, the fourth insulating layer, and the seventh insulating layer are preferably formed using a material having a barrier property against oxygen and an impurity such as hydrogen, moisture, hydride, or hydroxide. When the material having the barrier property is used for the insulating layers, entry of impurities from the substrate or the outside can be prevented and release of oxygen from the oxide semiconductor layer can be prevented.

Each of the second insulating layer and the third insulating layer is preferably an insulating layer containing oxygen. Further, the second insulating layer and the third insulating layer are in contact with the oxide semiconductor layer and therefore preferably contain oxygen in a proportion higher than that in the stoichiometric amount of oxygen in the layer (bulk).

Note that the first insulating layer and the second insulating layer each function as a base layer, and the third insulating layer and the fourth insulating layer each function as a gate insulating layer.

As described above, a side surface of the oxide semiconductor layer and a region in the vicinity of the side surface become a low-resistance region due to entry of a resistance-reducing element in a formation step of the oxide semiconductor layer or release of oxygen (O) from the oxide semiconductor layer. When the side surface of the oxide semiconductor layer and the region in the vicinity of the side surface become the low-resistance region, a parasitic channel of the transistor might be formed in the low-resistance region. The formation of a parasitic channel of the transistor might cause a change of electric characteristics of the transistor.

Therefore, a transistor is manufactured so that a low-resistance region is not formed on a side surface of an oxide semiconductor layer of the transistor and a region in the vicinity of the side surface, so that formation of a parasitic channel can be suppressed.

By suppressing formation of a parasitic channel, a transistor with favorable electric characteristics can be obtained.

According to one embodiment of the present invention, a transistor is manufactured by three photolithography processes: one for forming a gate electrode (including a wiring or the like formed from the same layer as the gate electrode), another for forming an opening in an insulating layer, the other for forming a conductive layer to be a source electrode and a drain electrode (including a wiring or the like formed from the same layer as the conductive layer).

Further, a photolithography process for forming an opening in an insulating layer covering the transistor and a photolithography process for forming a wiring for electrical connection to another transistor through the opening may be added.

Since the oxide semiconductor layer is not processed into an island shape, a side surface of the oxide semiconductor layer, which might be a transmission path of leakage current, is not formed. Therefore, favorable electric characteristics of the transistor can be obtained.

More specifically, in the case where an oxide semiconductor layer is formed over a substrate or an insulating layer, the oxide semiconductor layer is deposited over the entire surface of the substrate or the insulating layer, and the deposited oxide semiconductor layer is used without being processed into an island shape. In the oxide semiconductor layer, a channel formation region is formed in a region between a pair of electrodes, a source electrode and a drain electrode, which overlaps with a gate electrode with a gate insulating layer provided therebetween.

Further, an i-type (intrinsic) or substantially i-type oxide semiconductor is preferably used for the oxide semiconductor layer. The i-type (intrinsic) or substantially i-type oxide semiconductor has high resistance and a high insulating property. Therefore, even when the oxide semiconductor layer is not processed into an island-shaped oxide semiconductor layer, channel formation regions of a plurality of transistors can be electrically isolated from each other.

A source electrode and a drain electrode of one of the plurality of transistors are electrically isolated from a source electrode and a drain electrode of another one of the plurality of transistors in order that the plurality of transistors are electrically isolated from each other in the case of using the oxide semiconductor layer which is not processed into an island shape.

A side surface of the oxide semiconductor layer might be formed in a peripheral region of a side surface of the substrate or a peripheral region of a side surface of the insulating layer. In such a case where a side surface of the oxide semiconductor layer is formed, the side surface of the oxide semiconductor layer is positioned so as not to correspond to a side surface of a channel formation region and to keep a sufficiently far distance. In this specification, the sufficiently far distance means a distance in which the low-resistance region is sufficiently far from the channel formation region so as not to affect the channel formation region, even if a low-resistance region is formed on a side surface of an oxide semiconductor layer and a region in the vicinity of the side surface.

According to one embodiment of the present invention, an oxide semiconductor layer is deposited over a base insulating layer; a gate insulating layer is formed over the oxide semiconductor layer; a first conductive layer is formed over the gate insulating layer; a gate electrode is formed over the oxide semiconductor layer by removal of part of the first conductive layer; an insulating layer is formed over the gate electrode and the gate insulating layer; an opening reaching the oxide semiconductor layer is formed by removal of part of the gate insulating layer and part of the insulating layer; a second conductive layer is formed over the insulating layer so as to fill the opening; and a source electrode and a drain electrode electrically connected to the oxide semiconductor layer are formed over the insulating layer by removal of part of the second conductive layer. The oxide semiconductor layer is not processed into an island shape.

In one embodiment of the present invention, the source electrode and the drain electrode each having a comb shape are formed by removal of part of the second conductive layer so that projections of the comb shapes of the electrodes do not overlap with each other and the gate electrode is provided between the electrodes.

According to one embodiment of the present invention, an oxide semiconductor layer is deposited over a base insulating layer; a gate insulating layer is formed over the oxide semiconductor layer; a first conductive layer is formed over the gate insulating layer; a gate electrode is formed over the oxide semiconductor layer by removal of part of the first conductive layer; an insulating layer is formed over the gate electrode and the gate insulating layer; a first opening reaching the oxide semiconductor layer is formed by removal of part of the insulating layer and part of the gate insulating layer; a second opening reaching the oxide semiconductor layer is formed in a region on the side opposite to the first opening with respect to the gate electrode by removal of another part of the insulating layer and another part of the gate insulating layer; a second conductive layer is formed over the insulating layer so as to fill the first opening and the second opening; a source electrode and a drain electrode are formed in the first opening and the second opening by removal of the second conductive layer over the insulating layer through polishing treatment on the second conductive layer; and a source wiring and a drain wiring are formed over the source electrode and the drain electrode. The oxide semiconductor layer is not processed into an island shape.

According to one embodiment of the present invention, the polishing treatment on the second conductive layer is performed by chemical mechanical polishing treatment.

According to one embodiment of the present invention, a transistor including a semiconductor layer having a different band gap from the oxide semiconductor layer is formed below the base insulating layer.

According to one embodiment of the present invention, the base insulating layer is formed by stacking a first base insulating layer serving as a blocking layer for suppressing release of oxygen and a second base insulating layer including an oxygen-excess region.

According to one embodiment of the present invention, the gate insulating layer is formed by stacking a first gate insulating layer which is in contact with the oxide semiconductor layer and includes an oxygen-excess region, and a second gate insulating layer which is in contact with the gate electrode and functions as a blocking layer for suppressing release of oxygen.

According to one embodiment of the present invention, the insulating layer serves as a blocking layer for suppressing release of oxygen.

According to one embodiment of the present invention, a semiconductor device includes a base insulating layer, a single oxide semiconductor layer formed over the base insulating layer, and at least a first transistor and a second transistor. The first transistor includes a gate insulating layer provided over the oxide semiconductor layer, a first gate electrode provided over the oxide semiconductor layer with the gate insulating layer provided therebetween, an insulating layer provided over the first gate electrode and the gate insulating layer, and a first source electrode and a first drain electrode provided over the insulating layer which have a comb shape with the first gate electrode provided therebetween. A projection of the comb shape of the first source electrode and a projection of the comb shape of the first drain electrode are provided so as not to overlap with each other. The second transistor includes the gate insulating layer provided over the oxide semiconductor layer, a second gate electrode provided over the oxide semiconductor layer with the gate insulating layer provided therebetween, the insulating layer provided over the second gate electrode and the gate insulating layer, and a second source electrode and a second drain electrode provided over the insulating layer which have a comb shape with the second gate electrode provided therebetween. A projection of the comb shape of the second source electrode and a projection of the comb shape of the second drain electrode are provided so as not to overlap with each other. A channel formation region of the first transistor and a channel formation region of the second transistor are formed in respective regions of the single oxide semiconductor layer.

According to one embodiment of the present invention, a semiconductor device includes a base insulating layer, a single oxide semiconductor layer formed over the base insulating layer, and at least a first transistor and a second transistor. The first transistor includes a gate insulating layer provided over the oxide semiconductor layer, a first gate electrode provided over the oxide semiconductor layer with the gate insulating layer provided therebetween, an insulating layer provided over the first gate electrode and the gate insulating layer, a first source electrode and a first drain electrode which fill a first opening and a second opening in the gate insulating layer and the insulating layer and which are electrically connected to the oxide semiconductor layer, and a first source wiring and a first drain wiring provided over and in contact with the first source electrode and the first drain electrode. The second transistor includes the gate insulating layer provided over the oxide semiconductor layer, a second gate electrode provided over the oxide semiconductor layer with the gate insulating layer provided therebetween, the insulating layer provided over the second gate electrode and the gate insulating layer, a second source electrode and a second drain electrode which fill a third opening and a fourth opening in the gate insulating layer and the insulating layer and which are electrically connected to the oxide semiconductor layer, and a second source wiring and a second drain wiring provided over and in contact with the second source electrode and the second drain electrode. A channel formation region of the first transistor and a channel formation region of the second transistor are formed in respective regions of the single oxide semiconductor layer.

According to one embodiment of the present invention, a transistor including a semiconductor layer having a different band gap from that of the oxide semiconductor layer is provided below the base insulating layer.

According to one embodiment of the present invention, the base insulating layer is a stack of a first base insulating layer serving as a blocking layer for suppressing release of oxygen and a second base insulating layer including an oxygen-excess region.

According to one embodiment of the present invention, the gate insulating layer includes a first gate insulating layer in contact with the oxide semiconductor layer and a second gate insulating layer in contact with the gate electrode. The first gate insulating layer includes an oxygen-excess region, and the second gate insulating layer functions as a blocking layer for suppressing release of oxygen.

According to one embodiment of the present invention, the insulating layer serves as a blocking layer for suppressing release of oxygen.

According to one embodiment of the present invention, in a process of manufacturing a transistor by a photolithography method, a mask over a conductive layer provided when a source electrode and a drain electrode are formed by partly etching the conductive layer, is formed using electron beam exposure.

Further, in one embodiment of the present invention, a transistor is formed using an oxide semiconductor layer which is not patterned. Note that in this specification, "pattern" means to partly remove and divide a single film (layer) into a plurality of films (layers). For example, it means to remove and divide part of a film (layer) deposited over the entire top surface of a substrate into a plurality of island-shaped films (layers). Note that in this specification, "pattern" does not mean only to partly remove a film (layer). For example, "pattern" does not mean to remove part of a film (layer) deposited over the entire top surface of a substrate to form an opening in the single film (layer).

According to one embodiment of the present invention, a gate insulating layer is formed over a gate electrode; an oxide semiconductor layer is formed over the gate insulating layer; a conductive layer is formed over the oxide semiconductor layer; a positive type resist is formed over the conductive layer; a first conductive layer and a second conductive layer are formed by selectively etching the conductive layer after electron beam exposure; and a third conductive layer over and partly in contact with the first conductive layer and a fourth conductive layer over and partly in contact with the second conductive layer are formed. The gap between the first conductive layer and the second conductive layer is narrower than the gap between the third conductive layer and the fourth conductive layer. The first conductive layer and the third conductive layer function as a source electrode. The second conductive layer and the fourth conductive layer function as a drain electrode. The oxide semiconductor layer is not patterned at least in a channel width direction.

The oxide semiconductor layer is preferably highly purified so as to contain hardly any impurities such as copper, aluminum, and chlorine. In the process for manufacturing the transistor, steps in which these impurities are not mixed or attached to the surface of the oxide semiconductor layer are preferably selected as appropriate. In the case where the impurities are attached to the surface of the oxide semiconductor layer, the impurities on the surface of the oxide semiconductor layer are preferably removed by exposure to oxalic acid, diluted hydrofluoric acid, or the like or by plasma treatment (such as N$_2$O plasma treatment). Specifically, the copper concentration of the oxide semiconductor layer is lower than or equal to $1\times10^{18}$ atoms/cm$^3$, preferably lower than or equal to $1\times10^{17}$ atoms/cm$^3$. In addition, the aluminum concentration of the oxide semiconductor layer is lower than or equal to $1\times10^{18}$ atoms/cm$^3$. Further, the chlorine concentration of the oxide semiconductor layer is lower than or equal to $2\times10^{18}$ atoms/cm$^3$.

In addition, shortly after the oxide semiconductor layer is deposited, it is preferable that the oxide semiconductor layer be supersaturated which contains oxygen in a proportion higher than that in the stoichiometric composition. For example, in the case where the oxide semiconductor layer is deposited by a sputtering method, the deposition is preferably performed in the state where the proportion of oxygen in a deposition gas is large, and in particular, the deposition is preferably performed in an oxygen atmosphere (an oxygen gas: 100%). When the deposition is performed in the state where the proportion of oxygen in the deposition gas is large, particularly in a 100% oxygen gas atmosphere, release of zinc from the film can be reduced even at a deposition temperature higher than or equal to 300° C., for example.

The oxide semiconductor layer is preferably an oxide semiconductor layer which is highly purified by sufficient removal of impurities such as hydrogen or by sufficient supply of oxygen so as to be supersaturated with oxygen. Specifically, the hydrogen concentration of the oxide semiconductor layer is $5\times10^{19}$ atoms/cm$^3$ or less, preferably $5\times10^{18}$ atoms/cm$^3$ or less, more preferably $5\times10^{17}$ atoms/cm$^3$ or less. Note that the above hydrogen concentration of the oxide semiconductor layer is measured by secondary ion mass spectrometry (SIMS). In order that the oxide semiconductor layer is supersaturated with oxygen by sufficient supply of oxygen, an insulating layer containing excess oxygen (such as a SiO$_x$ layer) may be provided so as to surround and be in contact with the oxide semiconductor layer.

For the insulating layer containing excess oxygen, SiO$_x$ or silicon oxynitride containing much oxygen as a result of deposition under the conditions which are set as appropriate for a plasma CVD method or a sputtering method is used. In order to make the insulating layer contain much more excess oxygen, oxygen may be added by an ion implantation method, an ion doping method, or plasma treatment.

In the case where the hydrogen concentration of the insulating layer containing excess oxygen is greater than or equal to $7.2\times10^{20}$ atoms/cm$^3$, variation in initial characteristics of transistors is increased, a channel length dependence is increased, and a transistor is significantly deteriorated in the BT stress test; therefore, the hydrogen concentration of the insulating layer containing excess oxygen is preferably less than $7.2\times10^{20}$ atoms/cm$^3$. In other words, the hydrogen concentration of the oxide semiconductor layer is preferably less than or equal to $5\times10^{19}$ atoms/cm$^3$, and the hydrogen concentration of the insulating layer containing excess oxygen is preferably less than $7.2\times10^{20}$ atoms/cm$^3$.

In addition, a blocking layer (such as an AlO$_x$ layer) for suppressing release of oxygen from the oxide semiconductor layer is preferably provided so as to surround the oxide semiconductor layer and be positioned outside the insulating layer containing excess oxygen.

When the oxide semiconductor layer is surrounded by the insulating layer containing excess oxygen and the blocking layer, the oxide semiconductor layer can contain oxygen in a proportion which is substantially the same as that in the stoichiometric composition, or in a proportion higher than that in the stoichiometric composition i.e., the oxide semiconductor layer can be supersaturated with oxygen. For example, in the case where the oxide semiconductor layer is formed of IGZO, an example of stoichiometric composition is In:Ga:Zn:O=1:1:1:4 [atomic ratio]; thus, the atomic ratio of oxygen atoms is 4 or more.

According to one embodiment of the present invention, since a semiconductor layer is not processed into an island shape, a side surface of the semiconductor layer, which might be a transmission path of leakage current, is not formed. Therefore, a miniaturized transistor with less variation and favorable electric characteristics can be provided with high yield. Further, it is possible to provide a highly reliable transistor.

According to one embodiment of the present invention, a transistor can be formed by a smaller number of photolithography processes than the conventional one; thus, productivity of the transistor can be increased.

Further, also in a semiconductor device including the transistor, high performance, high reliability, and high productivity can be achieved.

In one embodiment of the present invention, a source electrode and a drain electrode are formed by etching a conductive layer in a state where a mask formed using electron beam exposure is provided over the conductive layer. Here, formation of a mask using electron beam exposure enables minute processing of the mask. Thus, it is possible to form a transistor in which a gap (channel length) between a source electrode and a drain electrode which are formed by etching a conductive layer in a state where the mask is provided over the conductive layer is short. For example, a transistor whose channel length is less than 50 nm can be obtained.

Further, in one embodiment of the present invention, a transistor is formed using an oxide semiconductor layer which is not patterned. Thus, it is possible to reduce a possibility that a source electrode and a drain electrode of the transistor are electrically connected to each other through a region in the vicinity of a side surface (end surface) of the oxide semiconductor layer (a region whose resistance is reduced due to release of oxygen (O) or the like). That is, formation of a parasitic channel in the transistor can be suppressed.

Furthermore, in one embodiment of the present invention, a step needed for patterning of an oxide semiconductor layer in a process for manufacturing a transistor is not needed. Thus, manufacturing cost of the transistor can be reduced and yield can be increased.

BRIEF DESCRIPTION OF THE DRAWINGS

In the accompanying drawings:

FIGS. 37A1 to 37A3, 37B1 to 37B3, and 37C1 to 37C3 are top views and cross-sectional views illustrating a method for manufacturing a semiconductor devices;

FIGS. 38A1 to 38A3, 38B1 to 38B3, and 38C1 to 38C3 are top views and cross-sectional views illustrating a method for manufacturing a semiconductor devices;

FIGS. 39A1 to 39A3, 39B1 to 39B3, and 39C1 to 39C3 are top views and cross-sectional views illustrating a method for manufacturing a semiconductor devices;

FIGS. 40A1 to 40A3, 40B1 to 40B3, and 40C1 to 40C3 are top views and cross-sectional views illustrating a method for manufacturing a semiconductor devices;

FIGS. 52A to 52C are model diagrams used for calculation of movement of excess oxygen;

FIGS. 54A to 54C are model diagrams used for calculation of movement of excess oxygen.

DETAILED DESCRIPTION OF THE INVENTION

Figure 1A:
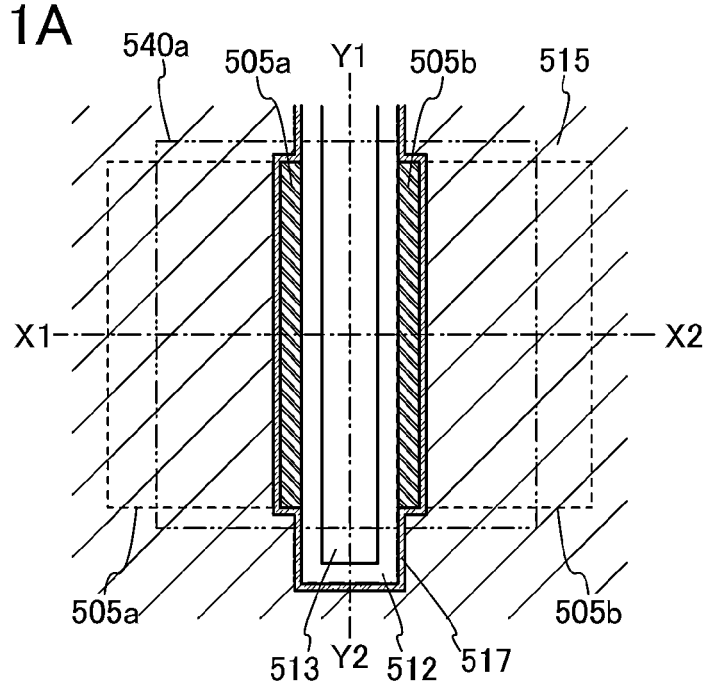
FIGS. 1A to 1C are a top view and cross-sectional views illustrating a semiconductor device.

Embodiments will be described in detail with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

In addition, in this specification and the like, ordinal numbers such as "first", "second", and "third" are used in order to avoid confusion among components, and the terms do not limit the components numerically.

Note that the position, size, range, or the like of each structure illustrated in drawings and the like is not accurately represented in some cases for easy understanding. Therefore, the disclosed invention is not necessarily limited to the position, size, range, or the like as disclosed in the drawings and the like.

Functions of a "source" and a "drain" of a transistor are sometimes replaced with each other when a transistor of opposite polarity is used or when the direction of current flowing is changed in circuit operation, for example. Therefore, the terms "source" and "drain" can be used to denote the drain and the source, respectively, in this specification.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Note that in this specification and the like, the term "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

In this specification and the like, the word concerning the thickness "substantially equal" means "almost equal" as well as "completely equal". For example, "substantially equal" refers to a case where, as compared to the "completely equal" thickness situation, there is a difference in thickness that causes a negligible influence on semiconductor device characteristics (a case where the influence on characteristics is 5% or less), a case where the thickness is slightly reduced by polishing without intention (a case where the polishing amount is approximately less than 5 nm), and the like.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

Embodiment 1

In this embodiment, one embodiment of a semiconductor device and a method for manufacturing the semiconductor device will be described with reference to FIGS. 1A to 1C. In this embodiment, a transistor including an oxide semiconductor layer is shown as an example of the semiconductor device.

The transistor may have a single-gate structure in which one channel formation region is formed, a double-gate structure in which two channel formation regions are formed, or a triple-gate structure in which three channel formation regions are formed. Alternatively, the transistor may have a dual gate structure including two gate electrodes positioned over and below a channel region with a gate insulating layer provided therebetween.

Figure 1B:
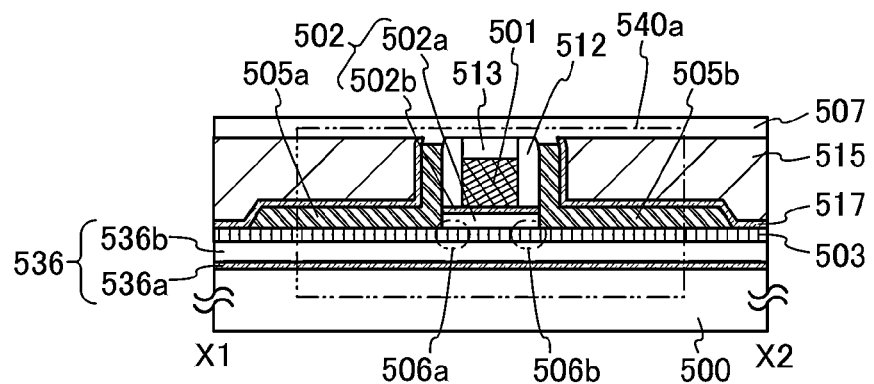
Figure 1C:
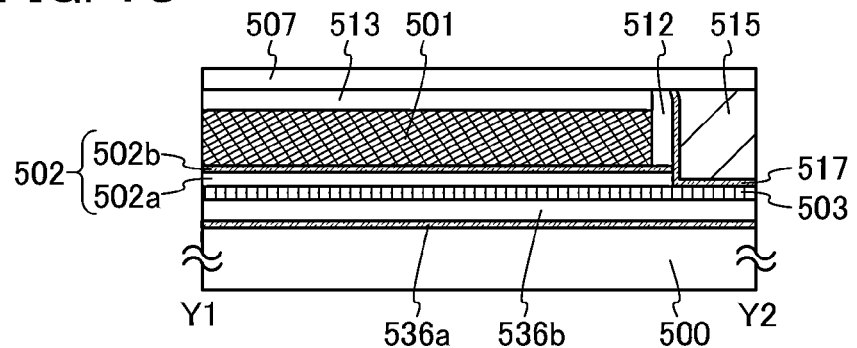

A transistor 540a illustrated in FIGS. 1A to 1C is an example of a top-gate transistor. FIG. 1A is a top view, FIG. 1B is a cross-sectional view along dashed line X1-X2 in FIG. 1A, and FIG. 1C is a cross-sectional view along dashed line Y1-Y2 in FIG. 1A.

As illustrated in FIG. 1B, which is a cross-sectional view in the channel length direction, and FIG. 1C, which is a cross-sectional view in the channel width direction, a semiconductor device including the transistor 540a includes, over a substrate 500 having an insulating surface over which an insulating layer 536 is provided, an oxide semiconductor layer 503, a source electrode 505a, a drain electrode 505b, a gate insulating layer 502, a gate electrode 501, a sidewall insulating layer 512 provided on a side surface of the gate electrode 501, an insulating layer 513 over the gate electrode 501, an interlayer insulating layer 517 over the source electrode 505a and the drain electrode 505b, an interlayer insulating layer 515 over the insulating layer 517, and an insulating layer 507 covering the transistor 540a. Note that in FIG. 1A, some components are omitted for easy understanding.

The insulating layer 536 functions as a base layer. An example of the insulating layer 536 in this embodiment is a stack of an insulating layer 536a and an insulating layer 536b. An example of the gate insulating layer 502 in this embodiment is a stack of the gate insulating layer 502a and the gate insulating layer 502b. For each of the insulating layer 536a, the gate insulating layer 502b, and the interlayer insulating layer 517, a material having a barrier property against oxygen or an impurity such as hydrogen, moisture, hydride, or hydroxide is preferably used. By applying a material having a barrier property to the above insulating layers, entry of impurities from the outside can be prevented and release of oxygen from the oxide semiconductor layer 503, the insulating layer 536b, and the gate insulating layer 502a can be prevented.

The interlayer insulating layer 515 is provided for planarizing unevenness due to the transistor 540a. The height of a top surface of the interlayer insulating layer 515 (here, the "height of a top surface of the interlayer insulating layer 515" means a perpendicular distance from a surface of the substrate 500 to a top surface of the interlayer insulating layer 515) is substantially the same as that of each top surface of the sidewall insulating layer 512 and the insulating layer 513. Further, the height of each top surface of the source electrode 505a and the drain electrode 505b is lower than that of each top surface of the interlayer insulating layer 515, the sidewall insulating layer 512, and the insulating layer 513, and higher than that of a top surface of the gate electrode 501.

Further, in FIGS. 1A to 1C, the insulating layer 507 is provided in contact with the interlayer insulating layer 515, the interlayer insulating layer 517, the source electrode 505a, the drain electrode 505b, the sidewall insulating layer 512, and the insulating layer 513.

Note that a region of the oxide semiconductor layer 503 which overlaps with the gate electrode 501 is referred to as a channel formation region, a region of the oxide semiconductor layer 503 which is in contact with the source electrode 505a is referred to as a source region, and a region of the oxide semiconductor layer 503 which is in contact with the drain electrode 505b is referred to as a drain region. Further, a region of the oxide semiconductor layer 503 which is between the channel formation region and the source region is referred to as an offset region 506a, and a region of the oxide semiconductor layer 503 which is between the channel formation region and the drain region is referred to as an offset region 506b. The offset region 506a and the offset region 506b are formed in the oxide semiconductor layer 503 to overlap with the sidewall insulating layer 512.

In other words, the channel formation region, the source region, the drain region, the offset region 506a, and the offset region 506b are formed in a self-aligned manner. By providing the offset regions, parasitic capacitance generated between the channel formation region and the source electrode 505a can be reduced. Further, parasitic capacitance generated between the channel formation region and the drain electrode 505b can be reduced.

Since the channel formation region is formed in a self-aligned manner, miniaturization of the transistor can be easily achieved, the transistor has excellent on-state characteristics (for example, on-state current and field-effect mobility) and can operate at high speed.

An oxide semiconductor to be used for the oxide semiconductor layer 503 preferably contains at least indium (In) or zinc (Zn). In particular, In and Zn are preferably contained. In addition, as a stabilizer for reducing the variation in electric characteristics of a transistor using the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0) may be used as an oxide semiconductor. Note that M represents one or more metal elements selected from Ga, Fe, Mn, and Co. Still alternatively, a material represented by $In_2SnO_5(ZnO)_n$ (n>0) may be used as an oxide semiconductor.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the semiconductor oxide is not limited to the materials given above, but a material with an appropriate composition may be used depending on needed semiconductor characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, mobility can be increased by reducing the defect density in a bulk also in the case of using an In—Ga—Zn-based oxide.

For example, the case where the composition of an oxide having an atomic ratio where In:Ga:Zn=a:b:c (a+b+c=1) is in the neighborhood of the composition of an oxide having an atomic ratio where In:Ga:Zn=A:B:C (A+B+C=1) means that a, b, and c satisfy the following relation: $(a-A)^2+(b-B)^2+(c-C)^2 \leq r^2$, and r may be 0.05, for example. The same applies to other oxides.

As the oxide semiconductor disclosed in this embodiment, a c-axis aligned crystalline oxide semiconductor (CAAC-OS) can be used besides a single crystal oxide semiconductor, a polycrystalline (also referred to as polycrystal) oxide semiconductor, an amorphous oxide semiconductor, and the like.

There are three methods for obtaining a CAAC-OS layer. The first method is to deposit an oxide semiconductor layer at a deposition temperature higher than or equal to 200° C. and lower than or equal to 450° C., thereby obtaining c-axis alignment substantially perpendicular to a surface. The second method is to deposit a thin oxide semiconductor layer and then subject the layer to a heat treatment performed at a temperature higher than or equal to 200° C. and lower than or equal to 700° C., thereby obtaining c-axis alignment substantially perpendicular to the surface thereof. The third method is to deposit a first thin oxide semiconductor layer, subject the layer to a heat treatment performed at a temperature higher than or equal to 200° C. and lower than or equal to 700° C., and then deposit a second oxide semiconductor layer, thereby obtaining c-axis alignment substantially perpendicular to the surface thereof.

The CAAC-OS is not completely single crystal or completely amorphous. The CAAC-OS is an oxide semiconductor with a crystal-amorphous mixed phase structure where crystal portions are included in an amorphous phase. Note that in most cases, the crystal part fits inside a cube whose one side is less than 100 nm. From an observation image obtained with a transmission electron microscope (TEM), a boundary between an amorphous portion and a crystal portion in the CAAC-OS is not clear. Further, with the TEM, a grain boundary in the CAAC-OS is not found. Thus, in the CAAC-OS, a reduction in electron mobility, due to the grain boundary, is suppressed.

In the crystal portion included in the CAAC-OS, the c-axes are aligned in a direction perpendicular to a surface where the CAAC-OS is formed or a surface of the CAAC-OS, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis.

In other words, in each of the crystal parts included in the CAAC-OS, a c-axis is aligned in a direction parallel to a normal vector of a surface where the CAAC-OS is formed or a normal vector of a surface of the CAAC-OS, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis.

Note that, among crystal parts, the directions of the a-axis and the b-axis of one crystal portion may be different from those of another crystal portion. In this specification, a simple term "perpendicular" includes a range from 85° to 95°. In addition, a simple term "parallel" includes a range from −5° to 5°.

In the CAAC-OS, distribution of crystal portions is not necessarily uniform. For example, in the formation process of the CAAC-OS, in the case where crystal growth occurs from a surface side of the oxide semiconductor layer, the proportion of crystal portions in the vicinity of the surface of the oxide semiconductor layer is higher than that in the vicinity of the surface where the oxide semiconductor layer is formed in some cases. Further, when an impurity is added to the CAAC-OS, the crystal portion in a region to which the impurity is added becomes amorphous in some cases.

Since the c-axes of the crystal portions included in the CAAC-OS are aligned in the direction perpendicular to the surface where the CAAC-OS is formed or a surface of the CAAC-OS, the directions of the c-axes may be different from each other depending on the shape of the CAAC-OS (the cross-sectional shape of the surface where the CAAC-OS is formed or the cross-sectional shape of the surface of the CAAC-OS). The direction of c-axis of the crystal portion is the direction perpendicular to the surface where the CAAC-OS is formed or the surface of the CAAC-OS. The crystal portion is formed by deposition or by performing treatment for crystallization such as heat treatment after deposition.

With use of the CAAC-OS in a transistor, a change in electric characteristics of the transistor due to irradiation with visible light or ultraviolet light is small. Thus, the transistor has high reliability.

Note that part of oxygen included in the oxide semiconductor layer may be substituted with nitrogen.

In an oxide semiconductor having a crystal portion such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with an arithmetic average surface roughness ($R_a$) of less than or equal to 1 nm, preferably less than or equal to 0.3 nm, further preferably less than or equal to 0.1 nm.

Note that, $R_a$ can be expressed as an "average value of the absolute values of deviations from a reference surface to a specific surface" and is defined by the formula (1) below.

[FORMULA 1]

$$Ra = \frac{1}{S_0} \int_{y_1}^{y_2} \int_{x_1}^{x_2} |f(x, y) - Z_0| dx dy$$

Here, the specific surface is a surface that is a target of roughness measurement, and is a quadrilateral region specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. Moreover, $S_0$ represents the area of a rectangle which is obtained by projecting the specific surface on the xy plane, and $Z_0$ represents the height of the reference surface (the average height of the specific surface). $R_a$ can be measured using an atomic force microscope (AFM).

The oxide semiconductor layer has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulsed laser deposition method, an atomic layer deposition (ALD) method, or the like as appropriate. The oxide semiconductor layer 503 may be deposited with a sputtering apparatus which performs deposition in the state where top surfaces of a plurality of substrates are substantially perpendicular to a top surface of a sputtering target.

An example of a method for manufacturing a semiconductor device including the transistor 540a is described with reference to FIGS. 2A to 2D and FIGS. 3A to 3D.

First, over the substrate 500, the insulating layer 536 is formed.

There is no particular limitation on a substrate that can be used as the substrate 500 as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate made of silicon, silicon carbide, or the like; a compound semiconductor substrate made of silicon germanium or the like; an SOI substrate; or the like can be used as the substrate 500, or the substrate provided with a semiconductor element can be used as the substrate 500.

The semiconductor device may be manufactured using a flexible substrate as the substrate 500. To manufacture a flexible semiconductor device, the transistor 540a including the oxide semiconductor layer 503 may be directly formed over a flexible substrate; or alternatively, the transistor 540a including the oxide semiconductor layer 503 may be formed over a substrate, and then may be separated and transferred to a flexible substrate. Note that in order to separate the transistor 540a from the manufacturing substrate and transfer it to the flexible substrate, a separation layer may be provided between the manufacturing substrate and the transistor 540a including the oxide semiconductor layer 503.

The insulating layer 536 can be formed using silicon oxide, silicon nitride, silicon oxynitride, silicon nitride oxide, aluminum oxide, aluminum nitride, aluminum oxynitride, aluminum nitride oxide, hafnium oxide, gallium oxide, or a mixed material of any of these materials by a plasma CVD method, a sputtering method, or the like. Note that in this specification, oxynitride contains more oxygen than nitrogen, and nitride oxide contains more nitrogen than oxygen. For example, silicon oxynitride refers to a substance that includes oxygen, nitrogen, and silicon at concentrations ranging from 50 at. % to 70 at. %, 0.5 at. % to 20 at. %, and 25 at. % to 35 at. %, respectively. In addition, the total of the percentages of the constituent elements does not exceed 100 at. %. The oxygen content and the nitrogen content are measured by Rutherford backscattering spectrometry (RBS) or hydrogen forward scattering spectrometry (HFS).

As the insulating layer 536, a thermal oxidation film may be used. The thermal oxidation film can be formed in the following manner: a substrate is subjected to heat treatment in an oxidation atmosphere, so that a surface of the substrate is oxidized. For example, a single crystal silicon substrate is used as the substrate 500, and heat treatment is performed at 900° C. to 1200° C. in an atmosphere containing oxygen or water vapor for several hours, whereby a thermal oxidation film can be formed on a surface of the substrate 500.

The insulating layer 536 may be either a single layer or a stacked layer. In this embodiment, a stack of the insulating layer 536a and the insulating layer 536b is used as the insulating layer 536. The insulating layer 536a formed over the substrate 500 is preferably formed using a material having a barrier property against oxygen and an impurity such as hydrogen, moisture, hydride, or hydroxide, for example, silicon nitride or aluminum oxide. Since the insulating layer 536b formed over the insulating layer 536a is in contact with the oxide semiconductor layer 503, the insulating layer 536b preferably contains oxygen in a proportion higher than that in the stoichiometric composition in the layer (bulk). For example, in the case where the insulating layer 536b is formed using silicon oxide, the composition formula is $SiO_{2+\alpha}$ ($\alpha>0$). By using the insulating layer 536b as described, oxygen can be supplied to the oxide semiconductor layer 503, leading to favorable characteristics. By supply of oxygen to the oxide semiconductor layer 503, oxygen vacancies in the oxide semiconductor layer 503 can be filled.

Figure 2A:
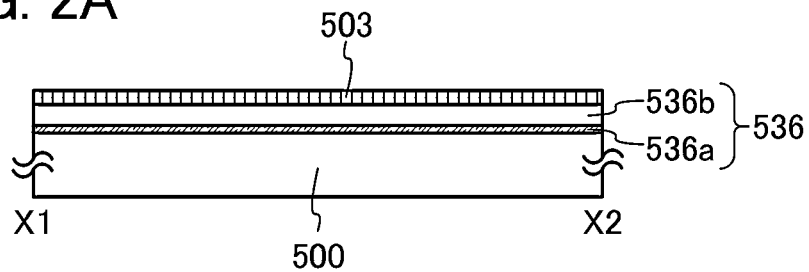
FIGS. 2A to 2D are cross-sectional views illustrating a method for manufacturing a semiconductor device.

In this embodiment, a single crystal silicon substrate is used as the substrate 500, a 50-nm-thick silicon nitride layer is formed over the substrate 500 by a plasma CVD method as the insulating layer 536a, and a 300-nm-thick silicon oxide layer is formed over the insulating layer 536a by a plasma CVD method as the insulating layer 536b (see FIG. 2A).

The temperature at the time of forming the insulating layer 536 is preferably as high as possible among temperatures that the substrate 500 can withstand. For example, the insulating layer 536 is formed with the substrate 500 heated at a temperature higher than or equal to 350° C. and lower than or equal to 450° C. Note that the temperature at the time of forming the insulating layer 536 is preferably constant. For example, the insulating layer 536 is formed with the substrate 500 heated at 350° C.

After the formation of the insulating layer 536, heat treatment may be performed under reduced pressure, a nitrogen atmosphere, a rare gas atmosphere, or an ultra-dry atmosphere. The heat treatment can reduce the concentration of hydrogen, moisture, hydride, hydroxide, or the like in the insulating layer 536. It is preferable that the temperature of the heat treatment be as high as possible among temperatures that the substrate 500 can withstand. Specifically, it is preferable that the heat treatment be performed at a temperature higher than or equal to the deposition temperature of the insulating layer 536 and lower than or equal to the strain point of the substrate 500.

Note that the hydrogen concentration in the insulating layer 536 is preferably lower than $5\times10^{18}$ atoms/cm$^3$, further preferably lower than or equal to $1\times10^{18}$ atoms/cm$^3$, still further preferably lower than or equal to $5\times10^{17}$ atoms/cm$^3$, and further more preferably lower than or equal to $1\times10^{16}$ atoms/cm$^3$.

After formation of the insulating layer 536, oxygen (including at least one of oxygen radicals, oxygen atoms, and oxygen ions) may be introduced into the insulating layer 536 so that the insulating layer 536 includes a region containing oxygen in a proportion higher than that in the stoichiometric composition (includes an oxygen-excess region). For the introduction of oxygen, heat treatment performed in an oxygen atmosphere, an ion implantation method, an ion doping method, a plasma immersion ion implantation method, plasma treatment performed in an atmosphere containing oxygen, or the like can be employed. In the case of performing plasma treatment in an atmosphere containing oxygen, an ashing apparatus can be used, for example.

By introduction of oxygen, a bond between hydrogen and a constituent element of the insulating layer 536 or a bond between the constituent element and a hydroxyl group is cut, and the hydrogen or the hydroxyl group reacts with the oxygen, so that water is produced. Accordingly, heat treatment performed after introduction of oxygen facilitates elimination of the hydrogen or the hydroxyl group, which is an impurity, as water. Therefore, heat treatment may be performed after introduction of oxygen into the insulating layer 536. After that, oxygen may be further introduced into the insulating layer 536 so that the insulating layer 536 is in an oxygen-excess state. The introduction of oxygen into the insulating layer 536 and the heat treatment may be performed alternately a plurality of times. The introduction of oxygen and the heat treatment may be performed at the same time.

Next, the oxide semiconductor layer 503 is formed over the insulating layer 536 by a sputtering method (see FIG. 2A).

In order that hydrogen or water will be not contained in the oxide semiconductor layer 503 as much as possible in the formation step of the oxide semiconductor layer 503, it is preferable to heat the substrate provided with the insulating layer 536 in a preheating chamber of a sputtering apparatus as a pretreatment for deposition of the semiconductor layer 503 so that impurities such as hydrogen and moisture adsorbed to the substrate and the insulating layer 536 are eliminated and evacuated. As an evacuation unit provided in the preheating chamber, a cryopump is preferable.

Therefore, planarization treatment may be performed on the region of the insulating layer 536 which is to be in contact with the oxide semiconductor layer 503. As the planarization treatment, polishing treatment (e.g., a chemical mechanical polishing method), dry-etching treatment, or plasma treatment can be used, though there is no particular limitation on the planarization treatment.

As plasma treatment, for example, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the top surface of the insulating layer 536.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the insulating layer 536.

Planarization treatment may be performed on a surface of the silicon oxide layer used as the insulating layer 536 by a chemical mechanical polishing method (the polishing conditions: a polyurethane-based polishing cloth, silica-based slurry, a slurry temperature of room temperature, a polishing pressure of 0.001 MPa, a rotation number in polishing (table/spindle) of 60 rpm/56 rpm, and a polishing time of 0.5 minutes) so that the average surface roughness ($R_a$) of the surface of the silicon oxide layer is preferably approximately 0.15 nm.

Note that a rare gas (typically argon) atmosphere, an oxygen atmosphere, or a mixed gas of a rare gas and oxygen is used as appropriate as a sputtering gas used for forming the oxide semiconductor layer 503. It is preferable that a high-purity gas from which impurities such as hydrogen, water, a hydroxyl group, and hydride are removed be used as a sputtering gas.

The oxide semiconductor layer 503 is preferably deposited under a condition such that much oxygen is contained (for example, by a sputtering method in an atmosphere where the proportion of oxygen is 100%) so as to contain much oxygen or oxygen in a supersaturated state (preferably include a region containing oxygen in excess of the stoichiometric composition of the oxide semiconductor in a crystalline state).

For example, in the case where the oxide semiconductor layer is formed by a sputtering method, the formation is performed preferably under a condition that the proportion of oxygen in the sputtering gas is large, more preferably under a condition that the proportion of oxygen in the sputtering gas is 100%. When film formation is performed under such a condition that the proportion of oxygen in the sputtering gas is high, particularly in a 100% oxygen gas atmosphere, release of Zn from the oxide semiconductor layer can be suppressed even at a formation temperature higher than or equal to 300° C., for example.

It is preferable that the oxide semiconductor layer 503 be highly purified so as to hardly contain impurities such as copper, aluminum, or chlorine. In a process for manufacturing a transistor, a step which has no risk that such impurities enter the oxide semiconductor layer or adhere to the surface of the oxide semiconductor layer is preferably selected as appropriate. Specifically, the concentration of copper in the oxide semiconductor layer 503 is lower than or equal to $1\times10^{18}$ atoms/cm$^3$, preferably lower than or equal to $1\times10^{17}$ atoms/cm$^3$. Further, the concentration of aluminum in the oxide semiconductor layer 503 is lower than or equal to $1\times10^{18}$ atoms/cm$^3$. Further, the concentration of chlorine in the oxide semiconductor layer 503 is lower than or equal to $2\times10^{18}$ atoms/cm$^3$.

The concentrations of alkali metals such as sodium (Na), lithium (Li), and potassium (K) in the oxide semiconductor layer 503 are preferably as follows. The concentration of Na is $5\times10^{16}$ atoms/cm$^{-3}$ or lower, preferably $1\times10^{16}$ atoms/cm$^{-3}$ or lower, further preferably $1\times10^{15}$ atoms/cm$^{-3}$ or lower. The concentration of Li is $5\times10^{15}$ atoms/cm$^{-3}$ or lower, preferably $1\times10^{15}$ atoms/cm$^{-3}$ or lower. The concentration of K is $5\times10^{15}$ atoms/cm$^{-3}$ or lower, preferably $1\times10^{15}$ atoms/cm$^{-3}$ or lower.

In this embodiment, as the oxide semiconductor layer 503, a 35-nm-thick In—Ga—Zn-based oxide (IGZO) layer is formed by a sputtering method using a sputtering apparatus including an AC power supply device. As a target for forming the oxide semiconductor layer 503 by a sputtering method, a metal oxide target having an atomic ratio of In:Ga:Zn=3:1:2 is used.

The relative density (the fill rate) of the metal oxide target is 90% to 100% inclusive, preferably 95% to 99.9% inclusive. By using the metal oxide target with high relative density, a dense oxide semiconductor layer 503 can be formed.

It is preferable to use a high-purity gas from which impurities such as hydrogen, water, a hydroxyl group, or hydride are removed as a sputtering gas used when the oxide semiconductor layer 503 is deposited.

The substrate is held in a deposition chamber kept under reduced pressure. Then, a sputtering gas from which hydrogen and moisture are removed is introduced while residual moisture in the deposition chamber is removed, and the oxide semiconductor layer 503 is deposited over the substrate 500 using the above target. In order to remove moisture remaining in the deposition chamber, an entrapment vacuum pump such as a cryopump, an ion pump, or a titanium sublimation pump is preferably used. As an evacuation unit, a turbo molecular pump to which a cold trap is added may be used. In the deposition chamber which is evacuated with a cryopump, a hydrogen atom, a compound containing a hydrogen atom such as water ($H_2O$) (more preferably, also a compound containing a carbon atom), and the like are removed, whereby the impurity concentration in the oxide semiconductor layer 503 formed in the deposition chamber can be reduced.

The insulating layer 536 and the oxide semiconductor layer 503 may be formed in succession without exposure to the air. By successive formation of the insulating layer 536 and the oxide semiconductor layer 503 without exposure to the air, impurities such as hydrogen and moisture can be prevented from being attached to a surface of the insulating layer 536.

Further, the oxide semiconductor layer 503 may be subjected to heat treatment for removing excess hydrogen (including water and a hydroxyl group) in the oxide semiconductor layer 503 (dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like. For example, the substrate is put in an electric furnace which is a kind of heat treatment apparatus, and the oxide semiconductor layer 503 is subjected to the heat treatment at 450° C. for one hour in a nitrogen atmosphere.

Further, an apparatus used for this heat treatment is not limited to an electric furnace, and a device for heating a process object by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

Note that in this heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, much preferably 7N (99.99999%) or higher (that is, the impurity concentration is preferably 1 ppm or lower, much preferably 0.1 ppm or lower).

In addition, after the oxide semiconductor layer 503 is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, further preferably less than or equal to 10 ppb, in the measurement with use of a dew point meter of a cavity ring down laser spectroscopy (CRDS) system) may be introduced into the same furnace. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main component of the oxide semiconductor and that is reduced by the step for removing an impurity for the dehydration or dehydrogenation, so that oxygen vacancies in the oxide semiconductor are reduced and the oxide semiconductor layer 503 can be an i-type (intrinsic) or substantially i-type oxide semiconductor. In this respect, it can be said that an embodiment of the disclosed invention includes a novel technical idea because it is different from an i-type semiconductor such as silicon added with an impurity element.

The timing of performing heat treatment for dehydration or dehydrogenation may be either before or after the island-shaped oxide semiconductor layer 503 is formed as long as it is after formation of the oxide semiconductor layer. The heat treatment for dehydration or dehydrogenation may be performed plural times and may be combined with another heat treatment.

Through the dehydration or dehydrogenation treatment, oxygen that is a main constituent material of an oxide semiconductor might be released and thus might be reduced. There is an oxygen vacancy in a portion in the oxide semiconductor layer, from which oxygen is released, and the oxygen vacancy causes a donor level which causes a variation in electric characteristics of a transistor.

Thus, oxygen (which includes at least one of oxygen radicals, oxygen atoms, and oxygen ions) may be added to the oxide semiconductor layer 503 which has been subjected to the dehydration or dehydrogenation treatment, so that oxygen is supplied to the oxide semiconductor layer.

By the introduction (supply) of oxygen to the dehydrated or dehydrogenated oxide semiconductor layer 503, oxygen vacancies in the oxide semiconductor, which are generated in a step of removing an impurity for dehydration or dehydrogenation, can be reduced and the oxide semiconductor layer 503 can be an i-type (intrinsic) oxide semiconductor layer. Variation in electric characteristics of a transistor including the electrically i-type (intrinsic) oxide semiconductor layer 503 is suppressed, and the transistor is electrically stable.

For the introduction of oxygen, an ion implantation method, an ion doping method, a plasma immersion ion implantation method, plasma treatment performed in an atmosphere containing oxygen, or the like can be employed.

In the step of introducing oxygen to the oxide semiconductor layer 503, oxygen may be directly added to the oxide semiconductor layer 503 or added to the oxide semiconductor layer 503 through another film. An ion implantation method, an ion doping method, a plasma immersion ion implantation method, or the like may be employed for the addition of oxygen through another film, whereas plasma treatment performed in an oxygen atmosphere or the like can also be employed for the addition of oxygen directly into an exposed oxide semiconductor layer 503.

By introduction of oxygen, a bond between hydrogen and a constituent element of the oxide semiconductor layer 503 or a bond between the constituent element and a hydroxyl group is cut, and the hydrogen or the hydroxyl group reacts with the oxygen, so that water is produced. Accordingly, heat treatment performed after introduction of oxygen facilitates elimination of the hydrogen or the hydroxyl group, which is an impurity, as water. Therefore, heat treatment may be performed after introduction of oxygen into the oxide semiconductor layer 503. After that, oxygen may be further introduced into the oxide semiconductor layer 503 so that the oxide semiconductor layer 503 is in an oxygen-excess state. The introduction of oxygen into the oxide semiconductor layer 503 and the heat treatment may be performed alternately a plurality of times. The introduction of oxygen and the heat treatment may be performed at the same time.

As described above, it is preferable to highly purify the oxide semiconductor layer 503 by removing impurities such as hydrogen and make the oxide semiconductor layer 503 be an i-type (intrinsic) or substantially i-type (intrinsic) oxide semiconductor by supplying oxygen sufficiently thereto and reducing oxygen vacancies therein.

Note that an oxide semiconductor which is highly purified (purified OS) by reduction of impurities such as moisture or hydrogen which serves as an electron donor (donor) can be made to be an i-type (intrinsic) oxide semiconductor or an oxide semiconductor extremely close to an i-type oxide semiconductor (a substantially i-type oxide semiconductor) by supplying oxygen to the oxide semiconductor to reduce oxygen vacancies in the oxide semiconductor. A transistor including the i-type or substantially i-type oxide semiconductor in a semiconductor layer in which a channel is formed has characteristics of very small off-state current.

Specifically, the hydrogen concentration of the highly purified oxide semiconductor layer which is measured by SIMS is lower than or equal to $5 \times 10^{19}$ atoms/cm$^3$, preferably lower than or equal to $5 \times 10^{18}$ atoms/cm$^3$, further preferably lower than or equal to $5 \times 10^{17}$ atoms/cm$^3$. Further, in order to supply the sufficient amount of oxygen to the oxide semiconductor layer 503 to supersaturate the oxide semiconductor layer 503 with oxygen, insulating layers (such as silicon oxide layer) containing much oxygen between which the oxide semiconductor layer 503 is sandwiched are provided to be in contact with the oxide semiconductor layer 503.

Further, the hydrogen concentration in the insulating layer containing much oxygen is important, because it affects characteristics of a transistor. In the case where the hydrogen concentration of the insulating layer containing much oxygen is higher than or equal to $7.2 \times 10^{20}$ atoms/cm$^3$, variation in initial characteristics of the transistor is increased, a channel length dependence is increased, and the transistor is significantly deteriorated in the BT stress test; therefore, the hydrogen concentration of the insulating layer containing much oxygen is preferably lower than $7.2 \times 10^{20}$ atoms/cm$^3$. In other words, the hydrogen concentration of the oxide semiconductor layer is preferably lower than or equal to $5 \times 10^{19}$ atoms/cm$^3$, and the hydrogen concentration of the insulating layer containing much oxygen is preferably lower than $7.2 \times 10^{20}$ atoms/cm$^3$.

The analysis of the hydrogen concentration by SIMS is described here. It is known to be difficult to obtain accurate data in the proximity of a surface of a sample or in the proximity of an interface between stacked films formed of different materials by the SIMS analysis in principle. Thus, in the case where the distribution of the hydrogen concentration in the thickness direction of a layer is analyzed by SIMS, the average value of the hydrogen concentration in a region of the layer where almost the same value can be obtained without significant variation is employed as the hydrogen concentration. Further, in the case where the thickness of the layer is small, a region where almost the same value can be obtained cannot be found in some cases due to the influence of the hydrogen concentration of an adjacent film. In this case, the maximum value or the minimum value of the hydrogen concentration in a region where the film is provided is employed as the hydrogen concentration of the film. Furthermore, in the case where a maximum value peak and a minimum value valley do not exist in the region where the film is provided, the value of the inflection point is employed as the hydrogen concentration.

The i-type (intrinsic) or substantially i-type (intrinsic) oxide semiconductor has high resistance and substantially functions as an insulator. Thus, even when the semiconductor layer is not divided for each transistor, channel formation regions of a plurality of transistors can be electrically isolated from each other. In other words, when an i-type (intrinsic) or substantially i-type (intrinsic) oxide semiconductor is used for the oxide semiconductor layer 503, a photolithography process for processing the oxide semiconductor layer 503 into an island shape can be omitted. In addition, since the oxide semiconductor layer 503 is not processed into an island shape, a side surface of a semiconductor layer, which might be a transmission path of leakage current, is not formed; thus, a transistor with favorable electric characteristics can be realized. In particular, even a transistor whose channel length is less than or equal to 100 nm, further, less than 60 nm can have favorable electric characteristics. Accordingly, a semiconductor device with reduced current consumption can be provided.

Figure 2B:
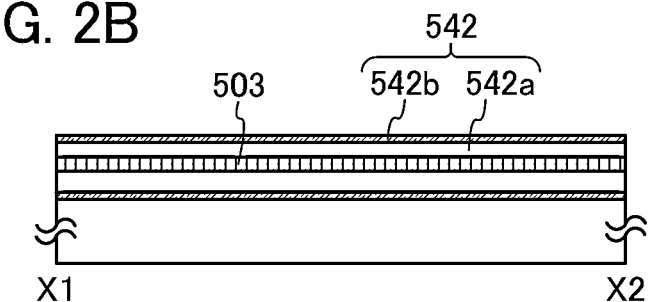

Next, the gate insulating layer 542 is formed to cover the oxide semiconductor layer 503 (see FIG. 2B).

Note that in order to improve coverage with the gate insulating layer 542, the surface of the oxide semiconductor layer 503 may also be subjected to the above-described planarization treatment. In particular, in the case where a thin insulating layer is used as the gate insulating layer 542, it is preferable that the oxide semiconductor layer 503 have improved surface flatness.

The gate insulating layer 542 can be formed to have a thickness greater than or equal to 1 nm and less than or equal to 20 nm by a sputtering method, an MBE method, a CVD method, a pulsed laser deposition method, an ALD method, or the like as appropriate. The gate insulating layer 542 may also be deposited with use of a sputtering apparatus which performs deposition with surfaces of a plurality of substrates set substantially perpendicular to a top surface of a sputtering target.

Further, the gate insulating layer 542 may be either a single layer or a stacked layer. In this embodiment, a stack of a gate insulating layer 542a and a gate insulating layer 542b is used as the gate insulating layer 542. The gate insulating layer 542 can be formed using silicon oxide, silicon nitride, silicon oxynitride, silicon nitride oxide, aluminum oxide, aluminum nitride, aluminum oxynitride, aluminum nitride oxide, hafnium oxide, gallium oxide, or a mixed material of any of these materials.

Generally, a capacitor has such a structure that a dielectric is sandwiched between two electrodes that face to each other, and as the thickness of the dielectric is smaller (as the distance between the two facing electrodes is shorter) or as the dielectric constant of the dielectric is higher, the capacitance becomes higher. However, when the thickness of the dielectric is reduced in order to increase the capacitance of the capacitor, leakage current flowing between the two electrodes tends to be increased and the withstand voltage of the capacitor tends to be lowered.

A portion where a gate electrode, a gate insulating layer, and a semiconductor layer of a transistor overlap with each other functions as the above-described capacitor (hereinafter also referred to as "gate capacitor"). A channel is formed in a region in the semiconductor layer, which overlaps with the gate electrode with the gate insulating layer provided therebetween. In other words, the gate electrode and the channel formation region function as two electrodes of the capacitor, and the gate insulating layer functions as a dielectric of the capacitor. Although it is preferable that the capacitance of the gate capacitor be high, a reduction in the thickness of the gate insulating layer for the purpose of increasing the capacitance may cause an increase in the leakage current or a reduction in the withstand voltage.

In the case where a high-k material such as hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), hafnium oxide, or yttrium oxide is used for the gate insulating layer 542, even when the thickness of the gate insulating layer 542 is made thick, an enough capacitance between the gate electrode 501 and the oxide semiconductor layer 503 can be ensured.

For example, in the case where a high-k material with a high dielectric constant is used for the gate insulating layer 542, even when the gate insulating layer 542 is made thick, a capacitance similar to that in the case of using silicon oxide for the gate insulating layer 542 can be obtained. This enables a reduction in leakage current between the gate electrode 501 and the oxide semiconductor layer 503. Further, leakage current between a wiring formed from the same layer as the gate electrode 501 and another wiring that overlaps with the wiring can be reduced. Note that the gate insulating layer 542 may have a stacked-layer structure of the high-k material and the above material.

It is preferable that the gate insulating layer 542 include oxygen in a portion which is in contact with the oxide semiconductor layer 503. In this embodiment, the gate insulating layer 542a which is in contact with the oxide semiconductor layer 503 preferably contains oxygen in a proportion higher than that in the stoichiometric composition in the layer (bulk). For example, in the case where silicon oxide is used for the gate insulating layer 542a, the composition formula is $SiO_{2+\alpha}$ ($\alpha$>0). In this embodiment, silicon oxide of $SiO_{2+\alpha}$ ($\alpha$>0) is used for the gate insulating layer 542a. By using the silicon oxide for the gate insulating layer 542, oxygen can be supplied to the oxide semiconductor layer 503, leading to good characteristics. Further, the gate insulating layer 542a is preferably formed in consideration of the size of a transistor and the step coverage with the gate insulating layer 542a.

The gate insulating layer 542b formed over the gate insulating layer 542a is preferably formed using a material having a bather property against oxygen and an impurity such as hydrogen, moisture, hydride, or hydroxide, for example, silicon nitride or aluminum oxide.

Before the gate insulating layer 542 is formed, impurities such as moisture or organic substances attached on the surface of the oxide semiconductor layer 503 are preferably removed by plasma treatment using oxygen, dinitrogen monoxide, or a rare gas (typically argon).

After formation of the gate insulating layer 542, oxygen (including at least one of oxygen radicals, oxygen atoms, and oxygen ions) may be introduced into the gate insulating layer 542 so that the gate insulating layer 542 is in an oxygen-excess state. For the introduction of oxygen, an ion implantation method, an ion doping method, a plasma immersion ion implantation method, plasma treatment performed in an atmosphere containing oxygen, or the like can be employed.

By introduction of oxygen, a bond between hydrogen and a constituent element of the gate insulating layer 542 or a bond between the constituent element and a hydroxyl group is cut, and the hydrogen or the hydroxyl group reacts with the oxygen, so that water is produced. Accordingly, heat treatment performed after introduction of oxygen facilitates elimination of the hydrogen or the hydroxyl group, which is an impurity, as water. In other words, the impurity concentration in the gate insulating layer 542 can be further reduced by heat treatment. Therefore, heat treatment may be performed after introduction of oxygen into the gate insulating layer 542. After that, oxygen may be further introduced into the gate insulating layer 542 so that the gate insulating layer 542 is in an oxygen-excess state. The introduction of oxygen into the gate insulating layer 542 and the heat treatment may be performed alternately a plurality of times. The introduction of oxygen and the heat treatment may be performed at the same time. Note that the introduction of oxygen may be performed on either one or both of the gate insulating layer 542a and the gate insulating layer 542b.

Figure 2C:
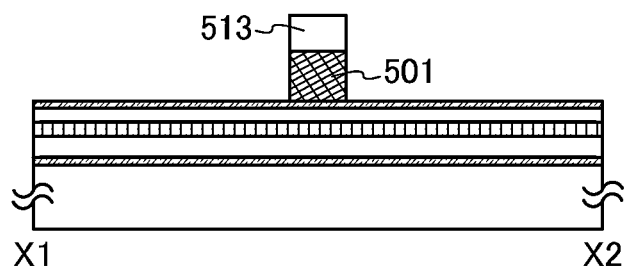
Figure 2D:
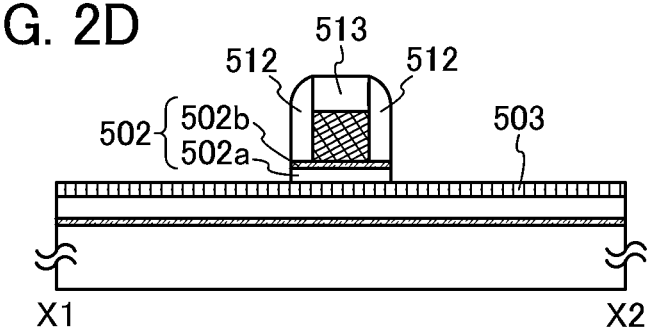

Next, a stack of a conductive layer 504 (not illustrated) for forming the gate electrode 501 and an insulating layer 508 (not illustrated) for forming the insulating layer 513 is formed over the gate insulating layer 542 and part of the conductive layer 504 and part of the insulating layer 508 are selectively etched by a first photolithography process, so that a stack of the gate electrode 501 and the insulating layer 513 is formed (see FIG. 2C).

Note that, unless otherwise specified, a photolithography process in this specification includes a step of forming a resist mask, a step of etching a conductive layer or an insulating layer, and a step of removing the resist mask.

In this embodiment, as the conductive layer 504, a 30-nm-thick tantalum nitride layer is formed over the gate insulating layer 542 by a sputtering method and a 135-nm-thick tungsten layer is formed over the tantalum nitride layer by a sputtering method. As the insulating layer 508, a 200-nm-thick silicon oxynitride layer is formed by a plasma CVD method.

A resist mask for forming the gate electrode 501 and the insulating layer 513 by selectively etching part of the conductive layer 504 and part of the insulating layer 508 may be formed by a printing method or an inkjet method. Formation of the resist mask by an inkjet method needs no photomask; thus, manufacturing cost can be reduced.

The etching for forming the gate electrode 501 and the insulating layer 513 may be dry etching, wet etching, or both dry etching and wet etching. In order to form a minute pattern, a dry etching method which can conduct anisotropic etching is preferably used.

In the case of etching the conductive layer 504 and the insulating layer 508 by a dry etching method, a gas including a halogen element can be used as an etching gas. As an example of the gas including a halogen element, a chlorine-based gas such as chlorine ($Cl_2$), boron trichloride ($BCl_3$), silicon tetrachloride ($SiCl_4$), or carbon tetrachloride ($CCl_4$); a fluorine-based gas such as carbon tetrafluoride ($CF_4$), sulfur hexafluoride ($SF_6$), nitrogen trifluoride ($NF_3$), or trifluoromethane ($CHF_3$); hydrogen bromide (HBr), or oxygen can be used as appropriate. Further, an inert gas may be added to the etching gas. As the dry etching method, a parallel plate RIE (reactive ion etching) method or an ICP (inductively coupled plasma) etching method can be used. In order to etch the layer into a desired shape, etching conditions (the amount of electric power applied to a coil-shaped electrode, the amount of electric power applied to an electrode on a substrate side, the temperature of the electrode on the substrate side, or the like) are adjusted as appropriate.

The conductive layer 504 which is to be the gate electrode 501 later can be formed using a metal material such as molybdenum, titanium, tantalum, tungsten, aluminum, copper, chromium, neodymium, or scandium or an alloy material which contains any of these materials as its main component. Alternatively, a semiconductor typified by polycrystalline silicon doped with an impurity element such as phosphorus, or a silicide such as a nickel silicide may be used for the conductive layer 504. The conductive layer 504 may have a single-layer structure or a stacked-layer structure.

The conductive layer 504 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the conductive layer 504 has a stacked structure of the above conductive material and the above metal material.

For the conductive layer 504 which is in contact with the gate insulating layer 542, a metal oxide containing nitrogen, specifically, an In—Ga—Zn-based oxide containing nitrogen, an In—Sn-based oxide containing nitrogen, an In—Ga-based oxide containing nitrogen, an In—Zn-based oxide containing nitrogen, tin oxide containing nitrogen, indium oxide containing nitrogen, or a metal nitride (InN, SnN, or the like), can be used. These materials each have a work function of 5 eV (electron volts) or higher which enables the threshold voltage, which is one of electric characteristics of a transistor, to be positive when used as the gate electrode. Thus, a normally-off switching element can be obtained.

For the insulating layer 513, typically, an inorganic insulating material such as silicon oxide, silicon oxynitride, aluminum oxide, aluminum oxynitride, silicon nitride, aluminum nitride, silicon nitride oxide, or aluminum nitride oxide can be used. The insulating layer 513 can be formed by a CVD method, a sputtering method, or the like.

Next, an insulating layer 511 (not illustrated) is formed over the gate electrode 501 and the insulating layer 513 and etched, so that the sidewall insulating layer 512 are formed. In addition, the gate insulating layer 542 is etched using the gate electrode 501 and the sidewall insulating layer 512 as masks, so that the gate insulating layer 502 (the gate insulating layer 502a and the gate insulating layer 502b) is formed (see FIG. 2D).

The insulating layer 511 can be formed using a material and a method similar to those of the insulating layer 513. In this embodiment, silicon oxynitride formed by a CVD method is used.

Figure 3A:
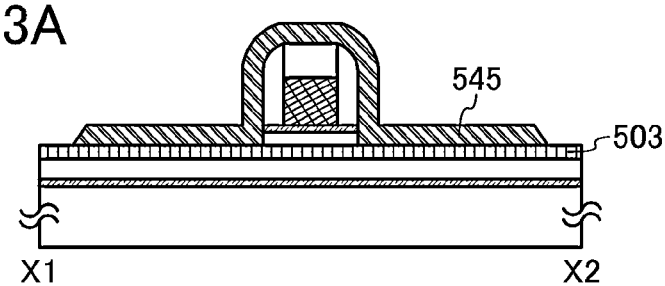
FIGS. 3A to 3D are cross-sectional views illustrating a method for manufacturing a semiconductor device.

Next, an island-shaped conductive layer 545 which is to be a source electrode and a drain electrode (including a wiring formed from the same layer as the source electrode and the drain electrode) is formed over the oxide semiconductor layer 503, the gate insulating layer 502, the gate electrode 501, the sidewall insulating layer 512, and the insulating layer 513 (see FIG. 3A).

The conductive layer 545 is formed using a material that can withstand a heat treatment performed later. For the material used for the conductive layer 545, a metal containing an element selected from Al, Cr, Cu, Ta, Ti, Mo, and W, a metal nitride containing any of the above elements as a component (e.g., titanium nitride, molybdenum nitride, or tungsten nitride), or the like can be used, for example. Alternatively, a refractory metal film of Ti, Mo, W, or the like or a metal nitride film of any of these elements (a titanium nitride film, a molybdenum nitride film, or a tungsten nitride film) may be stacked on one of or both a lower side and an upper side of a metal layer of Al, Cu, or the like. Alternatively, a conductive layer used as the conductive layer 545 may be formed using conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, which is abbreviated to ITO), indium oxide-zinc oxide ($In_2O_3$—ZnO), or any of these metal oxide in which silicon oxide is contained can be used.

In this embodiment, as the conductive layer 545, a tungsten layer with a thickness of 30 nm is formed by a sputtering method.

The island-shaped conductive layer 545 is formed by a second photolithography process. Specifically, a resist mask is formed over the conductive layer 545, part of the conductive layer 545 is selectively etched, and the resist mask is removed, so that the island-shaped conductive layer 545 is formed. Note that in the above etching step, part of the conductive layer 545 which overlaps with the gate electrode 501 is not removed.

In the case where a tungsten layer with a thickness of 30 nm is used as the conductive layer, part of the tungsten layer may be selectively etched (etching conditions: an etching gas of $CF_4$, $Cl_2$, and $O_2$ ($CF_4$:$Cl_2$:$O_2$=55 sccm: 45 sccm: 55 sccm); a power of 3000 W; a bias power of 140 W; and a pressure of 0.67 Pa), so that an island-shaped tungsten layer is formed.

At this time, a constituent element in the conductive layer 545, an element in the treatment chamber, and a constituent element of an etching gas used for the etching are attached as impurities to the surface of the oxide semiconductor layer 503 which are exposed due to the formation of the conductive layer 545 in some cases.

Such attachment of the impurities tends to bring about an increase in off-state current of the transistor or the deterioration of the electric characteristics of the transistor. Further, a parasitic channel tends to be formed in the oxide semiconductor layer 503, which leads to electrical connection of electrodes or wirings, which need be electrically isolated from each other, through the oxide semiconductor layer 503.

Further, depending on the impurities, the impurities may enter the vicinity of the surface of the oxide semiconductor layer 503 (bulk) to extract oxygen from the oxide semiconductor layer 503, so that oxygen vacancies may be generated on the surface and the vicinity of the surface of the oxide semiconductor layer 503. For example, chlorine or boron contained in the above-described etching gas or aluminum which is a component material in the treatment chamber may cause a reduction in resistance of the oxide semiconductor layer 503 (lead to make the oxide semiconductor layer 503 n-type).

Thus, cleaning treatment for removing impurities (treatment for removing impurities) which are attached to the surface of the oxide semiconductor layer 503 is preferably performed after the etching for forming the conductive layer 545 is performed.

As the treatment for removing impurities, plasma treatment or treatment using a solution can be used. As the plasma treatment, oxygen plasma treatment, dinitrogen monoxide plasma treatment, or the like can be used. Further, a rare gas (typically argon) can be used for the plasma treatment.

Further, for the cleaning treatment using a solution, an alkaline solution such as a tetramethylammonium hydroxide (TMAH) solution, an acidic solution such as diluted hydrofluoric acid or oxalic acid, water, or the like can be used. For example, when diluted hydrofluoric acid is used, 50 wt % hydrofluoric acid is diluted with water to approximately $1/10^2$ to $1/10^5$, preferably approximately $1/10^3$ to $1/10^5$. That is, diluted hydrofluoric acid having a concentration of 0.5 wt % to $5 \times 10^{-4}$ wt %, preferably $5 \times 10^{-2}$ wt % to $5 \times 10^{-4}$ wt %, is used for the cleaning treatment. By the cleaning treatment, the above-described impurities attached to the surface of the semiconductor layer 705 can be removed.

Further, with the treatment for removing impurities using a diluted hydrofluoric acid solution, the surfaces of the oxide semiconductor layer 503 can be etched. That is, impurities attached to the surface of the oxide semiconductor layer 503 or impurities entering the vicinity of the surface of the oxide semiconductor layer 503 can be removed together with part of the oxide semiconductor layer 503. Accordingly, a region of the oxide semiconductor layer 503 which overlaps with the conductive layer 545 may be thicker than a region of the oxide semiconductor layer 503 which does not overlap with the conductive layer 545. In other words, a region of the oxide semiconductor layer 503 which overlaps with the source electrode 505a or the drain electrode 505b may be thicker than a region of the oxide semiconductor layer 503 which does not overlap with any of the source electrode 505a and the drain electrode 505b. For example, an IGZO layer is processed with $1/10^3$ diluted hydrofluoric acid (0.05% hydrofluoric acid), so that the thickness of the IGZO layer is reduced by 1 to 3 nm per second. In the case of processing an IGZO layer with $2/10^5$ diluted hydrofluoric acid (0.0025% hydrofluoric acid), the thickness of the IGZO layer is reduced by approximately 0.1 nm per second.

By performing the treatment for removing impurities, the peak chlorine concentration at the surface of the semiconductor layer by SIMS can be reduced to be lower than or equal to $1 \times 10^{19}/cm^3$ (preferably lower than or equal to $5 \times 10^{18}/cm^3$, further preferably lower than or equal to $1 \times 10^{18}/cm^3$). The boron concentration at the surface of the semiconductor layer can be reduced to be lower than or equal to $1 \times 10^{19}/cm^3$ (preferably lower than or equal to $5 \times 10^{18}/cm^3$, further preferably lower than or equal to $1 \times 10^{18}/cm^3$). The aluminum concentration at the surface of the semiconductor layer can be reduced to be lower than or equal to $1 \times 10^{19}/cm^3$ (preferably lower than or equal to $5 \times 10^{18}/cm^3$, further preferably lower than or equal to $1 \times 10^{18}/cm^3$).

The treatment for removing impurities enables a highly reliable transistor having stable electric characteristics. Note that the treatment for removing impurities may also be performed after the gate insulating layer 502 is formed.

Figure 3B:
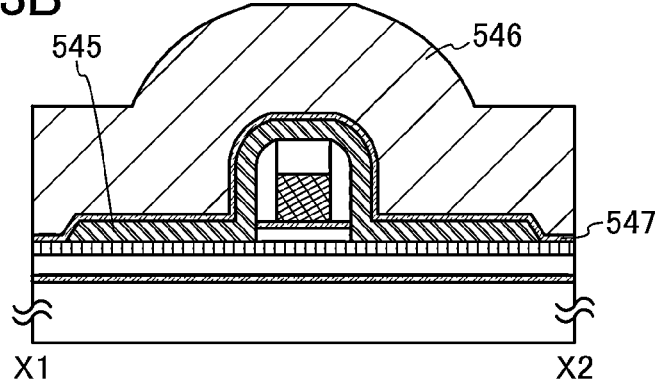

Next, an insulating layer 547 is formed over the island-shaped conductive layer 545, and an insulating layer 546 is formed over the insulating layer 547 (see FIG. 3B).

The insulating layer 547 can be formed using a material and a method similar to those of the gate insulating layer 502b and the insulating layer 536a. The insulating layer 546 can be formed using a material and a method similar to those of the insulating layer 513. The insulating layer 547 is preferably formed using a material having a barrier property against oxygen and an impurity such as hydrogen, moisture, hydride, or hydroxide, for example, silicon nitride or aluminum oxide. In this embodiment, an aluminum oxide layer is formed to have a thickness of 10 nm by a sputtering method as the insulating layer 547. When the aluminum oxide layer has high density (the film density is higher than or equal to 3.2 g/cm$^3$, preferably higher than or equal to 3.6 g/cm$^3$), the transistors 540a and 540b can have stable electric characteristics. The film density can be measured by Rutherford backscattering spectrometry (RBS) or X-ray reflection (XRR).

The insulating layer 546 is formed to such a thickness as to planarize unevenness caused by the layers formed over the substrate 500. In this embodiment, as the insulating layer 546, a 300-nm-thick silicon oxynitride layer is formed by a CVD method.

After the formation of the insulating layer 547, oxygen (including at least one of oxygen radicals, oxygen atoms, and oxygen ions) may be introduced into the insulating layer 547 so that the insulating layer 547 is in an oxygen-excess state. After the formation of the insulating layer 546, oxygen (including at least one of oxygen radicals, oxygen atoms, and oxygen ions) may be introduced into the insulating layer 546 so that the insulating layer 546 is in an oxygen-excess state.

Oxygen may be directly introduced into the insulating layer 547 or introduced into the insulating layer 547 through another layer. Oxygen may be directly introduced into the insulating layer 546 or introduced into the insulating layer 546 through another layer. When oxygen is introduced into the insulating layer through another layer, an ion implantation method, an ion doping method, a plasma immersion ion implantation method, or the like may be used. On the other hand, when oxygen is directly introduced into the insulating layer, in addition to the above methods, plasma treatment performed under an oxygen atmosphere, or the like can alternatively be employed.

By the introduction of oxygen, a bond between a constituent element of the insulating layer and hydrogen or a bond between the constituent element and a hydroxyl group is cut, and the hydrogen or the hydroxyl group reacts with oxygen to produce water; this leads to easy elimination of hydrogen or a hydroxyl group that is an impurity, in the form of water by heat treatment performed after the introduction of oxygen. In other words, the concentration of impurities in the insulating layer can be further reduced. Therefore, heat treatment may be performed after the introduction of oxygen into the insulating layer, and then oxygen may be further introduced into the insulating layer to make the insulating layer in an oxygen-excess state. The introduction of oxygen into the insulating layer and the heat treatment may be performed alternately a plurality of times. The heat treatment and the introduction of oxygen may be performed at the same time.

Figure 3C:
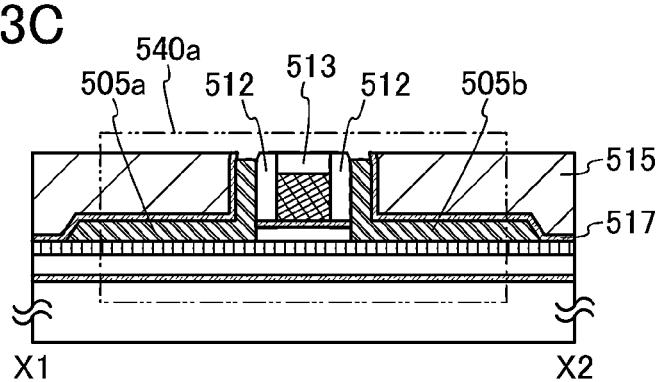

Next, the insulating layer 547, the insulating layer 546, and the conductive layer 545 are subjected to polishing treatment by a chemical mechanical polishing method, and part of the insulating layer 547, part of the insulating layer 546, and part of the conductive layer 545 are removed so that the insulating layer 513 is exposed (see FIG. 3C).

By the polishing treatment, the insulating layer 546 is processed into the interlayer insulating layer 515, the insulating layer 547 is processed into the interlayer insulating layer 517, and the conductive layer 545 over the gate electrode 501 is removed, so that the source electrode 505a and the drain electrode 505b are formed.

Although the chemical mechanical polishing method is employed for removing the insulating layer 546, the insulating layer 547, and the conductive layer 545 in this embodiment, a different cutting (grinding or polishing) method may be employed. Further, in addition to the cutting (grinding or polishing) method such as a chemical mechanical polishing method, etching (dry etching or wet etching), plasma treatment, or the like may be employed in combination for the step of removing the conductive layer 545 over the gate electrode 501. For example, after the removing step by a chemical mechanical polishing method, a dry etching method or plasma treatment (e.g., reverse sputtering method) may be performed in order to improve the planarity of a surface to be processed. In the case where a cutting (grinding or polishing) method is combined with etching, plasma treatment, or the like, the order of the steps is not limited and may be set as appropriate in accordance with the material, thickness, and surface unevenness of the insulating layer 546, the insulating layer 547, and the conductive layer 545.

Note that in this embodiment, the source electrode 505a and the drain electrode 505b are provided in contact with a side surface of the sidewall insulating layer 512 provided on side surfaces of the gate electrode 501, and the source electrode 505a and the drain electrode 505b each of which has a top end portion positioned a little lower than those of the sidewall insulating layer 512 cover the side surface of the sidewall insulating layer 512. The shapes of the source electrode 505a and the drain electrode 505b depend on the conditions of the polishing treatment for removing the conductive layer 545, and in some cases, as shown in this embodiment, the source electrode 505a and the drain electrode 505b are depressed in the film thickness direction from the surface of the sidewall insulating layer 512 and the insulating layer 513 on which polishing treatment is performed. However, depending on the conditions of the polishing treatment, the height of each of the top ends of the source electrode 505a and the drain electrode 505b is almost equal to that of each of the top end of the sidewall insulating layer 512 in some cases.

Through the above process, the transistor 540a of this embodiment can be manufactured (see FIG. 3C).

In the manufacturing process of the transistor 540a, the conductive layer 545 provided over the gate electrode 501, the insulating layer 513, and the sidewall insulating layer 512 is removed by chemical mechanical polishing treatment, so that the conductive layer 545 is divided; thus, the source electrode 505a and the drain electrode 505b are formed.

The source electrode 505a and the drain electrode 505b are in contact with the sidewall insulating layer 512 and an exposed portion of a top surface of the oxide semiconductor layer 503. Accordingly, the distance between the gate electrode 501 and a region (a source region or a drain region) in which the oxide semiconductor layer 503 is in contact with the source electrode 505a or the drain electrode 505b corresponds to a width of the sidewall insulating layer 512 in the channel length direction; thus, further miniaturization can be achieved and variation in the manufacturing process can be suppressed.

Accordingly, the distance between the gate electrode 501 and the region (the source region or the drain region) in which the oxide semiconductor layer 503 is in contact with the source electrode 505a or the drain electrode 505b can be made short, so that the resistance between the gate electrode 501 and the region (the source region or the drain region) in which the oxide semiconductor layer 503 is in contact with the source electrode 505a or the drain electrode 505b is reduced; thus, the on-state characteristics of the transistor 540a can be improved.

Further, precise processing can be performed accurately because etching with use of a resist mask is not performed when the conductive layer 545 over the gate electrode 501 is removed in a formation step of the source electrode 505a and the drain electrode 505b. Consequently, in a process for manufacturing the semiconductor device, the transistor 540a having a miniaturized structure with less variation in shape or characteristics can be manufactured with high yield.

When the conductive layer 545 over the gate electrode 501 is removed in the step for forming the source electrode 505a and the drain electrode 505b, part or all of the insulating layer 513 may be removed. FIG. 4C illustrates an example of a transistor 540c in which all of the insulating layer 513 is removed and the gate electrode 501 is exposed. Further, an upper part of the gate electrode 501 may also be removed. A structure in which the gate electrode 501 is exposed as in the transistor 540c can be used for an integrated circuit in which another wiring or another semiconductor element is stacked over the transistor 540c.

A highly dense inorganic insulating layer (typically an aluminum oxide layer) which is to be a protective insulating layer may be provided over the transistor 540a.

Figure 3D:
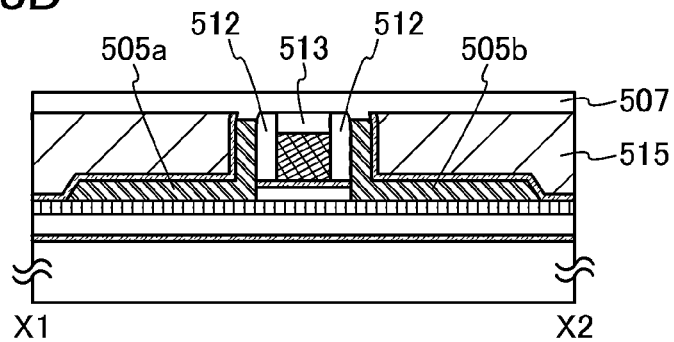

In this embodiment, the insulating layer 507 is formed over and in contact with the insulating layer 513, the source electrode 505a, the drain electrode 505b, the sidewall insulating layer 512, and the interlayer insulating layer 515 (see FIG. 3D).

Further, instead of forming the interlayer insulating layer 517, a highly-dense inorganic insulating layer (typically an aluminum oxide layer) which is to be a protective insulating layer may be provided as the interlayer insulating layer 515. FIG. 4B illustrates an example of the transistor 540b in which the interlayer insulating layer 517 is not provided between the source electrode 505a and the interlayer insulating layer 515 and between the drain electrode 505b and the interlayer insulating layer 515.

The insulating layer 507 may have either a single-layer structure or a stacked-layer structure, and preferably contains at least an aluminum oxide layer.

The insulating layer 507 can be deposited by a plasma CVD method, a sputtering method, an evaporation method, or the like.

Besides aluminum oxide, an inorganic insulating material such as silicon oxide, silicon nitride, silicon oxynitride, silicon nitride oxide, aluminum oxide, aluminum nitride, aluminum oxynitride, aluminum nitride oxide, or gallium oxide can be used as a material for the insulating layer 507, for example. Further, hafnium oxide, magnesium oxide, zirconium oxide, lanthanum oxide, barium oxide, or a metal nitride can also be used.

In this embodiment, an aluminum oxide layer formed by a sputtering method is used for the insulating layer 507. When the aluminum oxide layer has high density (the film density is higher than or equal to 3.2 g/cm$^3$, preferably higher than or equal to 3.6 g/cm$^3$), the transistors 540a and 540b can have stable electric characteristics.

The aluminum oxide layers which can be used as the insulating layers 507 and 510 over the oxide semiconductor layer 503 have a high shielding effect (blocking effect) of preventing penetration of both oxygen and impurities such as hydrogen or moisture.

Therefore, in and after the manufacturing process, the insulating layers formed using aluminum oxide each function as a protective layer for preventing an impurity such as hydrogen or moisture, which causes a change in characteristics, from entering the oxide semiconductor layer 503 and also preventing oxygen, which is a main constituent material of the oxide semiconductor, from being released from the oxide semiconductor layer 503.

The insulating layer 507 is preferably formed using a method in which impurities such as water or hydrogen are prevented from entering the insulating layer 507 (preferably a sputtering method or the like) as appropriate.

In order to remove remaining moisture in a deposition chamber as in the case of the deposition of the oxide semiconductor layer, an entrapment vacuum pump (e.g., a cryopump) is preferably used. When the insulating layers 507 and 510 are formed in the deposition chamber evacuated using a cryopump, the impurity concentrations of the insulating layers 507 and 510 can be reduced. In addition, as an evacuation unit for removing moisture remaining in the deposition chamber, a turbo molecular pump provided with a cold trap may be used.

It is preferable that a high-purity gas in which impurities such as hydrogen, water, a hydroxyl group, or hydride are reduced be used as the sputtering gas for the deposition of the insulating layer 507.

In addition, a planarization insulating layer may be formed over the transistor in order to reduce surface unevenness due to the transistor. As the planarization insulating layer, an organic material such as polyimide, an acrylic resin, or a benzocyclobutene-based resin can be used. Other than such organic materials, it is also possible to use a low-dielectric constant material (a low-k material) or the like. Note that the planarization insulating layer may be formed by stacking a plurality of insulating layers formed using any of these materials.

Figure 4A:
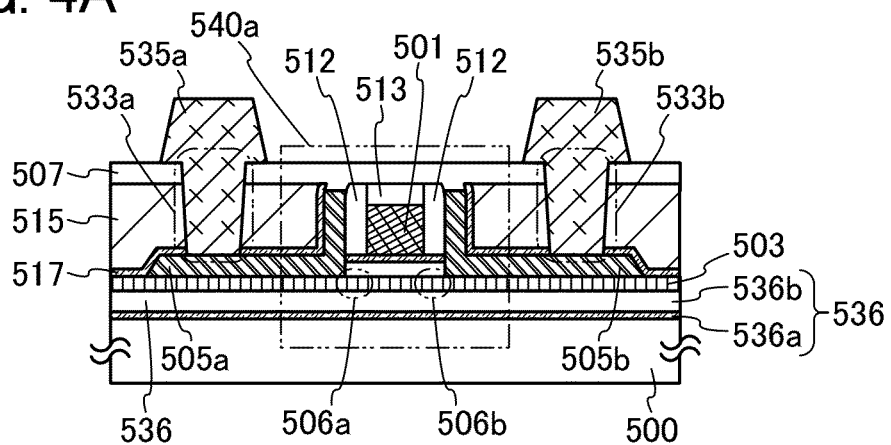
FIGS. 4A to 4C are cross-sectional views illustrating a method for manufacturing a semiconductor device.
Figure 4B:
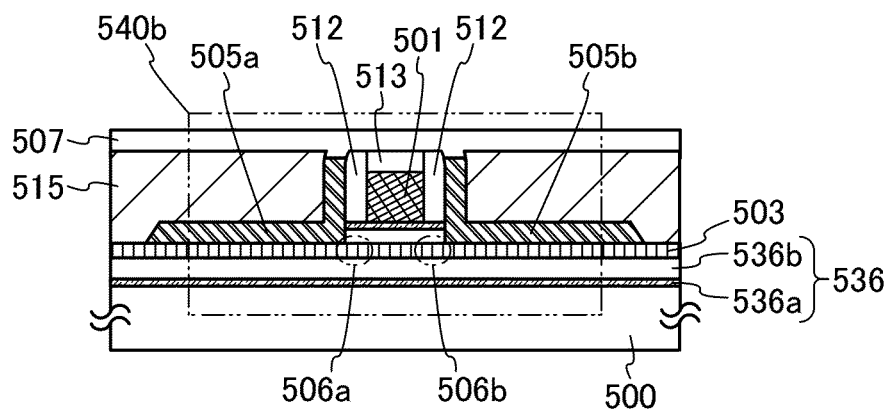
Figure 4C:
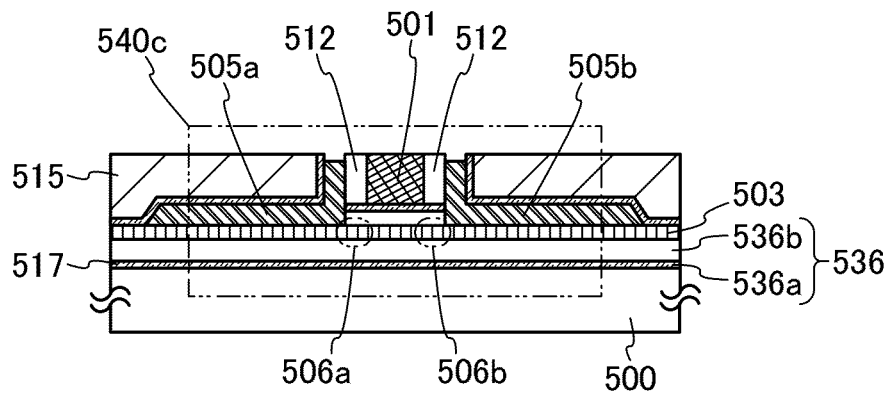

FIG. 4A shows an example in which an opening 533a and an opening 533b reaching the source electrode 505a and the drain electrode 505b, respectively, are formed in the insulating layer 507, the interlayer insulating layer 515, and the interlayer insulating layer 517, and a wiring 535a electrically connected to the source electrode 505a through the opening 533a and a wiring 535b electrically connected to the drain electrode 505b through the opening 533b are formed over the insulating layer 507. With use of the wirings 535a and 535b, the transistor is connected to another transistor or another element, which can lead to formation of a variety of circuits.

The opening 533a and the opening 533b can be formed by selective etching of part of the insulating layer 507, part of the interlayer insulating layer 515, and part of the interlayer insulating layer 517 by a third photolithography process. The insulating layer 507, the interlayer insulating layer 515, and the interlayer insulating layer 517 may be etched by either one or both of a dry etching method and a wet etching method.

The wiring 535a and the wiring 535b can be formed in the following manner: after the opening 533a and the opening 533b are formed, a conductive layer for forming the wiring 535a and the wiring 535b is formed over the insulating layer 507 and part of the conductive layer is selectively etched by a fourth photolithography process.

The conductive layer for forming the wirings 535a and 535b can be formed using a material similar to those of the gate electrode 501, the source electrode 505a, and the drain electrode 505b. For example, a metal material containing an element selected from Al, Cr, Cu, Ta, Ti, Mo, and W, a metal nitride containing any of the above elements as a component (e.g., titanium nitride, molybdenum nitride, or tungsten nitride), or the like can be used. A single layer or a stacked layer of any of the above materials can be used. For example, the conductive layer for forming the wirings 535a and 535b may have a structure in which a metal layer of a refractory metal such as Ti, Mo, or W or a metal nitride layer of any of these elements (a titanium nitride layer, a molybdenum nitride layer, and a tungsten nitride layer) is stacked on one of or both a lower side and an upper side of a metal layer of Al, Cu, or the like. The conductive layer used for the wirings 535a and 535b may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$; abbreviated to ITO), indium oxide-zinc oxide ($In_2O_3$—ZnO), or any of these metal oxide materials in which silicon oxide is contained can be used.

As the wirings 535a and 535b, a single layer of molybdenum, a stack of tantalum nitride and copper, a stack of tantalum nitride and tungsten, or the like can be used.

According to this embodiment, in a semiconductor device, the transistor 540a, 540b, or 540c having a miniaturized structure with less variation in shapes or characteristics and high on-state characteristics can be provided with high yield.

Accordingly, a semiconductor device which is miniaturized and has good electric characteristics and a method for manufacturing the semiconductor device can be provided.

According to this embodiment, a semiconductor device can be manufactured by a smaller number of photolithography processes than the conventional one because a photolithography process for forming an island-shaped semiconductor layer can be omitted. Therefore, a semiconductor device can be manufactured at low cost with high productivity.

Note that the oxide semiconductor layer 503 may have a structure in which a plurality of oxide semiconductor layers are stacked. For example, the oxide semiconductor layer 503 may have a stacked-layer structure of a first oxide semiconductor layer and a second oxide semiconductor layer which are formed using metal oxides with different compositions. For example, the first oxide semiconductor layer may be formed using a three-component metal oxide, and the second oxide semiconductor layer may be formed using a two-component metal oxide. Alternatively, for example, both the first oxide semiconductor layer and the second oxide semiconductor layer may be formed using a three-component metal oxide.

Further, the constituent elements of the first oxide semiconductor layer and the second oxide semiconductor layer may be the same and the composition ratios of the constituent elements of the first oxide semiconductor layer and the second oxide semiconductor layer may be different. For example, the first oxide semiconductor layer may have an atomic ratio of In:Ga:Zn=1:1:1, and the second oxide semiconductor layer may have an atomic ratio of In:Ga:Zn=3:1:2. Alternatively, the first oxide semiconductor layer may have an atomic ratio of In:Ga:Zn=1:3:2, and the second oxide semiconductor layer may have an atomic ratio of In:Ga:Zn=2:1:3.

In this case, one of the first oxide semiconductor layer and the second oxide semiconductor layer which is closer to the gate electrode (on a channel side) preferably contains In and Ga at a proportion satisfying In>Ga. The other which is farther from the gate electrode (on a back channel side) preferably contains In and Ga at a proportion satisfying In≤Ga.

In an oxide semiconductor, the s orbital of heavy metal mainly contributes to carrier transfer, and when the In content in the oxide semiconductor is increased, overlap of the s orbital is likely to be increased. Therefore, an oxide having a composition of In>Ga has higher mobility than an oxide having a composition of In≤Ga. Further, in Ga, the formation energy of oxygen vacancies is larger and thus oxygen vacancies are less likely to occur, than in In; therefore, the oxide having a composition of In≤Ga has more stable characteristics than the oxide having a composition of In>Ga.

An oxide semiconductor containing In and Ga at a proportion satisfying In>Ga is used on a channel side, and an oxide semiconductor containing In and Ga at a proportion satisfying In≤Ga is used on a back channel side, so that field-effect mobility and reliability of a transistor can be further improved.

Further, oxide semiconductors having different crystallinities may be used for the first oxide semiconductor layer and the second oxide semiconductor layer. That is, the oxide semiconductor layer 503 may be formed using any of a single crystal oxide semiconductor, a polycrystalline oxide semiconductor, an amorphous oxide semiconductor, and a CAAC-OS, as appropriate. When an amorphous oxide semiconductor is used for at least one of the first oxide semiconductor layer and the second oxide semiconductor layer, internal stress or external stress of the oxide semiconductor layer 503 is relieved, variation in characteristics of a transistor is reduced, and reliability of the transistor can be further improved.

On the other hand, an amorphous oxide semiconductor is likely to absorb an impurity which serves as a donor, such as hydrogen, and to generate an oxygen vacancy, and thus easily becomes an n-type. Thus, the oxide semiconductor layer on the channel side is preferably formed using a crystalline oxide semiconductor such as a CAAC-OS.

In the case where a channel-etched bottom-gate transistor is used as the transistor, when an amorphous oxide semiconductor is used on a back channel side, oxygen vacancies are generated due to etching treatment at the time of forming a source electrode and a drain electrode; thus, the oxide semiconductor is likely to be n-type. Therefore, in the case of using a channel-etched transistor, an oxide semiconductor having crystallinity is preferably used for an oxide semiconductor layer on a back channel side.

Further, the oxide semiconductor layer 503 may have a stacked-layer structure including three or more layers in which an amorphous oxide semiconductor layer is interposed between a plurality of oxide semiconductor layers having crystallinity. Furthermore, a structure in which an oxide semiconductor layer having crystallinity and an amorphous oxide semiconductor layer are alternately stacked may be employed.

These two structures used so that the oxide semiconductor layer 503 has a stacked-layer structure including a plurality of layers can be combined as appropriate.

Note that in the case where the oxide semiconductor layer 503 has a stacked-layer structure including a plurality of layers, oxygen may be introduced each time the oxide semiconductor layer is formed. For the introduction of oxygen, heat treatment performed in an oxygen atmosphere, an ion implantation method, an ion doping method, a plasma immersion ion implantation method, plasma treatment performed in an atmosphere containing oxygen, or the like can be employed.

Oxygen is introduced each time the oxide semiconductor layer is formed, whereby the effect of reducing oxygen vacancies in the oxide semiconductor can be improved.

The structure of the transistor described in this embodiment is effective particularly when a CAAC-OS is used for the oxide semiconductor layer 503. This is because oxygen is easily released from a side surface (an end surface) of an oxide semiconductor layer formed using a CAAC-OS. Note that this point is described below in detail in reference example.

In this embodiment, a transistor formed using an oxide semiconductor layer which is not processed into an island shape is described; however, formation of a parasitic channel can be suppressed even in a transistor having a structure different from this structure. Specifically, formation of a parasitic channel can be suppressed as long as an oxide semiconductor layer is not patterned in a channel width direction (a direction along Y1-Y2 in FIG. 1A) of a transistor (an oxide semiconductor layer extends in a channel width direction). In other words, formation of a parasitic channel is suppressed in some cases in an oxide semiconductor layer patterned in a channel length direction (a direction along X1-X2 in FIG. 1A) of a transistor.

This embodiment can be implemented in appropriate combination with the structures described in the other embodiments.

Embodiment 2

In this embodiment, an example of a semiconductor device which includes the transistor described in this specification, which can hold stored data even when not powered, and which does not have a limitation on the number of write cycles, will be described with reference to drawings.

Figure 5A:
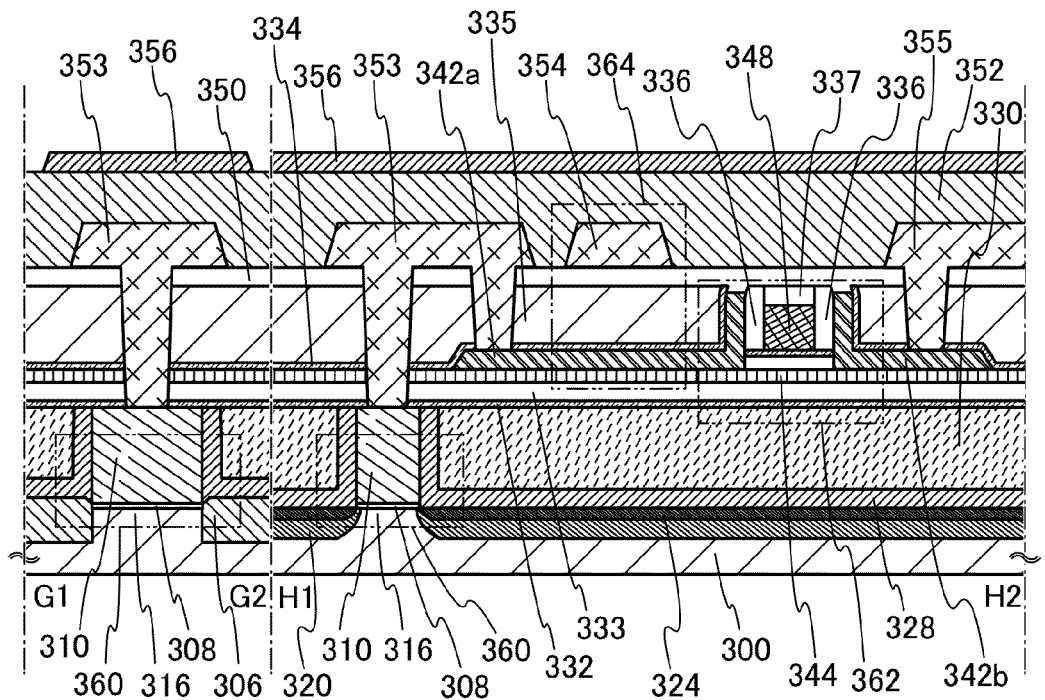
FIGS. 5A to 5C are a top view, a cross-sectional view, and a circuit diagram illustrating a semiconductor device.
Figure 5B:
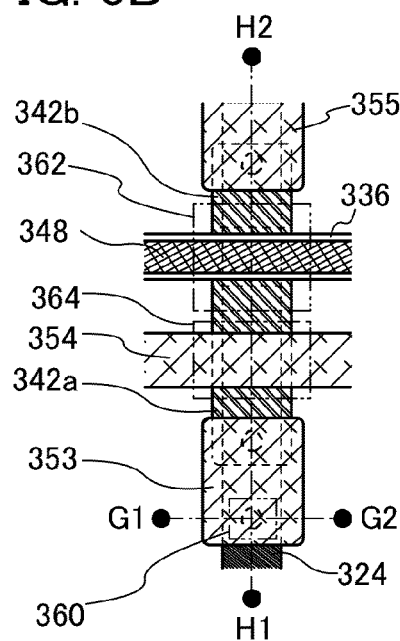
Figure 5C:
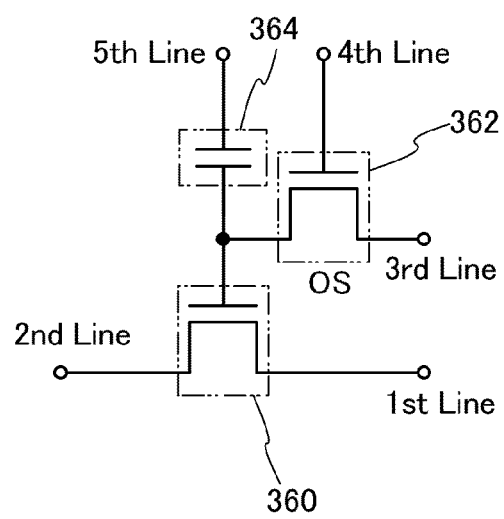

FIGS. 5A to 5C illustrate an example of a structure of a semiconductor device. FIG. 5A is a cross-sectional view of the semiconductor device, FIG. 5B is a top view of the semiconductor device, and FIG. 5C is a circuit diagram of the semiconductor device. Here, FIG. 5A corresponds to a cross section along line G1-G2 and line H1-H2 in FIG. 5B. Note that in FIG. 5B, some components of the semiconductor device illustrated in FIG. 5A are omitted for clarity.

The semiconductor device illustrated in FIGS. 5A and 5B includes a transistor 360 including a first semiconductor material in a lower portion, and a transistor 362 including a second semiconductor material in an upper portion. The transistor 362 is an example to which a structure of the transistor 540a described in Embodiment 1 is applied.

Here, the first semiconductor material and the second semiconductor material are preferably materials having different band gaps. For example, the first semiconductor material may be a semiconductor material (e.g., silicon) other than an oxide semiconductor and the second semiconductor material may be an oxide semiconductor. A transistor including a material other than an oxide semiconductor can operate at high speed easily. On the other hand, a transistor including an oxide semiconductor enables charge to be held for a long time owing to its characteristics.

Although all the transistors are n-channel transistors here, it is needless to say that p-channel transistors can be used. The specific constituent of the semiconductor device is not necessarily limited to those described here such as the material used for the semiconductor device and the structure of the semiconductor device (e.g., the use of the transistor described in Embodiment 1, which is formed using an oxide semiconductor, as the transistor 362 for holding data).

The transistor 360 in FIG. 5A includes a channel formation region 316 provided over a substrate 300 including a semiconductor material (e.g., silicon), impurity regions 320 with the channel formation region 316 provided therebetween, intermetallic compound regions 324 in contact with the impurity regions 320, a gate insulating layer 308 provided over the channel formation region 316, and a gate electrode 310 provided over the gate insulating layer 308. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

An element isolation insulating layer 306 is provided over the substrate 300 to surround the transistor 360. An insulating layer 328 and an insulating layer 330 are provided to cover the transistor 360. Note that, in the transistor 360, the sidewall insulating layer may be formed on side surfaces of the gate electrode 310 and the impurity regions 320 may include a region having a different impurity concentration. Note that the element isolation insulating layer 306 can be formed by an element isolation technique such as local oxidation of silicon (LOCOS) or shallow trench isolation (STI).

The transistor 360 formed using a single crystal semiconductor substrate can operate at high speed. Thus, when the transistor is used as a reading transistor, data can be read at a high speed. As treatment prior to formation of the transistor 362 and a capacitor 364, CMP treatment is performed on two insulating layers formed to cover the transistor 360, whereby the insulating layer 328 and the insulating layer 330 which are planarized are formed and, at the same time, an upper surface of the gate electrode 310 is exposed.

For the insulating layer 328 and the insulating layer 330, typically, an inorganic insulating material such as silicon oxide, silicon oxynitride, aluminum oxide, aluminum oxynitride, silicon nitride, aluminum nitride, silicon nitride oxide, or aluminum nitride oxide can be used. The insulating layer 328 and the insulating layer 330 can be formed by a plasma CVD method, a sputtering method, or the like.

Alternatively, an organic material such as polyimide, an acrylic resin, or a benzocyclobutene-based resin can be used. Other than such organic materials, it is also possible to use a low-dielectric constant material (a low-k material) or the like. In the case of using an organic material, a wet process such as a spin coating method or a printing method may be used to form the insulating layer 328 and the insulating layer 330.

Note that in this embodiment, silicon nitride is used as the insulating layer 328, and silicon oxide is used as the insulating layer 330.

Planarization treatment is preferably performed on a surface of the insulating layer 330 which is to be the formation region of an oxide semiconductor layer 344. In this embodiment, the oxide semiconductor layer 344 is formed over the insulating layer 330 which is sufficiently planarized by polishing treatment such as CMP treatment (the average surface roughness of the surface of the insulating layer 330 is preferably less than or equal to 0.15 nm).

The transistor 362 illustrated in FIG. 5A includes an oxide semiconductor in the channel formation region. Here, the oxide semiconductor layer 344 included in the transistor 362 is preferably formed using an i-type or substantially i-type oxide semiconductor. By using an i-type oxide semiconductor, the transistor 362 which has extremely favorable off-state characteristics can be obtained.

Since the off-state current of the transistor 362 is small, stored data can be held for a long time owing to such a transistor. In other words, power consumption can be sufficiently reduced because a semiconductor storage device in which refresh operation is unnecessary or the frequency of refresh operation is extremely low can be provided.

In a manufacturing process of the transistor 362, electrodes 342a and 342b which function as a source electrode and a drain electrode are formed in a step of removing a conductive layer provided over a gate electrode 348, an insulating layer 337, and a sidewall insulating layer 336 by chemical mechanical polishing treatment.

Thus, in the transistor 362, the distance between the gate electrode 348 and a region (contact region) where the electrode 342a or 342b which functions as a source electrode or a drain electrode is in contact with the oxide semiconductor layer 344 can be shortened. Thus, the resistance between the gate electrode 348 and the region (contact region) where the electrode 342a or 342b is in contact with the oxide semiconductor layer 344 can be reduced, which results in an improvement in the on-state characteristics of the transistor 362.

Further, precise processing can be performed accurately because etching treatment with use of a resist mask is not performed in a step of removing the conductive layer over the gate electrode 348 for forming the electrodes 342a and 342b. Consequently, in a process for manufacturing the semiconductor device, a transistor having a miniaturized structure with less variation in shape or characteristics can be manufactured with high yield.

An interlayer insulating layer 335 and an insulating layer 350 each of which has a single-layer structure or a stacked structure are provided over the transistor 362. In this embodiment, an aluminum oxide layer is used as the insulating layer 350. When the aluminum oxide layer has high density (layer density of 3.2 g/cm$^3$ or more, preferably 3.6 g/cm$^3$ or more), the transistor 362 can have stable electric characteristics.

In addition, a wiring 354 is provided in a region overlapping with the electrode 342a of the transistor 362 with the interlayer insulating layer 335 and the insulating layer 350 provided therebetween, and the electrode 342a, the interlayer insulating layer 335, the insulating layer 350, and the wiring 354 form the capacitor 364. That is, the electrode 342a of the transistor 362 functions as one electrode of the capacitor 364, and the wiring 354 functions as the other electrode of the capacitor 364. Note that the capacitor 364 may be omitted if a capacitor is not needed. Alternatively, the capacitor 364 may be separately provided above the transistor 362.

A wiring 353, the wiring 354, and a wiring 355 can be formed in the same step. The electrode 342a and the gate electrode 310 are electrically connected to each other through the wiring 353. The wiring 353 electrically connects the electrode 342a to the gate electrode 310 through openings formed in the insulating layer 350, the interlayer insulating layer 335, the insulating layer 334, the oxide semiconductor layer 344, the insulating layer 332, and the insulating layer 333. Further, the wiring 355 is electrically connected to the electrode 342b through another opening formed in the insulating layer 350, the interlayer insulating layer 335, the insulating layer 334, the oxide semiconductor layer 344, the insulating layer 332, and the insulating layer 333. An i-type or substantially i-type oxide semiconductor used for the oxide semiconductor layer 344 has high resistance and thus can be substantially regarded as an insulator. Therefore, even when a side surface of the oxide semiconductor layer 344 is in contact with the wiring 353 or the wiring 355 in the opening, there is no concern that leakage current flows to a wiring or an electrode through the oxide semiconductor layer 344.

Figure 6A:
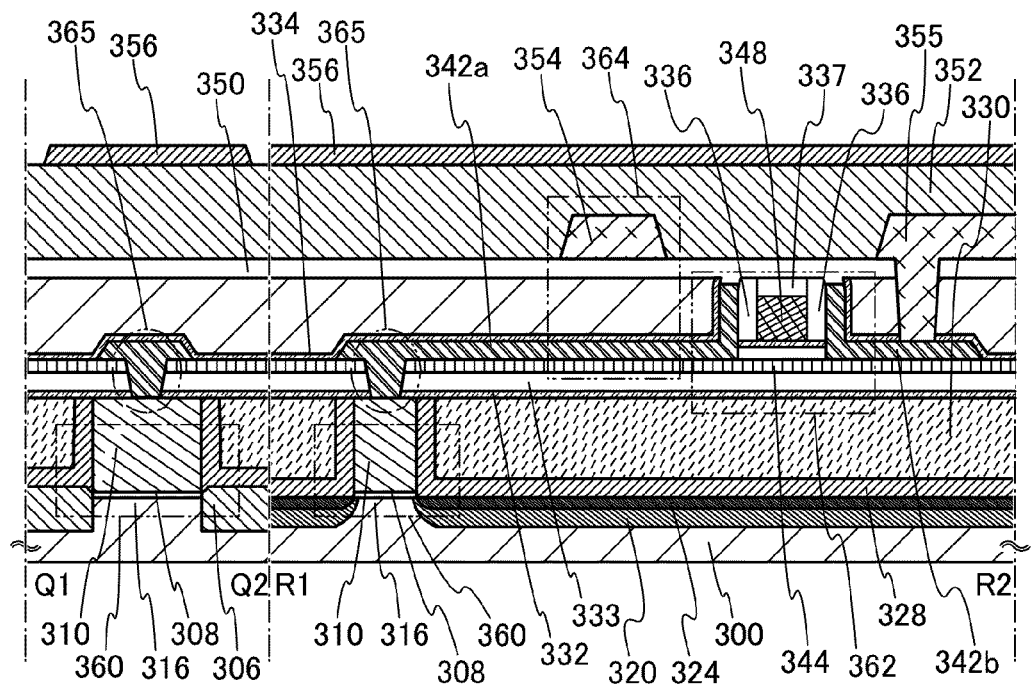
FIGS. 6A and 6B are a top view and a cross-sectional view illustrating a semiconductor device.
Figure 6B:
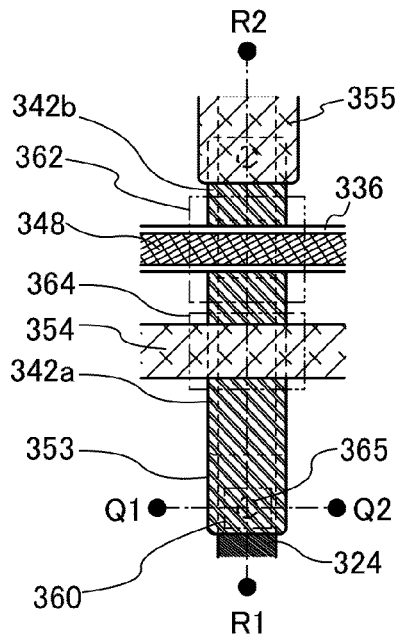

A structure may be employed in which an opening 365 is formed in the insulating layer 333 and the oxide semiconductor layer 344 before formation of the electrode 342a and the electrode 342b and the electrode 342a and the gate electrode 310 are directly connected to each other through the opening 365. FIG. 6A is a cross-sectional view of a semiconductor device having a structure in which the electrode 342a and the gate electrode 310 are directly connected to each other, and FIG. 6B is a top view of the semiconductor device. FIG. 6A corresponds to a cross section along line Q1-Q2 and line R1-R2 in FIG. 6B. Note that in FIG. 6B, some components of the semiconductor device illustrated in FIG. 6A are omitted.

An insulating layer 352 is provided over the transistor 362 and the capacitor 364. Further, a wiring 356 may be provided over the insulating layer 352 as necessary. Although not illustrated in FIG. 5A, the wiring 356 may be electrically connected to the wiring 353 through an opening formed in the insulating layer 352.

Alternatively, the wiring 356 may be electrically connected to the electrode 342a or the electrode 342b. Electrical connection between the wiring 356 and the electrode 342a or the electrode 342b may be established by direct contact of the wiring 356 and the electrode 342a or the electrode 342b or through an electrode provided in an insulating layer which is between the wiring 356 and the electrode 342a or the electrode 342b. Alternatively, the electrical connection may be established through a plurality of electrodes.

In FIGS. 5A and 5B, the transistor 360 is provided so as to overlap with at least part of the transistor 362. The source region or the drain region of the transistor 360 is preferably provided so as to overlap with part of the oxide semiconductor layer 344. Further, the transistor 362 and the capacitor 364 are provided so as to overlap with at least part of the transistor 360. For example, the wiring 354 of the capacitor 364 is provided so as to overlap with at least part of the gate electrode 310 of the transistor 360. With such a planar layout, the area occupied by the semiconductor device can be reduced; thus, higher integration can be achieved.

Next, an example of a circuit configuration corresponding to FIGS. 5A and 5B is illustrated in FIG. 5C.

In FIG. 5C, a first wiring (1st Line) is electrically connected to a source electrode of the transistor 360. A second wiring (2nd Line) is electrically connected to a drain electrode of the transistor 360. A third wiring (a 3rd Line) and one of a source electrode and a drain electrode of the transistor 362 are electrically connected to each other, and a fourth wiring (a 4th Line) and a gate electrode of the transistor 362 are electrically connected to each other. A gate electrode of the transistor 360 and the other of the source electrode and the drain electrode of the transistor 362 are electrically connected to one electrode of the capacitor 364. A fifth line (5th Line) and the other electrode of the capacitor 364 are electrically connected to each other.

The semiconductor device in FIG. 5C utilizes a characteristic in which the potential of the gate electrode of the transistor 360 can be held, and thus enables data writing, holding, and reading as follows.

Writing and holding of data will be described. First, the potential of the fourth wiring is set to a potential at which the transistor 362 is turned on, so that the transistor 362 is turned on. Accordingly, the potential of the third wiring is supplied to the gate electrode of the transistor 360 and the capacitor 364. That is, predetermined charge is given to the gate electrode of the transistor 360 (writing). Here, charge for supply of a potential level or charge for supply of a different potential level (hereinafter referred to as Low level charge and High level charge) is given. After that, the potential of the fourth wiring is set to a potential at which the transistor 362 is turned off, so that the transistor 362 is turned off. Thus, the charge given to the gate electrode of the transistor 360 is held (storing).

Since the amount of off-state current of the transistor 362 is extremely small, the charge of the gate electrode of the transistor 360 is held for a long time.

Next, reading data will be described. By supplying an appropriate potential (reading potential) to the fifth wiring while a predetermined potential (constant potential) is supplied to the first wiring, the potential of the second wiring fluctuates depending on the amount of charge held in the gate electrode of the transistor 360. This is because in general, when the transistor 360 is an n-channel transistor, an apparent threshold voltage $V_{th\_H}$ in the case where a high-level charge is given to the gate electrode of the transistor 360 is lower than an apparent threshold voltage $V_{th\_L}$ in the case where a low-level charge is given to the gate electrode of the transistor 360. Here, an apparent threshold voltage refers to the potential of the fifth wiring, which is needed to turn on the transistor 360. Thus, the potential of the fifth wiring is set to a potential $V_0$ which is between $V_{th\_H}$ and $V_{th\_L}$, whereby charge given to the gate electrode of the transistor 360 can be determined. For example, in the case where a high-level charge is given in writing, when the potential of the fifth wiring is set to $V_0$ ($>V_{th\_H}$), the transistor 360 is turned on. In the case where a low level charge is given in writing, even when the potential of the fifth wiring is set to $V_0$ ($<V_{th\_L}$), the transistor 360 remains in an off state. Therefore, the stored data can be read by the potential of the second wiring.

Note that in the case where memory cells are arrayed to be used, only data of desired memory cells needs to be read. In the case where such reading is not performed, a potential at which the transistor 360 is turned off, that is, a potential smaller than $V_{th\_H}$ may be given to the fifth wiring regardless of the state of the gate electrode of the transistor 360. Alternatively, a potential which allows the transistor 360 to be turned on regardless of a state of the gate electrode, that is, a potential higher than $V_{th\_L}$ may be applied to the fifth wiring.

When a transistor having a channel formation region formed using an oxide semiconductor and having extremely small off-state current is employed in the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

As described above, a miniaturized and highly-integrated semiconductor device having high electric characteristics and a method for manufacturing the semiconductor device can be provided. Further, a semiconductor device can be provided at low cost and high yield because the semiconductor device can be manufactured by a smaller number of photolithography processes than the conventional one.

This embodiment can be implemented in appropriate combination with the structures described in the other embodiments.

Embodiment 3

In this embodiment, a semiconductor device which includes the transistor described in the above embodiment and has a structure different from the structure described in Embodiment 2 will be described with reference to FIGS. 7A and 7B, FIGS. 8A and 8B, and FIG. 9.

Figure 7A:
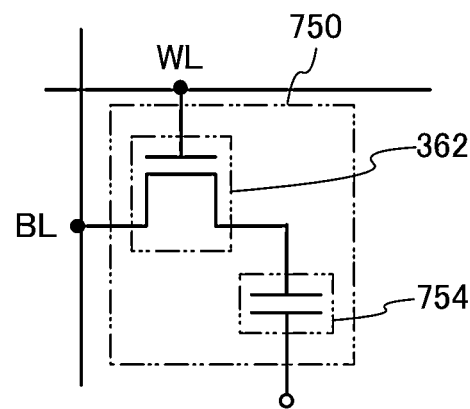
FIGS. 7A and 7B are a circuit diagram and a perspective view illustrating a semiconductor device.
Figure 7B:
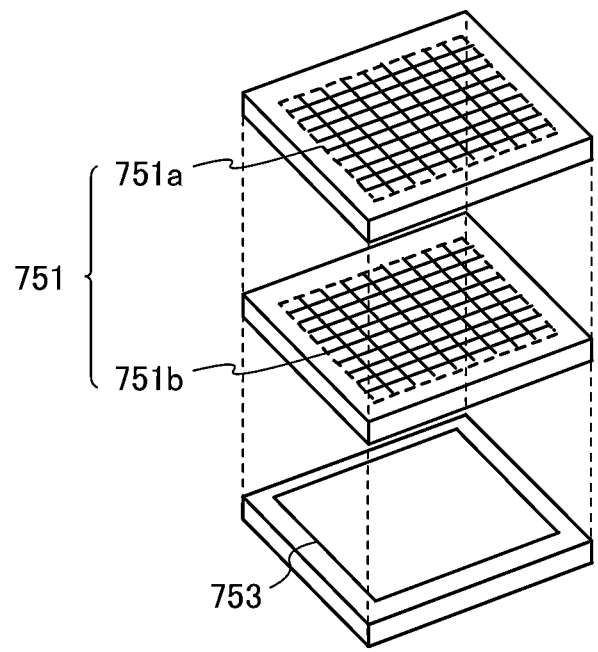

FIG. 7A illustrates an example of a circuit configuration of a semiconductor device, and FIG. 7B is a conceptual diagram illustrating an example of a semiconductor device. First, the semiconductor device illustrated in FIG. 7A will be described, and then, the semiconductor device illustrated in FIG. 7B will be described.

In the semiconductor device illustrated in FIG. 7A, a bit line BL is electrically connected to one of a source electrode and a drain electrode of the transistor 362, a word line WL is electrically connected to the gate electrode of the transistor 362, and the other of the source electrode and the drain electrode of the transistor 362 is electrically connected to a first terminal of a capacitor 754.

Next, writing and holding of data in the semiconductor device (a memory cell 750) illustrated in FIG. 7A will be described.

First, the potential of the word line WL is set to a potential at which the transistor 362 is turned on, and the transistor 362 is turned on. Accordingly, the potential of the bit line BL is supplied to the first terminal of the capacitor 754 (writing). After that, the potential of the word line WL is set to a potential at which the transistor 362 is turned off, so that the transistor 362 is turned off. Thus, the potential at the first terminal of the capacitor 754 is held (holding).

In addition, the amount of off-state current is extremely small in the transistor 362 which uses an oxide semiconductor. For that reason, the potential of the first terminal of the capacitor 754 (or a charge accumulated in the capacitor 754) can be held for an extremely long period by turning off the transistor 362.

Next, reading of data will be described. When the transistor 362 is turned on, the bit line BL which is in a floating state and the first terminal of the capacitor 754 are electrically connected to each other, and the charge is redistributed between the bit line BL and the capacitor 754. As a result, the potential of the bit line BL is changed. The amount of change in potential of the bit line BL varies depending on the potential of the first terminal of the capacitor 754 (or the charge accumulated in the capacitor 754).

For example, the potential of the bit line BL after charge redistribution is $(C_B \times V_{B0} + C \times V)/(C_B + C)$, where V is the potential of the first terminal of the capacitor 754, C is the capacitance of the capacitor 754, $C_B$ is the capacitance of the bit line BL (hereinafter also referred to as bit line capacitance), and $V_{B0}$ is the potential of the bit line BL before the charge redistribution. Therefore, it can be found that assuming that the memory cell 750 is in either of two states in which the potentials of the first terminal of the capacitor 754 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 7A can hold charge that is accumulated in the capacitor 754 for a long time because the off-state current of the transistor 362 is extremely small. In other words, power consumption can be adequately reduced because refresh operation becomes unnecessary or the frequency of refresh operation can be extremely low. Moreover, stored data can be held for a long time even when power is not supplied.

Next, the semiconductor device illustrated in FIG. 7B will be described.

The semiconductor device illustrated in FIG. 7B includes a memory cell array 751 (memory cell arrays 751a and 751b) including a plurality of memory cells 750 illustrated in FIG. 7A as memory circuits in the upper portion, and a peripheral circuit 753 in the lower portion, which is necessary for operating the memory cell array 751 (the memory cell arrays 751a and 751b). Note that the peripheral circuit 753 is electrically connected to the memory cell array 751.

In the structure illustrated in FIG. 7B, the peripheral circuit 753 can be provided under the memory cell array 751. Thus, the size of the semiconductor device can be decreased.

It is preferable that a semiconductor material of the transistor provided in the peripheral circuit 753 be different from that of the transistor 362. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably realized by the transistor.

Note that FIG. 7B illustrates, as an example, the semiconductor device in which two memory cell arrays 751 (the memory cell array 751a and the memory cell array 751b) are stacked; however, the number of stacked memory cell arrays is not limited thereto. Three or more memory cell arrays may be stacked.

Next, a specific structure of the memory cell 750 illustrated in FIG. 7A will be described with reference to FIGS. 8A and 8B.

Figure 8A:
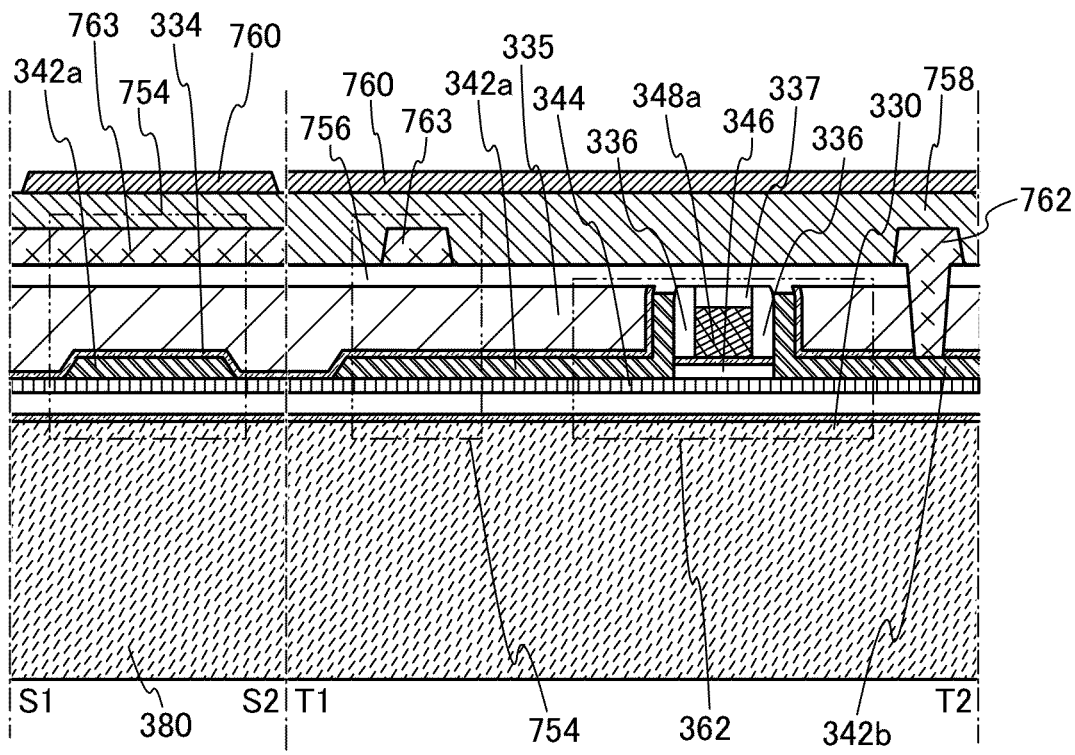
FIGS. 8A and 8B are a top view and a cross-sectional view illustrating a semiconductor device.
Figure 8B:
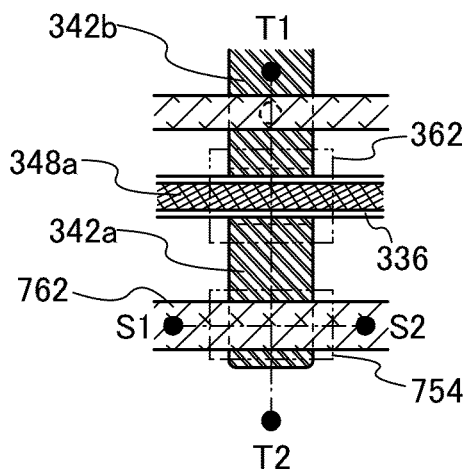

FIGS. 8A and 8B illustrate an example of a structure of the memory cell 750. FIG. 8A is a cross-sectional view of the memory cell 750, and FIG. 8B is a top view of the memory cell 750. Here, FIG. 8A corresponds to a cross section taken along lines S1-S2 and T1-T2 of FIG. 8B. Note that in FIG. 8B, some components are omitted for easy understanding.

The transistor 362 in FIGS. 8A and 8B can have the same structure as the transistor in the above embodiment.

An insulating layer 756 having a single-layer structure or a stacked structure is provided over the transistor 362 over an insulating layer 380. In addition, a wiring 763 is provided in a region overlapping with the electrode 342a of the transistor 362 with the insulating layer 756 provided therebetween, so that the electrode 342a, the interlayer insulating layer 335, the insulating layer 756, and the wiring 763 form the capacitor 754. That is, the electrode 342a of the transistor 362 functions as one electrode of the capacitor 754, and the wiring 763 functions as the other electrode of the capacitor 754.

An insulating layer 758 is provided over the transistor 362 and the capacitor 754. Further, a wiring 760 for connecting the memory cell 750 to an adjacent memory cell 750 is provided over the insulating layer 758. Although not illustrated, the wiring 760 may be electrically connected to the wiring 762 through an opening provided in the insulating layer 758.

The wiring 760 may be electrically connected to the electrode 342a or the electrode 342b of the transistor 362 through an opening provided in the insulating layer 758, the insulating layer 756, the interlayer insulating layer 335, and the insulating layer 334. The wiring 760 may be electrically connected to the electrode 342a or the electrode 342b through another conductive layer provided in the opening. Note that the wiring 760 in this embodiment corresponds to the bit line BL in the circuit diagram of FIG. 7A.

In FIGS. 8A and 8B, the electrode layer 342b of the transistor 362 can also function as a source electrode of a transistor included in an adjacent memory cell.

When the planar layout in FIG. 8A is employed, the area occupied by the semiconductor device can be reduced; thus, the degree of integration can be increased.

Figure 9:
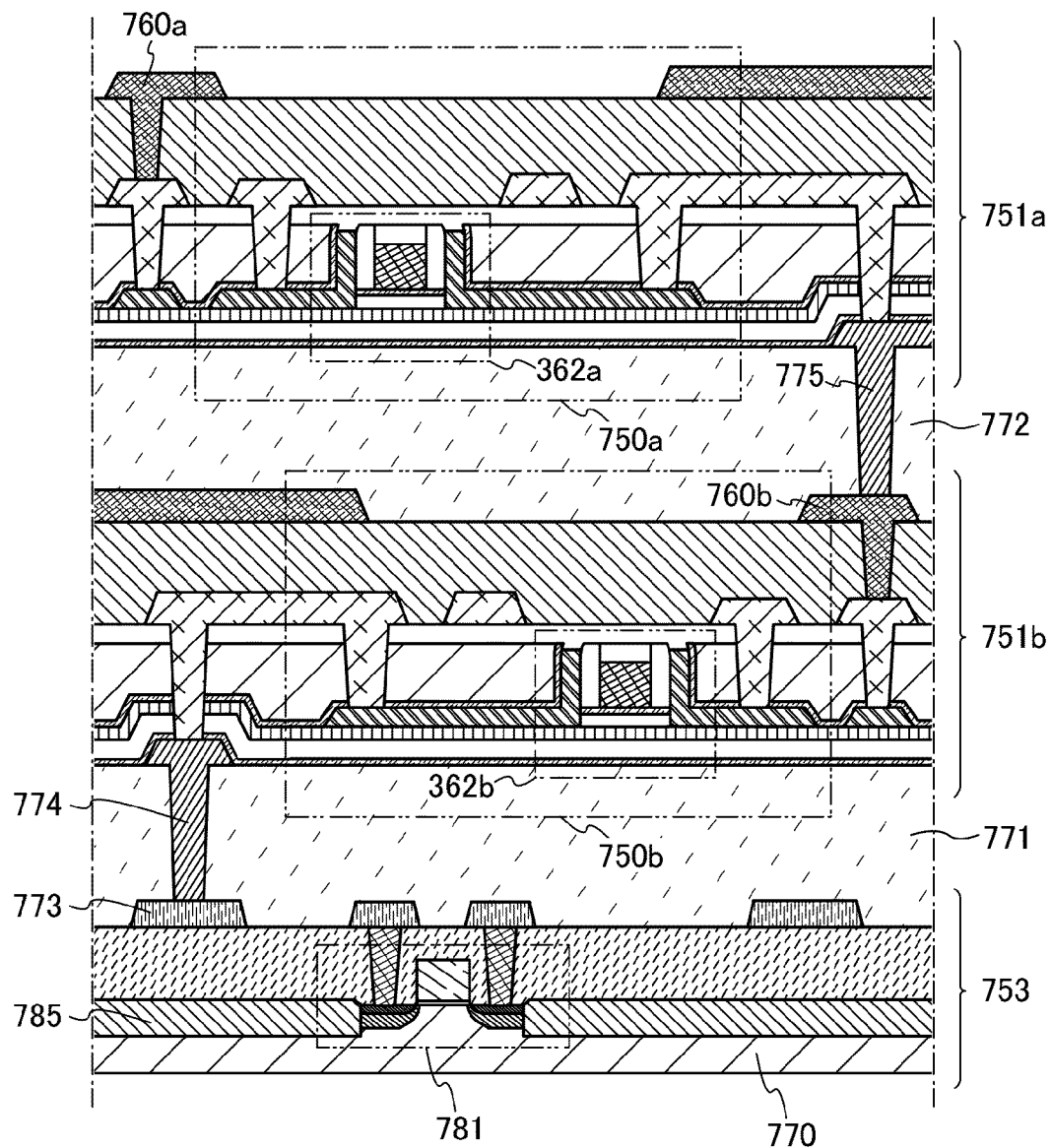
FIG. 9 is a cross-sectional view illustrating a semiconductor device.

FIG. 9 is a cross-sectional view illustrating an example of a stacked structure of the semiconductor device illustrated in FIG. 7B. In FIG. 9, part of a stacked structure of the peripheral circuit 753, the memory cell array 751a, and the memory cell array 751b is illustrated. In FIG. 9, one of a plurality of memory cells 750 of the memory cell array 751a is shown as a memory cell 750a. One of a plurality of memory cells 750 of the memory cell array 751b is shown as a memory cell 750b. The transistor 362 of the memory cell 750a is shown as a transistor 362a, and the transistor 362 of the memory cell 750b is shown as a transistor 362b.

A transistor 781 included in the peripheral circuit 753 is provided in a substrate 770 formed using a material other than an oxide semiconductor (e.g., silicon). The transistor 781 can be a transistor obtained by forming a region to be a channel formation region in a region surrounded by an element isolation insulating layer 785. Note that the transistor 781 may be a transistor whose channel formation region is formed in a semiconductor layer, such as a silicon layer, formed on an insulating surface or in a silicon layer of an SOI substrate. A known structure can be used as the structure of the transistor 781 and thus the description is omitted.

The memory cell array 751b is formed over the peripheral circuit 753 with an insulating layer 771 provided therebetween, and the memory cell array 751a is formed over the memory cell array 751b with an insulating layer 772 provided therebetween. The memory cell array 751a can be electrically connected to another circuit through a wiring 760a.

The insulating layer 771 and the insulating layer 772 each function as an interlayer insulating layer whose surface can be planarized.

The peripheral circuit 753, the memory cell array 751a, and the memory cell array 751b are electrically connected to one another through a wiring 773, a wiring 774, a wiring 775, and a wiring 760b.

The transistor 362a and the transistor 362b are each formed using an oxide semiconductor. Since the amount of off-state current of the transistor including an oxide semiconductor is small, stored data can be held for a long time owing to such a transistor. In other words, the frequency of refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose amount of off-state current is sufficiently small). In addition, with a structure where the peripheral circuit and the memory circuit are stacked, the degree of integration of the semiconductor device can be increased.

As described above, a miniaturized and highly-integrated semiconductor device having high electric characteristics and a method for manufacturing the semiconductor device can be provided. Further, a semiconductor device can be provided at low cost and high yield because the semiconductor device can be manufactured by a smaller number of photolithography processes than the conventional one.

This embodiment can be implemented in appropriate combination with the structures described in the other embodiments.

Embodiment 4

In this embodiment, one embodiment of a semiconductor device and a method of manufacturing the semiconductor device will be described with reference to FIGS. 10A to 10C, FIGS. 11A to 11H, and FIGS. 12A to 12C.

Figure 10A:
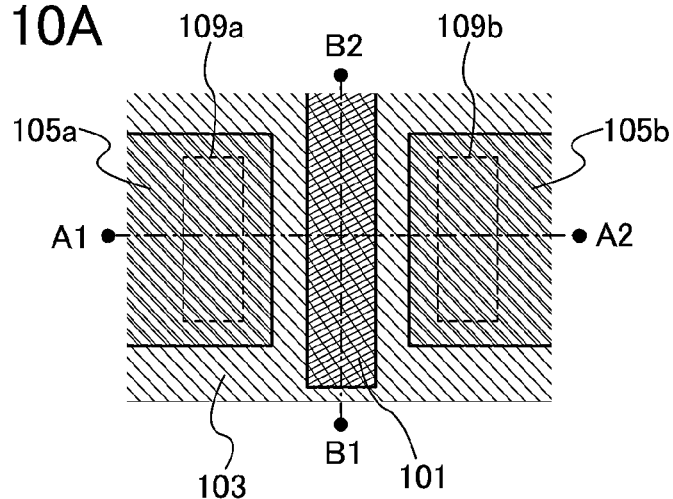
FIGS. 10A to 10C are a top view and cross-sectional views illustrating a semiconductor device.
Figure 10B:
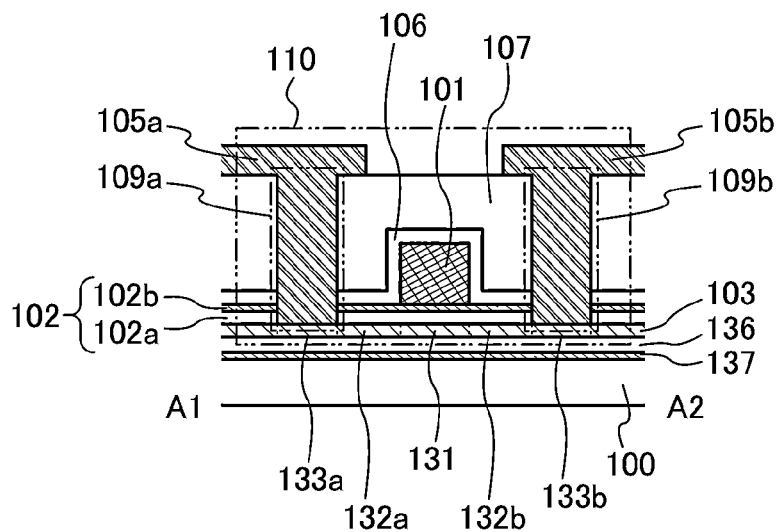
Figure 10C:
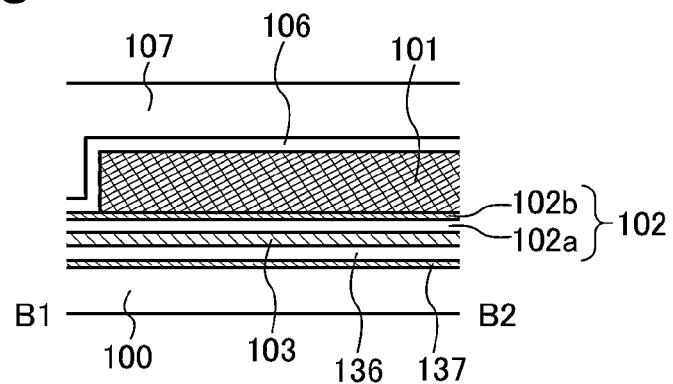

FIGS. 10A to 10C are a top view and cross-sectional views of a transistor 110 as one example of a semiconductor device. FIG. 10A is a top view of the transistor 110, FIG. 10B is a cross-sectional view along line A1-A2 in FIG. 10A, and FIG. 10C is a cross-sectional view along line B1-B2 in FIG. 10A. Note that in FIG. 10A, some components of the transistor 110 (e.g., a second insulating layer 107) are omitted for easy understanding.

The transistor 110 illustrated in FIGS. 10A to 10C includes, over a substrate 100 having an insulating surface, a first base insulating layer 137, a second base insulating layer 136 over the first base insulating layer 137, an oxide semiconductor layer 103 over the second base insulating layer 136, a gate insulating layer 102 including a first gate insulating layer 102a and a second gate insulating layer 102b over the oxide semiconductor layer 103, a gate electrode 101 over the oxide semiconductor layer 103 with the gate insulating layer 102 provided therebetween, a first insulating layer 106 over the gate electrode 101, the second insulating layer 107 over the first insulating layer 106, and a source electrode 105a and a drain electrode 105b electrically connected to the oxide semiconductor layer 103 through openings in the gate insulating layer 102, the first insulating layer 106, and the second insulating layer 107. The source electrode 105a and the drain electrode 105b are a pair of electrodes between which the gate electrode 101 is provided. Note that a source wiring and a drain wiring may be formed on and in contact with the source electrode 105a and the drain electrode 105b, respectively. It is also possible to employ a structure in which the first insulating layer 106 is provided but the second insulating layer 107 is not provided, details of which will be described later. In the case where the second insulating layer 107 is not provided, the source electrode 105a and the drain electrode 105b are formed over the first insulating layer 106.

The oxide semiconductor layer 103 includes a channel formation region 131 overlapping with the gate electrode 101 with the gate insulating layer 102 provided therebetween, a source region 133a in contact with the source electrode 105a, a drain region 133b in contact with the drain electrode 105b, an offset region 132a provided between the source region 133a and the channel formation region 131, and an offset region 132b provided between the drain region 133b and the channel formation region 131. In other words, the channel formation region 131, the source region 133a, the drain region 133b, the offset region 132a, and the offset region 132b are formed in a self-aligned manner. By providing the offset region 132a, parasitic capacitance generated between the channel formation region 131 and the source electrode 105a can be reduced. Further, by providing the offset region 132b, parasitic capacitance generated between the channel formation region 131 and the drain electrode 105b can be reduced. Note that the length of the channel formation region 131, which is the distance within which carriers flow (also referred to as channel length), is preferably less than 60 nm.

Since the channel formation region 131 is formed in a self-aligned manner, miniaturization of the transistor can be easily achieved, the transistor has excellent on-state characteristics (for example, on-state current and field-effect mobility) and can operate at high speed.

Note that the transistor 110 may have a single-gate structure in which one channel formation region is formed, a double-gate structure in which two channel formation regions are formed, or a triple-gate structure in which three channel formation regions are formed. Alternatively, the transistor 110 may have a dual-gate structure including two gate electrodes positioned over and below a channel region with a gate insulating layer provided therebetween.

As described above, in the case where a side surface of the oxide semiconductor layer 103 is formed, the side surface of the oxide semiconductor layer 103 is positioned so as not to correspond to a side surface of the channel formation region 131 and to keep a sufficiently far distance.

As the substrate 100 having an insulating surface, any substrate can be used as long as it has heat resistance high enough to withstand heat treatment performed later. For example, a substrate such as a glass substrate, a ceramic substrate, a quartz substrate, or a sapphire substrate can be used. A flexible substrate may alternatively be used as the substrate 100 having an insulating surface. The first base insulating layer 137 is formed over the substrate 100 in order to prevent an element contained in the substrate 100 from entering the oxide semiconductor layer 103 to be formed later.

The first base insulating layer 137 can have a single-layer structure or a stacked-layer structure including one or more films selected from those containing silicon oxide, silicon nitride, silicon oxynitride, silicon nitride oxide, aluminum oxide, aluminum nitride, aluminum oxynitride, aluminum nitride oxide, hafnium oxide, gallium oxide, and a mixed material of any of these materials.

The first base insulating layer 137 has a function of preventing entry of an element (particularly hydrogen or water) contained in the substrate 100 to the oxide semiconductor layer 103, which is formed later, and also functions as a blocking layer for suppressing release of oxygen from the oxide semiconductor layer 103.

The second base insulating layer 136 may be formed using the same material as the first base insulating layer 137. The second base insulating layer 136 includes a region containing oxygen in excess of the stoichiometric composition (hereinafter also referred to as an oxygen-excess region). The second base insulating layer 136 preferably contains oxygen in excess of the stoichiometric composition because oxygen vacancies in the oxide semiconductor layer 103 to be formed later can be filled with the excess oxygen contained in the second base insulating layer 136. In the case of having a stacked-layer structure, the second base insulating layer 136 preferably includes an oxygen-excess region at least in a layer in contact with the oxide semiconductor layer 103. In order to provide the oxygen-excess region in the second base insulating layer 136, for example, the second base insulating layer 136 may be formed in an oxygen atmosphere. Alternatively, the oxygen-excess region may be formed by implanting oxygen (including at least one of oxygen radicals, oxygen atoms, and oxygen ions) into the second base insulating layer 136 after its formation. Oxygen can be implanted by an ion implantation method, an ion doping method, a plasma immersion ion implantation method, plasma treatment, or the like.

The oxide semiconductor layer 103 may have either a single-layer structure or a stacked-layer structure. Further, the oxide semiconductor layer 103 may either have an amorphous structure or be a crystalline oxide semiconductor. In the case where the oxide semiconductor layer 103 has an amorphous structure, heat treatment may be performed on the oxide semiconductor layer in a later manufacturing step so that the oxide semiconductor layer has crystallinity. The heat treatment for crystallizing the amorphous oxide semiconductor layer is performed at a temperature higher than or equal to 250° C. and lower than or equal to 700° C., preferably higher than or equal to 400° C., further preferably higher than or equal to 500° C., still further preferably higher than or equal to 550° C. Note that the heat treatment can also serve as another heat treatment in the manufacturing process.

The oxide semiconductor layer 103 can be formed by a sputtering method, a molecular beam epitaxy (MBE) method, a CVD method, a pulse laser deposition method, an atomic layer deposition (ALD) method, or the like as appropriate. The oxide semiconductor layer 103 may be formed with a sputtering apparatus which performs deposition in the state where top surfaces of a plurality of substrates are substantially perpendicular to a top surface of a sputtering target.

In the formation of the oxide semiconductor layer 103, the concentration of hydrogen contained in the oxide semiconductor layer 103 is preferably reduced as much as possible. In order to reduce the hydrogen concentration, for example, in the case where the oxide semiconductor layer 103 is formed by a sputtering method, oxygen, a high-purity rare gas (typically, argon) from which impurities such as hydrogen, water, a hydroxyl group, and hydride have been removed, or a mixed gas of oxygen and the rare gas is used as appropriate as an atmosphere gas supplied to a deposition chamber of a sputtering apparatus.

The oxide semiconductor layer is formed in such a manner that a sputtering gas from which hydrogen and moisture are removed is introduced into a deposition chamber while moisture remaining in the deposition chamber is removed, whereby the concentration of hydrogen in the oxide semiconductor layer can be reduced. In order to remove moisture remaining in the deposition chamber, an entrapment vacuum pump such as a cryopump, an ion pump, or a titanium sublimation pump is preferably used. As an evacuation unit, a turbo molecular pump to which a cold trap is added may be used. In the deposition chamber which is evacuated with a cryopump, a hydrogen atom, a compound containing a hydrogen atom such as water ($H_2O$) (more preferably, also a compound containing a carbon atom), and the like are removed, whereby the impurity concentration in the oxide semiconductor layer 103 formed in the deposition chamber can be reduced.

Further, in the case where the oxide semiconductor layer 103 is formed by a sputtering method, the relative density (the fill rate) of a metal oxide target which is used for forming the oxide semiconductor layer 103 is greater than or equal to 90% and less than or equal to 100%, preferably greater than or equal to 95% and less than or equal to 99.9%. With the use of a metal oxide target with a high relative density, a dense oxide semiconductor layer can be formed.

In order to reduce the impurity concentration in the oxide semiconductor layer 103, it is also effective to form the oxide semiconductor layer 103 while the substrate 100 is kept at high temperature. The temperature at which the substrate 100 is heated may be higher than or equal to 150° C. and lower than or equal to 450° C.; the substrate temperature is preferably higher than or equal to 200° C. and lower than or equal to 350° C. A crystalline oxide semiconductor layer can be formed by heating the substrate at a high temperature in the formation.

Any of the oxide semiconductors disclosed in the above embodiment can be used as an oxide semiconductor for the oxide semiconductor layer 103.

The oxide semiconductor layer 103 is preferably formed under a condition such that much oxygen is contained (for example, by a sputtering method in an atmosphere where the proportion of oxygen is 100%) so as to be a film containing much oxygen (preferably including a region containing oxygen in excess of the stoichiometric composition of the oxide semiconductor in a crystalline state).

It is preferable to use a high-purity gas from which impurities such as hydrogen, water, a hydroxyl group, or a hydride are removed as a sputtering gas used when the oxide semiconductor layer 103 is formed.

Before the formation of the oxide semiconductor layer 103, planarization treatment may be performed on the surface on which the oxide semiconductor layer 103 is to be formed. As the planarization treatment, polishing treatment (e.g., a chemical mechanical polishing method), dry etching treatment, or plasma treatment can be used, though there is no particular limitation on the planarization treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to a surface where the oxide semiconductor layer 103 is to be formed.

As the planarization treatment, polishing treatment, dry etching treatment, or plasma treatment may be performed plural times, or these treatments may be performed in combination. In the case where the treatments are combined, the order of steps may be set as appropriate, without particular limitation, depending on the unevenness of the surface on which the oxide semiconductor layer 103 is to be formed.

Further, the oxide semiconductor layer 103 is preferably subjected to heat treatment for removing excess hydrogen (including water and a hydroxyl group) in the oxide semiconductor layer 103 (dehydration or dehydrogenation). The temperature of the heat treatment is higher than or equal to 300° C. and lower than or equal to 700° C., or lower than the strain point of a substrate. The heat treatment can be performed under reduced pressure, a nitrogen atmosphere, or the like.

Hydrogen, which is an n-type impurity, can be removed from the oxide semiconductor by the heat treatment. For example, the hydrogen concentration in the oxide semiconductor layer 103 after the dehydration or dehydrogenation treatment can be lower than or equal to $5\times10^{19}/cm^3$, preferably lower than or equal to $5\times10^{18}/cm^3$.

Note that the heat treatment for dehydration or dehydrogenation may be performed at any timing in the process of manufacturing the transistor 110 as long as the heat treatment is performed after the formation of the oxide semiconductor layer 103. In the case where an aluminum oxide layer is used as the gate insulating layer 102 or the first insulating layer 106, the heat treatment is preferably performed before the aluminum oxide layer is formed. The heat treatment for dehydration or dehydrogenation may be performed plural times and may also serve as another heat treatment.

In the heat treatment, it is preferable that water, hydrogen, or the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor layer 103 is heated in the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, further preferably less than or equal to 10 ppb, in the measurement with use of a dew point meter of a cavity ring down laser spectroscopy (CRDS) system) may be introduced into the same furnace while the heating temperature is maintained or slow cooling is performed to lower the temperature from the heating temperature. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main component of the oxide semiconductor and that has been reduced by removing an impurity for the dehydration or dehydrogenation, so that the oxide semiconductor layer 103 can have high purity and be an i-type (intrinsic) semiconductor.

Further or alternatively, oxygen (which includes at least one of oxygen radicals, oxygen atoms, and oxygen ions) may be introduced into the oxide semiconductor layer 103 that has been subjected to the dehydration or dehydrogenation treatment in order to supply oxygen to the oxide semiconductor layer 103.

Introduction (supply) of oxygen to the dehydrated or dehydrogenated oxide semiconductor layer 103 enables the oxide semiconductor layer 103 to be highly purified and to be i-type (intrinsic). Variation in electric characteristics of a transistor including the highly purified and i-type (intrinsic) oxide semiconductor layer 103 is suppressed, and the transistor is electrically stable.

In the step of introducing oxygen into the oxide semiconductor layer 103, oxygen may be directly introduced into the oxide semiconductor layer 103 or may be introduced into the oxide semiconductor layer 103 through another film such as the gate insulating layer 102 or the first insulating layer 106 to be formed later. An ion implantation method, an ion doping method, a plasma immersion ion implantation method, or the like may be employed for the introduction of oxygen through another film, whereas plasma treatment or the like can be employed in addition to the above methods for the direct introduction of oxygen to the exposed oxide semiconductor layer 103.

Oxygen can be introduced into the oxide semiconductor layer 103 anytime after dehydration or dehydrogenation treatment is performed thereon. Further, oxygen may be introduced plural times into the dehydrated or dehydrogenated oxide semiconductor layer 103.

As described above, an i-type oxide semiconductor is obtained by removal of an impurity such as water or hydrogen and supply of oxygen that is a component of an oxide semiconductor. In this respect, it can be said that one embodiment of the disclosed invention includes a novel technical idea because it is different from an i-type semiconductor such as silicon added with an impurity element.

The oxide semiconductor layer 103 is formed over the second base insulating layer 136 in the manner described above (see FIGS. 11A and 11B and FIG. 12A).

Note that a single layer of a single crystal oxide semiconductor, a polycrystalline oxide semiconductor, an amorphous oxide semiconductor, or a CAAC-OS, or a stack of at least two layers of these materials may be used as the oxide semiconductor layer 103.

Next, the gate insulating layer 102 covering the oxide semiconductor layer 103 is formed without the oxide semiconductor layer 103 being processed into a predetermined shape. The oxide semiconductor layer 103 is left as formed over the substrate 100 with the first base insulating layer 137 and the second base insulating layer 136 provided therebetween, without being processed into a predetermined shape; thus, the oxide semiconductor layer 103 does not have a side surface of the semiconductor layer where a parasitic channel, which might be a transmission path of leakage current, is easily generated. Without a side surface of the semiconductor layer where a parasitic channel, which might be a transmission path of leakage current, is easily generated, a side surface of the oxide semiconductor layer 103 and a region in the vicinity of the side surface is prevented from becoming a low-resistance region. This can suppress formation of a parasitic channel in a transistor including the oxide semiconductor layer 103. Further, the suppression of formation of a parasitic channel can suppress change in the electric characteristics of the transistor.

Moreover, an i-type (intrinsic) or substantially i-type oxide semiconductor layer, which has high resistance and a high insulating property as described above, is used as the oxide semiconductor layer 103. Therefore, even when the oxide semiconductor layer 103 is not processed into an island-shaped oxide semiconductor layer, channel formation regions of a plurality of transistors can be electrically isolated from each other.

Since the oxide semiconductor layer 103 is not processed into a predetermined shape, there is no need to form a mask for such processing. Therefore, the number of masks can be reduced in the manufacturing process of the transistor of this embodiment.

The gate insulating layer 102 (the first gate insulating layer 102a and the second gate insulating layer 102b) has a thickness greater than or equal to 1 nm and less than or equal to 20 nm and can be formed by a sputtering method, a MBE method, a CVD method, a pulse laser deposition method, an ALD method, or the like as appropriate. The gate insulating layer 102 may be formed with a sputtering apparatus which performs deposition in the state where top surfaces of a plurality of substrates are substantially perpendicular to a top surface of a sputtering target.

The gate insulating layer 102 can be formed using silicon oxide, gallium oxide, aluminum oxide, silicon nitride, silicon oxynitride, aluminum oxynitride, silicon nitride oxide, or the like. The first gate insulating layer 102a, which is in contact with the oxide semiconductor layer 103, of the gate insulating layer 102 preferably contains oxygen. In particular, the first gate insulating layer 102a preferably includes an oxygen-excess region in a region in contact with the oxide semiconductor layer 103, as in the case of the second base insulating layer 136. In particular, it is preferable that the oxygen content of the first gate insulating layer 102a in (a bulk of) the film be in excess of that in the stoichiometric composition. For example, in the case where silicon oxide is used for the first gate insulating layer 102a, the composition formula thereof is preferably SiO$_{2+\alpha}$ ($\alpha>0$). In this embodiment, silicon oxide of SiO$_{2+\alpha}$ ($\alpha>0$) is used for the first gate insulating layer 102a. By using the silicon oxide for the first gate insulating layer 102a, oxygen can be supplied to the oxide semiconductor layer 103, leading to good characteristics. Further, the first gate insulating layer 102a is preferably formed in consideration of the size of a transistor to be formed and the step coverage with the first gate insulating layer 102a.

The second gate insulating layer 102b, which is in contact with the gate electrode 101, of the gate insulating layer 102 has a function of preventing entry of an element contained in the gate electrode 101 to the oxide semiconductor layer 103, and also functions as a blocking layer for suppressing release of oxygen from the oxide semiconductor layer 103.

The gate insulating layer 102 can be formed using a high-k material such as hafnium oxide, yttrium oxide, hafnium silicate (HfSi$_x$O$_y$ (x>0, y>0)), hafnium silicate to which nitrogen is added (HfSiO$_x$N$_y$ (x>0, y>0)), hafnium aluminate (HfAl$_x$O$_y$ (x>0, y>0)), or lanthanum oxide, whereby gate leakage current can be reduced. Furthermore, each of the first gate insulating layer 102a and the second gate insulating layer 102b may have either a single-layer structure or a stacked-layer structure.

Figure 11A:
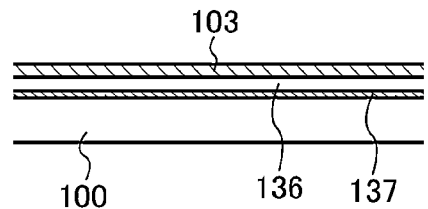
FIGS. 11A to 11H are cross-sectional views illustrating a method for manufacturing a semiconductor device.
Figure 11B:
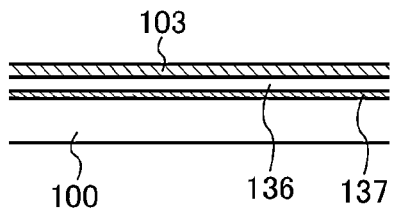
Figure 11C:
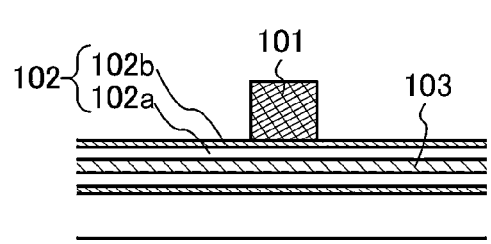
Figure 11D:
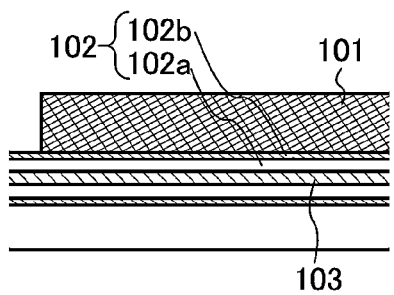
Figure 12A:
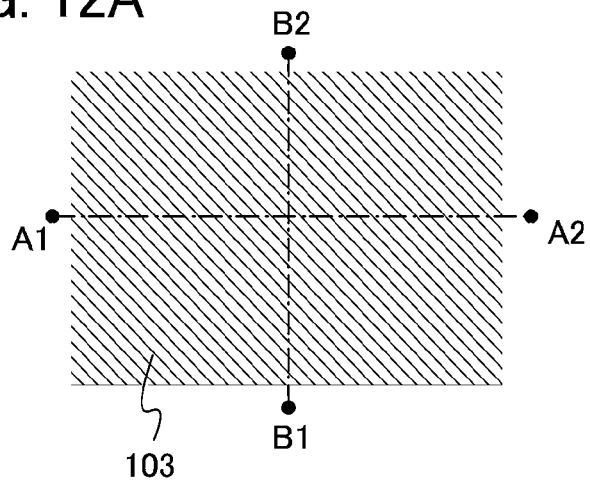
FIGS. 12A to 12C are top views illustrating a method for manufacturing a semiconductor device.
Figure 12B:
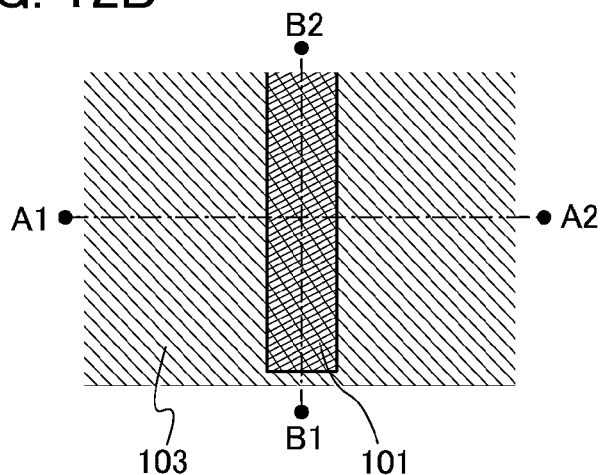

Next, the gate electrode 101 is formed over the oxide semiconductor layer 103 with the gate insulating layer 102 provided therebetween (see FIGS. 11C and 11D and FIG. 12B). The gate electrode 101 can be formed as follows: a first conductive layer which is to be the gate electrode 101 is formed by a plasma CVD method, a sputtering method, or the like, and part of the first conductive layer is selectively removed by etching or the like by a first photolithography process. The gate electrode 101 can be formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a semiconductor typified by polycrystalline silicon doped with an impurity element such as phosphorus, or a silicide such as nickel silicide may be used for the gate electrode 101. The gate electrode 101 may have either a single-layer structure or a stacked-layer structure.

The gate electrode 101 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode 101 has a stacked structure of the above conductive material and the above metal material.

For one layer of the gate electrode 101 which is in contact with the gate insulating layer 102, a metal oxide containing nitrogen, specifically, an In—Ga—Zn-based oxide containing nitrogen, an In—Sn-based oxide containing nitrogen, an In—Ga-based oxide containing nitrogen, an In—Zn-based oxide containing nitrogen, tin oxide containing nitrogen, indium oxide containing nitrogen, or a metal nitride (InN, SnN, or the like), can be used. These materials each have a work function of 5 eV (electron volts) or higher, preferably 5.5 eV or higher, which enables the threshold voltage, which is one of electric characteristics of a transistor, to be positive when used as the gate electrode. Thus, a normally-off switching element can be obtained.

Note that the gate electrode 101 can be formed by processing a first conductive layer (not illustrated) provided over the gate insulating layer 102 with the use of a mask. Here, as the mask used for the processing, a mask having a finer pattern which is formed by performing a slimming process on a mask formed by a photolithography method or the like is preferably used.

As the slimming process, an ashing process in which oxygen in a radical state (an oxygen radical) or the like is used can be employed, for example. However, the slimming process is not limited to the ashing process as long as the mask formed by a photolithography method or the like can be processed into a finer pattern. Note that the channel length (L) of a transistor is determined by the mask formed by the slimming process. Therefore, it can be preferable to employ a process with high controllability as the slimming process.

As a result of the slimming process, the line width of the mask formed by a photolithography method or the like can be reduced to a length shorter than or equal to the resolution limit of a light exposure apparatus, preferably less than or equal to half of the resolution limit of a light exposure apparatus, more preferably less than or equal to one third of the resolution limit of the light exposure apparatus. For example, the line width can be greater than or equal to 30 nm and less than or equal to 2000 nm, preferably greater than or equal to 50 nm and less than or equal to 350 nm. This enables further miniaturization of the transistor.

Next, the first insulating layer 106 is formed over the gate insulating layer 102 and the gate electrode 101.

The first insulating layer 106 can be formed by a plasma CVD method, a sputtering method, an evaporation method, or the like. For the first insulating layer 106, an inorganic insulating material such as silicon oxide, silicon oxynitride, aluminum oxynitride, or gallium oxide, or the like can be typically used.

Alternatively, for the first insulating layer 106, aluminum oxide, hafnium oxide, magnesium oxide, zirconium oxide, lanthanum oxide, barium oxide, or a metal nitride (e.g., aluminum nitride) can be used.

The first insulating layer 106 may be either a single layer or a stacked layer. The first insulating layer 106 can be a stack of a silicon oxide layer and an aluminum oxide layer, for example. The aluminum oxide layer can be suitably used because it has a high shielding effect (blocking effect) which prevents penetration of both oxygen and impurities such as hydrogen and moisture, and, in and after the manufacturing process, the aluminum oxide layer functions as a blocking layer for suppressing entry of an impurity such as hydrogen or moisture, which causes a change in characteristics, into the oxide semiconductor layer 103 and release of oxygen, which is a main component material of the oxide semiconductor, from the oxide semiconductor layer 103.

The first insulating layer 106 is preferably formed using, as appropriate, a method such as a sputtering method, in which an impurity such as water or hydrogen does not enter the first insulating layer 106.

As in the case of formation of the oxide semiconductor layer 103, an entrapment vacuum pump (e.g., a cryopump) is preferably used in order to remove moisture remaining in a deposition chamber of the first insulating layer 106. The first insulating layer 106 is formed in the deposition chamber evacuated using a cryopump, whereby the concentration of impurities in the first insulating layer 106 can be reduced. As an evacuation unit for removing moisture remaining in the deposition chamber of the first insulating layer 106, a turbo molecular pump provided with a cold trap may be used.

In this embodiment, a stack of an aluminum oxide layer and a silicon oxide layer is used as the first insulating layer 106. The aluminum oxide layer is on the gate electrode 101 side. When the aluminum oxide layer has high density (the film density is higher than or equal to 3.2 g/cm$^3$, preferably higher than or equal to 3.6 g/cm$^3$), the transistor 110 can have stable electric characteristics. The film density can be measured by Rutherford backscattering spectrometry (RBS) or X-ray reflection (XRR).

Figure 11E:
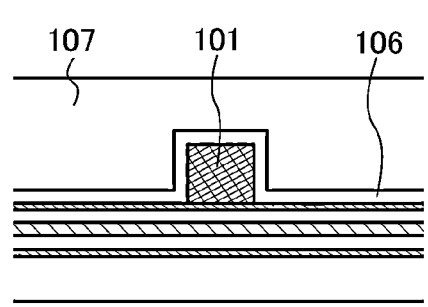
Figure 11F:
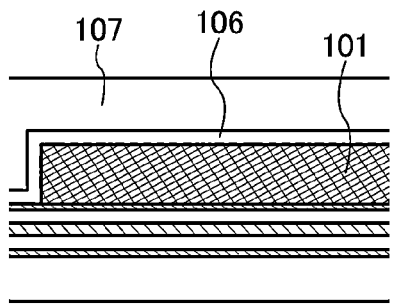

Next, the second insulating layer 107 is formed over the first insulating layer 106 (see FIGS. 11E and 11F). The second insulating layer 107 preferably functions as a planarization insulating layer for suppressing surface unevenness due to the transistor. For the second insulating layer 107, a material appropriately selected from the above-mentioned materials for the first insulating layer 106 can be used. Besides those materials, an organic material such as polyimide, an acrylic resin, or a benzocyclobutene-based resin can be used for the second insulating layer 107. Other than such organic materials, it is also possible to use a low-dielectric constant material (a low-k material) or the like. Note that the planarization insulating layer may be formed by stacking a plurality of insulating layers formed using any of these materials. It is also possible to employ a structure in which the first insulating layer 106 is provided but the second insulating layer 107 is not provided.

As described above, in order that the oxide semiconductor layer 103 is supersaturated with oxygen by sufficient supply of oxygen, an insulating layer containing excess oxygen is preferably provided so as to surround and be in contact with the oxide semiconductor layer 103. In this embodiment, an insulating layer containing excess oxygen or an insulating layer including an oxygen-excess region in a region in contact with the oxide semiconductor layer 103 is used as each of the second base insulating layer 136 and the first gate insulating layer 102a, which are in contact with the oxide semiconductor layer 103.

In addition, a blocking layer for suppressing release of oxygen from the oxide semiconductor layer 103 is preferably provided so as to be positioned outside the insulating layer containing excess oxygen. In this embodiment, the first base insulating layer 137, the second gate insulating layer 102b, and the first insulating layer 106 function as blocking layers.

The insulating layers containing excess oxygen and the blocking layers for suppressing release of oxygen are provided over and below the oxide semiconductor layer 103, so that the oxide semiconductor layer 103 can contain oxygen in a proportion which is substantially the same as that in the stoichiometric composition, or in a proportion higher than that in the stoichiometric composition i.e., the oxide semiconductor layer 103 can be supersaturated with oxygen. For example, when the oxide semiconductor layer 103 is an IGZO layer, an example of the stoichiometric composition is In:Ga:Zn:O=1:1:1:4 [atomic ratio]; thus, the atomic ratio of oxygen atoms is 4 or more.

Figure 11G:
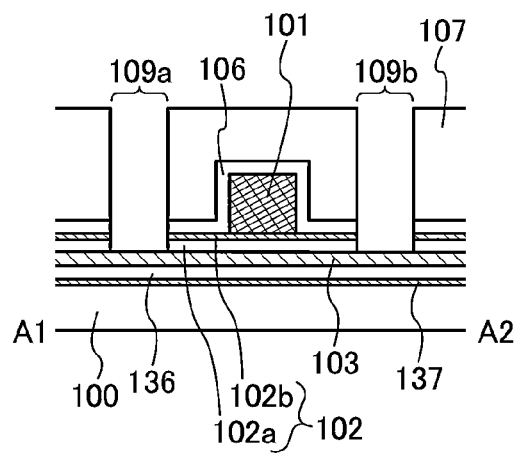
Figure 11H:
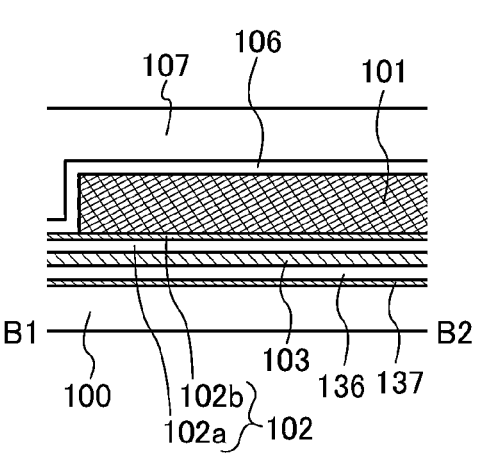
Figure 12C:
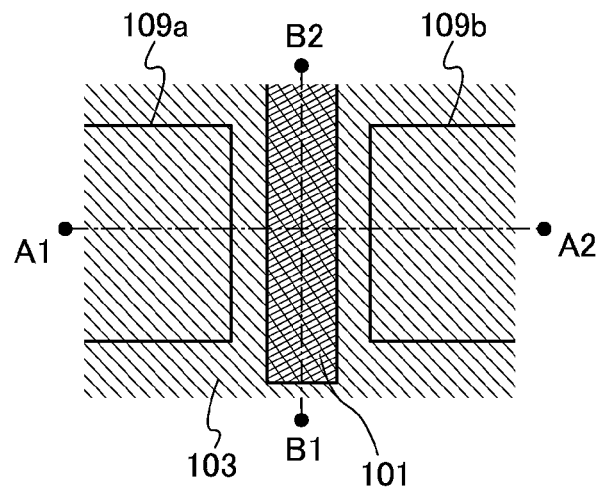

Next, a mask (not illustrated) is formed over the second insulating layer 107, and part of the second insulating layer 107, part of the first insulating layer 106, and part of the gate insulating layer 102 are removed by etching or the like with use of the mask by a second photolithography process, so that an opening 109a and an opening 109b which reach the oxide semiconductor layer 103 are formed (see FIGS. 11G and 11H and FIG. 12C). Note that in FIGS. 12A to 12C, the second insulating layer 107, the first insulating layer 106, and the gate insulating layer 102 are omitted for easy understanding. In the case where the second insulating layer 107 is not provided, the opening 109a and the opening 109b reaching the oxide semiconductor layer 103 are formed by etching of the first insulating layer 106 and the gate insulating layer 102.

Next, a second conductive layer which is to be the source electrode 105a and the drain electrode 105b is formed over the second insulating layer 107 to fill the opening 109a and the opening 109b.

The second conductive layer is formed using a material that can withstand heat treatment performed later. For example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. A metal film of a refractory metal such as Ti, Mo, or W or a metal nitride film of any of these elements (a titanium nitride film, a molybdenum nitride film, or a tungsten nitride film) may be stacked on one of or both a lower side and an upper side of a metal film of Al, Cu, or the like. Further, the second conductive layer used for the source electrode 105a and the drain electrode 105b may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$; abbreviated to ITO), indium oxide-zinc oxide ($In_2O_3$—ZnO), or any of these metal oxide materials in which silicon oxide is contained can be used.

The second conductive layer is partly removed by a third photolithography process so as to have a predetermined pattern, so that the source electrode 105a and the drain electrode 105b which are electrically connected to the oxide semiconductor layer 103 are formed (see FIGS. 10A to 10C).

The structure of the transistor described in this embodiment is effective particularly when a CAAC-OS is used for the oxide semiconductor layer 103. This is because oxygen is easily released from a side surface (an end surface) of an oxide semiconductor layer formed using a CAAC-OS. Note that this point is described below in detail in reference example.

In this embodiment, a transistor formed using an oxide semiconductor layer which is not processed into an island shape is described; however, formation of a parasitic channel can be suppressed even in a transistor having a structure different from this structure. Specifically, formation of a parasitic channel can be suppressed as long as an oxide semiconductor layer is not patterned in a channel width direction (a direction along B1-B2 in FIG. 10A) of a transistor (an oxide semiconductor layer extends in a channel width direction). In other words, formation of a parasitic channel is suppressed in some cases in an oxide semiconductor layer patterned in a channel length direction (a direction along A1-A2 in FIG. 10A) of a transistor.

According to this embodiment, formation of a parasitic channel of the transistor on a side surface of the oxide semiconductor layer can be suppressed.

Further, according to this embodiment, a transistor with favorable electric characteristics can be obtained by suppressing formation of a parasitic channel.

According to one embodiment of the disclosed invention, the number of photolithography processes used for manufacturing a transistor can be reduced to less than the conventional one, so that productivity of transistors can be improved.

The methods, structures, and the like described in this embodiment can be combined as appropriate with any of the methods, structures, and the like described in the other embodiments.

Embodiment 5

In this embodiment, a semiconductor device having a structure which is different from that shown in the above embodiment will be described.

Figure 13A:
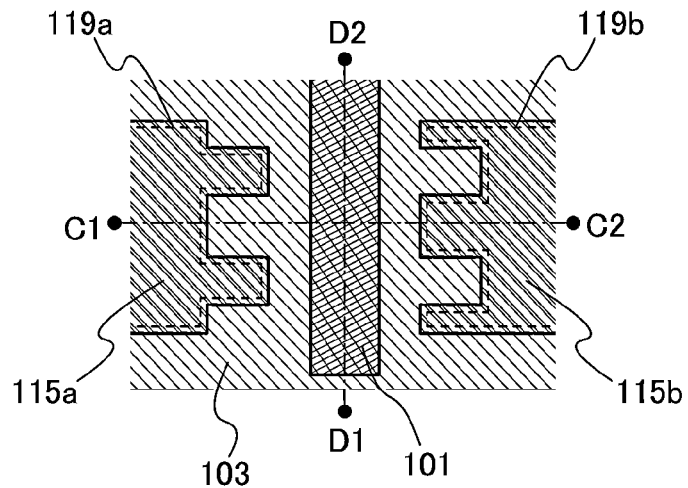
FIGS. 13A to 13C are a top view and cross-sectional views illustrating a semiconductor device.
Figure 13B:
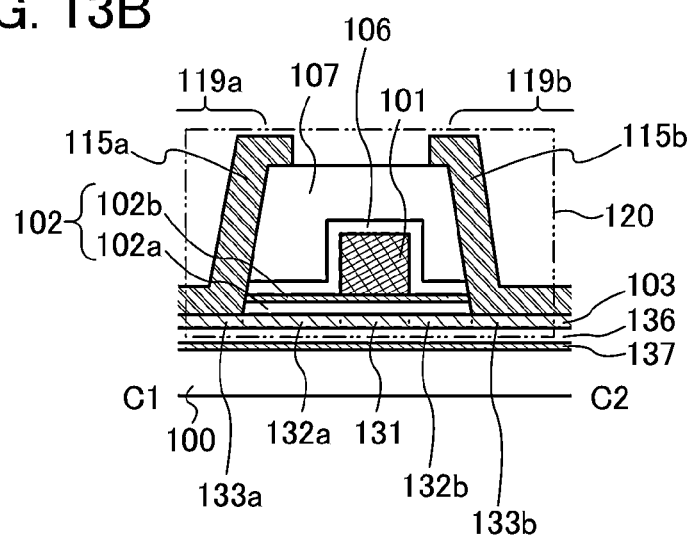
Figure 13C:
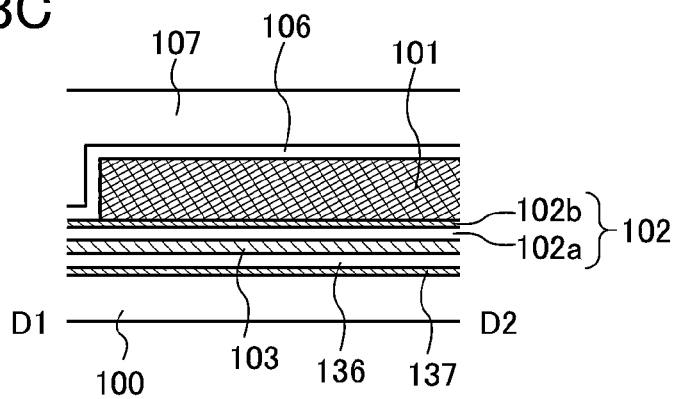

FIGS. 13A to 13C are a top view and cross-sectional views of a transistor 120 as one example of a semiconductor device. FIG. 13A is a top view of the transistor 120, FIG. 13B is a cross-sectional view along line C1-C2 in FIG. 13A, and FIG. 13C is a cross-sectional view along line D1-D2 in FIG. 13A. Note that in FIG. 13A, some components of the transistor 120 (e.g., the second insulating layer 107) are omitted for easy understanding.

The transistor 120 illustrated in FIGS. 13A to 13C includes, over the substrate 100 having an insulating surface, the first base insulating layer 137, the second base insulating layer 136 over the first base insulating layer 137, the oxide semiconductor layer 103 over the second base insulating layer 136, the gate insulating layer 102 including the first gate insulating layer 102a and the second gate insulating layer 102b over the oxide semiconductor layer 103, the gate electrode 101 over the oxide semiconductor layer 103 with the gate insulating layer 102 provided therebetween, the first insulating layer 106 over the gate electrode 101, the second insulating layer 107 over the first insulating layer 106, and a source electrode 115a and a drain electrode 115b electrically connected to the oxide semiconductor layer 103 through openings in the gate insulating layer 102, the first insulating layer 106, and the second insulating layer 107. The source electrode 115a and the drain electrode 115b are a pair of electrodes between which the gate electrode 101 is provided. Note that a source wiring and a drain wiring may be formed on and in contact with the source electrode 115a and the drain electrode 115b, respectively.

The oxide semiconductor layer 103 includes the channel formation region 131 overlapping with the gate electrode 101 with the gate insulating layer 102 provided therebetween, the source region 133a in contact with the source electrode 115a, the drain region 133b in contact with the drain electrode 115b, the offset region 132a provided between the source region 133a and the channel formation region 131, and the offset region 132b provided between the drain region 133b and the channel formation region 131. In other words, the channel formation region 131, the source region 133a, the drain region 133b, the offset region 132a, and the offset region 132b are formed in a self-aligned manner. By providing the offset region 132a, parasitic capacitance generated between the channel formation region 131 and the source electrode 105a can be reduced. Further, by providing the offset region 132b, parasitic capacitance generated between the channel formation region 131 and the drain electrode 105b can be reduced. Note that the length of the channel formation region 131, which is the distance within which carriers flow (also referred to as channel length), is preferably less than 60 nm.

Since the channel formation region 131 is formed in a self-aligned manner, miniaturization of the transistor can be easily achieved, the transistor has excellent on-state characteristics (for example, on-state current and field-effect mobility) and can operate at high speed.

Note that the transistor 120 may have a single-gate structure in which one channel formation region is formed, a double-gate structure in which two channel formation regions are formed, or a triple-gate structure in which three channel formation regions are formed. Alternatively, the transistor 120 may have a dual-gate structure including two gate electrodes positioned over and below a channel region with a gate insulating layer provided therebetween.

As described above, in the case where a side surface of the oxide semiconductor layer 103 is formed, the side surface of the oxide semiconductor layer 103 is positioned so as not to correspond to a side surface of the channel formation region 131 and to keep a sufficiently far distance.

This embodiment differs from Embodiment 4 in that the shapes of the source electrode 115a and the drain electrode 115b, which are a pair of electrodes, differ from those of Embodiment 4 (the shapes of the source electrode 105a and the drain electrode 105b). The source electrode 115a and the drain electrode 115b in this embodiment are comb-like electrodes (also referred to as teeth-shaped electrodes or comb electrodes). In the top view, the projections of the source electrode 115a and the projections of the drain electrode 115b do not overlap with each other with the gate electrode 101 provided therebetween.

A channel formation region of the transistor 120 is formed in a region of the oxide semiconductor layer 103 which is between the projections of the source electrode 115a and the projections of the drain electrode 115b.

A manufacturing process of the transistor 120 is illustrated in FIGS. 14A to 14H, FIGS. 15A to 15C, and FIGS. 13A to 13C. Note that FIGS. 14A to 14F and FIGS. 15A and 15B are similar to FIGS. 11A to 11F and FIGS. 12A and 12B in Embodiment 4; refer to Embodiment 4 for description of these drawings.

Figure 14A:
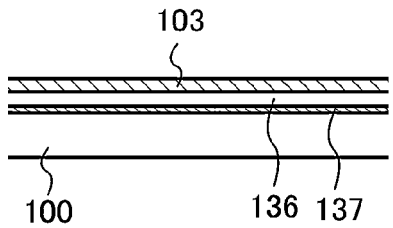
FIGS. 14A to 14H are cross-sectional views illustrating a method for manufacturing a semiconductor device.
Figure 14B:
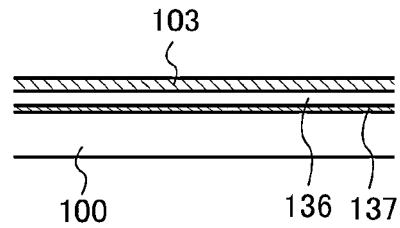
Figure 14C:
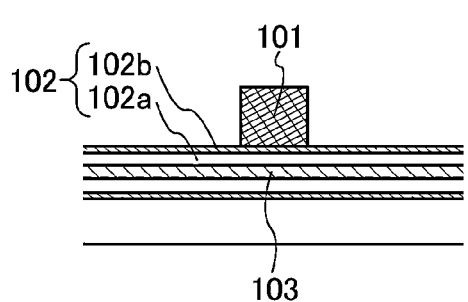
Figure 14D:
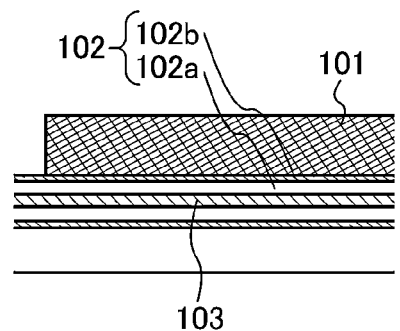
Figure 14E:
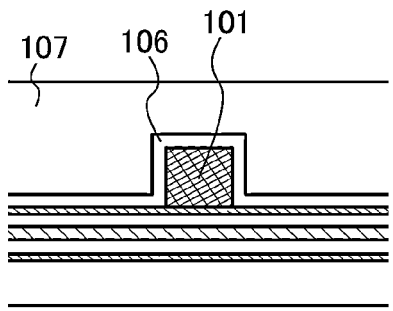
Figure 14F:
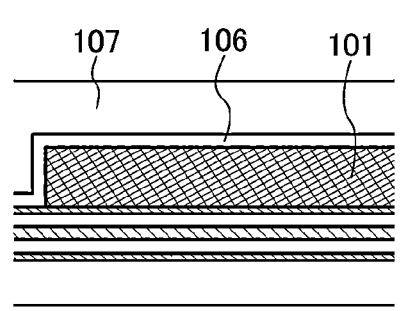
Figure 14G:
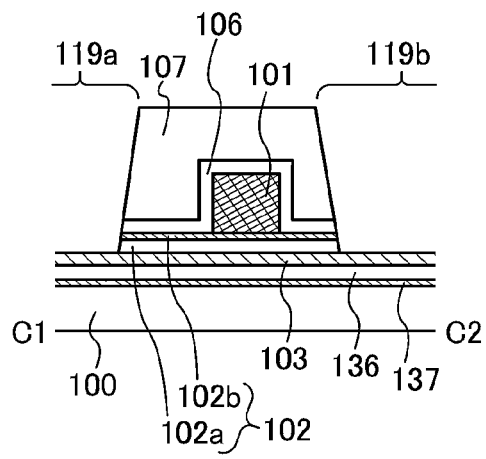
Figure 14H:
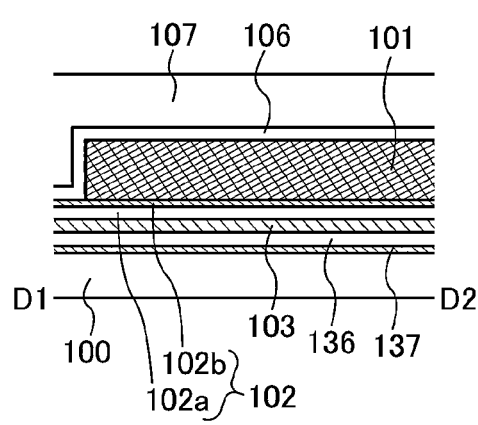
Figure 15A:
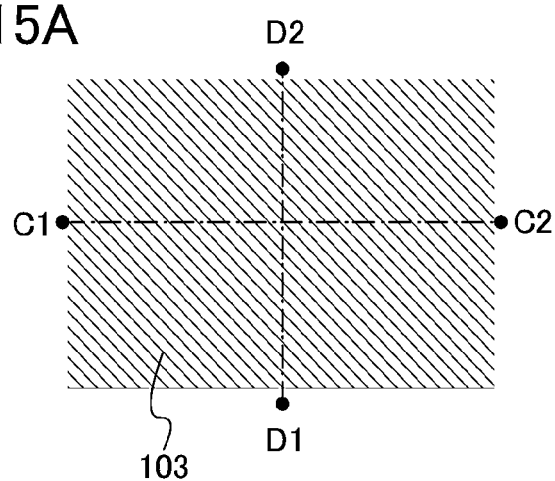
FIGS. 15A to 15C are top views illustrating a method for manufacturing a semiconductor device.
Figure 15B:
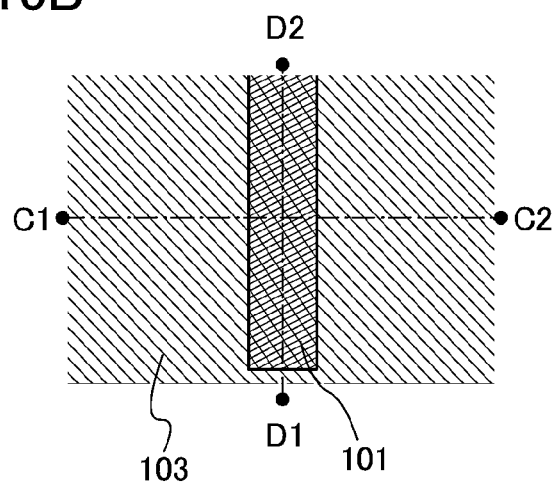
Figure 15C:
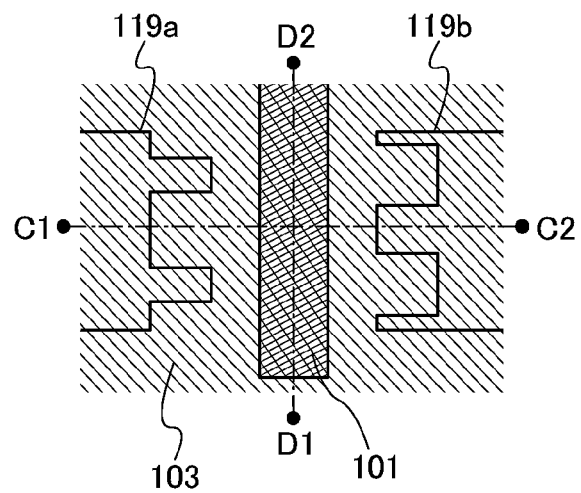

After formation of the second insulating layer 107, a mask (not illustrated) is formed over the second insulating layer 107, and part of the second insulating layer 107, part of the first insulating layer 106, and part of the gate insulating layer 102 are removed by etching or the like with use of the mask by a second photolithography process, so that an opening 119a and an opening 119b which reach the oxide semiconductor layer 103 are formed (see FIGS. 14G and 14H and FIG. 15C). Note that in FIGS. 15A to 15C, the second insulating layer 107, the first insulating layer 106, and the gate insulating layer 102 are omitted for easy understanding. In the case where the second insulating layer 107 is not provided, the opening 119a and the opening 119b reaching the oxide semiconductor layer 103 are formed by etching of the first insulating layer 106 and the gate insulating layer 102.

Note that the opening 119a and the opening 119b have comb-like shapes in the top view (FIG. 15C). In the top view, the projections of the opening 119a and the projections of the opening 119b do not overlap with each other with the gate electrode 101 provided therebetween.

The distance between the projections of the opening 119b (or the opening 119a, needless to say) and the gate electrode 101 in this embodiment is determined by the resolution of a light-exposure machine used in the second photolithography process.

Next, a second conductive layer which is to be the source electrode 115a and the drain electrode 115b is formed over the second insulating layer 107 (over the first insulating layer 106 when the second insulating layer 107 is not provided) to fill the opening 119a and the opening 119b. A material similar to that used in Embodiment 4 may be used for the second conductive layer.

The second conductive layer is partly removed by a third photolithography process so as to have a comb-like pattern, so that the source electrode 115a and the drain electrode 115b which are electrically connected to the oxide semiconductor layer 103 and have comb-like shapes are formed (see FIGS. 13A and 13B).

The distance between the projections of the drain electrode 115b (or the source electrode 115a, needless to say) and the gate electrode 101 in this embodiment is determined by the resolution of a light-exposure machine used in the third photolithography process.

In the transistor of this embodiment, the projections of the source electrode 115a and the projections of the drain electrode 115b do not overlap with each other with the gate electrode 101 provided therebetween. This structure makes it possible to arrange the source electrode 115a and the drain electrode 115b as close as possible to the gate electrode 101 while preventing a short circuit between the gate electrode 101 and the source electrode 115a or the drain electrode 115b in the second and third photolithography processes.

Moreover, an i-type (intrinsic) or substantially i-type oxide semiconductor layer, which has high resistance and a high insulating property as described above, is used as the oxide semiconductor layer 103. Therefore, even when the oxide semiconductor layer 103 is not processed into an island-shaped oxide semiconductor layer, channel formation regions of a plurality of transistors can be electrically isolated from each other.

Since the oxide semiconductor layer 103 is not processed into a predetermined shape, there is no need to form a mask for such processing. Therefore, the number of masks can be reduced in the manufacturing process of the transistor of this embodiment.

The structure of the transistor described in this embodiment is effective particularly when a CAAC-OS is used for the oxide semiconductor layer 103. This is because oxygen is easily released from a side surface (an end surface) of an oxide semiconductor layer formed using a CAAC-OS. Note that this point is described below in detail in reference example.

In this embodiment, a transistor formed using an oxide semiconductor layer which is not processed into an island shape is described; however, formation of a parasitic channel can be suppressed even in a transistor having a structure different from this structure. Specifically, formation of a parasitic channel can be suppressed as long as an oxide semiconductor layer is not patterned in a channel width direction (a direction along D1-D2 in FIG. 13A) of a transistor (an oxide semiconductor layer extends in a channel width direction). In other words, formation of a parasitic channel is suppressed in some cases in an oxide semiconductor layer patterned in a channel length direction (a direction along C1-C2 in FIG. 13A) of a transistor.

According to this embodiment, formation of a parasitic channel of the transistor on a side surface of the oxide semiconductor layer can be suppressed.

Further, according to this embodiment, a transistor with favorable electric characteristics can be obtained by suppressing formation of a parasitic channel.

According to one embodiment of the disclosed invention, the number of photolithography processes used for manufacturing a transistor can be reduced to less than the conventional one, so that productivity of transistors can be improved.

The methods, structures, and the like described in this embodiment can be combined as appropriate with any of the methods, structures, and the like described in the other embodiments.

Embodiment 6

In this embodiment, a semiconductor device having a structure different from the structures in Embodiments 4 and 5 will be described.

Figure 16A:
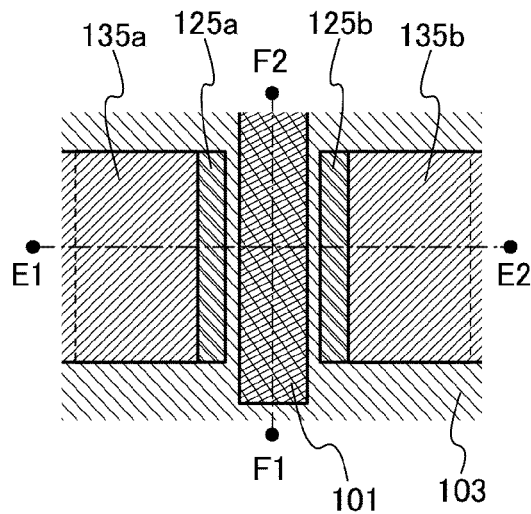
FIGS. 16A to 16C are a top view and cross-sectional views illustrating a semiconductor device.
Figure 16B:
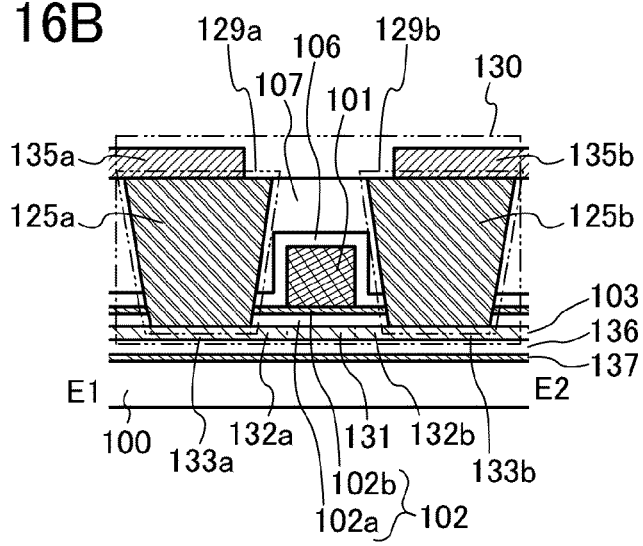
Figure 16C:
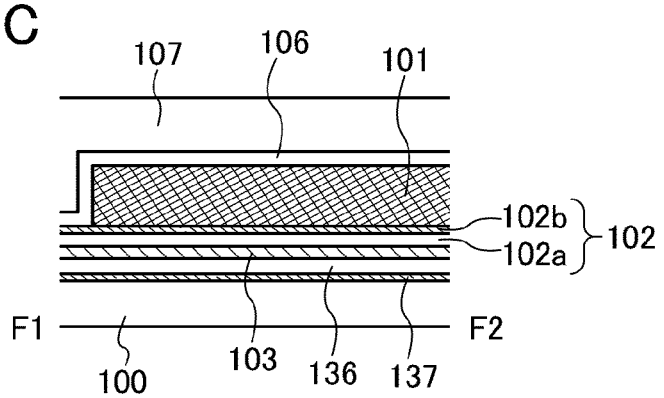

FIGS. 16A to 16C are a top view and cross-sectional views of a transistor 130 as one example of a semiconductor device. FIG. 16A is a top view of the transistor 130, FIG. 16B is a cross-sectional view along line E1-E2 in FIG. 16A, and FIG. 16C is a cross-sectional view along line F1-F2 in FIG. 16A. Note that in FIG. 16A, some components of the transistor 130 (e.g., the second insulating layer 107) are omitted for easy understanding.

The transistor 130 illustrated in FIGS. 16A to 16C includes, over the substrate 100 having an insulating surface, the first base insulating layer 137, the second base insulating layer 136 over the first base insulating layer 137, the oxide semiconductor layer 103 over the second base insulating layer 136, the gate insulating layer 102 including the first gate insulating layer 102a and the second gate insulating layer 102b over the oxide semiconductor layer 103, the gate electrode 101 over the oxide semiconductor layer 103 with the gate insulating layer 102 provided therebetween, the first insulating layer 106 over the gate electrode 101, the second insulating layer 107 over the first insulating layer 106, and a source electrode 125a and a drain electrode 125b electrically connected to the oxide semiconductor layer 103 through openings in the gate insulating layer 102, the first insulating layer 106, and the second insulating layer 107, and a source wiring 135a and a drain wiring 135b on and in contact with the source electrode 125a and the drain electrode 125b, respectively. The source electrode 125a and the drain electrode 125b are a pair of electrodes between which the gate electrode 101 is provided.

In the transistor 130, the source electrode 125a and the drain electrode 125b are formed to fill the openings formed in the gate insulating layer 102, the first insulating layer 106, and the second insulating layer 107 to be in contact with the oxide semiconductor layer 103. The source electrode 125a and the drain electrode 125b are formed as follows: a conductive layer is formed over the second insulating layer 107 to fill the openings which reach the oxide semiconductor layer 103 and are formed in the gate insulating layer 102, the first insulating layer 106, and the second insulating layer 107; polishing treatment is performed on the conductive layer to remove part of the conductive layer over the second insulating layer 107 (at least a region overlapping with the gate electrode 101), so that the conductive layer is divided.

In the transistor 130, the distance between the source electrode 125a and the drain electrode 125b in the channel length direction is shorter than the distance between the source wiring 135a and the drain wiring 135b in the channel length direction.

The oxide semiconductor layer 103 includes the channel formation region 131 overlapping with the gate electrode 101 with the gate insulating layer 102 provided therebetween, the source region 133a in contact with the source electrode 125a, the drain region 133b in contact with the drain electrode 125b, the offset region 132a provided between the source region 133a and the channel formation region 131, and the offset region 132b provided between the drain region 133b and the channel formation region 131. In other words, the channel formation region 131, the source region 133a, the drain region 133b, the offset region 132a, and the offset region 132b are formed in a self-aligned manner. By providing the offset region 132a, parasitic capacitance generated between the channel formation region 131 and the source electrode 105a can be reduced. Further, by providing the offset region 132b, parasitic capacitance generated between the channel formation region 131 and the drain electrode 105b can be reduced. Note that the length of the channel formation region 131, which is the distance within which carriers flow (also referred to as channel length), is preferably less than 60 nm.

Since the channel formation region 131 is formed in a self-aligned manner, miniaturization of the transistor can be easily achieved, the transistor has excellent on-state characteristics (for example, on-state current and field-effect mobility) and can operate at high speed.

Note that the transistor 130 may have a single-gate structure in which one channel formation region is formed, a double-gate structure in which two channel formation regions are formed, or a triple-gate structure in which three channel formation regions are formed. Alternatively, the transistor 130 may have a dual-gate structure including two gate electrodes positioned over and below a channel region with a gate insulating layer provided therebetween.

As described above, in the case where a side surface of the oxide semiconductor layer 103 is formed, the side surface of the oxide semiconductor layer 103 is positioned so as not to correspond to a side surface of the channel formation region 131 and to keep a sufficiently far distance.

This embodiment differs from Embodiments 4 and 5 in that the shapes of the source electrode 125a and the drain electrode 125b differ from those of Embodiment 4 (the shapes of the source electrode 105a and the drain electrode 105b) and that the source wiring 135a and the drain wiring 135b are formed on and in contact with the source electrode 125a and the drain electrode 125b, respectively. In addition, a manufacturing process (described later) of the transistor 130 differs from those of the transistors 110 and 120 in that an opening 129a and an opening 129b for electrically connecting the source electrode 125a and the drain electrode 125b to the oxide semiconductor layer 103 are not formed concurrently but in different steps.

A manufacturing process of the transistor 130 is illustrated in FIGS. 17A to 17H, FIGS. 18A to 18F, FIGS. 19A to 19C, FIGS. 20A to 20C, and FIGS. 16A to 16C. Note that FIGS. 17A to 17F and FIGS. 19A and 19B are similar to FIGS. 11A to 11F and FIGS. 12A and 12B in Embodiment 4; refer to Embodiment 4 for description of these drawings.

Figure 17A:
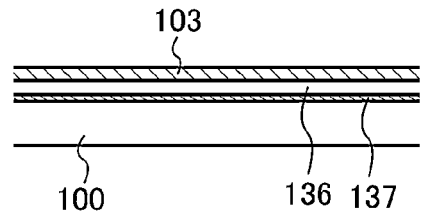
FIGS. 17A to 17H are cross-sectional views illustrating a method for manufacturing a semiconductor device.
Figure 17B:
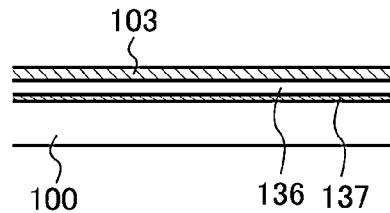
Figure 17C:
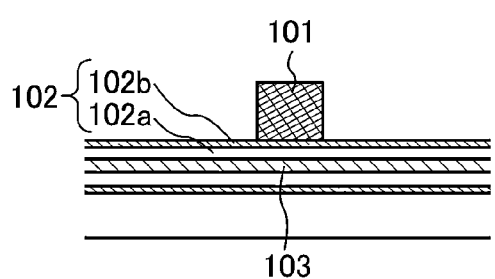
Figure 17D:
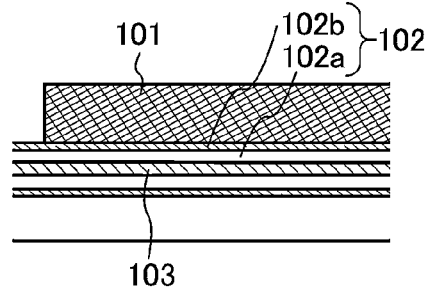
Figure 17E:
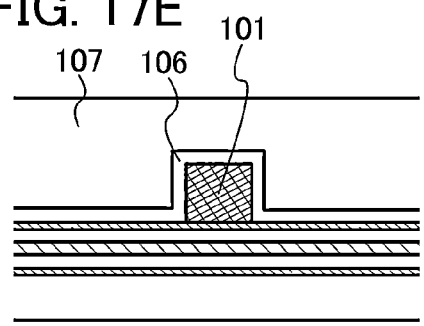
Figure 17F:
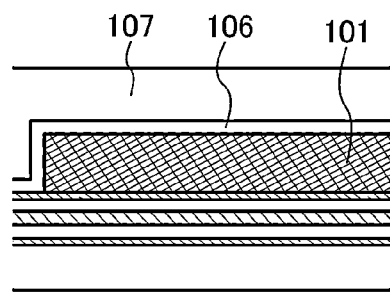
Figure 17G:
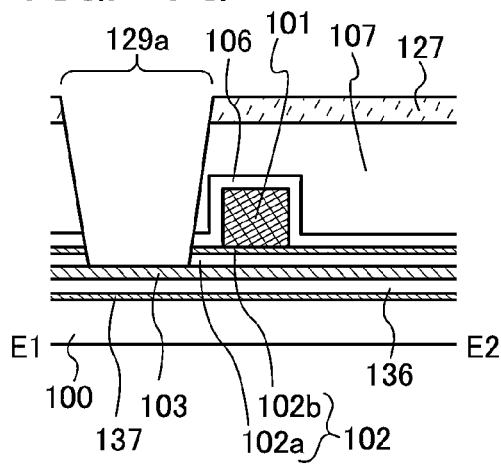
Figure 17H:
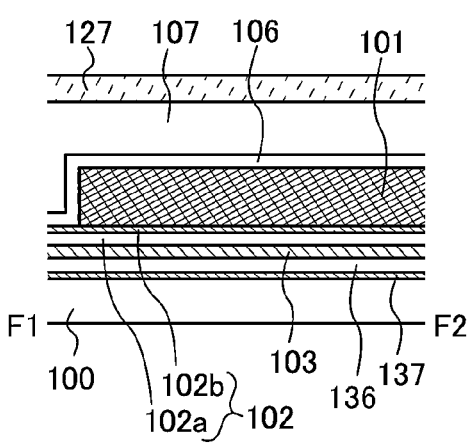
Figure 19A:
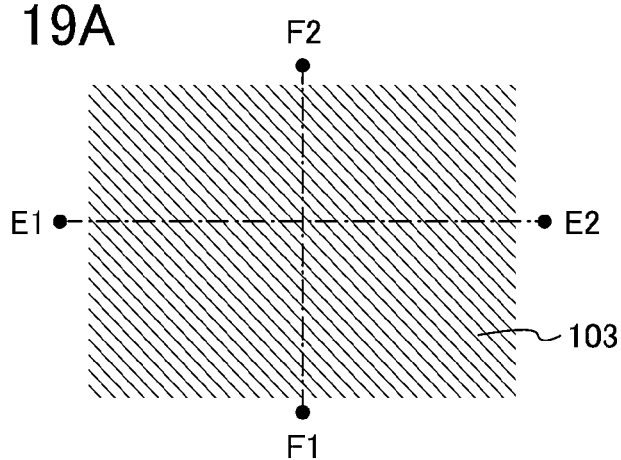
FIGS. 19A to 19C are top views illustrating a method for manufacturing a semiconductor device.
Figure 19B:
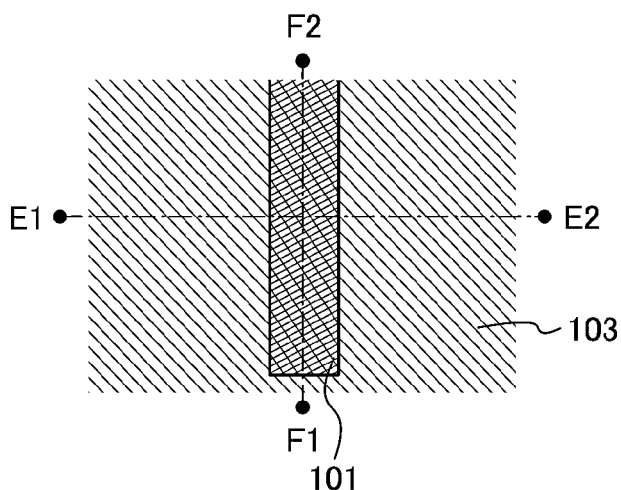
Figure 19C:
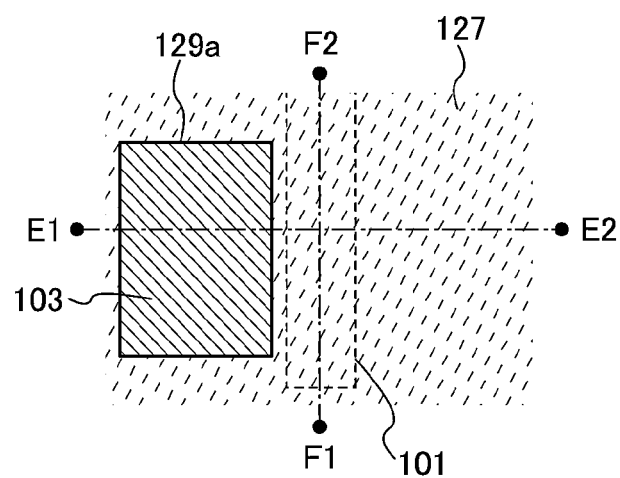

After formation of the second insulating layer 107, a mask 127 is formed over the second insulating layer 107, and part of the second insulating layer 107, part of the first insulating layer 106, and part of the gate insulating layer 102 are removed by etching or the like with use of the mask 127 by a second photolithography process, so that the opening 129a reaching the oxide semiconductor layer 103 is formed (see FIGS. 17G and 17H and FIG. 19C). Note that in FIGS. 19A to 19C, the second insulating layer 107, the first insulating layer 106, and the gate insulating layer 102 are omitted for easy understanding. In the case where the second insulating layer 107 is not provided, the opening 129a reaching the oxide semiconductor layer 103 is formed as follows: the mask 127 is formed over the first insulating layer 106, and part of the first insulating layer 106 and part of the gate insulating layer 102 are removed by etching or the like with use of the mask 127.

The mask 127 can be formed using a material such as a photoresist. For light exposure at the time of forming the mask 127, extreme ultraviolet light having a wavelength as short as several nanometers to several tens of nanometers is preferably used. In the light exposure by extreme ultraviolet light, the resolution is high and the focus depth is large. Thus, the mask 127 having a fine pattern can be formed.

As long as it is possible to form the mask 127 having a sufficiently fine pattern, a different method such as an ink-jet method may be used to form the mask 127. In this case, it is unnecessary to use a photosensitive material such as a photoresist as a material of the mask 127.

After removal of the mask 127, a mask 128 is formed over the opening 129a and the second insulating layer 107 (the first insulating layer 106 when the second insulating layer 107 is not provided). The mask 128 can be formed in a manner similar to that of the mask 127. Then, with use of the mask 128, another part of the second insulating layer 107, another part of the first insulating layer 106, and another part of the gate insulating layer 102 are removed by etching or the like by a third photolithography process, so that the opening 129b reaching the oxide semiconductor layer 103 is formed (see FIGS. 18A and 18B and FIG. 20A). The opening 129b is formed on a side opposite to the opening 129a with the gate electrode 101 provided therebetween. In this manner, the opening 129a and the opening 129b, which are a pair of openings, are formed with the gate electrode 101 provided therebetween over the gate insulating layer 102, the first insulating layer 106, and the second insulating layer 107.

Figure 18A:
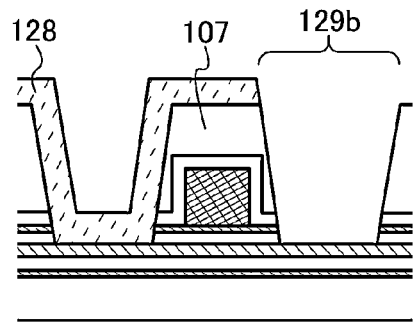
FIGS. 18A to 18F are cross-sectional views illustrating a method for manufacturing a semiconductor device.
Figure 18B:
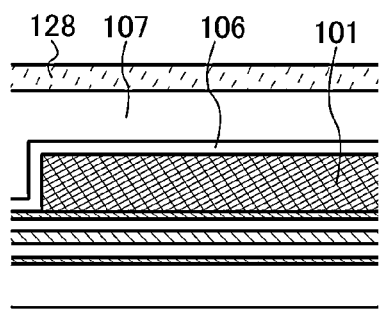
Figure 18C:
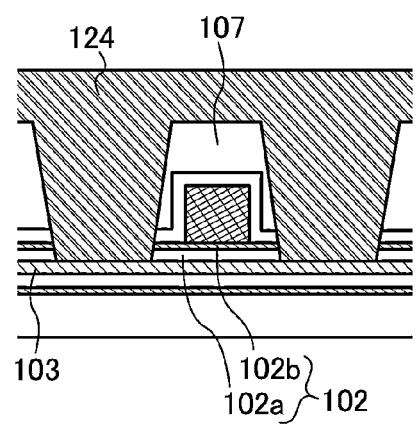
Figure 18D:
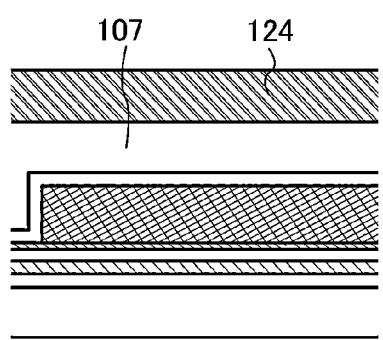
Figure 20A:
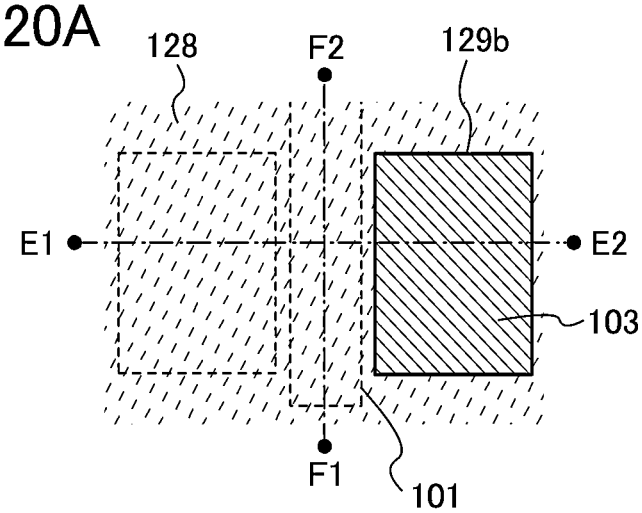
FIGS. 20A to 20C are top views illustrating a method for manufacturing a semiconductor device.
Figure 20B:
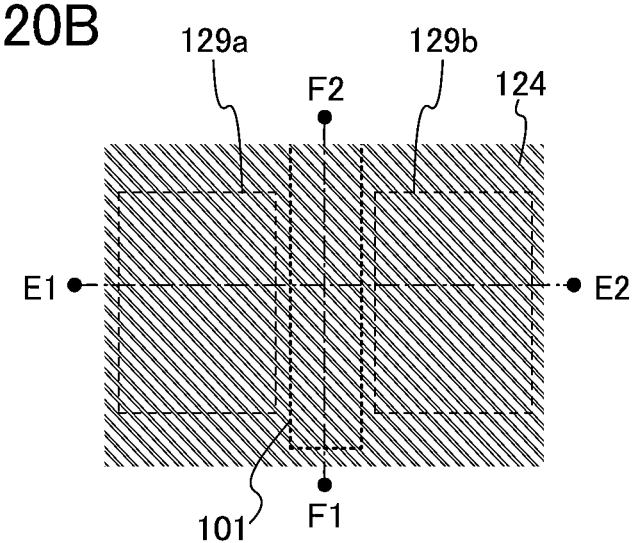

Next, a conductive layer 124 which is to be the source electrode and the drain electrode is formed over the second insulating layer 107 (over the first insulating layer 106 when the second insulating layer 107 is not provided) to fill the opening 129a and the opening 129b (see FIGS. 18C and 18D and FIG. 20B).

The conductive layer 124 is formed using a material that can withstand heat treatment performed later. For example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. A metal film of a refractory metal such as Ti, Mo, or W or a metal nitride film of any of these elements (a titanium nitride film, a molybdenum nitride film, or a tungsten nitride film) may be stacked on one of or both a lower side and an upper side of a metal film of Al, Cu, or the like. Further, the conductive layer 124 used for the source electrode 125a and the drain electrode 125b may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$; abbreviated to ITO), indium oxide-zinc oxide ($In_2O_3$—ZnO), or any of these metal oxide materials in which silicon oxide is contained can be used.

Figure 18E:
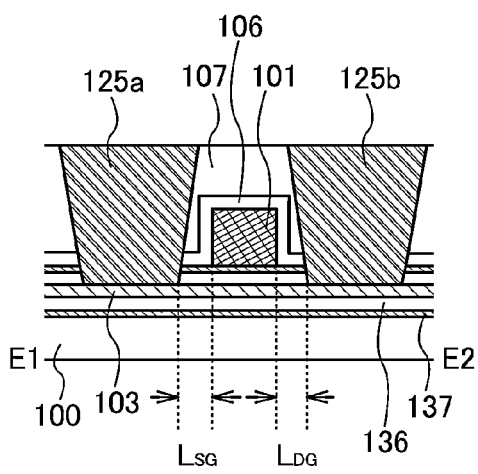
Figure 18F:
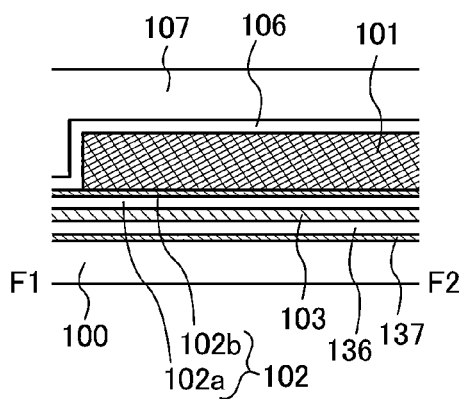
Figure 20C:
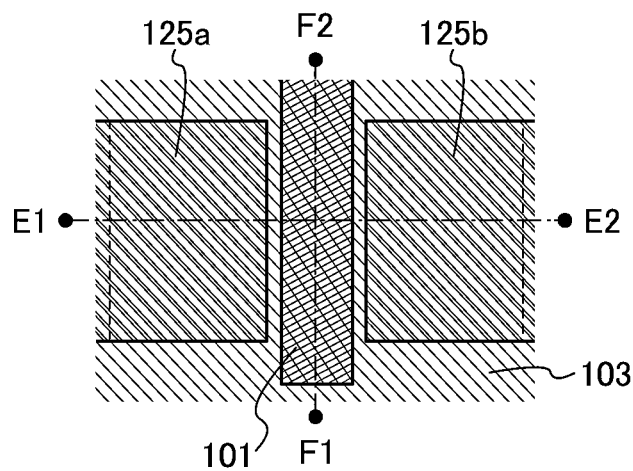

Next, CMP treatment is performed on the conductive layer 124 (see FIGS. 18E and 18F and FIG. 20C). The CMP treatment is performed on the conductive layer 124 in order to remove the conductive layer 124 provided over the second insulating layer 107 (at least a region overlapping with the gate electrode 101), whereby the source electrode 125a and the drain electrode 125b which fill the opening 129a and the opening 129b can be formed. In this embodiment, through the CMP treatment performed on the conductive layer 124 under such conditions that the surface of the second insulating layer 107 can be exposed, the source electrode 125a and the drain electrode 125b are formed. Note that the surface of the second insulating layer 107 or the surface of the gate electrode 101 may also be polished depending on conditions of the CMP treatment.

The CMP treatment is a method for planarizing a surface of an object to be processed by a combination of chemical and mechanical actions. More specifically, the CMP treatment is a method in which a polishing cloth is attached to a polishing stage, the polishing stage and an object to be processed are each rotated or swung while a slurry (an abrasive) is supplied between the object to be processed and the polishing cloth, and the surface of the object to be processed is polished by a chemical reaction between the slurry and the surface of the object to be processed and by a mechanical polishing action of the polishing cloth on the object to be processed.

Note that the CMP treatment may be performed only once or plural times. When the CMP treatment is performed plural times, first polishing is preferably performed with a high polishing rate followed by final polishing with a low polishing rate. By performing polishing at different polishing rates, the planarity of the surfaces of the source electrode 125a, the drain electrode 125b, and the second insulating layer 107 can be further improved.

Note that in this embodiment, the CMP treatment is used for removing the conductive layer 124 in the region overlapping with the second insulating layer 107; however, another polishing (grinding or cutting) treatment may be used. Alternatively, the polishing treatment such as the CMP treatment may be combined with etching (dry etching or wet etching) treatment or plasma treatment. For example, after the CMP treatment, dry etching treatment or plasma treatment (e.g., reverse sputtering) may be performed to improve the planarity of the surface to be processed. In the case where the polishing treatment is combined with etching treatment, plasma treatment, or the like, the order of the steps may be set as appropriate, without particular limitation, depending on the material, thickness, and roughness of the surface of the conductive layer 124.

As described above, the source electrode 125a and the drain electrode 125b are formed, respectively, to fill the opening 129a and the opening 129b formed in the gate insulating layer 102, the first insulating layer 106, and the second insulating layer 107. Accordingly, in the transistor 130, the distance ($L_{SG}$ in FIG. 18E) between a region where the source electrode 125a is in contact with the oxide semiconductor layer 103 (source side contact region) and the gate electrode 101 is determined by the distance between the end of the opening 129a and the end of the gate electrode 101. Similarly, in the transistor 130, the distance ($L_{DG}$ in FIG. 18E) between a region where the drain electrode 125b is in contact with the oxide semiconductor layer 103 (drain side contact region) and the gate electrode 101 is determined by the distance between the end of the opening 129b and the end of the gate electrode 101.

In the case where the opening 129a for providing the source electrode 125a and the opening 129b for providing the drain electrode 125b are formed by performing an etching treatment once, the minimum feature size of the distance between the opening 129a and the opening 129b in the channel length direction is limited to a resolution limit of a light-exposure apparatus used for forming a mask. Therefore, it is difficult to scale down the distance between the opening 129a and the opening 129b sufficiently, so that it is also difficult to scale down the distance ($L_{SG}$) between the gate electrode 101 and the source side contact region and the distance ($L_{DG}$) between the gate electrode 101 and the drain side contact region.

However, in the manufacturing method shown in this embodiment, the opening 129a and the opening 129b are formed separately by two etching treatments using two masks; therefore, the position of the openings can be set freely without depending on the resolution limit of a light-exposure apparatus. Thus, the distance ($L_{SG}$ or $L_{DG}$) between the gate electrode 101 and the source side contact region or the drain side contact region can be reduced to 0.05 μm to 0.1 μm, for example. By reducing $L_{SG}$ and $L_{DG}$, the resistance between the source and the drain of the transistor 130 can be reduced, so that the electric characteristics of the transistor 130 (e.g., on-state current characteristics) can be improved.

Further, since etching treatment using a resist mask is not performed in the step of removing the conductive layer 124 over the second insulating layer 107 in order to form the source electrode 125a and the drain electrode 125b, precise processing can be performed accurately even in the case where the distance between the source electrode 125a and the drain electrode 125b in the channel length direction is shortened. Thus, in the manufacturing process of the semiconductor device, the miniaturized transistor 130 having little variation in shapes and characteristics can be manufactured with high yield.

Next, a conductive layer which is to be a source wiring and a drain wiring (including a wiring formed in the same layer as the wirings) is formed over the source electrode 125a, the drain electrode 125b, and the second insulating layer 107 (the first insulating layer 106 when the second insulating layer 107 is not provided) and is processed, so that the source wiring 135a and the drain wiring 135b are formed (see FIGS. 16A to 16C).

The source wiring 135a and the drain wiring 135b can be formed using a material and a method similar to those of the gate electrode 101. For example, as the source wiring 135a and the drain wiring 135b, a stack of a tantalum nitride film and a copper film or a stack of a tantalum nitride film and a tungsten film can be used.

As described above, the distance between the source electrode 125a and the drain electrode 125b in the channel length direction can be processed minutely without depending on the resolution limit of a light-exposure apparatus. On the other hand, the source wiring 135a and the drain wiring 135b are processed using a mask formed by a photolithography method; therefore, the distance between the source wiring 135a and the drain wiring 135b becomes longer than that between the source electrode 125a and the drain electrode 125b. For miniaturizing the transistor 130, the distance between the source wiring 135a and the drain wiring 135b is preferably set in accordance with the resolution limit of a light-exposure apparatus.

Through the above process, the transistor 130 of this embodiment can be formed.

Note that in the transistor 130, the thickness of the source electrode 125a is substantially equal to the thickness of the drain electrode 125b; and the top surfaces of the source electrode 125a, the drain electrode 125b, and the second insulating layer 107 are substantially all at the same vertical level. However, this embodiment is not limited thereto.

Figure 21A:
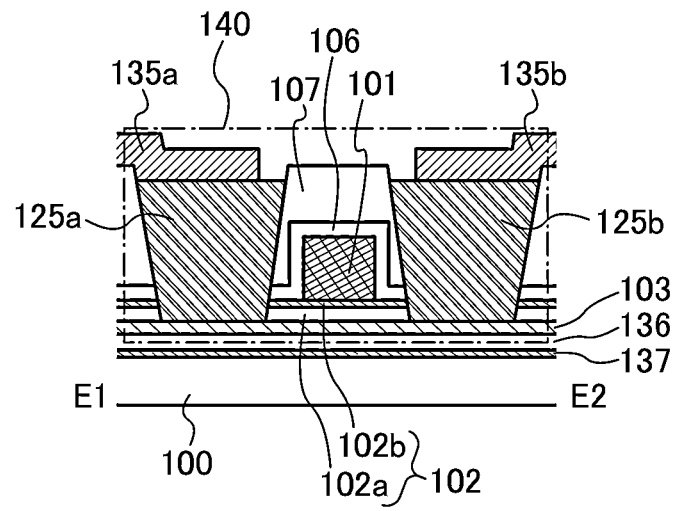
FIGS. 21A and 21B are cross-sectional views each illustrating a semiconductor device.
Figure 21B:
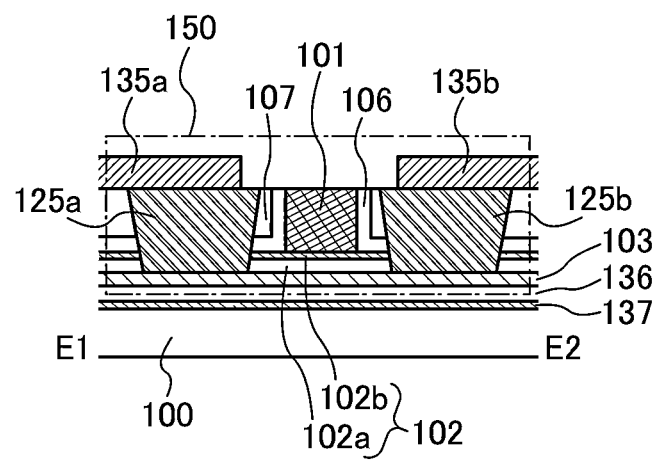

For example, as in a transistor 140 illustrated in FIG. 21A, a height difference may be formed between the top surface of the source electrode 125a or the drain electrode 125b and the top surface of the second insulating layer 107 depending on conditions of the polishing treatment of the conductive layer 124. Further, as in a transistor 150 illustrated in FIG. 21B, the top surface of the gate electrode 101 may be exposed by polishing treatment of the conductive layer 124, the first insulating layer 106, and the second insulating layer 107. Moreover, the upper portion of the gate electrode 101 may be partly removed by the polishing treatment. A structure in which the gate electrode 101 is exposed as in the transistor 150 can be used for an integrated circuit in which another wiring or another semiconductor element is stacked over the transistor 150.

As described above, in this embodiment, the opening 129a for providing the source electrode 125a and the opening 129b for providing the drain electrode 125b are formed separately by two etching treatments using two masks. Thus, the transistors 130, 140, and 150 can be miniaturized sufficiently; in each transistor, distances between the source side contact region and the gate electrode 101 and between the drain side contact region and the gate electrode 101 can be reduced sufficiently, so that the resistance between the source and the drain can be reduced. Therefore, the electric characteristics of the transistor (e.g., on-state current characteristics) can be improved.

Further, since etching treatment using a resist mask is not performed in the step of removing the conductive layer 124 over the second insulating layer 107 in order to form the source electrode 125a and the drain electrode 125b, precise processing can be performed accurately even in the case where the distance between the source electrode 125a and the drain electrode 125b is shortened. Thus, in the manufacturing processes of the semiconductor devices, the miniaturized transistors 130, 140, and 150 having little variation in shapes and characteristics can be manufactured with high yield.

The structure of the transistor described in this embodiment is effective particularly when a CAAC-OS is used for the oxide semiconductor layer 103. This is because oxygen is easily released from a side surface (an end surface) of an oxide semiconductor layer formed using a CAAC-OS. Note that this point is described below in detail in reference example.

In this embodiment, a transistor formed using an oxide semiconductor layer which is not processed into an island shape is described; however, formation of a parasitic channel can be suppressed even in a transistor having a structure different from this structure. Specifically, formation of a parasitic channel can be suppressed as long as an oxide semiconductor layer is not patterned in a channel width direction (a direction along F1-F2 in FIG. 16A) of a transistor (an oxide semiconductor layer extends in a channel width direction). In other words, formation of a parasitic channel is suppressed in some cases in an oxide semiconductor layer patterned in a channel length direction (a direction along E1-E2 in FIG. 16A) of a transistor.

According to this embodiment, formation of a parasitic channel of the transistor on a side surface of the oxide semiconductor layer can be suppressed.

Further, according to this embodiment, a transistor with favorable electric characteristics can be obtained by suppressing formation of a parasitic channel.

According to one embodiment of the disclosed invention, the number of photolithography processes used for manufacturing a transistor can be reduced to less than the conventional one, so that productivity of transistors can be improved.

The methods, structures, and the like described in this embodiment can be combined as appropriate with any of the methods, structures, and the like described in the other embodiments.

Embodiment 7

In this embodiment, a semiconductor device having a structure different from the structures in Embodiments 4 to 6 will be described.

In Embodiments 4 to 6, an oxide semiconductor layer with a single composition is used as the oxide semiconductor layer 103; alternatively, the oxide semiconductor layer 103 may be a stack of two oxide semiconductor layers with different compositions. Described in this embodiment is the case where a first oxide semiconductor layer 103a and a second oxide semiconductor layer 103b are stacked as the oxide semiconductor layer 103.

Figure 22A:
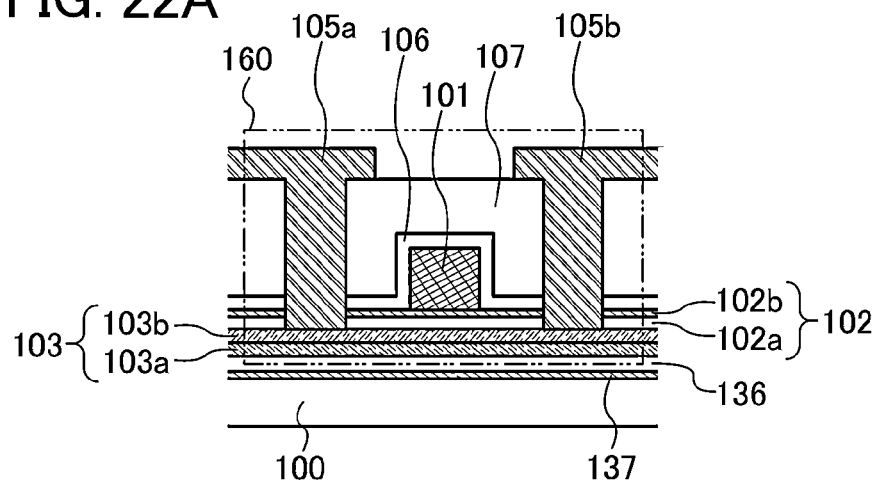
FIGS. 22A to 22C are cross-sectional views each illustrating a semiconductor device.
Figure 22B:
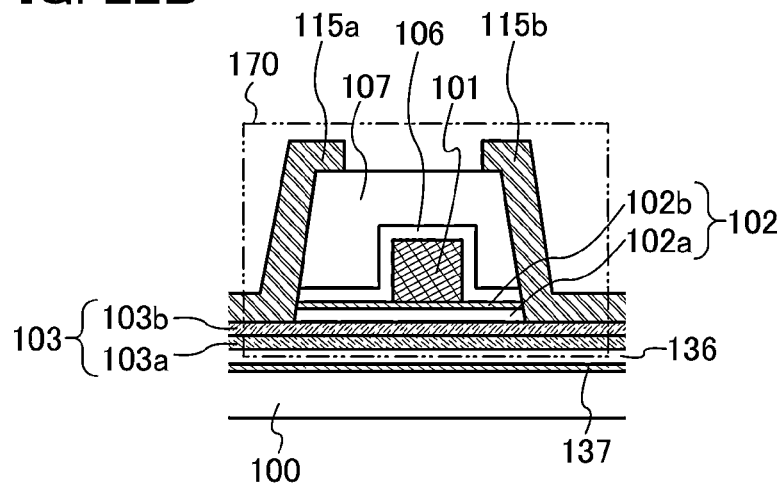
Figure 22C:
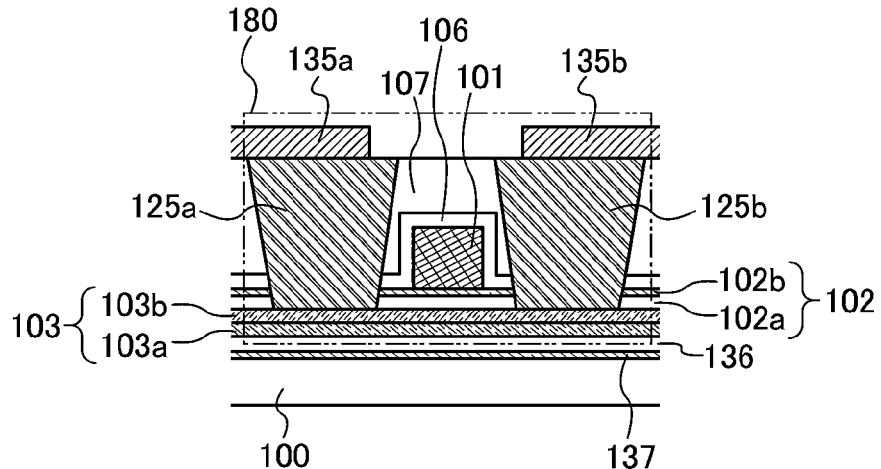

FIGS. 22A to 22C illustrate, respectively, a transistor 160, a transistor 170, and a transistor 180 of this embodiment. The transistor 160, the transistor 170, and the transistor 180 correspond, respectively, to the transistor 110 of Embodiment 4, the transistor 120 of Embodiment 5, and the transistor 130 of Embodiment 6 in each of which the oxide semiconductor layer 103 is replaced with a stack of the first oxide semiconductor layer 103a and the second oxide semiconductor layer 103b. Although not illustrated, it is needless to say that the oxide semiconductor layer 103 in each of the transistor 140 and the transistor 150 described in Embodiment 6 may be replaced with a stack of the first oxide semiconductor layer 103a and the second oxide semiconductor layer 103b.

For example, the first oxide semiconductor layer 103a and the second oxide semiconductor layer 103b may be formed using metal oxides with different compositions. For example, the first oxide semiconductor layer 103a may be formed using a three-component metal oxide, and the second oxide semiconductor layer 103b may be formed using a two-component metal oxide. Alternatively, for example, both the first oxide semiconductor layer 103a and the second oxide semiconductor layer 103b may be formed using a three-component metal oxide.

Further, the constituent elements of the first oxide semiconductor layer 103a and the second oxide semiconductor layer 103b may be the same and the composition ratios of the constituent elements of the first oxide semiconductor layer 103a and the second oxide semiconductor layer 103b may be different. For example, the first oxide semiconductor layer 103a may have an atomic ratio of In:Ga:Zn=1:1:1, and the second oxide semiconductor layer 103b may have an atomic ratio of In:Ga:Zn=3:1:2. Alternatively, the first oxide semiconductor layer 103a may have an atomic ratio of In:Ga:Zn=1:3:2, and the second oxide semiconductor layer 103b may have an atomic ratio of In:Ga:Zn=2:1:3.

In this case, one of the first oxide semiconductor layer 103a and the second oxide semiconductor layer 103b which is closer to the gate electrode (on a channel side), i.e., the second oxide semiconductor layer 103b preferably contains In and Ga at a proportion satisfying In>Ga. The other which is farther from the gate electrode (on a back channel side), i.e., the first oxide semiconductor layer 103a preferably contains In and Ga at a proportion satisfying In≤Ga.

In an oxide semiconductor, the s orbital of heavy metal mainly contributes to carrier transfer, and when the In content in the oxide semiconductor is increased, overlap of the s orbital is likely to be increased. Therefore, an oxide having a composition of In>Ga has higher mobility than an oxide having a composition of In≤Ga. Further, in Ga, the formation energy of oxygen vacancies is larger and thus oxygen vacancies are less likely to occur, than in In; therefore, the oxide having a composition of In≤Ga has more stable characteristics than the oxide having a composition of In>Ga.

An oxide semiconductor containing In and Ga at a proportion of In>Ga is used on the channel side, and an oxide semiconductor containing In and Ga at a proportion of In≤Ga is used on the back channel side, so that mobility and reliability of a transistor can be further improved.

Further, oxide semiconductors having different crystallinities may be used for the first oxide semiconductor layer 103a and the second oxide semiconductor layer 103b. That is, the oxide semiconductor layer 103 may be formed using any of a single crystal oxide semiconductor, a polycrystalline oxide semiconductor, an amorphous oxide semiconductor, and a CAAC-OS, as appropriate. When an amorphous oxide semiconductor is used for at least one of the first oxide semiconductor layer 103a and the second oxide semiconductor layer 103b, internal stress or external stress of the oxide semiconductor layer 103 is relieved, variation in characteristics of a transistor is reduced, and reliability of the transistor can be further improved.

On the other hand, an amorphous oxide semiconductor is likely to absorb an impurity which serves as a donor, such as hydrogen, and to generate an oxygen vacancy, and thus easily becomes an n-type. Thus, the oxide semiconductor layer on the channel side is preferably formed using a crystalline oxide semiconductor such as a CAAC-OS.

Further, the oxide semiconductor layer 103 may have a stacked-layer structure including three or more layers in which an amorphous oxide semiconductor layer is interposed between a plurality of oxide semiconductor layers having crystallinity. Furthermore, a structure in which an oxide semiconductor layer having crystallinity and an amorphous oxide semiconductor layer are alternately stacked may be employed.

These two structures used so that the oxide semiconductor layer 103 has a stacked-layer structure including a plurality of layers can be combined as appropriate.

In the case where the oxide semiconductor layer 103 has a stacked-layer structure including a plurality of layers, oxygen may be introduced each time the oxide semiconductor layer is formed. For the introduction of oxygen, heat treatment under an oxygen atmosphere, an ion implantation method, an ion doping method, a plasma immersion ion implantation method, plasma treatment performed under an atmosphere containing oxygen, or the like can be employed.

Oxygen is introduced each time the oxide semiconductor layer is formed, whereby the effect of reducing oxygen vacancies in the oxide semiconductor can be improved.

After formation of the first oxide semiconductor layer 103a and the second oxide semiconductor layer 103b, the gate insulating layer 102 covering the second oxide semiconductor layer 103b is formed without the stack of the first oxide semiconductor layer 103a and the second oxide semiconductor layer 103b being processed into a predetermined shape. The first oxide semiconductor layer 103a and the second oxide semiconductor layer 103b are left as formed over the substrate 100 with the first base insulating layer 137 and the second base insulating layer 136 provided therebetween, without being processed into a predetermined shape; thus, the stack of the first oxide semiconductor layer 103a and the second oxide semiconductor layer 103b does not have a side surface of the semiconductor layer where a parasitic channel, which might be a transmission path of leakage current, is easily generated. Without a side surface of the semiconductor layer where a parasitic channel, which might be a transmission path of leakage current, is easily generated, a side surface of the stack of the first oxide semiconductor layer 103a and the second oxide semiconductor layer 103b and a region in the vicinity of the side surface is prevented from becoming a low-resistance region. This can suppress formation of a parasitic channel in a transistor including the first oxide semiconductor layer 103a and the second oxide semiconductor layer 103b. Further, the suppression of formation of a parasitic channel can suppress change in the electric characteristics of the transistor.

Since the stack of the first oxide semiconductor layer 103a and the second oxide semiconductor layer 103b is not processed into a predetermined shape, there is no need to form a mask for such processing. Therefore, the number of masks can be reduced in the manufacturing process of the transistor of this embodiment.

According to this embodiment, formation of a parasitic channel of the transistor on a side surface of the oxide semiconductor layer can be suppressed.

Further, according to this embodiment, a transistor with favorable electric characteristics can be obtained by suppressing formation of a parasitic channel.

According to one embodiment of the disclosed invention, the number of photolithography processes used for manufacturing a transistor can be reduced to less than the conventional one, so that productivity of transistors can be improved.

The methods, structures, and the like described in this embodiment can be combined as appropriate with any of the methods, structures, and the like described in the other embodiments.

Embodiment 8

In this embodiment, an example of a semiconductor device which includes the transistor described in this specification, which can hold stored data even when not powered, and which does not have a limitation on the number of write cycles, will be described with reference to drawings.

Figure 23A:
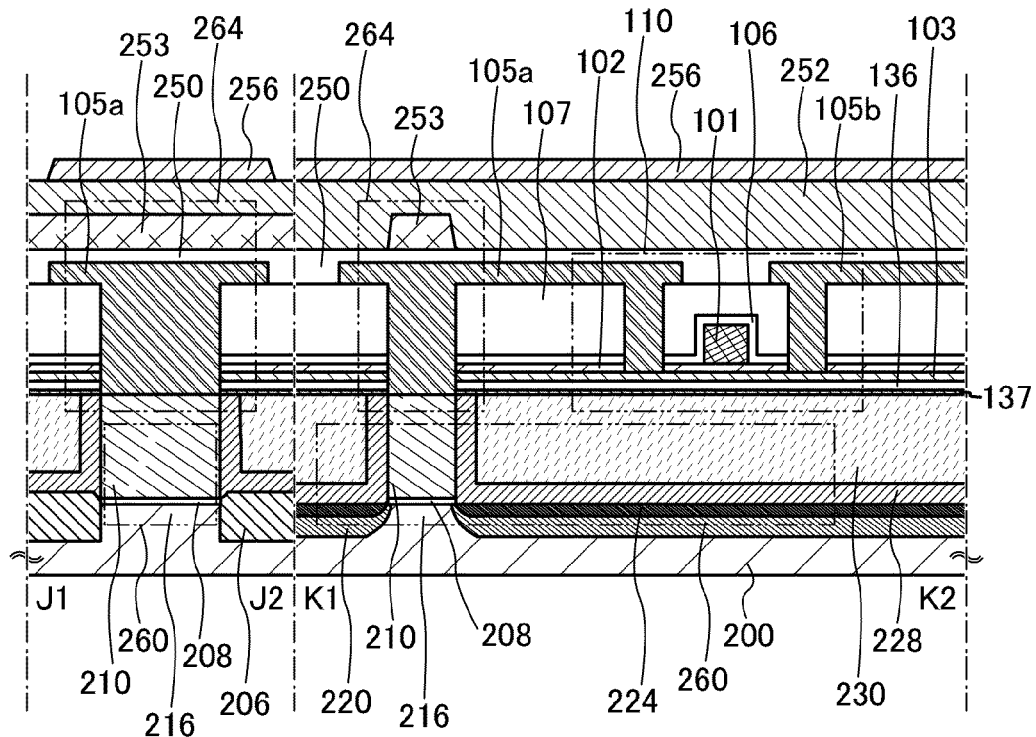
FIGS. 23A to 23C are a top view, a cross-sectional view, and a circuit diagram illustrating a semiconductor device.
Figure 23B:
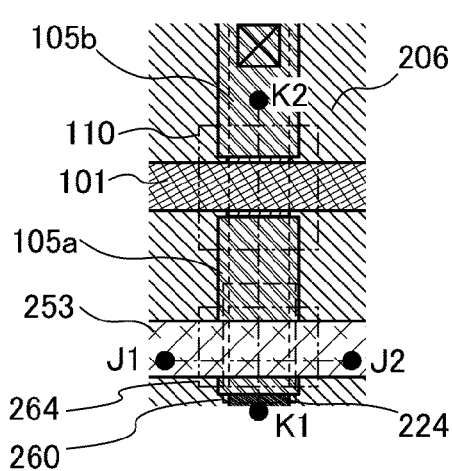
Figure 23C:
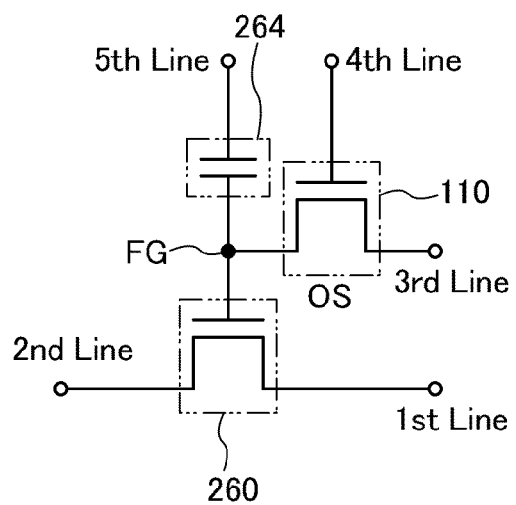

FIGS. 23A to 23C illustrate an example of a structure of a semiconductor device. FIG. 23A is a cross-sectional view of the semiconductor device, FIG. 23B is a top view of the semiconductor device, and FIG. 23C is a circuit diagram of the semiconductor device. Here, FIG. 23A corresponds to a cross section taken along lines J1-J2 and K1-K2 of FIG. 23B.

The semiconductor device illustrated in FIGS. 23A and 23B includes a transistor 260 including a first semiconductor material in a lower portion, and the transistor 110 including a second semiconductor material in an upper portion. The transistor 110 is described in Embodiment 4. Note that the first gate insulating layer 102a and the second gate insulating layer 102b are collectively referred to as the gate insulating layer 102 for simplicity.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor enables charge to be held for a long time owing to its characteristics.

Although all the transistors are n-channel transistors here, it is needless to say that p-channel transistors can be used. The specific structure of the semiconductor device, such as the material used for the semiconductor device and the structure of the semiconductor device, is not necessarily limited to those described here except for the use of the transistor described in Embodiment 4, which is formed using an oxide semiconductor, for holding data.

The transistor 260 in FIG. 23A includes a channel formation region 216 provided in a substrate 200 including a semiconductor material (e.g., silicon), impurity regions 220 provided such that the channel formation region 216 is sandwiched therebetween, intermetallic compound regions 224 in contact with the impurity regions 220, a gate insulating layer 208 provided over the channel formation region 216, and a gate electrode 210 provided over the gate insulating layer 208. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

An element isolation insulating layer 206 is provided over the substrate 200 so as to surround the transistor 260, and an insulating layer 228 and an insulating layer 230 are provided to cover the transistor 260. Note that in the transistor 260, a sidewall insulating layer may be formed on side surfaces of the gate electrode 210, and the impurity regions 220 may each include regions having different concentrations of impurities. The element isolation insulating layer 206 can be formed by an element isolation technique such as local oxidation of silicon (LOCOS) or shallow trench isolation (STI).

The transistor 260 formed using a single crystal semiconductor substrate can operate at high speed. Thus, when the transistor is used as a reading transistor, data can be read at a high speed. Two insulating layers are formed so as to cover the transistor 260. As treatment prior to formation of the transistor 110 and a capacitor 264, CMP treatment is performed on the two insulating layers, whereby the insulating layer 228 and the insulating layer 230 which are planarized are formed and, at the same time, an upper surface of the gate electrode 210 is exposed.

For the insulating layer 228 and the insulating layer 230, typically, an inorganic insulating material such as silicon oxide, silicon oxynitride, aluminum oxide, aluminum oxynitride, silicon nitride, aluminum nitride, silicon nitride oxide, or aluminum nitride oxide can be used. The insulating layer 228 and the insulating layer 230 can be formed by a plasma CVD method, a sputtering method, or the like.

Alternatively, an organic material such as polyimide, an acrylic resin, or a benzocyclobutene-based resin can be used. Other than such organic materials, it is also possible to use a low-dielectric constant material (a low-k material) or the like. In the case of using an organic material, the insulating layer 228 and the insulating layer 230 may be formed by a wet method such as a spin coating method or a printing method.

Note that in this embodiment, silicon nitride is used for the insulating layer 228, and silicon oxide is used for the insulating layer 230.

The first base insulating layer 137 and the second base insulating layer 136 are formed between the transistor 260 and the transistor 110. The first base insulating layer 137 has a function of preventing entry of hydrogen, water, or the like from the transistor 260 to the oxide semiconductor layer 103, and also functions as a blocking layer for suppressing release of oxygen from the oxide semiconductor layer 103. The second base insulating layer 136 is an insulating layer containing excess oxygen so as to supply oxygen to the oxide semiconductor layer 103. Oxygen supplied from the second base insulating layer 136 can fill the oxygen vacancies in the oxide semiconductor layer 103 of the transistor 110, which are formed later.

The insulating layer 228, the insulating layer 230, the first base insulating layer 137, and the second base insulating layer 136 are provided in the structure illustrated in FIGS. 23A to 23C; in the case where the insulating layer 228 functions as a blocking layer, similarly to the first base insulating layer 137, and the insulating layer 230 has a function of supplying oxygen to the oxide semiconductor layer 103, similarly to the second base insulating layer 136, a structure without the first base insulating layer 137 and the second base insulating layer 136 may be employed.

The transistor 110 illustrated in FIG. 23A includes an oxide semiconductor in a channel formation region, as described in Embodiment 4. Here, the oxide semiconductor layer 103 included in the transistor 110 is preferably highly purified. By using a highly purified oxide semiconductor, the transistor 110 which has extremely favorable off-state characteristics can be obtained.

Since the off-state current of the transistor 110 is small, stored data can be held for a long time owing to such a transistor. In other words, power consumption can be sufficiently reduced because a semiconductor device in which refresh operation is unnecessary or the frequency of refresh operation is extremely low can be provided.

In this embodiment, the source electrode 105a is electrically connected to the gate electrode 210 of the transistor 260. In order to form an opening which reaches the gate electrode 210 of the transistor 260, an opening is formed in the gate insulating layer 102, the first insulating layer 106, and the second insulating layer 107 in a region over the gate electrode 210 of the transistor 260 at the time of forming the opening 109a and the opening 109b by etching the gate insulating layer 102, the first insulating layer 106, and the second insulating layer 107 (see FIG. 11G). Then, a new mask, which is different from the mask used for the formation of the opening 109a and the opening 109b, is formed and an opening is formed with use of the new mask in the first base insulating layer 137, the second base insulating layer 136, and the oxide semiconductor layer 103 in a region over the gate electrode 210 of the transistor 260. In this manner, the source electrode 105a is electrically connected to the gate electrode 210 of the transistor 260 through the opening formed in the first base insulating layer 137, the second base insulating layer 136, the oxide semiconductor layer 103, the gate insulating layer 102, the first insulating layer 106, and the second insulating layer 107.

The first insulating layer 106, the second insulating layer 107, and an insulating layer 250 each having a single-layer structure or a stacked structure are provided over the transistor 110. In this embodiment, an aluminum oxide layer is used as the insulating layer 250. When the aluminum oxide layer has high density (the film density is higher than or equal to 3.2 g/cm$^3$, preferably higher than or equal to 3.6 g/cm$^3$), the transistor 110 can have stable electric characteristics.

In addition, a conductive layer 253 is provided in a region overlapping with the source electrode 105a of the transistor 110 with the insulating layer 250 provided therebetween, and the source electrode 105a, the insulating layer 250, and the conductive layer 253 form the capacitor 264. That is, the source electrode 105a of the transistor 110 functions as one electrode of the capacitor 264, and the conductive layer 253 functions as the other electrode of the capacitor 264. Note that in the case where a capacitor is not needed, the capacitor 264 may be omitted. Alternatively, the capacitor 264 may be separately provided above the transistor 110.

An insulating layer 252 is provided over the transistor 110 and the capacitor 264. In addition, a wiring 256 for connecting the transistor 110 to another transistor is provided over the insulating layer 252. Although not illustrated in FIG. 23A, the wiring 256 is electrically connected to the source electrode 105a or the drain electrode 105b through an electrode formed in an opening that is formed in the insulating layer 250, the insulating layer 252, and the like. Here, the electrode is preferably provided so as to partly overlap with at least the oxide semiconductor layer 103 of the transistor 110.

In FIGS. 23A and 23B, the transistor 260 and the transistor 110 are provided so as to at least partly overlap with each other. The source region or the drain region of the transistor 260 is preferably provided so as to overlap with part of the oxide semiconductor layer 103. Further, the transistor 110 and the capacitor 264 are provided so as to overlap with at least part of the transistor 260. For example, the conductive layer 253 of the capacitor 264 is provided so as to overlap with at least part of the gate electrode 210 of the transistor 260. With such a planar layout, the area occupied by the semiconductor device can be reduced; thus, higher integration can be achieved.

Note that the electrical connection between the drain electrode 105b and the wiring 256 may be established by direct contact of the drain electrode 105b and the wiring 256 with each other or through an electrode provided in an insulating layer lying between the drain electrode 105b and the wiring 256. Alternatively, the electrical connection may be established through a plurality of electrodes.

Next, an example of a circuit configuration corresponding to FIGS. 23A and 23B is illustrated in FIG. 23C.

In FIG. 23C, a first wiring (1st Line) is electrically connected to a source electrode of the transistor 260, and a second wiring (2nd Line) is electrically connected to a drain electrode of the transistor 260. A third wiring (3rd Line) is electrically connected to one of the source electrode and the drain electrode of the transistor 110, and a fourth wiring (4th Line) is electrically connected to the gate electrode of the transistor 110. A gate electrode of the transistor 260 and the other of the source electrode and the drain electrode of the transistor 110 are electrically connected to one electrode of the capacitor 264. A fifth wiring (5th Line) is electrically connected to the other electrode of the capacitor 264.

The semiconductor device in FIG. 23C utilizes a characteristic in which the potential of the gate electrode of the transistor 260 can be held, and thus enables data writing, holding, and reading as follows.

Writing and holding of data will be described. First, the potential of the fourth wiring is set to a potential at which the transistor 110 is turned on, so that the transistor 110 is turned on. Thus, the potential of the third wiring is supplied to the gate electrode of the transistor 260 and the capacitor 264. In other words, predetermined charge is given to the gate electrode of the transistor 260 (writing). Here, one of two kinds of charge providing different potentials (hereinafter referred to as a low-level charge and a high-level charge) is given. After that, the potential of the fourth wiring is set to a potential at which the transistor 110 is turned off, so that the transistor 110 is turned off. Thus, the charge given to the gate electrode of the transistor 260 is held (holding).

Since the off-state current of the transistor 110 is extremely small, the charge of the gate electrode of the transistor 260 is held for a long time.

Next, reading of data will be described. By supplying an appropriate potential (reading potential) to the fifth wiring while a predetermined potential (constant potential) is supplied to the first wiring, the potential of the second wiring varies depending on the amount of charge held in the gate electrode of the transistor 260. This is because in general, when the transistor 260 is an n-channel transistor, an apparent threshold voltage $V_{th\_H}$ in the case where a high-level charge is given to the gate electrode of the transistor 260 is lower than an apparent threshold voltage $V_{th\_L}$ in the case where a low-level charge is given to the gate electrode of the transistor 260. Here, an apparent threshold voltage refers to the potential of the fifth wiring, which is needed to turn on the transistor 260. Thus, the potential of the fifth wiring is set to a potential $V_0$ that is between $V_{th\_H}$ and $V_{th\_L}$, whereby charge given to the gate electrode of the transistor 260 can be determined. For example, in the case where a high-level charge is given in writing, when the potential of the fifth wiring is set to $V_0$ ($>V_{th\_H}$), the transistor 260 is turned on. In the case where a low-level charge is given in writing, even when the potential of the fifth wiring is set to $V_0$ ($<V_{th\_L}$), the transistor 260 remains in an off state. Therefore, the stored data can be read by the potential of the second wiring.

Note that in the case where memory cells are arrayed to be used, only data of desired memory cells needs to be read. In the case where such reading is not performed, a potential at which the transistor 260 is turned off regardless of the state of the gate electrode of the transistor 260, that is, a potential lower than $V_{th\_H}$ may be supplied to the fifth wiring. Alternatively, a potential at which the transistor 260 is turned on regardless of the state of the gate electrode of the transistor 260, that is, a potential higher than $V_{th\_L}$ may be supplied to the fifth wiring.

When a transistor having a channel formation region formed using an oxide semiconductor and having extremely small off-state current is applied to the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

Figure 24A:
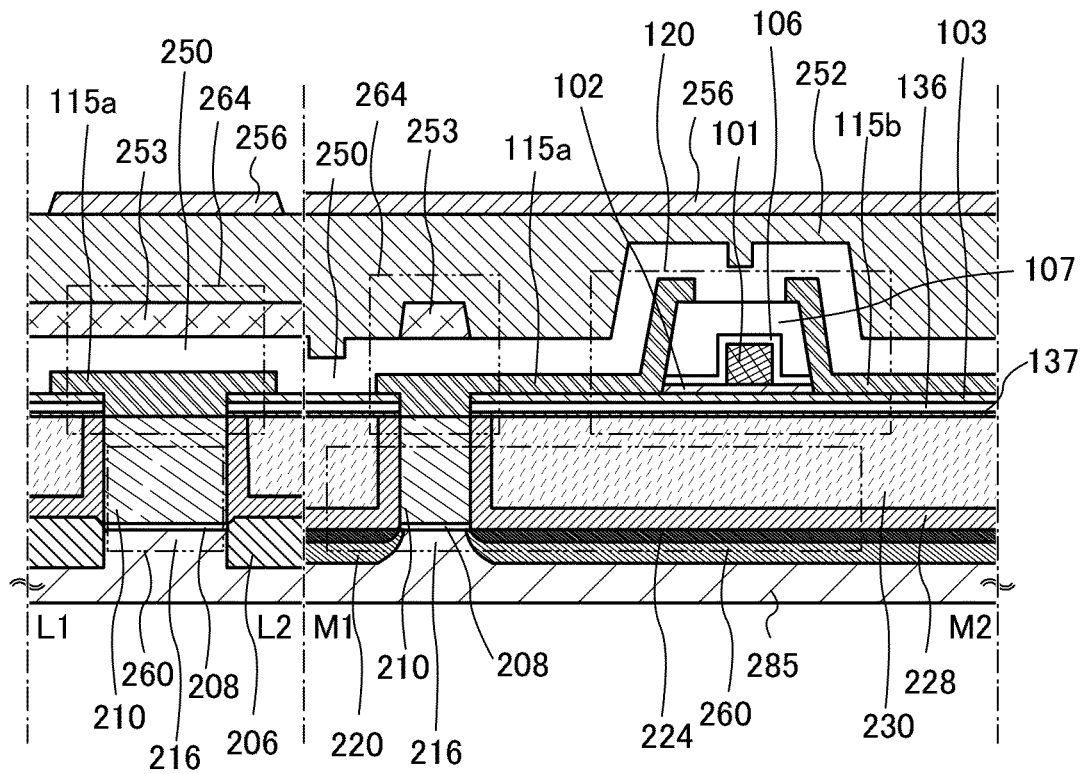
FIGS. 24A to 24C are a top view, a cross-sectional view, and a circuit diagram illustrating a semiconductor device.
Figure 24B:
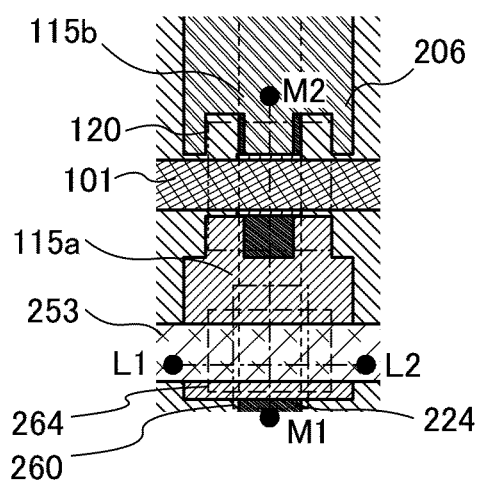
Figure 24C:
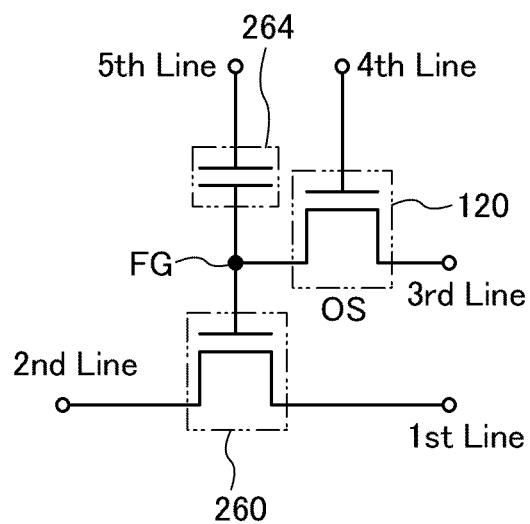

FIGS. 24A to 24C illustrate an example of a semiconductor device having a structure different from that in FIGS. 23A to 23C. FIG. 24A is a cross-sectional view of the semiconductor device, FIG. 24B is a top view of the semiconductor device, and FIG. 24C is a circuit diagram of the semiconductor device. Here, FIG. 24A corresponds to a cross section taken along lines L1-L2 and M1-M2 of FIG. 24B. Note that in FIGS. 24A to 24C, components in common with those in FIGS. 23A to 23C are denoted by the reference numerals used in those drawings; refer to the description of FIGS. 23A to 23C for details thereof. The transistor 120, the source electrode 115a, and the drain electrode 115b in the description below of FIGS. 24A to 24C may be replaced, respectively, with the transistor 110, the source electrode 105a, and the drain electrode 105b in the description of FIGS. 23A to 23C as appropriate.

The semiconductor device illustrated in FIGS. 24A and 24B includes the transistor 260 including a first semiconductor material in a lower portion, and the transistor 120 including a second semiconductor material in an upper portion. The transistor 120 is described in Embodiment 5. Note that the first gate insulating layer 102a and the second gate insulating layer 102b are collectively referred to as the gate insulating layer 102 for simplicity, as in FIGS. 23A and 23B.

In this embodiment, the source electrode 115a is electrically connected to the gate electrode 210 of the transistor 260. In order to form an opening which reaches the gate electrode 210 of the transistor 260, an opening is formed in the gate insulating layer 102, the first insulating layer 106, and the second insulating layer 107 in a region over the gate electrode 210 of the transistor 260 at the time of forming the opening 119a and the opening 119b by etching the gate insulating layer 102, the first insulating layer 106, and the second insulating layer 107 (see FIG. 14G). Then, a new mask, which is different from the mask used for the formation of the opening 119a and the opening 119b, is formed and an opening is formed with use of the new mask in the first base insulating layer 137, the second base insulating layer 136, and the oxide semiconductor layer 103 in a region over the gate electrode 210 of the transistor 260. In this manner, the source electrode 115a is electrically connected to the gate electrode 210 of the transistor 260 through the opening formed in the first base insulating layer 137, the second base insulating layer 136, the oxide semiconductor layer 103, the gate insulating layer 102, the first insulating layer 106, and the second insulating layer 107.

The first insulating layer 106, the second insulating layer 107, and the insulating layer 250 each having a single-layer structure or a stacked structure are provided over the transistor 120. In this embodiment, an aluminum oxide layer is used as the insulating layer 250. When the aluminum oxide layer has high density (the film density is higher than or equal to 3.2 g/cm$^3$, preferably higher than or equal to 3.6 g/cm$^3$), the transistor 120 can have stable electric characteristics.

In addition, the conductive layer 253 is provided in a region overlapping with the source electrode 115a of the transistor 120 with the insulating layer 250 provided therebetween, and the source electrode 115a, the insulating layer 250, and the conductive layer 253 form the capacitor 264. That is, the source electrode 115a of the transistor 120 functions as one electrode of the capacitor 264, and the conductive layer 253 functions as the other electrode of the capacitor 264. Note that in the case where a capacitor is not needed, the capacitor 264 may be omitted. Alternatively, the capacitor 264 may be separately provided above the transistor 120.

Note that the electrical connection between the drain electrode 115b and the wiring 256 may be established by direct contact of the drain electrode 115b and the wiring 256 with each other or through an electrode provided in an insulating layer lying between the drain electrode 115b and the wiring 256. Alternatively, the electrical connection may be established through a plurality of electrodes.

Figure 25A:
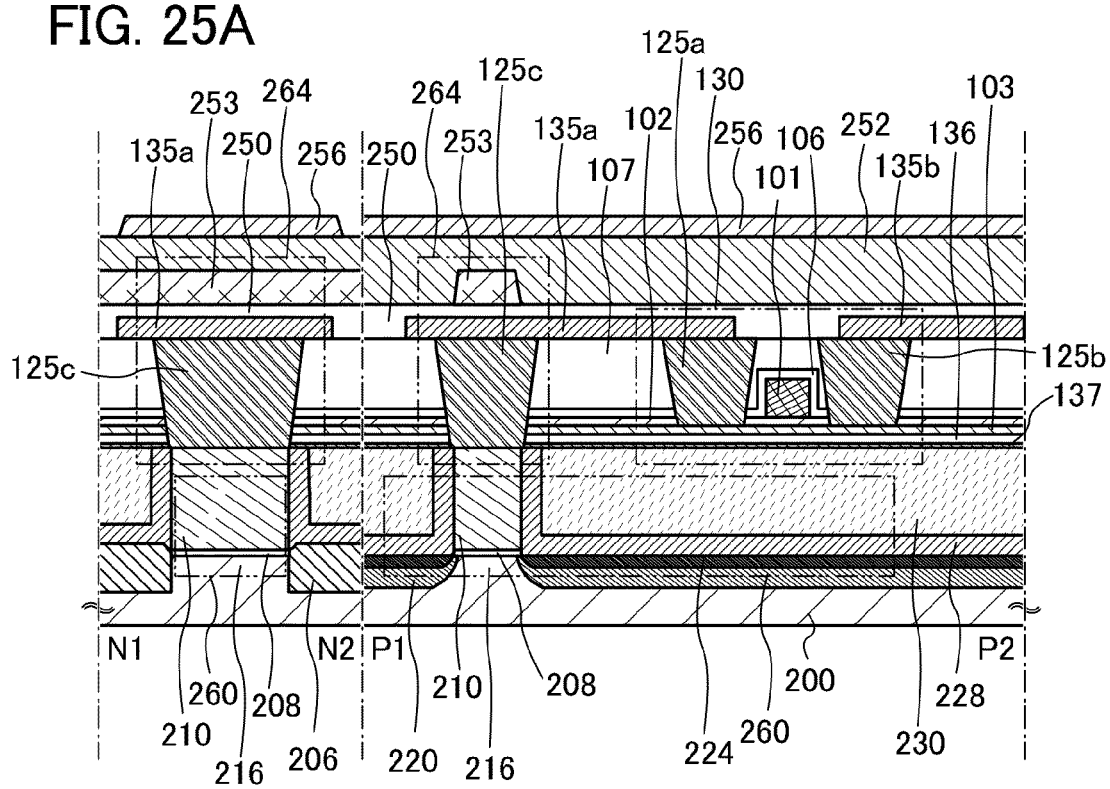
FIGS. 25A to 25C are a top view, a cross-sectional view, and a circuit diagram illustrating a semiconductor device.
Figure 25B:
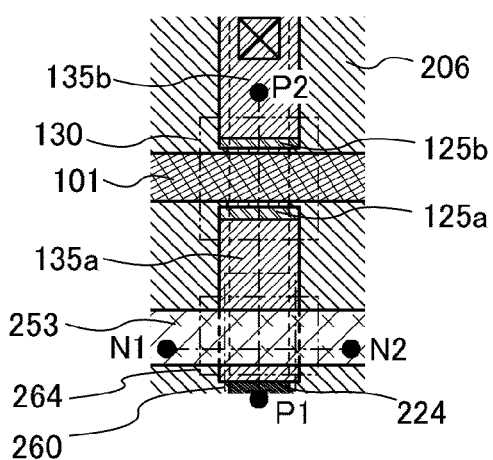
Figure 25C:
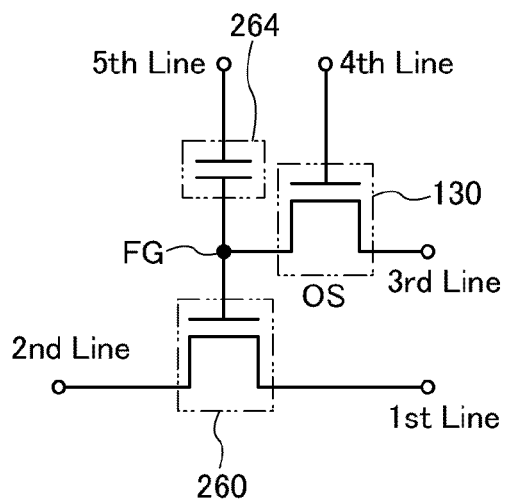

FIGS. 25A to 25C illustrate an example of a semiconductor device having a structure different from those in FIGS. 23A to 23C and FIGS. 24A to 24C. FIG. 25A is a cross-sectional view of the semiconductor device, FIG. 25B is a top view of the semiconductor device, and FIG. 25C is a circuit diagram of the semiconductor device. Here, FIG. 25A corresponds to a cross section taken along lines N1-N2 and P1-P2 of FIG. 25B. Note that in FIGS. 25A to 25C, components in common with those in FIGS. 23A to 23C and FIGS. 24A to 24C are denoted by the reference numerals used in those drawings; refer to the descriptions of FIGS. 23A to 23C and FIGS. 24A to 24C for details thereof. The transistor 130, the source electrode 125a, and the drain electrode 125b in the description below of FIGS. 25A to 25C may be replaced, respectively, with the transistor 110, the source electrode 105a, and the drain electrode 105b in the description of FIGS. 23A to 23C or the transistor 120, the source electrode 115a, and the drain electrode 115b in the description of FIGS. 24A to 24C as appropriate.

The semiconductor device illustrated in FIGS. 25A and 25B includes the transistor 260 including a first semiconductor material in a lower portion, and the transistor 130 including a second semiconductor material in an upper portion. The transistor 130 is described in Embodiment 6. Note that the first gate insulating layer 102a and the second gate insulating layer 102b are collectively referred to as the gate insulating layer 102 for simplicity, as in FIGS. 23A and 23B and FIGS. 24A and 24B.

In a manufacturing process of the transistor 130, the source electrode 125a and the drain electrode 125b are formed in a step of removing a conductive layer provided over the second insulating layer 107 by chemical mechanical polishing treatment. In this embodiment, an electrode 125c which is electrically connected to the gate electrode 210 is formed in the same step as the source electrode 125a and the drain electrode 125b. The gate electrode 210 of the transistor 260 is electrically connected to the source electrode 125a of the transistor 130 through the electrode 125c and the source wiring 135a.

In this embodiment, the electrode 125c is electrically connected to the gate electrode 210 of the transistor 260, and the source electrode 125a of the transistor 130 is electrically connected to the gate electrode 210 of the transistor 260 through the electrode 125c and the source wiring 135a. In order to form an opening which reaches the gate electrode 210 of the transistor 260, an opening is formed in the gate insulating layer 102, the first insulating layer 106, and the second insulating layer 107 in a region over the gate electrode 210 of the transistor 260 at the time of forming the opening 129a by etching the gate insulating layer 102, the first insulating layer 106, and the second insulating layer 107 with use of the mask 127 (see FIG. 17G) or at the time of forming the opening 129b by etching the gate insulating layer 102, the first insulating layer 106, and the second insulating layer 107 with use of the mask 128 (see FIG. 18A). Then, a new mask, which is different from the masks 127 and 128, is formed and an opening is formed with use of the new mask in the first base insulating layer 137, the second base insulating layer 136, and the oxide semiconductor layer 103 in a region over the gate electrode 210 of the transistor 260. The electrode 125c is formed in the opening that is formed in this manner in the first base insulating layer 137, the second base insulating layer 136, the oxide semiconductor layer 103, the gate insulating layer 102, the first insulating layer 106, and the second insulating layer 107. Thus, the source electrode 125a of the transistor 130 and the gate electrode 210 of the transistor 260 are electrically connected to each other through the electrode 125c and the source wiring 135a.

In the transistor 130, the distance between the gate electrode 101 and a region (contact region) where the source electrode 125a or the drain electrode 125b is in contact with the oxide semiconductor layer 103 can be shortened. Thus, the resistance between the gate electrode 101 and the region (contact region) where the source electrode 125a or the drain electrode 125b is in contact with the oxide semiconductor layer 103 can be reduced, which results in an improvement in the on-state characteristics of the transistor 130.

Further, precise processing can be performed accurately because etching with use of a resist mask is not performed when the conductive layer (the conductive layer 124 in FIG. 18C) over the gate electrode 101 is removed in a formation step of the source electrode 125a, the drain electrode 125b, and the electrode 125c. Thus, in the manufacturing process of the semiconductor device, a miniaturized transistor having little variation in shapes and characteristics can be manufactured with high yield.

The first insulating layer 106, the second insulating layer 107, and the insulating layer 250 each having a single-layer structure or a stacked structure are provided over the transistor 130. In this embodiment, an aluminum oxide layer is used as the insulating layer 250. When the aluminum oxide layer has high density (the film density is higher than or equal to 3.2 g/cm$^3$, preferably higher than or equal to 3.6 g/cm$^3$), the transistor 130 can have stable electric characteristics.

The conductive layer 253 is provided in a region overlapping with the source wiring 135a of the transistor 130 with the insulating layer 250 provided therebetween. The source wiring 135a electrically connected to the source electrode 125a, the insulating layer 250, and the conductive layer 253 form the capacitor 264. That is, the source wiring 135a of the transistor 130 functions as one electrode of the capacitor 264, and the conductive layer 253 functions as the other electrode of the capacitor 264. Note that in the case where a capacitor is not needed, the capacitor 264 may be omitted. Alternatively, the capacitor 264 may be separately provided above the transistor 130.

Note that the electrical connection between the drain wiring 135*b* and the wiring 256 may be established by direct contact of the drain wiring 135*b* and the wiring 256 with each other or through an electrode provided in an insulating layer lying between the drain wiring 135*b* and the wiring 256. Alternatively, the electrical connection may be established through a plurality of electrodes.

In this embodiment, a semiconductor device including the transistor 110 of Embodiment 4, a semiconductor device including the transistor 120 of Embodiment 5, and a semiconductor device including the transistor 130 of Embodiment 6 are described. Needless to say, it is also possible to apply any of the structures of the transistors 140 and 150 of Embodiment 6 and the transistors 160, 170, and 180 of Embodiment 7 to the transistor of this embodiment.

As described above, a miniaturized and highly integrated semiconductor device having high electric characteristics and a method for manufacturing the semiconductor device can be provided.

According to this embodiment, formation of a parasitic channel of the transistor on a side surface of the oxide semiconductor layer can be suppressed.

Further, according to this embodiment, a transistor with favorable electric characteristics can be obtained by suppressing formation of a parasitic channel.

According to one embodiment of the disclosed invention, the number of photolithography processes used for manufacturing a transistor can be reduced to less than the conventional one, so that productivity of transistors can be improved.

The methods, structures, and the like described in this embodiment can be combined as appropriate with any of the methods, structures, and the like described in the other embodiments.

Embodiment 9

In this embodiment, a semiconductor device which includes the transistor described in this specification, can hold stored data even when not powered, and does not have a limitation on the number of write cycles, and which has a structure different from the structure described in Embodiment 8 will be described.

Figure 26:
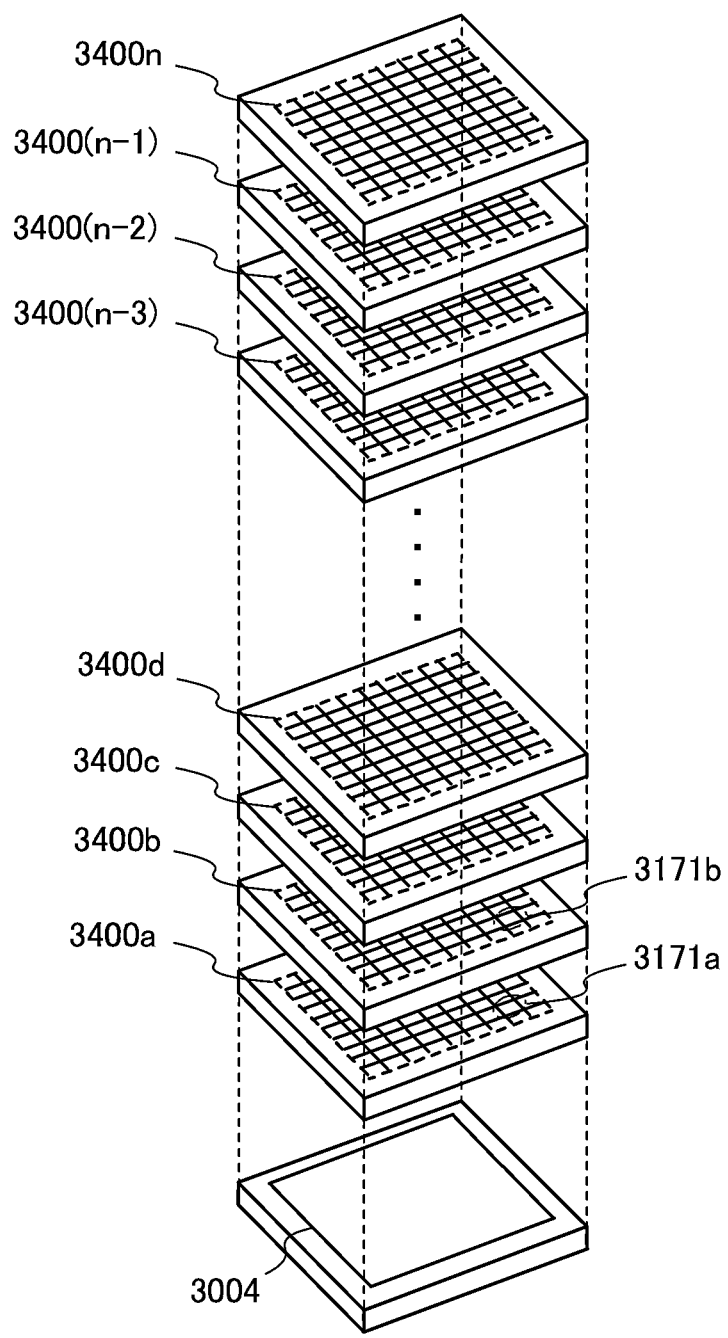
FIG. 26 is a perspective view illustrating a semiconductor device.

FIG. 26 is a perspective view of a semiconductor device. The semiconductor device illustrated in FIG. 26 includes a plurality of layers of memory cell arrays (memory cell arrays 3400*a* to 3400*n* (n is an integer greater than or equal to 2)) each including a plurality of memory cells as memory circuits in the upper portion, and a logic circuit 3004 in the lower portion which is necessary for operating the memory cell arrays 3400*a* to 3400*n*.

Figure 27:
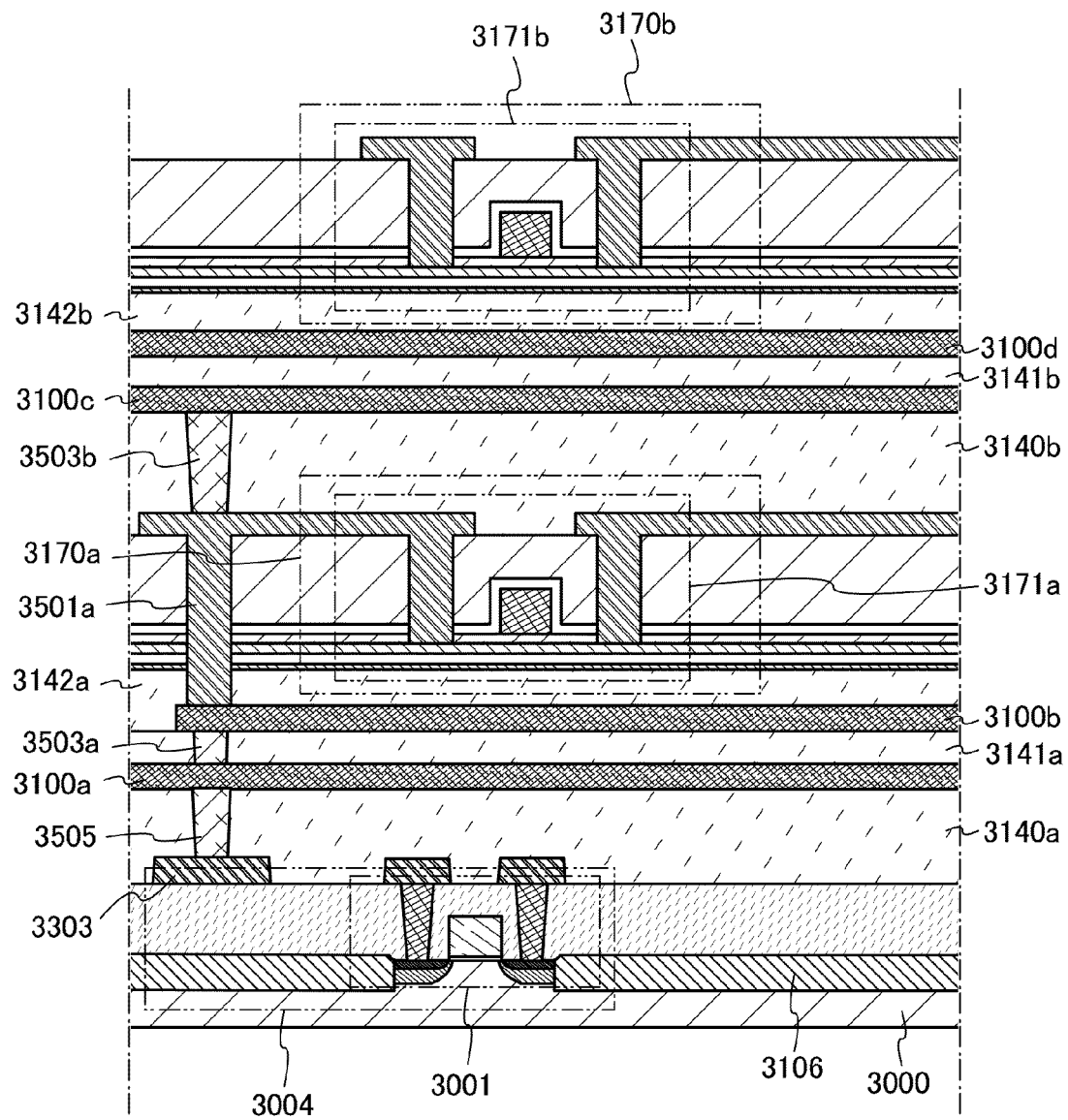
FIG. 27 is a cross-sectional view illustrating a semiconductor device.
Figure 28:
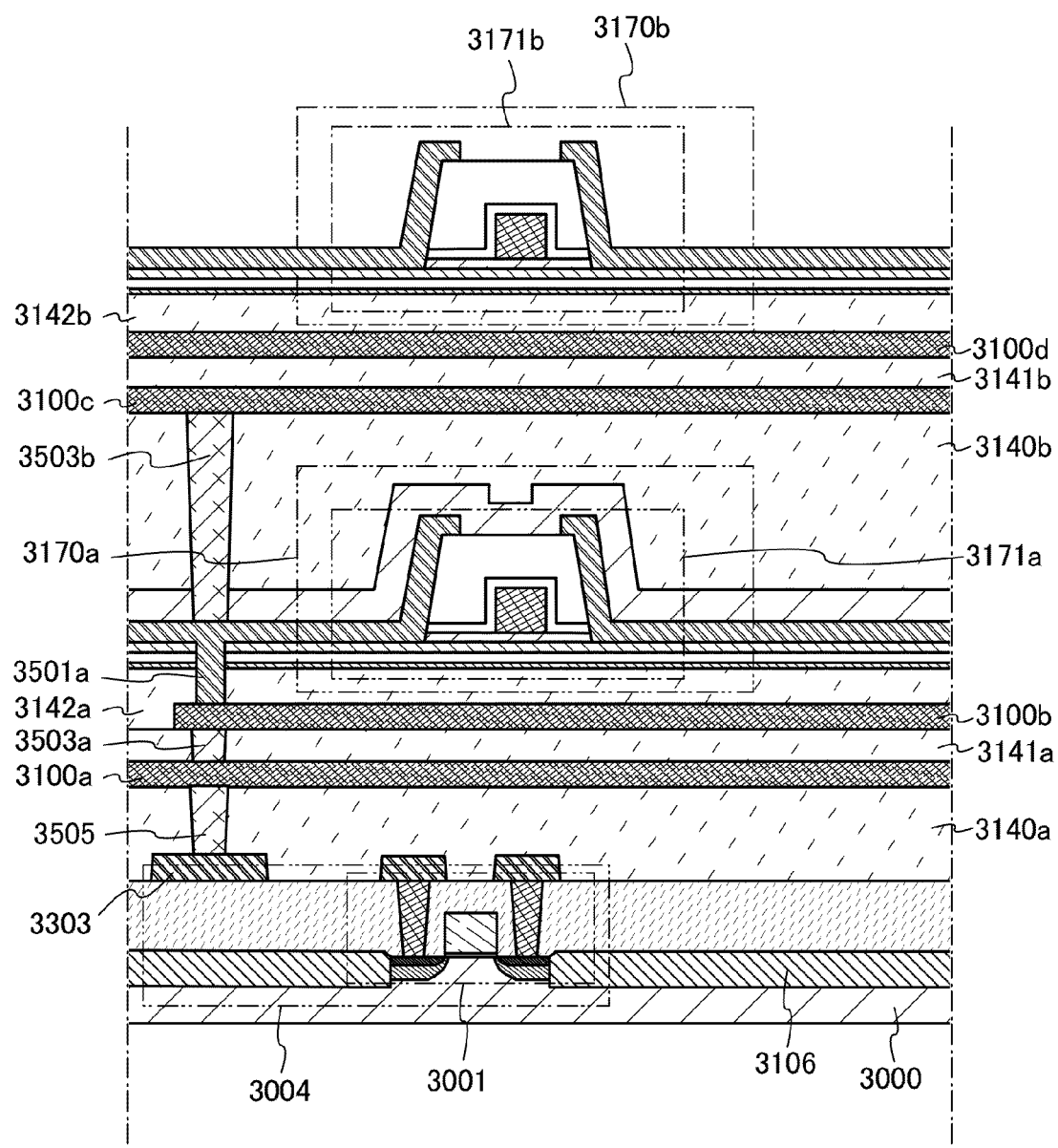
FIG. 28 is a cross-sectional view illustrating a semiconductor device.
Figure 29:
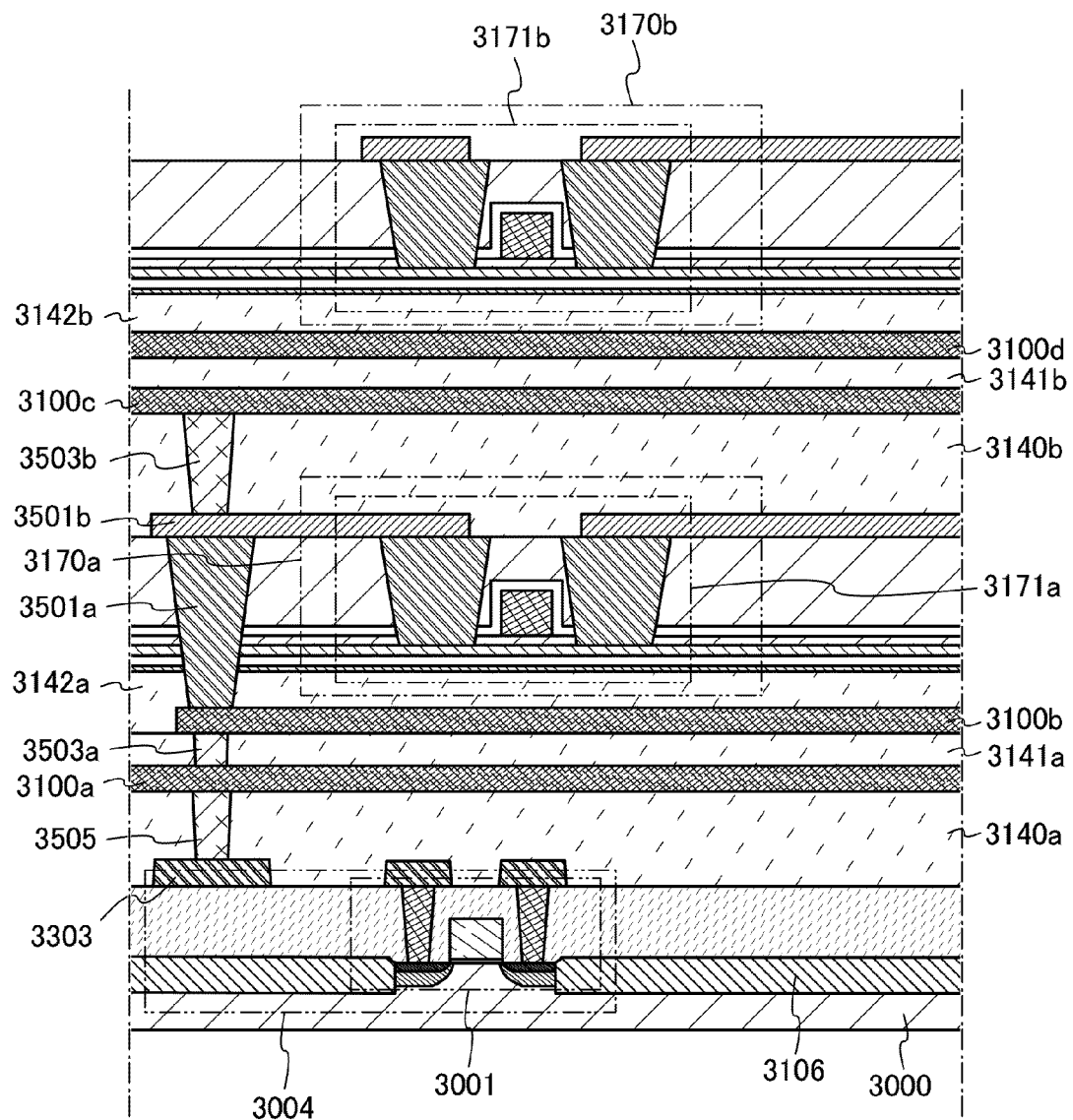
FIG. 29 is a cross-sectional view illustrating a semiconductor device.

FIG. 27, FIG. 28, and FIG. 29 are partial enlarged views of the semiconductor device illustrated in FIG. 26. Each of FIG. 27, FIG. 28, and FIG. 29 illustrates the logic circuit 3004, the memory cell array 3400*a*, and the memory cell array 3400*b*, and illustrates a memory cell 3170*a* and a memory cell 3170*b* as typical examples among the plurality of memory cells included in the memory cell array 3400*a* and the memory cell array 3400*b*. The memory cell 3170*a* and the memory cell 3170*b* can have a configuration similar to the circuit configuration described in the above embodiment, for example.

Note that a transistor 3171*a* included in the memory cell 3170*a* is illustrated as a typical example. A transistor 3171*b* included in the memory cell 3170*b* is illustrated as a typical example. Each of the transistors 3171*a* and 3171*b* includes a channel formation region in an oxide semiconductor layer. The structure of the transistor in which the channel formation region is formed in the oxide semiconductor layer is the same as the structure described in any of the other embodiments, and thus the description of the structure is omitted. Note that the transistor 3171*a* and the transistor 3171*b* employ the structure of the transistor 110 of Embodiment 4 in FIG. 27, the structure of the transistor 120 of Embodiment 5 in FIG. 28, and the structure of the transistor 130 of Embodiment 6 in FIG. 29.

Figure 30:
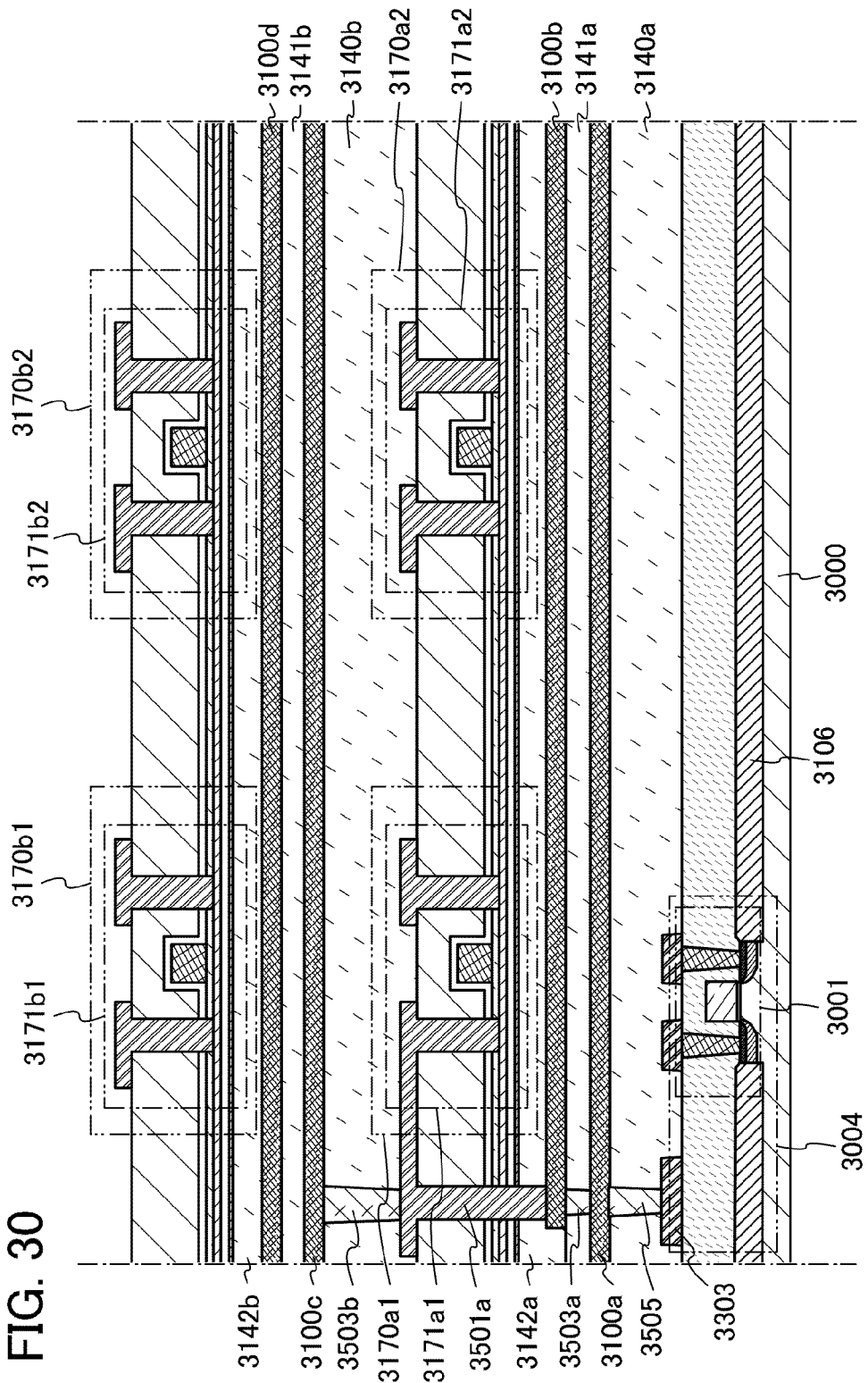
FIG. 30 is a cross-sectional view illustrating a semiconductor device.

In the semiconductor device according to this embodiment, the transistor 3171*a* included in the memory cell 3170*a* and the transistor 3171*b* included in the memory cell 3170*b* each belong to a plurality of transistors including channel formation regions in respective regions of a single oxide semiconductor layer. For example, as illustrated in FIG. 30, a transistor 3171*a*1 included in a memory cell 3170*a*1 and a transistor 3171*a*2 included in a memory cell 3170*a*2 each of which has a structure similar to that of the transistor 110 described in Embodiment 4 are provided using a single oxide semiconductor layer. Similarly, in FIG. 30, a memory cell 3171*b*1 included in a memory cell 3170*b*1 and a transistor 3171*b*2 included in a memory cell 3170*b*2 each of which has a structure similar to that of the transistor 110 described in Embodiment 4 are provided using another single oxide semiconductor layer.

Figure 31:
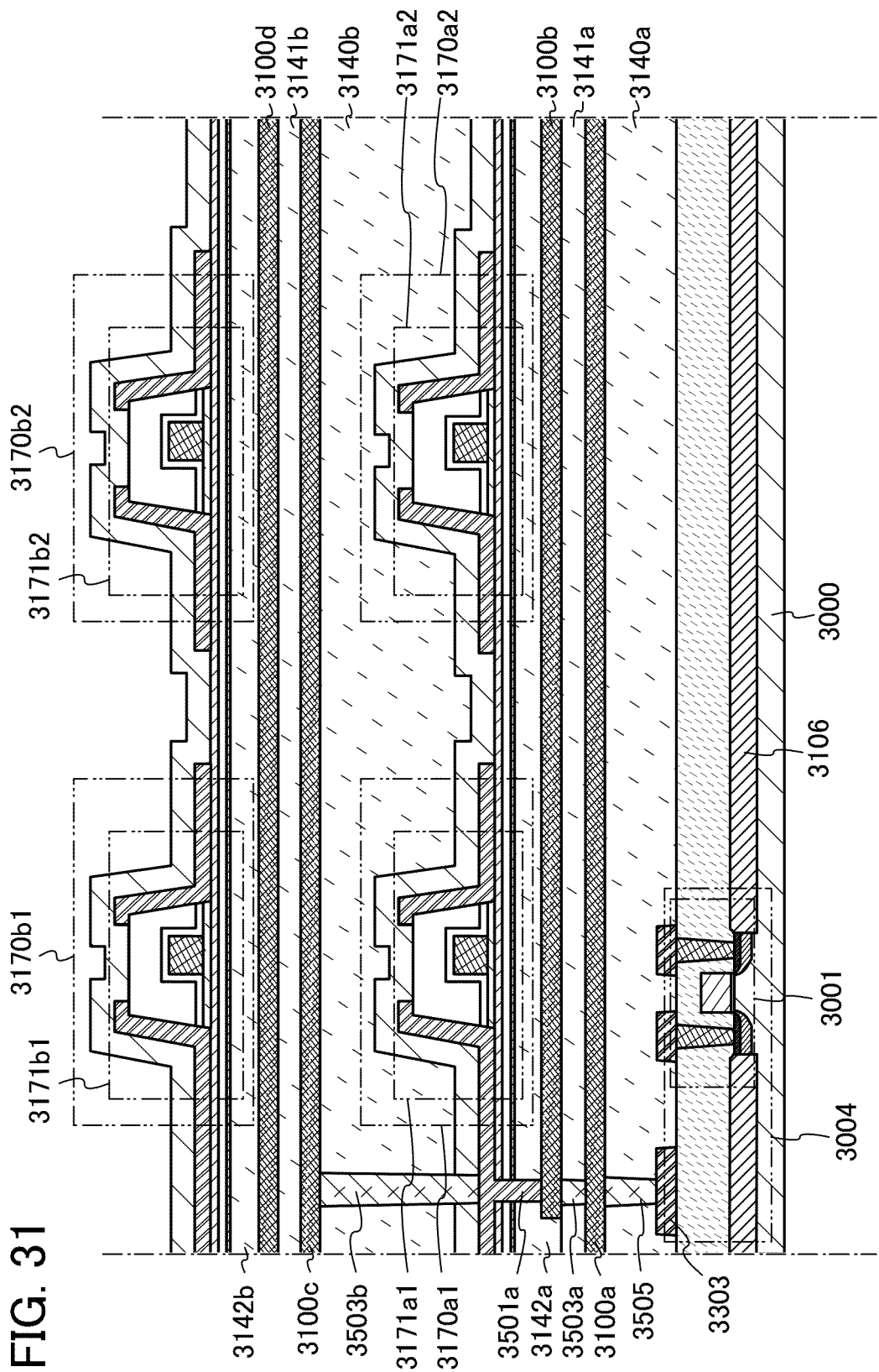
FIG. 31 is a cross-sectional view illustrating a semiconductor device.

For another example, as illustrated in FIG. 31, a transistor 3171*a*1 and a transistor 3171*a*2 each of which has a structure similar to that of the transistor 120 described in Embodiment 5 are provided using a single oxide semiconductor layer. Similarly, in FIG. 31, a memory cell 3171*b*1 and a transistor 3171*b*2 each of which has a structure similar to that of the transistor 120 described in Embodiment 5 are provided using another single oxide semiconductor layer.

Figure 32:
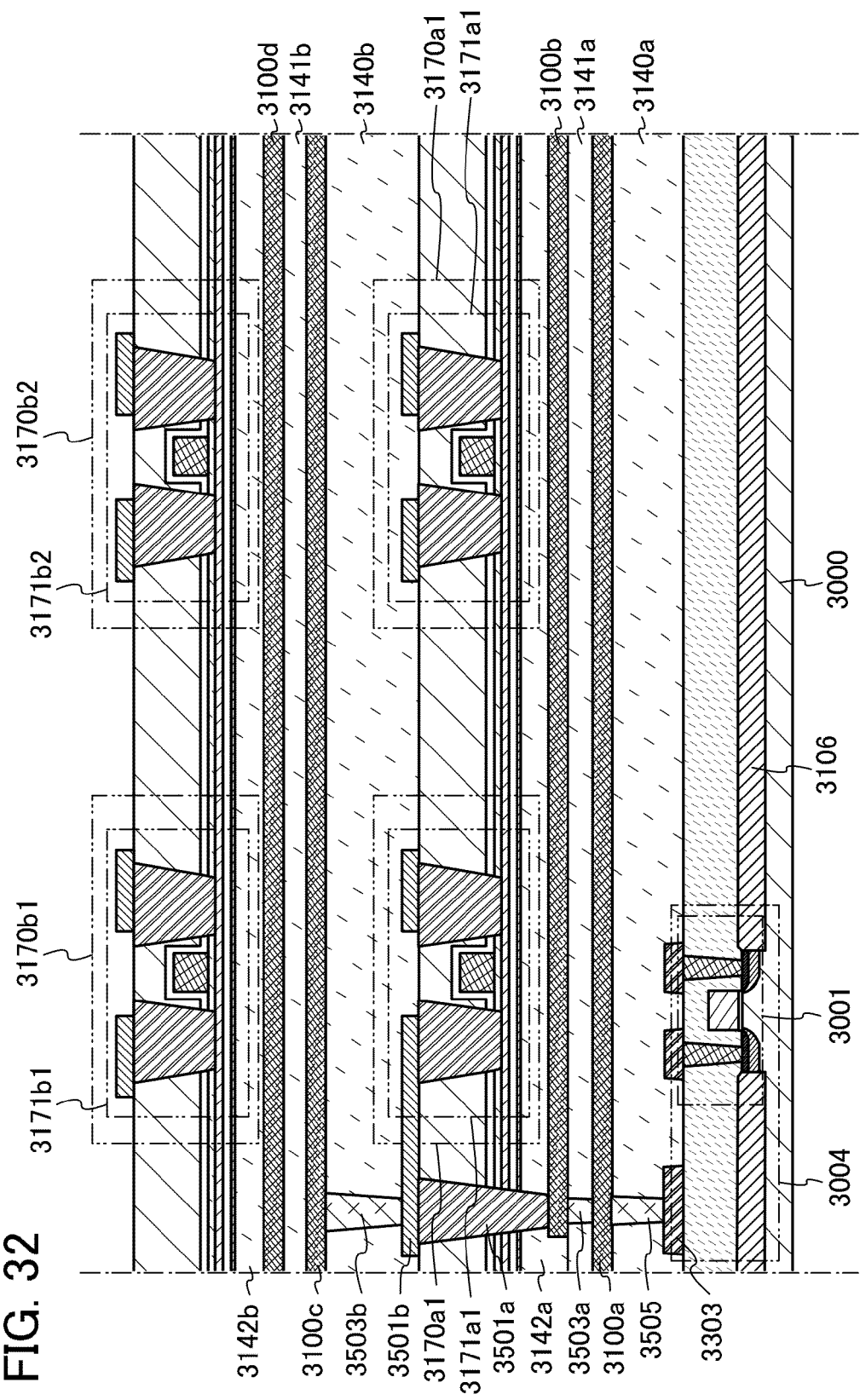
FIG. 32 is a cross-sectional view illustrating a semiconductor device.

For another example, as illustrated in FIG. 32, a transistor 3171*a*1 and a transistor 3171*a*2 each of which has a structure similar to that of the transistor 130 described in Embodiment 6 are provided using a single oxide semiconductor layer. Similarly, in FIG. 32, a memory cell 3171*b*1 and a transistor 3171*b*2 each of which has a structure similar to that of the transistor 130 described in Embodiment 6 are provided using another single oxide semiconductor layer.

Note that an oxide semiconductor layer which is formed on the entire surface of a substrate or an insulating layer and not processed into an island shape, as described above, is used as the oxide semiconductor layer of this embodiment. In the oxide semiconductor layer, a channel formation region is formed in a region between a source electrode and a drain electrode, which overlaps with a gate electrode with a gate insulating layer provided therebetween.

Further, an i-type (intrinsic) or substantially i-type oxide semiconductor is preferably used for the oxide semiconductor layer. The i-type (intrinsic) or substantially i-type oxide semiconductor has high resistance and a high insulating property. Therefore, even when the oxide semiconductor layer is not processed into an island-shaped oxide semiconductor layer, channel formation regions of a plurality of transistors can be electrically isolated from each other.

Note that a source electrode and a drain electrode of one of the plurality of transistors are electrically isolated from a source electrode and a drain electrode of another one of the plurality of transistors. Thus, the channel formation regions of the plurality of transistors are electrically isolated from each other, which enables the plurality of transistors to operate individually.

The logic circuit 3004 includes a transistor 3001 in which a semiconductor material other than an oxide semiconductor is used for a channel formation region.

Here, a "semiconductor material other than an oxide semiconductor" is equivalent to a "first semiconductor material"

(e.g., silicon) whose band gap differs from that of an oxide semiconductor, a second semiconductor material, as described in Embodiment 8. A transistor including a first semiconductor material can easily operate at high speed. On the other hand, a transistor including an oxide semiconductor, a second semiconductor material, enables charge to be held for a long time owing to its characteristics.

The transistor 3001 can be a transistor obtained in such a manner that an element isolation insulating layer 3106 is provided on a substrate 3000 including a semiconductor material (e.g., silicon) and a region serving as the channel formation region is formed in a region surrounded by the element isolation insulating layer 3106. Note that the transistor 3001 may be a transistor whose channel formation region is formed in a semiconductor layer, such as a silicon layer, formed on an insulating surface or in a silicon layer of an SOI substrate. A known structure can be used as the structure of the transistor 3001 and thus the description is omitted.

A wiring 3100a and a wiring 3100b are formed between layers in which the transistor 3171a is formed and layers in which the transistor 3001 is formed. An insulating layer 3140a is provided between the wiring 3100a and the layers in which the transistor 3001 is formed. An insulating layer 3141a is provided between the wiring 3100a and the wiring 3100b. An insulating layer 3142a is provided between the wiring 3100b and the layers in which the transistor 3171a is formed.

Similarly, a wiring 3100c and a wiring 3100d are formed between layers in which the transistor 3171b is formed and the layers in which the transistor 3171a is formed. An insulating layer 3140b is provided between the wiring 3100c and the layers in which the transistor 3171a is formed. An insulating layer 3141b is provided between the wiring 3100c and the wiring 3100d. An insulating layer 3142b is provided between the wiring 3100d and the layers in which the transistor 3171b is formed.

The insulating layers 3140a, 3141a, 3142a, 3140b, 3141b, and 3142b each function as an interlayer insulating layer whose surface can be planarized.

The wirings 3100a, 3100b, 3100c, and 3100d enable electrical connection between the memory cells, electrical connection between the logic circuit 3004 and the memory cells, and the like.

An electrode 3303 included in the logic circuit 3004 can be electrically connected to a circuit provided in the upper portion.

For example, as illustrated in FIG. 27 and FIG. 28, the electrode 3303 can be electrically connected to the wiring 3100a via an electrode 3505. The wiring 3100a can be electrically connected to the wiring 3100b via an electrode 3503a. The wiring 3100b can be electrically connected to an electrode 3501a, which is one of a source electrode and a drain electrode of the transistor 3171a. In this manner, the wiring 3100a and the electrode 3303 can be electrically connected to the source or the drain of the transistor 3171a. The electrode 3501a can be electrically connected to the wiring 3100c via an electrode 3503b.

Further, for example, as illustrated in FIG. 29, the electrode 3303 can be electrically connected to the wiring 3100a via the electrode 3505. The wiring 3100a can be electrically connected to the wiring 3100b via the electrode 3503a. The wiring 3100b can be electrically connected to the electrode 3501a, which is one of a source electrode and a drain electrode of the transistor 3171a. In this manner, the wiring 3100a and the electrode 3303 can be electrically connected to the source or the drain of the transistor 3171a. The electrode 3501a can be electrically connected to the wiring 3100c via a wiring 3501b, which is one of a source wiring and a drain wiring of the transistor 3171a, and the electrode 3503b.

Although FIG. 27, FIG. 28, and FIG. 29 each illustrate the example in which two memory cells (the memory cell 3170a and the memory cell 3170b) are stacked, the number of memory cells to be stacked is not limited thereto.

FIG. 27, FIG. 28, and FIG. 29 each illustrate an example in which the electrode 3303 and the transistor 3171a are electrically connected to each other through the wiring 3100a; however, one embodiment of the disclosed invention is not limited thereto. The electrode 3303 may be electrically connected to the transistor 3171a through the wiring 3100b, through both the wiring 3100a and the wiring 3100b, or through another electrode without using the wiring 3100a nor the wiring 3100b.

FIG. 27, FIG. 28, and FIG. 29 each illustrate the structure where two wirings, i.e., the wiring 3100a and the wiring 3100b are provided between the layers in which the transistor 3171a is formed and the layers in which the transistor 3001 is formed; however, the number of wirings provided therebetween is not limited to two. One wiring or three or more wirings may be provided between the layers in which the transistor 3171a is formed and the layers in which the transistor 3001 is formed.

FIG. 27, FIG. 28, and FIG. 29 each illustrate the structure where two wirings, i.e., the wiring 3100c and the wiring 3100d are provided between the layers in which the transistor 3171b is formed and the layers in which the transistor 3171a is formed; however, the number of wirings provided therebetween is not limited to two. One wiring or three or more wirings may be provided between the layers in which the transistor 3171b is formed and the layers in which the transistor 3171a is formed.

In this embodiment, a semiconductor device including the transistor 110 of Embodiment 4, a semiconductor device including the transistor 120 of Embodiment 5, and a semiconductor device including the transistor 130 of Embodiment 6 are described. Needless to say, it is also possible to apply any of the structures of the transistors 140 and 150 of Embodiment 6 and the transistors 160, 170, and 180 of Embodiment 7 to the transistor of this embodiment.

Described in this embodiment is a structure in which a plurality of transistors formed using an oxide semiconductor layer, which includes the second semiconductor material, is stacked over a transistor including the first semiconductor material whose band gap differs from that of the oxide semiconductor, the second semiconductor material. Channel formation regions of the plurality of transistors formed using an oxide semiconductor layer can be formed in respective regions of a single oxide semiconductor layer. Another plurality of transistors including channel formation regions in respective regions of another single oxide semiconductor layer may be further provided over the plurality of transistors including the channel formations regions in the respective regions of the single oxide semiconductor layer, with an insulating layer provided therebetween. Structures which can be applied to the transistors are described in Embodiments 4 to 7.

According to this embodiment, formation of a parasitic channel of the transistor on a side surface of the oxide semiconductor layer can be suppressed.

Further, according to this embodiment, a transistor with favorable electric characteristics can be obtained by suppressing formation of a parasitic channel.

According to one embodiment of the disclosed invention, the number of photolithography processes used for manufacturing a transistor can be reduced to less than the conventional one, so that productivity of transistors can be improved.

This embodiment can be implemented as appropriate in combination with any of the structures described in the other embodiments.

Embodiment 10

In this embodiment, one embodiment of a semiconductor device will be described with reference to FIGS. 33A and 33B. FIG. 33B is a top view of a transistor 420, and FIG. 33A is a cross-sectional view taken along X-Y in FIG. 33B.

Figure 33A:
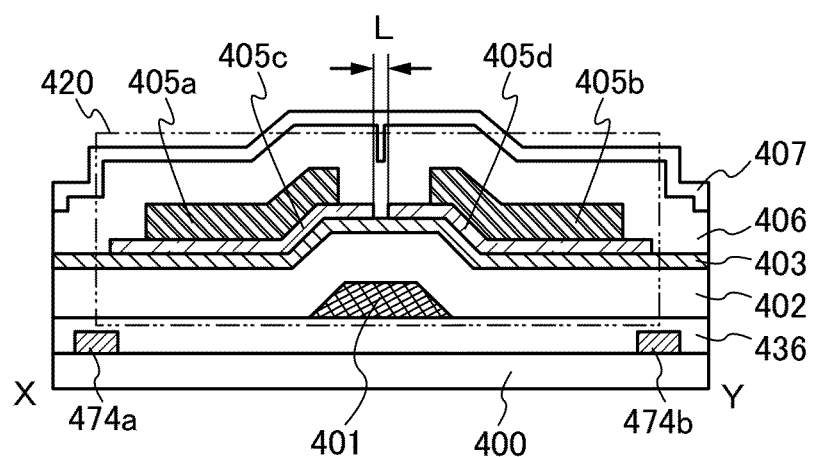
FIGS. 33A and 33B are a top view and a cross-sectional view illustrating a semiconductor device.
Figure 33B:
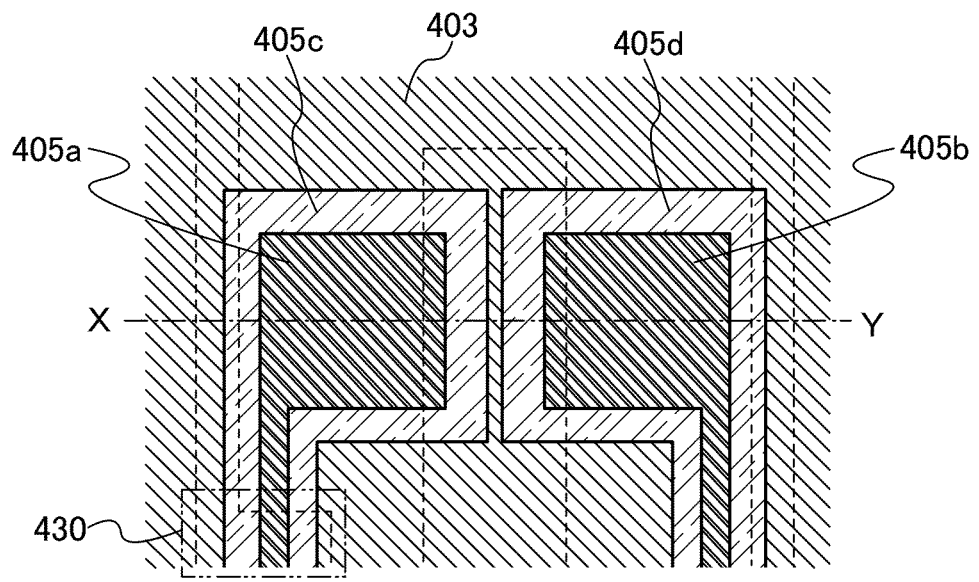

The transistor 420 illustrated in FIGS. 33A and 33B includes a base insulating layer 436 over a substrate 400, a gate electrode 401 over the base insulating layer 436, a gate insulating layer 402 over the gate electrode 401, an oxide semiconductor layer 403 over the gate electrode 401 with the gate insulating layer 402 provided therebetween, a drain electrode and a source electrode, and an insulating layer 406 and an insulating layer 407 over the oxide semiconductor layer 403.

The drain electrode includes a stack of a first barrier layer 405c and a first low-resistance material layer 405a, and the source electrode includes a stack of a second barrier layer 405d and a second low-resistance material layer 405b.

The oxide semiconductor layer 403 is not patterned.

In the base insulating layer 436, a wiring 474a and a wiring 474b are buried, and the wiring 474a and the drain electrode (the first barrier layer 405c and the first low-resistance material layer 405a) form a capacitor 430.

A region where the first barrier layer 405c and the second barrier layer 405d overlap with the first low-resistance material layer 405a and the second low-resistance material layer 405b is thicker than a region where they do not.

The base insulating layer 436 can be formed using an oxide insulating layer of silicon oxide, silicon oxynitride, aluminum oxide, aluminum oxynitride, hafnium oxide, gallium oxide, or the like, a nitride insulating layer of silicon nitride, silicon nitride oxide, aluminum nitride, aluminum nitride oxide, or the like, or a mixed material thereof. Further, the base insulating layer 436 can be formed with a single-layer structure or a stacked-layer structure including two or more layers with the use of these compounds.

The gate electrode 401 can be formed using a metal material such as molybdenum, titanium, tantalum, tungsten, aluminum, copper, chromium, neodymium, or scandium or an alloy material which contains any of these materials as its main component. Alternatively, a semiconductor typified by polycrystalline silicon doped with an impurity element such as phosphorus, or a silicide such as nickel silicide may be used for the gate electrode 401. The gate electrode 401 may have either a single-layer structure or a stacked-layer structure.

The gate electrode 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode 401 has a stacked-layer structure of the above conductive material and the above metal material.

For the gate electrode 401, a metal oxide containing nitrogen, specifically, an In—Ga—Zn-based oxide containing nitrogen, an In—Sn-based oxide containing nitrogen, an In—Ga-based oxide containing nitrogen, an In—Zn-based oxide containing nitrogen, tin oxide containing nitrogen, indium oxide containing nitrogen, or a metal nitride (InN, SnN, or the like), can be used. These materials each have a work function of 5 eV (electron volts) or higher, preferably 5.5 eV or higher, which enables the threshold voltage, which is one of electric characteristics of a transistor, to be positive when used as the gate electrode. Thus, a normally-off switching element can be obtained.

The gate insulating layer 402 can be formed using silicon oxide, gallium oxide, aluminum oxide, silicon nitride, silicon oxynitride, aluminum oxynitride, or silicon nitride oxide.

The gate insulating layer 402 can be formed using a high-k material such as hafnium oxide, yttrium oxide, hafnium silicate (HfSi$_x$O$_y$ (x>0, y>0)), hafnium silicate to which nitrogen is added (HfSiO$_x$N$_y$ (x>0, y>0)), hafnium aluminate (HfAl$_x$O$_y$ (x>0, y>0)), or lanthanum oxide, whereby gate leakage current can be reduced. Further, the gate insulating layer 402 may have either a single-layer structure or a stacked-layer structure.

The gate insulating layer 402 is formed with an insulating layer containing excess oxygen. When the gate insulating layer 402 contains excess oxygen, the oxide semiconductor layer 403 can be supplied with oxygen.

The drain electrode includes the first barrier layer 405c and the first low-resistance material layer 405a over the first barrier layer 405c. The first low-resistance material layer 405a is formed using aluminum or the like, and the first barrier layer 405c is formed using titanium, tungsten, molybdenum, titanium nitride, tantalum nitride, or the like. The first barrier layer 405c prevents the first low-resistance material layer 405a from being oxidized by being in contact with the oxide semiconductor layer 403.

The source electrode includes the second barrier layer 405d and the second low-resistance material layer 405b over the second barrier layer 405d. The second low-resistance material layer 405b is formed using aluminum or the like, and the second barrier layer 405d is formed using titanium, tungsten, molybdenum, titanium nitride, tantalum nitride, or the like. The second barrier layer 405d prevents the second low-resistance material layer 405b from being oxidized by being in contact with the oxide semiconductor layer 403.

The channel length L of the transistor 420 is determined by the gap between the first barrier layer 405c and the second barrier layer 405d, and the gap between the first barrier layer 405c and the second barrier layer 405d is determined by etching with a resist mask obtained by performing exposure to an electron beam. Precise exposure and development using an electron beam can provide a precise pattern; thus, the gap between the first barrier layer 405c and the second barrier layer 405d, i.e., the channel length L, can be less than 50 nm, e.g., 20 nm or 30 nm. At a higher acceleration voltage, an electron beam can provide a more precise pattern. The use of multiple electron beams can shorten the process time per substrate. Note that the first barrier layer 405c and the second barrier layer 405d may be formed by etching with a photomask, except in the region which determines the channel length L. Note that the first barrier layer 405c and the second barrier layer 405d have a thickness of 5 nm to 30 nm, preferably 10 nm or less.

Here, a method for creating the gap between the first barrier layer 405c and the second barrier layer 405d by etching with a resist mask formed using an electron beam will be described with reference to FIGS. 35A to 35C. Note that a more specific method for manufacturing a transistor will be described in Embodiment 11.

Figure 35A:
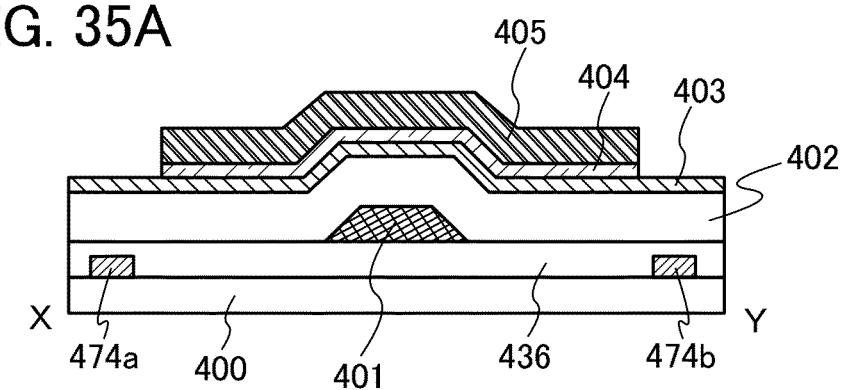
FIGS. 35A to 35C are cross-sectional views illustrating a method for manufacturing a semiconductor device.
Figure 35B:
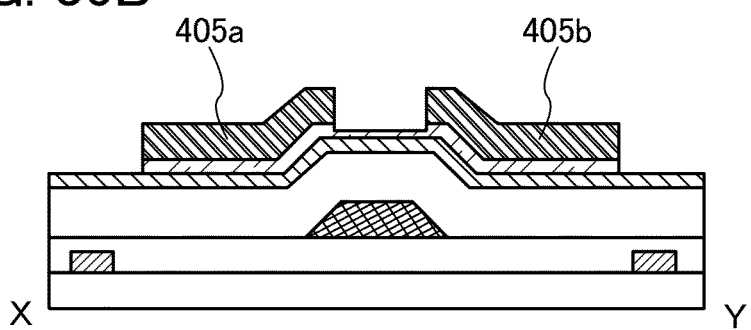
Figure 35C:
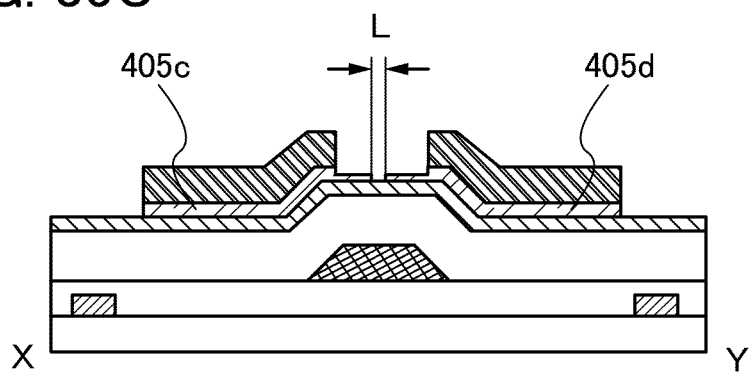

A conductive layer 404 to be processed into the first barrier layer 405c and the second barrier layer 405d and a conductive layer 405 to be processed into the first low-resistance material layer 405a and the second low-resistance material layer 405b are formed over the oxide semiconductor layer 403 (see FIG. 35A).

Next, a first resist mask is formed over the conductive layer 405 through a photolithography process, and selective etching is performed. Thus, the first low-resistance material layer 405a and the second low-resistance material layer 405b are formed (see FIG. 35B).

In some cases, together with the conductive layer 405, the conductive layer 404 may also be etched and become thinner. Therefore, it is preferable to employ etching conditions where the etching selectivity of the conductive layer 405 to the conductive layer 404 is high. High etching selectivity of the conductive layer 405 to the conductive layer 404 can suppress the etching of the conductive layer 404.

Then, a resist is formed over the conductive layer 404 and subjected to exposure to an electron beam; thus, a second resist mask is formed. The second resist mask is formed so as to overlap with a portion other than a channel region of the transistor 420. Using the second resist mask, the conductive layer 404 is etched; thus, the first barrier layer 405c and the second barrier layer 405d are formed (see FIG. 35C).

As a resist material, a siloxane-based resist, a polystyrene-based resist, or the like can be used, for example. Note that it is preferable to use a positive resist rather than a negative resist because a pattern with a small width is to be formed. For example, in the case where the width of the pattern is 30 nm, the thickness of the resist can be 30 nm.

Here, in an electron beam writing apparatus capable of electron beam irradiation, the acceleration voltage is preferably in the range from 5 kV to 50 kV, for example. The current intensity is preferably in the range from $5\times10^{-12}$ A to $1\times10^{-11}$ A. The minimum beam size is preferably 2 nm or less. The minimum possible pattern line width is preferably 8 nm or less.

Under the above conditions, a pattern with a width of 30 nm or less, preferably 20 nm or less, more preferably 8 nm or less, can be obtained, for example.

Note that the method is described here in which after the first low-resistance material layer 405a and the second low-resistance material layer 405b are formed, the resist mask is formed by exposure to an electron beam and the first barrier layer 405c and the second barrier layer 405d are formed. However, the order of forming the first and second low-resistance material layers and the first and second barrier layers is not limited thereto.

Figure 34:
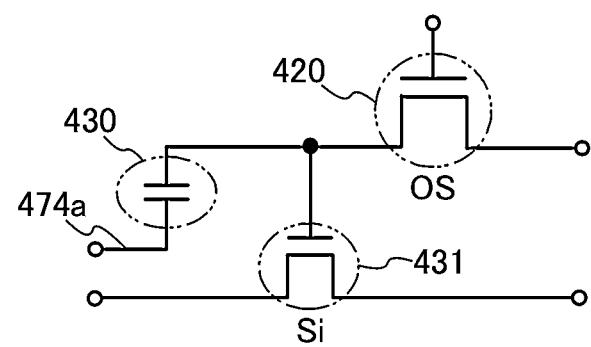
FIG. 34 is a circuit diagram illustrating a semiconductor device.

Note that the substrate 400 is provided with a semiconductor element, which is not illustrated here for simplicity. The wirings 474a and 474b and the base insulating layer 436 covering the wirings 474a and 474b are provided over the substrate 400, part of which is a component of a memory illustrated in FIG. 34. FIG. 34 illustrates an example of an equivalent circuit, showing a connection between the transistor 420 and a transistor 431 formed using the substrate 400.

The capacitor 430 illustrated in FIG. 34 has the drain electrode (the first barrier layer 405c and the first low-resistance material layer 405a) of the transistor 420 and the wiring 474a as a pair of electrodes and has the base insulating layer 436 and the gate insulating layer 402 as a dielectric.

The memory configuration illustrated in FIG. 34 has the advantages of being capable of holding stored data even when not powered and having an unlimited number of write cycles. Note that the memory configuration illustrated in FIG. 34 will be described in detail in Embodiment 12.

Any of the oxide semiconductors disclosed in the above embodiment can be used as an oxide semiconductor for the oxide semiconductor layer 403.

The oxide semiconductor layer 403 may be a stack of a plurality of oxide semiconductor films. For example, a layer including at least two of an amorphous oxide semiconductor film, a polycrystalline oxide semiconductor film, and a CAAC-OS film can be used as the oxide semiconductor layer 403.

It is also possible to use a stack of oxide semiconductor films with different compositions as the oxide semiconductor layer 403. Specifically, the oxide semiconductor layer 403 may be a layer including a first oxide semiconductor film (hereinafter also referred to as a lower layer) which is in contact with the gate insulating layer 402 and a second oxide semiconductor film (hereinafter also referred to as an upper layer) which is in contact with the insulating layer 406 and whose composition differs from that of the first oxide semiconductor film.

For example, in the case where the lower layer and the upper layer both contain indium, gallium, and zinc, concentrations are preferably set such that the indium concentration in the lower layer is higher than that in the upper layer and the gallium concentration in the upper layer is higher than that in the lower layer, or such that the indium concentration in the lower layer is higher than the gallium concentration in the lower layer and the gallium concentration in the upper layer is higher than the indium concentration in the upper layer.

Thus, it is possible to improve mobility of a transistor including the oxide semiconductor layer 403 and suppress formation of a parasitic channel in the transistor. Specifically, the mobility of the transistor can be improved by an increase in the indium concentration in the lower layer. This is because, in an oxide semiconductor, the s orbital of heavy metal mainly contributes to carrier transfer, and when the In content in the oxide semiconductor is increased, overlap of the s orbital is increased. Further, formation of a parasitic channel in the upper layer can be suppressed by suppression of oxygen release, which is achieved by an increase in the gallium concentration in the upper layer. This is because, in Ga, the formation energy of oxygen vacancies is larger and thus oxygen vacancies are less likely to occur, than in In.

The oxide semiconductor layer 403 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulse laser deposition method, an atomic layer deposition (ALD) method, or the like as appropriate. The oxide semiconductor layer 403 may be formed with a sputtering apparatus which performs deposition in the state where top surfaces of a plurality of substrates are substantially perpendicular to a top surface of a sputtering target.

The insulating layer 406 preferably contains excess oxygen, and a $SiO_x$ or silicon oxynitride layer containing much oxygen as a result of deposition under the conditions which are set as appropriate for a plasma CVD method or a sputtering method is used. In order to make the insulating layer contain much more excess oxygen, oxygen may be added as appropriate by an ion implantation method, an ion doping method, or plasma treatment.

The insulating layer 407 is a blocking layer (e.g., $AlO_x$) for suppressing release of oxygen from the oxide semiconductor layer. An aluminum oxide ($AlO_x$) layer has a high shielding effect (blocking effect) of preventing penetration of both oxygen and impurities such as hydrogen and moisture. Therefore, in and after the manufacturing process, the aluminum oxide layer functions as a protective layer for preventing entry of an impurity such as hydrogen or moisture, which causes a change in characteristics, into the oxide semiconductor layer and release of oxygen, which is a main component material of the oxide semiconductor, from the oxide semiconductor layer. Note that the insulating layer 407 can be formed by direct deposition of aluminum oxide ($AlO_x$), deposition of aluminum (Al) followed by treatment such as oxygen plasma treatment, or the like.

The channel length of the transistor described in this embodiment is determined by the gap between the first barrier layer 405c and the second barrier layer 405d, and the gap between the first barrier layer 405c and the second barrier layer 405d is determined by etching with a resist mask obtained by exposure to an electron beam. Precise exposure and development using an electron beam can provide a precise pattern; thus, a minute transistor with a channel length L of less than 50 nm can be manufactured.

Further, in this embodiment, a transistor is formed using the oxide semiconductor layer 403 which is not patterned. Accordingly, a step needed for patterning of an oxide semiconductor layer in a process for manufacturing the transistor is not needed. Thus, manufacturing cost of the transistor can be reduced and yield can be increased.

Moreover, in the transistor formed using the oxide semiconductor layer 403 which is not patterned, the source electrode and the drain electrode are not electrically connected to each other through regions in the vicinities of side surfaces (end surfaces) of the oxide semiconductor layer. That is, formation of a parasitic channel in the transistor can be suppressed.

The structure of the transistor described in this embodiment is effective particularly when a CAAC-OS is used for the oxide semiconductor layer 403. This is because oxygen is easily released from a side surface (an end surface) of an oxide semiconductor layer formed using a CAAC-OS. Note that this point is described below in detail in reference example.

In this embodiment, a transistor formed using the oxide semiconductor layer 403 which is not patterned at all is described; however, formation of a parasitic channel can be suppressed even in a transistor having a structure different from this structure. Specifically, formation of a parasitic channel can be suppressed as long as an oxide semiconductor layer is not patterned in a channel width direction (a direction perpendicular to line X-Y in FIG. 33B) of a transistor (an oxide semiconductor layer extends in a channel width direction). In other words, formation of a parasitic channel is suppressed in some cases in an oxide semiconductor layer patterned in a channel length direction (a direction parallel to line X-Y in FIG. 33B) of a transistor.

The methods, structures, and the like described in this embodiment can be combined as appropriate with any of the methods, structures, and the like described in the other embodiments.

Embodiment 11

In this embodiment, a semiconductor device of another embodiment, which is different from the semiconductor device described in Embodiment 10, and a method for manufacturing the semiconductor device will be described.

Figure 36A:
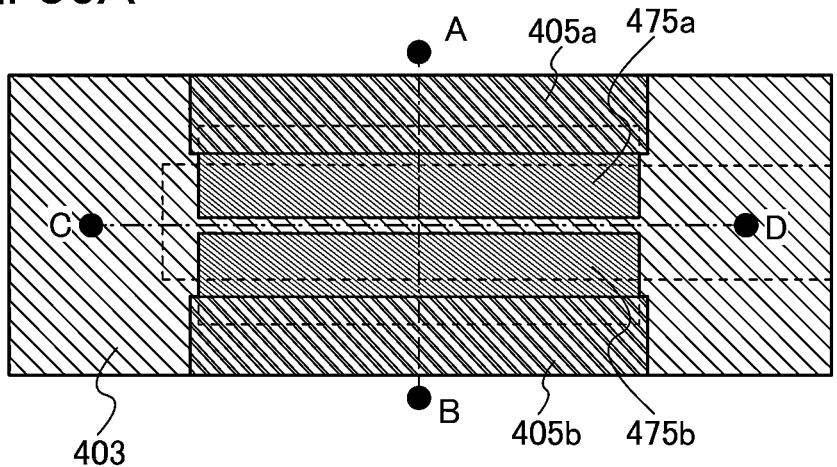
FIGS. 36A to 36C are a top view and cross-sectional views illustrating a semiconductor device.
Figure 36B:
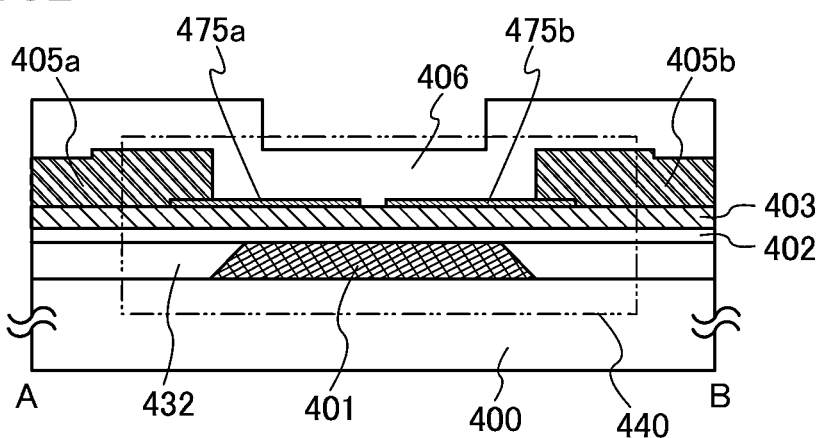
Figure 36C:
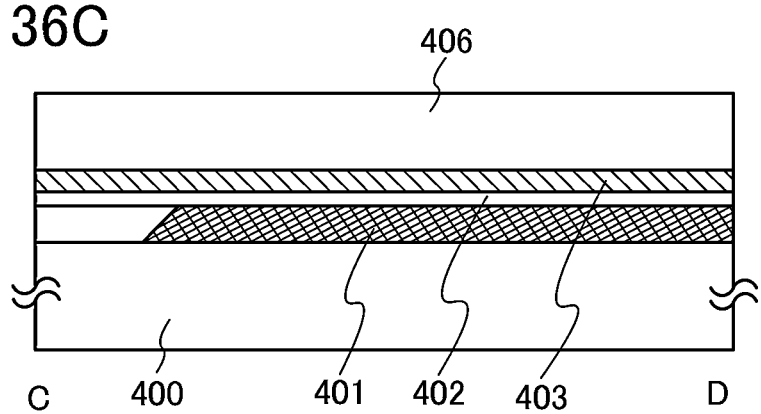

FIGS. 36A to 36C illustrate the semiconductor device of this embodiment. FIG. 36A is a top view of a transistor included in the semiconductor device of this embodiment. FIG. 36B is a cross-sectional view taken along A-B (channel length direction) in FIG. 36A. FIG. 36C is a cross-sectional view taken along C-D in FIG. 36A. Note that some components illustrated in FIG. 36B or 36C are not illustrated in FIG. 36A for simplicity of the drawing.

Note that, in this embodiment, portions that are similar to the portions in Embodiment 10 are denoted by the same reference numerals in the drawings, and detailed description thereof is omitted.

A transistor 440 illustrated in FIGS. 36A to 36C includes the gate electrode 401 over the substrate 400, an insulating layer 432 which is in contact with a side surface of the gate electrode 401 and in which the gate electrode 401 is buried, the gate insulating layer 402 over the insulating layer 432 and the gate electrode 401, the oxide semiconductor layer 403 over the gate insulating layer 402, a source electrode and a drain electrode over the oxide semiconductor layer 403, and the insulating layer 406 over the oxide semiconductor layer 403, the source electrode, and the drain electrode.

The drain electrode includes a first barrier layer 475a and the first low-resistance material layer 405a in contact with the first barrier layer 475a. The source electrode includes a second barrier layer 475b and the second low-resistance material layer 405b in contact with the second barrier layer 475b. The first barrier layer 475a and the second barrier layer 475b prevent the first low-resistance material layer 405a and the second low-resistance material layer 405b, respectively, from being oxidized by being in contact with the oxide semiconductor layer 403.

The oxide semiconductor layer 403 is not patterned.

The gap between the first barrier layer 475a and the second barrier layer 475b is determined with a resist mask obtained by exposure to an electron beam. Precise exposure and development using an electron beam can provide a precise pattern.

The channel length of the transistor 440 is equal to the gap between the first barrier layer 475a and the second barrier layer 475b; thus, a minute transistor whose channel length can be determined precisely can be obtained.

An example of a method for manufacturing the semiconductor device including the transistor 440 is illustrated in FIGS. 37A1 to 37A3, 37B1 to 37B3, and 37C1 to 37C3, FIGS. 38A1 to 38A3, 38B1 to 38B3, and 38C1 to 38C3, FIGS. 39A1 to 39A3, 39B1 to 39B3, and 39C1 to 39C3, and FIGS. 40A1 to 40A3, 40B1 to 40B3, and 40C1 to 40C3.

Note that FIG. 37A3 is a top view for explaining a process for manufacturing the transistor. FIG. 37A1 is a cross-sectional view taken along A-B in FIG. 37A3. FIG. 37A2 is a cross-sectional view taken long C-D in FIG. 37A3. In the following description, FIG. 37A refers to FIGS. 37A1 to 37A3. The same applies to FIGS. 37B to 40C.

First, a conductive layer is formed over the substrate 400 and is etched; thus, the gate electrode 401 is formed. The etching of the conductive layer may be performed by dry etching, wet etching, or both dry etching and wet etching.

Note that, as in the transistor described in Embodiment 10, the substrate 400 is provided with a semiconductor element, a wiring, the base insulating layer 436 covering the wiring, and the like, which are not illustrated here for simplicity. There is no particular limitation on a substrate that can be used as the substrate 400 as long as it has heat resistance high enough to withstand heat treatment performed later. For example, a single crystal semiconductor substrate or a polycrystalline semiconductor substrate of silicon, silicon carbide, or the like; a compound semiconductor substrate of silicon germanium or the like; an SOI substrate; or the like can be used. Alternatively, a glass substrate of barium borosilicate glass, aluminoborosilicate glass, or the like, a ceramic substrate, a quartz substrate, a sapphire substrate, or the like can be used.

The semiconductor device may be manufactured using a flexible substrate as the substrate 400. In order to manufacture a flexible semiconductor device, the transistor 440 may be directly formed over a flexible substrate. Alternatively, the transistor 440 may be formed over a formation substrate, and then, the transistor 440 may be separated and transferred to a flexible substrate. Note that in order to separate the transistor 440 from the formation substrate and transfer it to the flexible substrate, a separation layer may be provided between the formation substrate and the transistor 440.

The substrate 400 (or the substrate 400 and the base film, wiring, and the like) may be subjected to heat treatment. For example, the heat treatment may be performed with a gas rapid thermal annealing (GRTA) apparatus, in which heat treatment is performed using a high-temperature gas, at 650° C. for 1 minute to 5 minutes. As the high-temperature gas for GRTA, an inert gas which does not react with an object to be processed by heat treatment, such as nitrogen or a rare gas like argon, is used. Alternatively, the heat treatment may be performed with an electric furnace at 500° C. for 30 minutes to one hour.

After the formation of the gate electrode 401, the substrate 400 and the gate electrode 401 may be subjected to heat treatment. For example, the heat treatment may be performed with a GRTA apparatus at 650° C. for 1 minute to 5 minutes. Alternatively, the heat treatment may be performed with an electric furnace at 500° C. for 30 minutes to one hour.

Next, an insulating layer to be processed into the insulating layer 432 is formed so as to cover the gate electrode 401 and the substrate 400. The insulating layer can be formed by a sputtering method, an MBE method, a CVD method, a pulsed laser deposition method, an ALD method, or the like as appropriate.

The insulating layer can be formed using a material and a method similar to those for the base insulating layer 436.

Next, the insulating layer is subjected to polishing treatment (e.g., chemical mechanical polishing (CMP) treatment) or etching treatment, so that the upper surface of the gate electrode 401 becomes exposed and not covered with the insulating layer. Thus, the insulating layer 432 whose upper surface is at the same height as the upper surface of the gate electrode 401 is formed (see FIG. 37A). The polishing treatment or etching treatment may be performed plural times, or these treatments may be performed in combination. When the polishing treatment and etching treatment are performed in combination, there is no particular limitation on the order of the steps.

When the insulating layer 432 is provided, the coverage of the gate electrode 401 with the gate insulating layer 402 can be improved. In addition, a surface on which a resist mask is to be formed in a later step through exposure to an electron beam can be flat; thus, the resist mask can be formed thin.

Note that in this embodiment, the method is described in which the insulating layer 432 is formed after the gate electrode 401 is formed; however, a method for forming the gate electrode 401 and the insulating layer 432 is not limited thereto. For example, the gate electrode 401 may be formed as follows: the insulating layer 432 is provided over the substrate 400, an opening is formed in the insulating layer 432 by an etching step or the like, and the opening is filled with a conductive material.

Next, the gate insulating layer 402 is formed over the gate electrode 401 and the insulating layer 432 (see FIG. 37B).

The gate insulating layer 402 has a thickness of 1 nm to 300 nm and can be formed by a CVD method using a deposition gas. As a CVD method, an LPCVD method, a plasma CVD method, or the like can be used, and as another method, a coating film or the like can also be used.

In this embodiment, as the gate insulating layer 402, a silicon oxynitride layer having a thickness of 200 nm is formed by a plasma CVD method. For example, the gate insulating layer 402 may be formed under the conditions where the gas flow rate ratio of $SiH_4$ to $N_2O$ is $SiH_4:N_2O=4$ sccm:800 sccm, the pressure is 40 Pa, the RF power (power output) is 50 W, and the substrate temperature is 350° C.

The gate insulating layer 402 may be subjected to heat treatment for dehydration or dehydrogenation treatment.

The temperature of the heat treatment is higher than or equal to 300° C. and lower than or equal to 700° C., or lower than the strain point of a substrate. The temperature of the heat treatment is preferably higher than the film formation temperature of the gate insulating layer 402, in which case dehydration or dehydrogenation becomes more effective. For example, the substrate is put in an electric furnace which is one of heat treatment apparatuses, and the gate insulating layer 402 is subjected to heat treatment at 450° C. for one hour in vacuum.

Note that a heat treatment apparatus is not limited to an electric furnace, and a device for heating an object to be processed by heat conduction or heat radiation from a heating element such as a resistance heating element may alternatively be used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the high-temperature gas, an inert gas that does not react with an object to be processed by heat treatment, for example, nitrogen or a rare gas such as argon, is used.

For example, as the heat treatment, GRTA may be performed as follows. The substrate is put in an inert gas heated at high temperature of 650° C. to 700° C., heated for several minutes, and taken out of the inert gas.

The heat treatment may be performed under reduced pressure (vacuum), in a nitrogen atmosphere, or in a rare gas atmosphere. It is preferable that water, hydrogen, and the like be not contained in the atmosphere of nitrogen, a rare gas, or the like. The purity of nitrogen or the rare gas which is introduced into the heat treatment apparatus is preferably 6N (99.9999%) or higher, further preferably 7N (99.99999%) or higher (that is, the impurity concentration is preferably 1 ppm or lower, further preferably 0.1 ppm or lower).

With the heat treatment, the gate insulating layer 402 can be dehydrated or dehydrogenated, whereby the gate insulating layer 402 from which impurities such as hydrogen or water, which cause a change in characteristics of a transistor, are removed can be formed.

In the heat treatment for dehydration or dehydrogenation treatment, it is preferable that a surface of the gate insulating layer 402 be not in a state where hydrogen, water, or the like is prevented from being released (for example, in a state where a film or the like which prevents penetration of (or blocks) hydrogen, water, or the like is provided), but in a state where the surface of the gate insulating layer 402 is exposed.

The heat treatment for dehydration or dehydrogenation may be performed plural times, and may also serve as another heat treatment.

Planarization treatment may be performed on the gate insulating layer 402. The planarization treatment may be, but not particularly limited to, a polishing treatment (such as chemical mechanical polishing (CMP)), dry etching treatment, or plasma treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particle or dust) attached to the surface of the gate insulating layer 402.

As the planarization treatment, polishing treatment, dry etching treatment, or plasma treatment may be performed plural times, or these treatments may be performed in combination. In the case where the treatments are combined, the order of the steps is not particularly limited and may be set as appropriate depending on the roughness of the surface of the gate insulating layer 402.

Next, the oxide semiconductor layer 403 is formed in a film shape over the gate insulating layer 402.

The oxide semiconductor layer 403 is preferably formed under a condition such that much oxygen is contained (for example, by a sputtering method in an atmosphere where the proportion of oxygen is 100%) so as to be a film containing much oxygen (preferably including a region containing oxygen in excess of the stoichiometric composition of the oxide semiconductor in a crystalline state).

Note that in this embodiment, as the oxide semiconductor layer 403, an In—Ga—Zn-based oxide (IGZO) layer with a thickness of 35 nm is formed by a sputtering method with a sputtering apparatus including an AC power supply device. In this embodiment, an In—Ga—Zn-based oxide target having an atomic ratio of In:Ga:Zn=1:1:1 (=1/3:1/3:1/3) is used. The deposition conditions are as follows: the atmosphere is oxygen and argon (the proportion of the oxygen flow rate is 50%), the pressure is 0.6 Pa, the electric power is 5 kW, and the substrate temperature is 170° C. The deposition rate under these deposition conditions is 16 nm/min.

It is preferable to use a high-purity gas from which impurities such as hydrogen, water, a hydroxyl group, or hydride are removed as a sputtering gas used when the oxide semiconductor layer 403 is formed.

The substrate is held in a deposition chamber kept under reduced pressure. Then a sputtering gas from which hydrogen and moisture are removed is introduced while moisture remaining in the deposition chamber is removed, and the oxide semiconductor layer 403 is formed over the substrate 400 with the use of the above target. In order to remove moisture remaining in the deposition chamber, an entrapment vacuum pump such as a cryopump, an ion pump, or a titanium sublimation pump is preferably used. As an evacuation unit, a turbo molecular pump provided with a cold trap may be used. In the deposition chamber which is evacuated with a cryopump, a hydrogen atom, a compound containing a hydrogen atom such as water ($H_2O$) (more preferably, also a compound containing a carbon atom), and the like are removed, whereby the impurity concentration in the oxide semiconductor layer 403 formed in the deposition chamber can be reduced.

The gate insulating layer 402 and the oxide semiconductor layer 403 are preferably formed successively without exposing the gate insulating layer 402 to the air. The successive formation of the gate insulating layer 402 and the oxide semiconductor layer 403 without exposing the gate insulating layer 402 to air can prevent impurities such as hydrogen or moisture from adsorbing onto the surface of the gate insulating layer 402.

Then, the oxide semiconductor layer 403 and the gate insulating layer 402 are subjected to oxygen doping treatment (see FIG. 37C). By the oxygen doping treatment of the gate insulating layer 402, oxygen 451 is supplied to the oxide semiconductor layer 403 and the gate insulating layer 402, so that oxygen is contained in the oxide semiconductor layer 403 and the gate insulating layer 402, and in the vicinity of the interface between the oxide semiconductor layer 403 and the gate insulating layer 402.

The doping with oxygen (an oxygen radical, an oxygen atom, an oxygen molecule, ozone, an oxygen ion (an oxygen molecular ion), and/or an oxygen cluster ion) can be performed by an ion implantation method, an ion doping method, a plasma immersion ion implantation method, plasma treatment, or the like. For the ion implantation method, a gas cluster ion beam may be used. The oxygen doping treatment may be performed on the entire surface at one time or may be performed by moving a linear ion beam or the like (scanning the substrate with a linear ion beam or the like).

For example, oxygen (an oxygen radical, an oxygen atom, an oxygen molecule, ozone, an oxygen ion (an oxygen molecular ion) and/or an oxygen cluster ion) for the doping may be supplied from a plasma generating apparatus with use of a gas containing oxygen or from an ozone generating apparatus. Specifically, for example, the oxygen 451 can be generated with an apparatus for etching treatment on a semiconductor device, an apparatus for ashing on a resist mask, or the like to process the oxide semiconductor layer 403 and the gate insulating layer 402.

A gas containing oxygen can be used for the oxygen doping treatment. As a gas containing oxygen, oxygen, dinitrogen monoxide, nitrogen dioxide, carbon dioxide, carbon monoxide, or the like can be used. Alternatively, a rare gas can be used for the oxygen doping treatment.

For example, in the case where oxygen ions are implanted by an ion implantation method as the doping treatment with the oxygen 451, the dose may be greater than or equal to $1 \times 10^{13}$ ions/cm$^2$ and less than or equal to $5 \times 10^{16}$ ions/cm$^2$.

Since the gate insulating layer 402 in contact with the oxide semiconductor layer 403 contains much (excess) oxygen which serves as an oxygen supply source, oxygen can be supplied from the gate insulating layer 402 to the oxide semiconductor layer 403.

As a method for supplying oxygen from the gate insulating layer 402 to the oxide semiconductor layer 403, heat treatment is performed in a state where the oxide semiconductor layer 403 and the gate insulating layer 402 are in contact with each other. By the heat treatment, oxygen can be effectively supplied from the gate insulating layer 402 to the oxide semiconductor layer 403.

Note that, by heat treatment for supplying oxygen from the gate insulating layer 402 to the oxide semiconductor layer 403 performed without processing the oxide semiconductor layer 403 into an island shape, oxygen contained in the gate insulating layer 402 can be prevented from being released by the heat treatment.

By the supply of oxygen to the oxide semiconductor layer 403, oxygen vacancies in the oxide semiconductor layer 403 can be filled.

Then, a conductive layer 475 is formed over the oxide semiconductor layer 403 (see FIG. 38A).

The conductive layer 475 is to be processed into the first barrier layer 475a and the second barrier layer 475b, which are one layer of the drain electrode and one layer of the source electrode, respectively.

As the conductive layer 475, it is possible to use, for example, a metal layer containing an element selected from Al, Cr, Cu, Ta, Ti, Mo, and W, a metal nitride layer containing any of these elements as its component (a titanium nitride layer, a molybdenum nitride layer, or a tungsten nitride layer), or the like. A metal layer of a refractory metal such as Ti, Mo, or W or a metal nitride layer of any of these elements (a titanium nitride layer, a molybdenum nitride layer, or a tungsten nitride layer) may be stacked on one of or both a lower side and an upper side of a metal layer of Al, Cu, or the like. Further, the conductive layer 475 may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

Then, a resist is formed over the conductive layer 475 and subjected to exposure to an electron beam; thus, a resist mask 453 is formed (see FIG. 38B). The resist mask 453 is formed so as to overlap with a portion other than a channel region of the transistor 440.

A method for forming a resist mask by exposure to an electron beam is described in detail in Embodiment 10, and therefore the description is omitted here. Note that in Embodiment 10, the method is described in which after the first low-resistance material layer 405a and the second low-resistance material layer 405b are formed, the resist mask is formed by exposure to an electron beam and the first barrier layer 405c and the second barrier layer 405d are formed by etching with the mask. In Embodiment 11, a method is described in which the first barrier layer 475a and the second barrier layer 475b are formed earlier.

For the exposure to an electron beam, it is preferable that the resist mask 453 be as thin as possible. In order to form the resist mask 453 thin, it is preferable that a surface on which the resist mask is formed be as flat as possible. In the method for manufacturing the semiconductor device of this embodiment, the unevenness due to the gate electrode 401 and the insulating layer 432 can be reduced by planarization treatment of the gate electrode 401 and the insulating layer 432; thus, the resist mask can be thin. This facilitates the exposure to an electron beam.

Next, the conductive layer 475 is selectively etched using the resist mask 453 as a mask; thus, an opening is formed in a region where a channel is formed (see FIG. 38C). Here, the region from which the conductive layer 475 has been removed serves as a channel formation region of the transistor 440. Since the channel length can be determined by the exposure to an electron beam, a transistor with a small channel length, e.g., a channel length of less than 50 nm, can be manufactured.

At that time, it is preferable to employ etching conditions where the etching selectivity of the conductive layer 475 to the resist mask 453 is high. For example, it is preferable to employ dry etching using a mixed gas of $Cl_2$ and HBr as an etching gas with the flow rate of HBr higher than the flow rate of $Cl_2$. For example, it is preferable that the flow rate ratio be $Cl_2$:HBr=20:80. In the case of etching with inductively coupled plasma (also referred to as ICP etching) with an ICP power of 500 W, the etching selectivity of the conductive layer 475 to the resist mask 453 can be high when the bias power is set to 30 W to 40 W.

Then, a resist mask 455 is provided over the oxide semiconductor layer 403 and the conductive layer 475 through a photolithography process (see FIG. 39A).

Note that the resist mask 455 may be formed by an inkjet method. Formation of the resist mask by an inkjet method needs no photomask; thus, manufacturing cost can be reduced.

Then, the conductive layer 475 is etched using the resist mask 455. Thus, the first barrier layer 475a having an island shape and the second barrier layer 475b having an island shape are formed (see FIG. 39B).

For the etching of the conductive layer 475, a gas containing chlorine, for example, a gas containing chlorine ($Cl_2$), boron trichloride ($BCl_3$), silicon tetrachloride ($SiCl_4$), or carbon tetrachloride ($CCl_4$) can be used. Alternatively, a gas containing fluorine, for example, a gas containing carbon tetrafluoride ($CF_4$), sulfur hexafluoride ($SF_6$), nitrogen trifluoride ($NF_3$), or trifluoromethane ($CHF_3$) can be used. Alternatively, any of these gases to which a rare gas such as helium (He) or argon (Ar) is added, or the like can be used.

As the etching method, a parallel plate reactive ion etching (RIE) method or an inductively coupled plasma (ICP) etching method can be used. In order to etch the layer into a desired shape, etching conditions (the amount of electric power applied to a coil-shaped electrode, the amount of electric power applied to an electrode on a substrate side, the temperature of the electrode on the substrate side, or the like) are adjusted as appropriate.

In this embodiment, a titanium film is used as the conductive layer 475. The conductive layer is etched by a dry etching method; thus, the first barrier layer 475a and the second barrier layer 475b are formed.

Note that it is preferable that etching conditions be optimized such that the oxide semiconductor layer 403 is not divided by being etched when the conductive layer 475 is etched. However, it is difficult to obtain etching conditions in which only the conductive layer 475 is etched and the oxide semiconductor layer 403 is not etched at all. In some cases, the oxide semiconductor layer 403 is partly etched to be an oxide semiconductor layer having a groove portion (a recessed portion) when the conductive layer 475 is etched.

The first barrier layer 475a and the second barrier layer 475b can be formed using a layer including a material similar to that for the first barrier layer 405c and the second barrier layer 405d illustrated in FIGS. 33A and 33B.

Note that the first barrier layer 475a and the second barrier layer 475b are thinner than the first low-resistance material layer 405a and the second low-resistance material layer 405b, which are formed later; however, the present invention is not limited thereto. The first barrier layer 475a and the second barrier layer 475b are formed using the resist mask which is formed by the electron beam exposure, and are therefore preferably thin in terms of the manufacturing process. In addition, when the first low-resistance material layer 405a and the second low-resistance material layer 405b are formed thick, the resistance of the source electrode and the drain electrode can be lowered.

The gap between the first barrier layer 475a and the second barrier layer 475b is narrower than the gap between the first low-resistance material layer 405a and the second low-resistance material layer 405b, which are formed later. In particular, when the first barrier layer 475a and the second barrier layer 475b have higher resistance than the first low-resistance material layer 405a and the second low-resistance material layer 405b, the resistance between the source electrode, the oxide semiconductor layer 403, and the drain electrode can be lowered by decreasing the gap between the first barrier layer 475a and the second barrier layer 475b.

Next, the resist mask 455 is removed, and then a conductive layer 452 is formed over the oxide semiconductor layer 403, the first barrier layer 475a, and the second barrier layer 475b (see FIG. 39C).

The conductive layer 452 is to be processed into the first low-resistance material layer 405a and the second low-resistance material layer 405b.

A resist mask 456 is formed over the conductive layer 452 through a photolithography process (see FIG. 40A), and selective etching is performed. Thus, the first low-resistance material layer 405a and the second low-resistance material layer 405b are formed. After the first low-resistance material layer 405a and the second low-resistance material layer 405b are formed, the resist mask 456 is removed (see FIG. 40B).

The first barrier layer 475a and the first low-resistance material layer 405a function as the source electrode of the transistor 440. The second barrier layer 475b and the second low-resistance material layer 405b function as the drain electrode of the transistor 440.

The conductive layer 452 can be etched under conditions similar to those for the etching of the conductive layer 475.

Through the above-described process, the transistor 440 of this embodiment can be manufactured.

In this embodiment, the insulating layer 406 is formed over the stacked source electrode, the stacked drain electrode, and the oxide semiconductor layer 403 (see FIG. 40C).

As the insulating layer 406, a single layer or a stack of one or more inorganic insulating materials, typical examples of which are silicon oxide, silicon oxynitride, aluminum oxide, aluminum oxynitride, hafnium oxide, gallium oxide, silicon nitride, aluminum nitride, silicon nitride oxide, and aluminum nitride oxide, can be used.

Note that the insulating layer 406 may be subjected to oxygen doping treatment. When the insulating layer 406 is subjected to the oxygen doping treatment, the oxide semiconductor layer 403 can be supplied with oxygen. The oxygen doping of the insulating layer 406 can be similar to the above-described oxygen doping treatment of the gate insulating layer 402 and the oxide semiconductor layer 403.

Further, a dense inorganic insulating layer may be provided over the insulating layer 406. For example, an aluminum oxide layer is formed over the insulating layer 406 by a sputtering method. When the aluminum oxide layer has high density (the film density is higher than or equal to 3.2 g/cm$^3$, preferably higher than or equal to 3.6 g/cm$^3$), the transistor 440 can have stable electric characteristics. The film density can be measured by Rutherford backscattering spectrometry (RBS) or X-ray reflection (XRR).

The aluminum oxide layer which can be used as the insulating layer provided over the transistor 440 has a high shielding effect (blocking effect) of preventing penetration of both oxygen and impurities such as hydrogen and moisture.

Therefore, in and after the manufacturing process, the aluminum oxide layer functions as a protective layer for preventing entry of an impurity such as hydrogen or moisture, which causes a change in characteristics, into the oxide semiconductor layer 403 and release of oxygen, which is a main component material of the oxide semiconductor, from the oxide semiconductor layer 403.

In addition, a planarization insulating layer may be formed in order to reduce surface unevenness due to the transistor 440. For the planarization insulating layer, an organic material such as a polyimide-based resin, an acrylic-based resin, or a benzocyclobutene-based resin can be used. Other than such organic materials, it is also possible to use a low-dielectric constant material (a low-k material) or the like. Note that the planarization insulating layer may be formed by stacking a plurality of insulating layers formed using any of these materials.

For example, a 1500-nm-thick acrylic resin film may be formed as the planarization insulating layer. The acrylic resin film can be formed in such a manner that an acrylic resin is applied by a coating method and then baked (e.g., at 250° C. for one hour in a nitrogen atmosphere).

Heat treatment may be performed after the planarization insulating layer is formed. For example, the heat treatment is performed at 250° C. in a nitrogen atmosphere for one hour.

As described above, heat treatment may be performed after the transistor 440 is formed. The heat treatment may be performed more than once.

The channel length of the transistor described in this embodiment is determined by the gap between the first barrier layer 475a and the second barrier layer 475b, and the gap between the first barrier layer 475a and the second barrier layer 475b is determined by etching with a resist mask obtained by exposure to an electron beam. Precise exposure and development using an electron beam can provide a precise pattern; thus, a minute transistor with a channel length L of less than 50 nm can be manufactured.

Further, the transistor described in this embodiment includes the oxide semiconductor layer 403 which is not patterned. Therefore, the source electrode and the drain electrode are not electrically connected to each other through regions in the vicinities of side surfaces (end surfaces) of the oxide semiconductor layer. That is, formation of a parasitic channel in the transistor can be suppressed. Moreover, in the transistor formed using the oxide semiconductor layer 403 which is not patterned, a step needed for patterning of an oxide semiconductor layer in a process for manufacturing the transistor is not needed. Thus, manufacturing cost of the transistor can be reduced and yield can be increased.

This embodiment can be implemented in appropriate combination with any of the other embodiments.

Embodiment 12

In this embodiment, an example of a semiconductor device (memory device) which includes the transistor described in this specification, which can hold stored data even when not powered, and which has an unlimited number of write cycles will be described with reference to drawings.

Figure 41A:
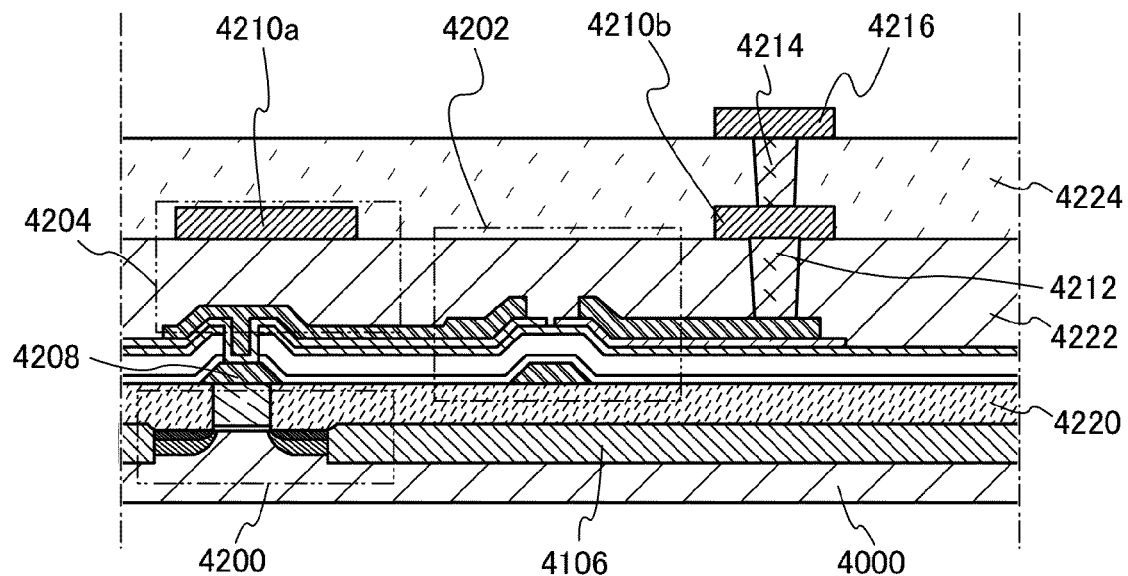
FIGS. 41A and 41B are a cross-sectional view and a circuit diagram illustrating a semiconductor device.
Figure 41B:
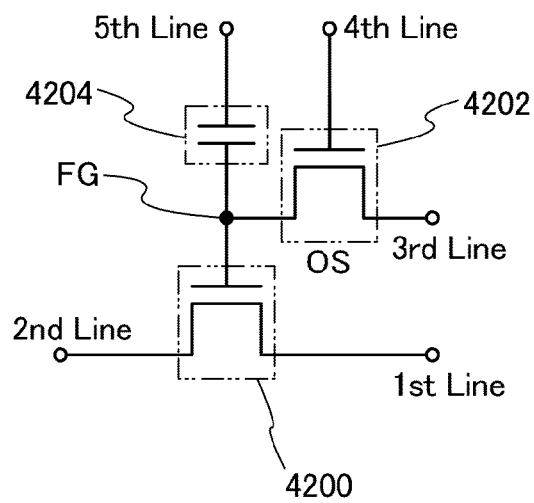

FIGS. 41A and 41B illustrate an example of a structure of a semiconductor device. FIG. 41A is a cross-sectional view of the semiconductor device, and FIG. 41B is a circuit diagram of the semiconductor device.

The semiconductor device illustrated in FIGS. 41A and 41B includes a transistor 4200 including a first semiconductor material in a lower portion, and a transistor 4202 including a second semiconductor material and a capacitor 4204 in an upper portion. Here, the structure of the transistor 420 described in Embodiment 10 is applied to the transistor 4202.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor enables charge to be held for a long time owing to its characteristics.

Although all the transistors are n-channel transistors here, it is needless to say that p-channel transistors can be used. The specific structure of the semiconductor device, such as the material used for the semiconductor device and the structure of the semiconductor device, is not necessarily limited to those described here except for the use of the transistor described in Embodiment 10 or 11, which is formed using an oxide semiconductor, for holding data.

The transistor 4200 in FIG. 41A includes a channel formation region provided in a substrate 4000 including a semiconductor material (e.g., silicon), impurity regions provided such that the channel formation region is sandwiched therebetween, intermetallic compound regions provided in contact with the impurity regions, a gate insulating layer provided over the channel formation region, and a gate electrode provided over the gate insulating layer. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

An element isolation insulating layer 4106 is provided over the substrate 4000 to surround the transistor 4200. An insulating layer 4220 is provided to cover the transistor 4200. Note that the element isolation insulating layer 4106 can be formed by an element isolation technique such as local oxidation of silicon (LOCOS) or shallow trench isolation (STI).

The transistor 4200 formed using a single crystal semiconductor substrate can operate at high speed. Thus, when the transistor is used as a reading transistor, data can be read at a high speed. As treatment prior to formation of the transistor 4202 and a capacitor 4204, CMP treatment is performed on the insulating layer 4220 covering the transistor 4200, whereby the insulating layer 4220 is planarized and, at the same time, an upper surface of the gate electrode of the transistor 4200 is exposed.

The transistor 4202 shown in FIG. 41A is a bottom-gate transistor in which a channel is formed in an oxide semiconductor layer. Here, an oxide semiconductor layer included in the transistor 4202 is preferably highly purified. By using a highly purified oxide semiconductor, the transistor 4202 can have extremely favorable off-state characteristics.

Since the off-state current of the transistor 4202 is small, stored data can be held for a long time owing to such a transistor. In other words, power consumption can be sufficiently reduced because a semiconductor device in which refresh operation is unnecessary or the frequency of refresh operation is extremely low can be provided.

One of a source electrode and a drain electrode of the transistor 4202 is electrically connected to an electrode 4208 through an opening provided in a gate insulating layer and an oxide semiconductor layer and is electrically connected to the gate electrode of the transistor 4200 through the electrode 4208. The electrode 4208 can be formed concurrently with a gate electrode of the transistor 4202.

An insulating layer 4222 having a single-layer structure or a stacked-layer structure is provided over the transistor 4202. In addition, a conductive layer 4210*a* is provided in a region overlapping with the one of the source electrode and the drain electrode of the transistor 4202 with the insulating layer 4222 provided therebetween, and the one of the source electrode and the drain electrode of the transistor 4202, the insulating layer 4222, and the conductive layer 4210*a* form the capacitor 4204. That is, the one of the source electrode and the drain electrode of the transistor 4202 functions as one electrode of the capacitor 4204, and the conductive layer 4210*a* functions as the other electrode of the capacitor 4204. Note that in the case where a capacitor is not needed, the capacitor 4204 may be omitted. Alternatively, the capacitor 4204 may be separately provided above the transistor 4202.

An insulating layer 4224 is provided over the capacitor 4204. In addition, a wiring 4216 for connecting the transistor 4202 to another transistor is provided over the insulating layer 4224. The wiring 4216 is electrically connected to the other of the source electrode and the drain electrode of the transistor 4202 through an electrode 4214 provided in an opening formed in the insulating layer 4224, a conductive layer 4210*b* formed using the same layer as the conductive layer 4210*a*, and an electrode 4212 provided in an opening formed in the insulating layer 4222.

In FIG. 41A, the transistor 4200 and the transistor 4202 are provided so as to at least partly overlap with each other. The source region or the drain region of the transistor 4200 is preferably provided so as to overlap with part of the oxide semiconductor layer included in the transistor 4202. Further, the transistor 4202 and the capacitor 4204 are provided so as to overlap with at least part of the transistor 4200. For example, the conductive layer 4210*a* of the capacitor 4204 is provided so as to overlap with at least part of the gate electrode of the transistor 4200. With such a planar layout, the area occupied by the semiconductor device can be reduced; thus, higher integration can be achieved.

Next, an example of a circuit configuration corresponding to FIG. 41A is illustrated in FIG. 41B.

In FIG. 41B, a first wiring (1st Line) is electrically connected to a source electrode of the transistor 4200. A second wiring (2nd Line) is electrically connected to a drain electrode of the transistor 4200. A third wiring (3rd Line) is electrically connected to one of the source electrode and the drain electrode of the transistor 4202, and a fourth wiring (4th Line) is electrically connected to the gate electrode of the transistor 4202. The gate electrode of the transistor 4200 and the other of the source electrode and the drain electrode of the transistor 4202 are electrically connected to one electrode of the capacitor 4204. A fifth wiring (5th Line) is electrically connected to the other electrode of the capacitor 4204.

The semiconductor device in FIG. 41B utilizes a characteristic in which the potential of the gate electrode of the transistor 4200 can be held, and thus enables data writing, holding, and reading as follows.

Writing and holding of data will be described. First, the potential of the fourth wiring is set to a potential at which the transistor 4202 is turned on, so that the transistor 4202 is turned on. Accordingly, the potential of the third wiring is supplied to the gate electrode of the transistor 4200 and the capacitor 4204. In other words, predetermined charge is given to the gate electrode of the transistor 4200 (writing). Here, one of two kinds of charge providing different potentials (hereinafter referred to as a low-level charge and a high-level charge) is given. After that, the potential of the fourth wiring is set to a potential at which the transistor 4202 is turned off, so that the transistor 4202 is turned off. Thus, the charge given to the gate electrode of the transistor 4200 is held (holding).

Since the off-state current of the transistor 4202 is extremely small, the charge of the gate electrode of the transistor 4200 is held for a long time.

Next, reading of data will be described. By supplying an appropriate potential (reading potential) to the fifth wiring while a predetermined potential (constant potential) is supplied to the first wiring, the potential of the second wiring varies depending on the amount of charge held in the gate electrode of the transistor 4200. This is because in general, when the transistor 4200 is an n-channel transistor, an apparent threshold voltage $V_{th\_H}$ in the case where a high-level charge is given to the gate electrode of the transistor 4200 is lower than an apparent threshold voltage $V_{th\_L}$ in the case where a low-level charge is given to the gate electrode of the transistor 4200. Here, the apparent threshold voltage refers to the potential of the fifth wiring, which is needed to turn on the transistor 4200. Thus, the potential of the fifth wiring is set to a potential $V_0$ that is between $V_{th\_H}$ and $V_{th\_L}$, whereby charge given to the gate electrode of the transistor 4200 can be determined. For example, in the case where a high-level charge is given in writing, when the potential of the fifth wiring is set to $V_0$ ($>V_{th\_H}$), the transistor 4200 is turned on. In the case where a low-level charge is given in writing, even when the potential of the fifth wiring is set to $V_0$ ($<V_{th\_L}$), the transistor 4200 remains in an off state. Therefore, the stored data can be read by the potential of the second wiring.

Note that in the case where memory cells are arrayed to be used, only data of desired memory cells needs to be read. In the case where such reading is not performed, a potential at which the transistor 4200 is turned off regardless of the state of the gate electrode of the transistor 4200, that is, a potential lower than $V_{th\_H}$ may be supplied to the fifth wiring. Alternatively, a potential at which the transistor 4200 is turned on regardless of the state of the gate electrode of the transistor 4200, that is, a potential higher than $V_{th\_L}$ may be supplied to the fifth wiring.

When a transistor having a channel formation region formed using an oxide semiconductor and having extremely small off-state current is applied to the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

As described above, a miniaturized and highly integrated semiconductor device having high electric characteristics and a method for manufacturing the semiconductor device can be provided.

Note that a memory device including the transistor disclosed in this specification is not limited to the memory device illustrated in FIGS. 41A and 41B. For example, the transistor may be used as a transistor provided in a memory cell of a DRAM.

The methods, structures, and the like described in this embodiment can be combined as appropriate with any of the methods, structures, and the like described in the other embodiments.

Embodiment 13

In this embodiment, one embodiment of a structure of a memory device which is different from that in Embodiment 12 will be described.

Figure 42:
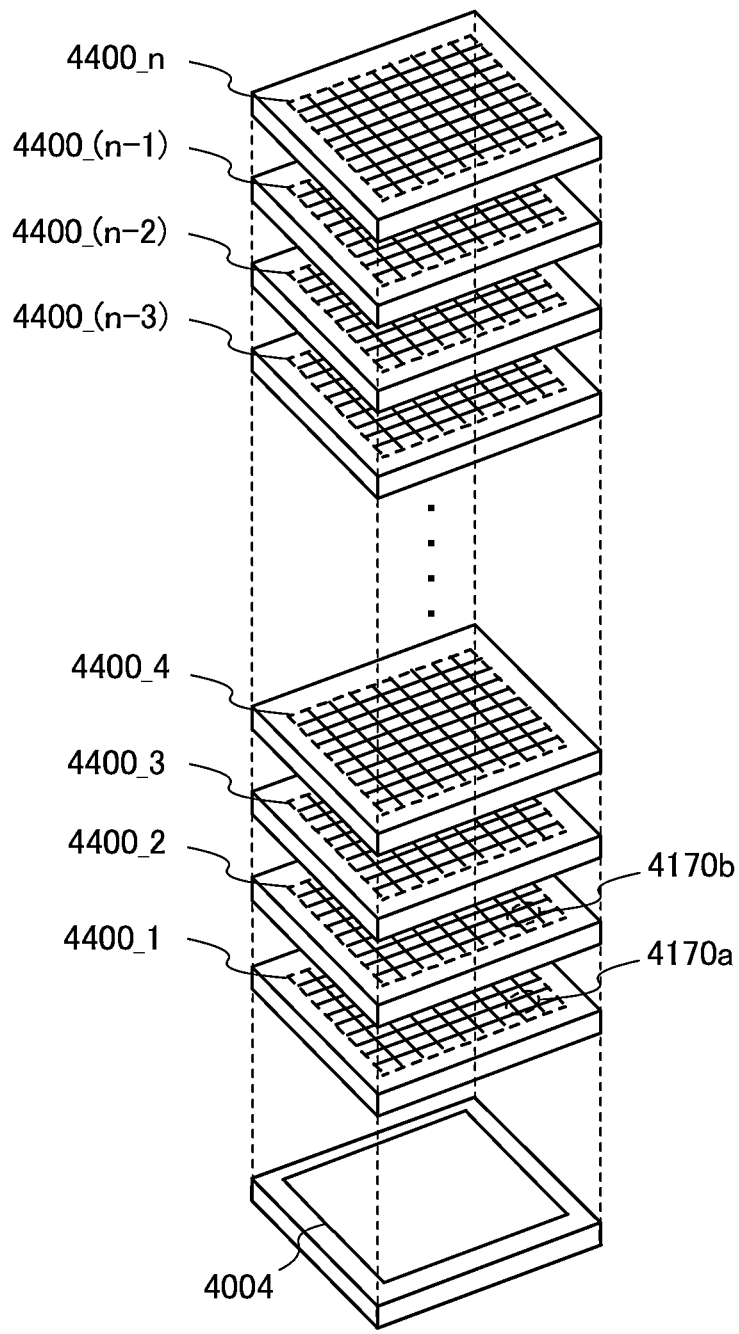
FIG. 42 is a perspective view illustrating a semiconductor device.

FIG. 42 is a perspective view of a memory device. The memory device illustrated in FIG. 42 includes a plurality of layers of memory cell arrays (memory cell arrays 4400_1 to 4400_*n* (n is an integer greater than or equal to 2)) each including a plurality of memory cells as memory circuits in the upper portion, and a driver circuit 4004 in the lower portion which is necessary for operating the memory cell arrays.

Figure 43:
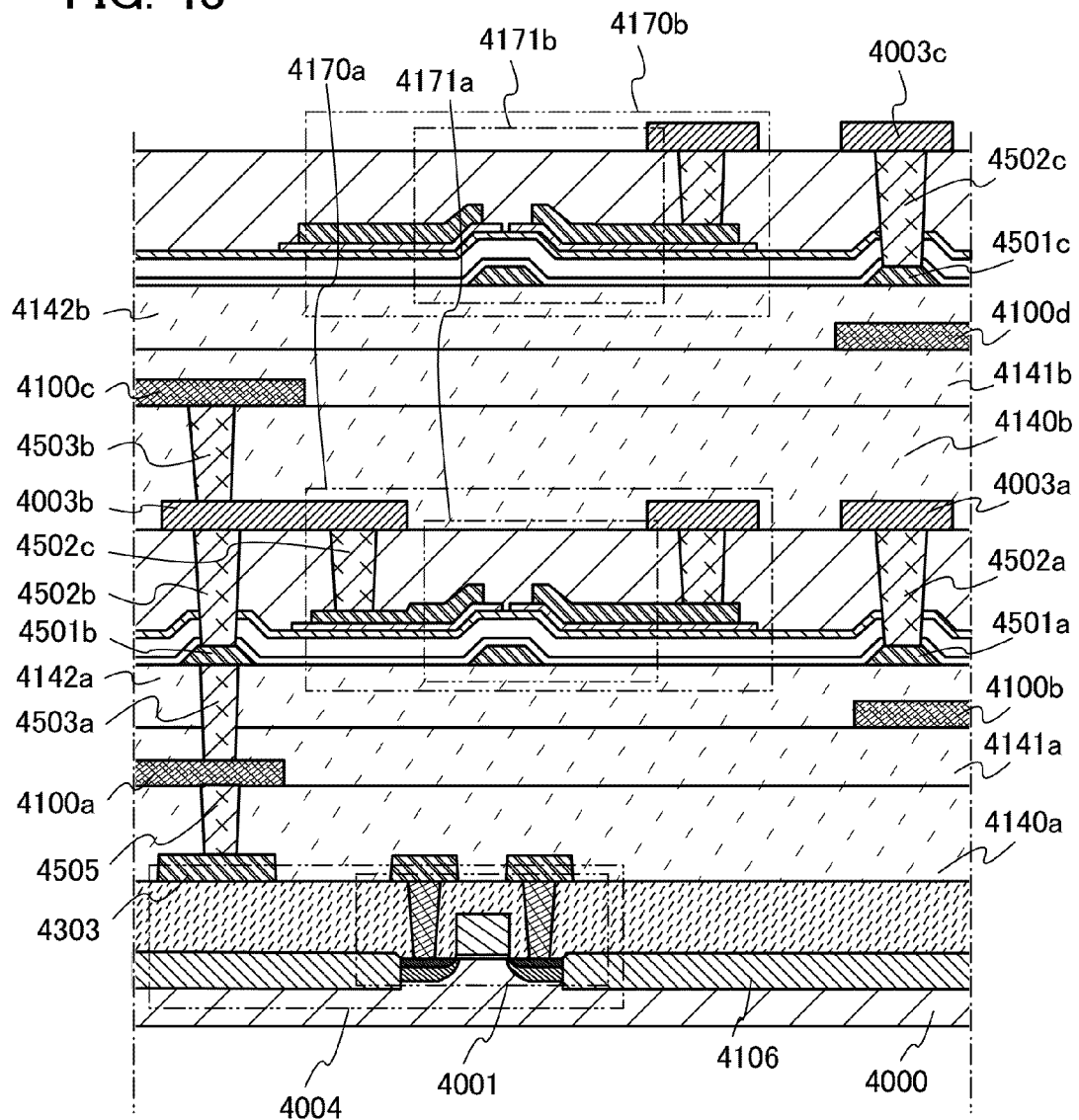
FIG. 43 is a cross-sectional view illustrating a semiconductor device.

FIG. 43 is a partial enlarged view of the memory device illustrated in FIG. 42. FIG. 43 illustrates the driver circuit 4004, the memory cell array 4400_1, and the memory cell array 44002, and illustrates a memory cell 4170*a* and a memory cell 4170*b* as typical examples among the plurality of memory cells included in the memory cell array 4400_1 and the memory cell array 4400_2. The memory cell 4170*a* and the memory cell 4170*b* can have a configuration similar to the circuit configuration described in the above embodiment, for example.

Note that a transistor 4171*a* included in the memory cell 4170*a* is illustrated as a typical example. A transistor 4171*b* included in the memory cell 4170*b* is illustrated as a typical example. Each of the transistors 4171*a* and 4171*b* includes a channel formation region in an oxide semiconductor layer. The structure of the transistor in which the channel formation region is formed in the oxide semiconductor layer is the same as the structure described in any of the other embodiments, and thus the description of the structure is omitted.

An electrode 4501*a* which is formed using the same layer as a gate electrode of the transistor 4171*a* is electrically connected to an electrode 4003*a* via an electrode 4502*a*. An electrode 4501*c* which is formed using the same layer as a gate electrode of the transistor 4171*b* is electrically connected to an electrode 4003*c* via an electrode 4502*c*.

The driver circuit 4004 includes a transistor 4001 in which a semiconductor material other than an oxide semiconductor is used for a channel formation region. The transistor 4001 can be a transistor obtained in such a manner that an element isolation insulating layer 4106 is provided on a substrate 4000 including a semiconductor material (e.g., silicon) and a region serving as the channel formation region is formed in a region surrounded by the element isolation insulating layer 4106. Note that the transistor 4001 may be a transistor whose channel formation region is formed in a semiconductor layer, such as a silicon layer, formed on an insulating surface or in a silicon layer of an SOI substrate. A known structure can be used as the structure of the transistor 4001 and thus the description is omitted.

A wiring 4100*a* and a wiring 4100*b* are formed between layers in which the transistor 4171*a* is formed and layers in which the transistor 4001 is formed. An insulating layer 4140*a* is provided between the wiring 4100*a* and the layers in which the transistor 4001 is formed. An insulating layer 4141*a* is provided between the wiring 4100*a* and the wiring 4100*b*. An insulating layer 4142*a* is provided between the wiring 4100*b* and the layers in which the transistor 4171*a* is formed.

Similarly, a wiring 4100*c* and a wiring 4100*d* are formed between the layers in which the transistor 4171*b* is formed and the layers in which the transistor 4171*a* is formed. An insulating layer 4140*b* is provided between the wiring 4100*c* and the layers in which the transistor 4171*a* is formed. An insulating layer 4141*b* is provided between the wiring 4100*c* and the wiring 4100*d*. An insulating layer 4142*b* is provided between the wiring 4100*d* and the layers in which the transistor 4171*b* is formed.

The insulating layers 4140a, 4141a, 4142a, 4140b, 4141b, and 4142b each function as an interlayer insulating layer whose surface can be planarized.

The wirings 4100a, 4100b, 4100c, and 4100d enable electrical connection between the memory cells, electrical connection between the driver circuit 4004 and the memory cells, and the like.

An electrode 4303 included in the driver circuit 4004 can be electrically connected to a circuit provided in the upper portion.

For example, as illustrated in FIG. 43, the electrode 4303 can be electrically connected to the wiring 4100a via an electrode 4505. The wiring 4100a can be electrically connected to an electrode 4501b which is formed using the same layer as the gate electrode of the transistor 4171a via an electrode 4503a. The electrode 4501b can be electrically connected to an electrode 4003b via an electrode 4502b. The electrode 4003b can be electrically connected to a source or a drain of the transistor 4171a via the electrode 4502c. In this manner, the wiring 4100a and the electrode 4303 can be electrically connected to the source or the drain of the transistor 4171a. The electrode 4003b can be electrically connected to the wiring 4100c via an electrode 4503b.

FIG. 43 illustrates an example in which the electrode 4303 and the transistor 4171a are electrically connected to each other through the wiring 4100a; however, one embodiment of the disclosed invention is not limited thereto. The electrode 4303 may be electrically connected to the transistor 4171a through the wiring 4100b, through both the wiring 4100a and the wiring 4100b, or through another electrode without using the wiring 4100a nor the wiring 4100b.

FIG. 43 illustrates the structure where two wirings, i.e., the wiring 4100a and the wiring 4100b are provided between the layers in which the transistor 4171a is formed and the layers in which the transistor 4001 is formed; however, the number of wirings provided therebetween is not limited to two. One wiring or three or more wirings may be provided between the layers in which the transistor 4171a is formed and the layers in which the transistor 4001 is formed.

FIG. 43 illustrates the structure where two wirings, i.e., the wiring 4100c and the wiring 4100d are provided between the layers in which the transistor 4171b is formed and the layers in which the transistor 4171a is formed; however, the number of wirings provided therebetween is not limited to two. One wiring or three or more wirings may be provided between the layers in which the transistor 4171b is formed and the layers in which the transistor 4171a is formed.

The methods, structures, and the like described in this embodiment can be combined as appropriate with any of the methods, structures, and the like described in the other embodiments.

Embodiment 14

In this embodiment, examples of application of the semiconductor device described in any of the above embodiments to portable devices such as a mobile phone, a smartphone, or an e-book reader will be described with reference to FIGS. 44A and 44B, FIG. 45, FIG. 46, and FIG. 47.

In portable electronic devices such as a mobile phone, a smart phone, and an e-book reader, an SRAM or a DRAM is used so as to store image data temporarily. This is because response speed of a flash memory is low and thus a flash memory is not suitable for image processing. On the other hand, an SRAM or a DRAM has the following characteristics when used for temporary storage of image data.

Figure 44A:
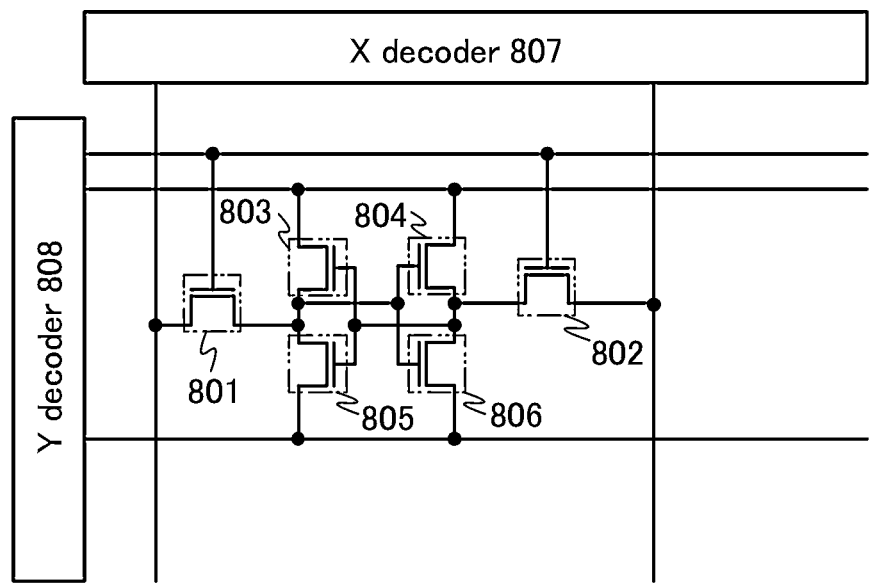
FIGS. 44A and 44B are circuit diagrams each illustrating a semiconductor device.

In a normal SRAM, as illustrated in FIG. 44A, one memory cell includes six transistors, which are a transistor 801, a transistor 802, a transistor 803, a transistor 804, a transistor 805, and a transistor 806, and they are driven by an X decoder 807 and a Y decoder 808. A pair of transistors 803 and 805 and a pair of the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, the price per bit of an SRAM is the highest among a variety of memory devices.

Figure 44B:
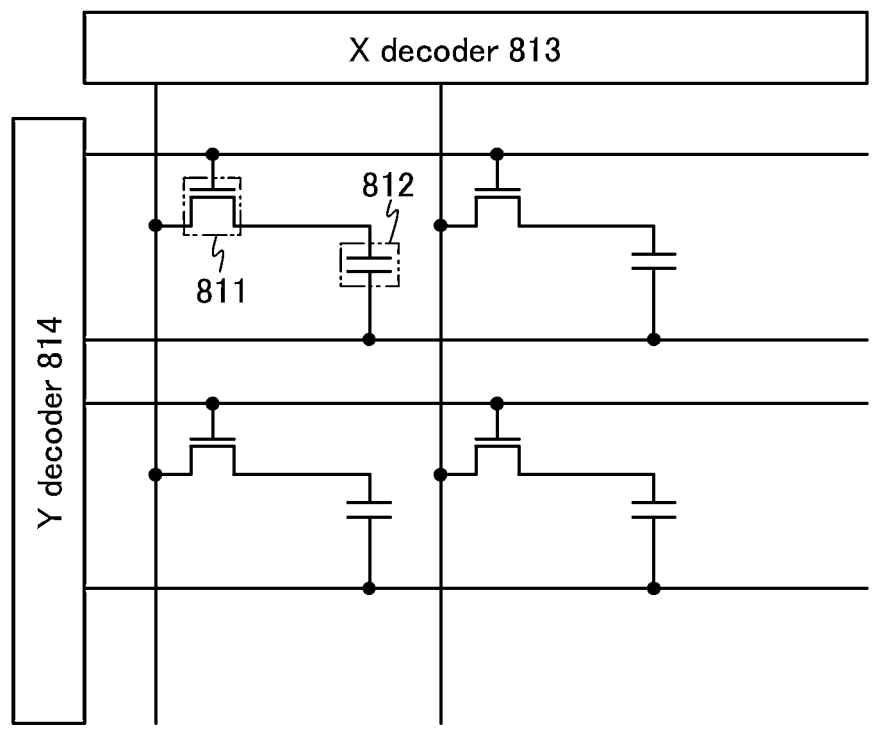

On the other hand, as illustrated in FIG. 44B, a memory cell in a DRAM includes a transistor 811 and a storage capacitor 812, and is driven by an X decoder 813 and a Y decoder 814. One cell includes one transistor and one capacitor and has a small area. The area of a memory cell in a DRAM is generally less than or equal to 10 $F^2$. Note that the DRAM needs to be refreshed periodically and consumes electric power even when a rewriting operation is not performed.

However, the area of the memory cell of the semiconductor device described the above embodiments is about 10 $F^2$ and frequent refreshing is not needed. Therefore, the area of the memory cell can be reduced, which results in a reduction in power consumption.

Figure 45:
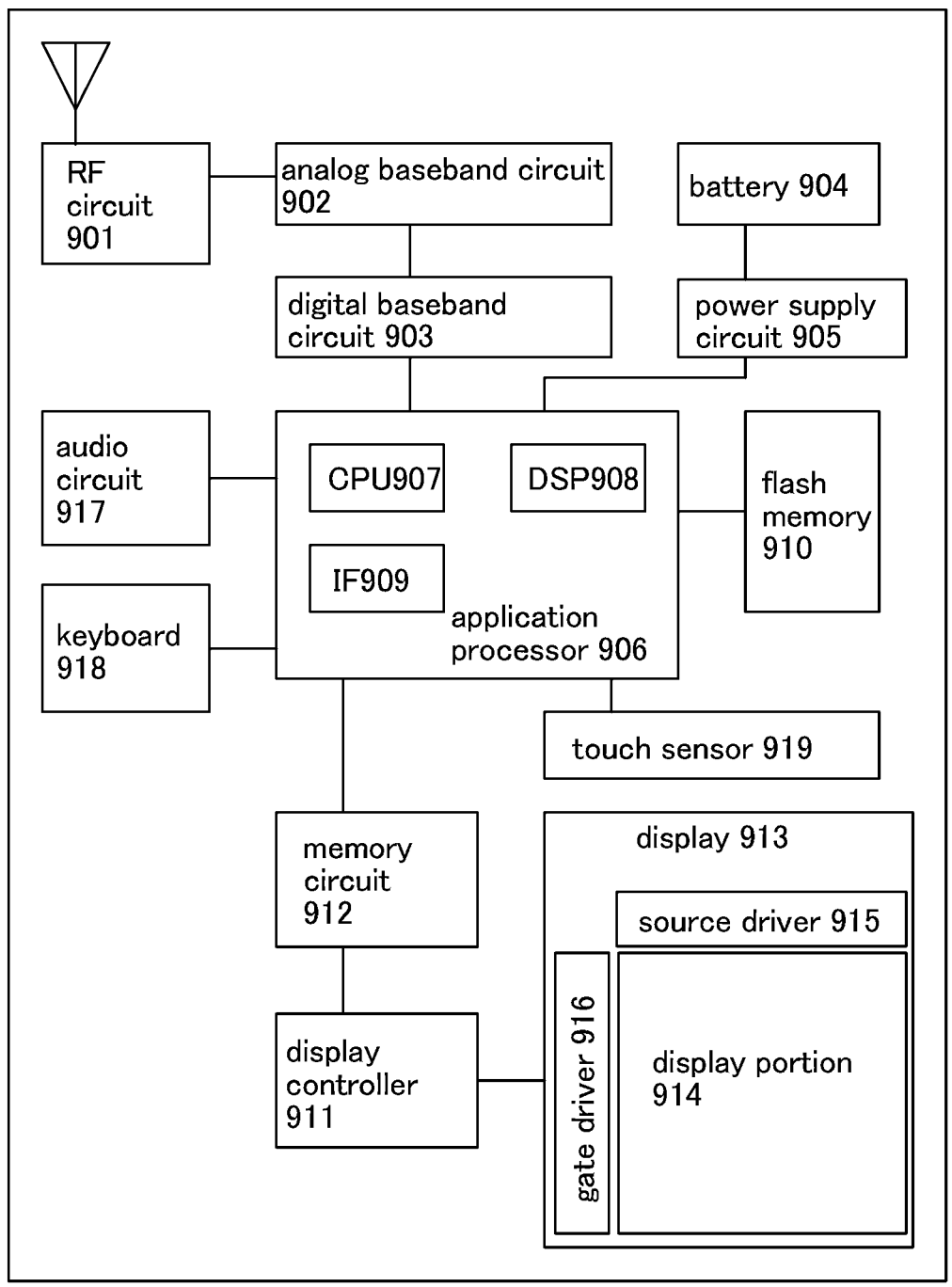
FIG. 45 is a block diagram illustrating a semiconductor device.

FIG. 45 is a block diagram of a portable device. A portable device illustrated in FIG. 45 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM; by employing any of the semiconductor devices described in the above embodiments for the memory circuit 912, writing and reading of data can be performed at high speed, data can be held for a long time, and power consumption can be sufficiently reduced.

Figure 46:
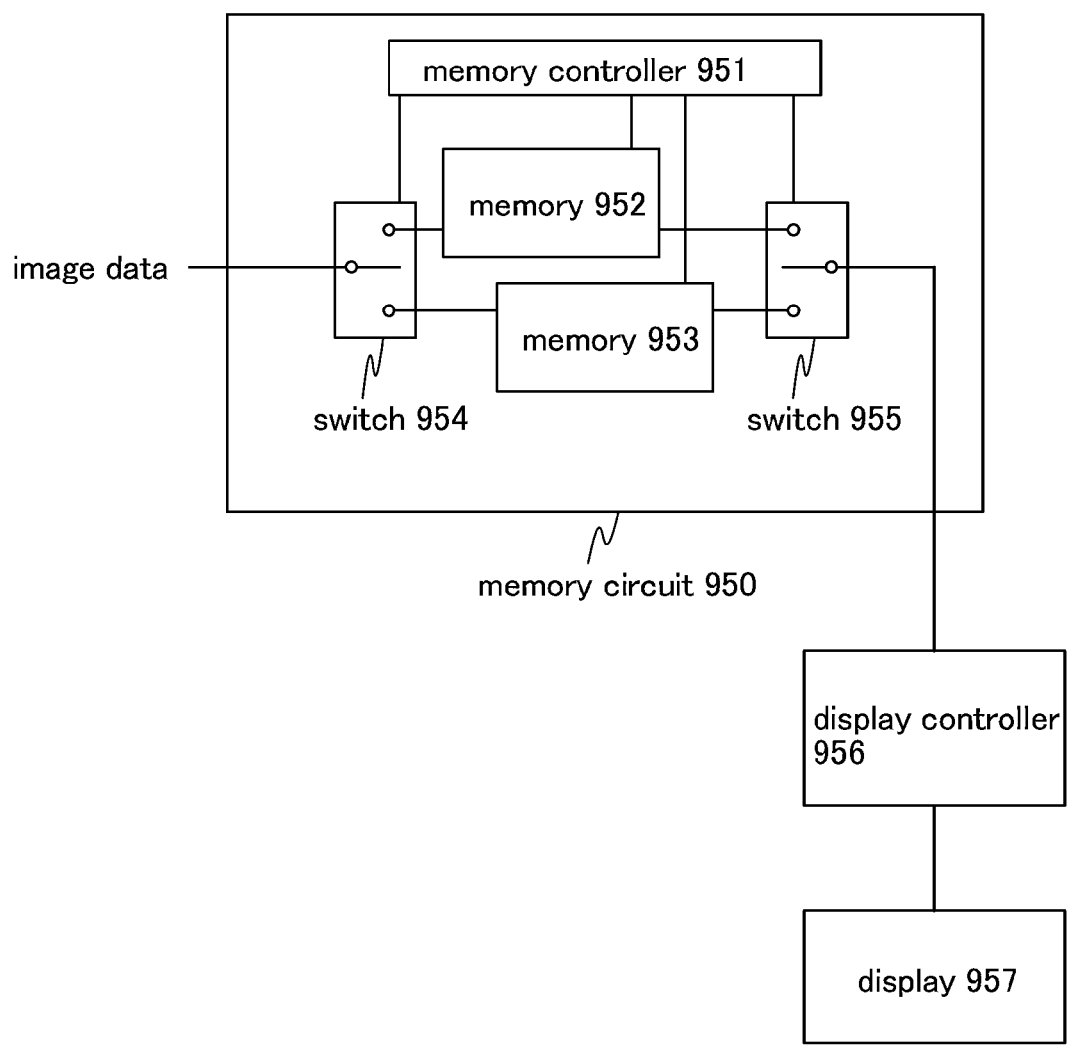
FIG. 46 is a block diagram illustrating a semiconductor device.

FIG. 46 illustrates an example in which any of the semiconductor devices described in the above embodiments is used for a memory circuit 950 in a display. The memory circuit 950 illustrated in FIG. 46 includes a memory 952, a memory 953, a switch 954, a switch 955, and a memory controller 951. Further, the memory circuit 950 is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not illustrated). The input image data A is stored in the memory 952 though the switch 954. The image data (stored image data A) stored in the memory 952 is transmitted to the display 957 through the switch 955 and the display controller 956, and is displayed on the display 957.

In the case where the input image data A is not changed, the stored image data A is read from the memory 952 through the switch 955 by the display controller 956 normally at a frequency of approximately 30 Hz to 60 Hz.

Next, for example, when a user performs an operation to rewrite a screen (i.e., when the input image data A is changed), the application processor produces new image data (input image data B). The input image data B is stored in the memory 953 through the switch 954. Also during this time, the stored image data A is regularly read from the memory 952 through the switch 955. After the completion of storing the new image data (stored image data B) in the memory 953, from the next frame for the display 957, the stored image data B starts to be read, is transmitted to the display 957 through the switch 955 and the display controller 956, and is displayed on the display 957. This reading operation continues until another new image data is stored in the memory 952.

By alternately writing and reading image data to and from the memory 952 and the memory 953 as described above, images are displayed on the display 957. Note that the memory 952 and the memory 953 are not necessarily separate memories and a single memory may be divided and used. By employing any of the semiconductor devices described in the above embodiments for the memory 952 and the memory 953, data can be written and read at high speed and held for a long time, and power consumption can be sufficiently reduced.

Figure 47:
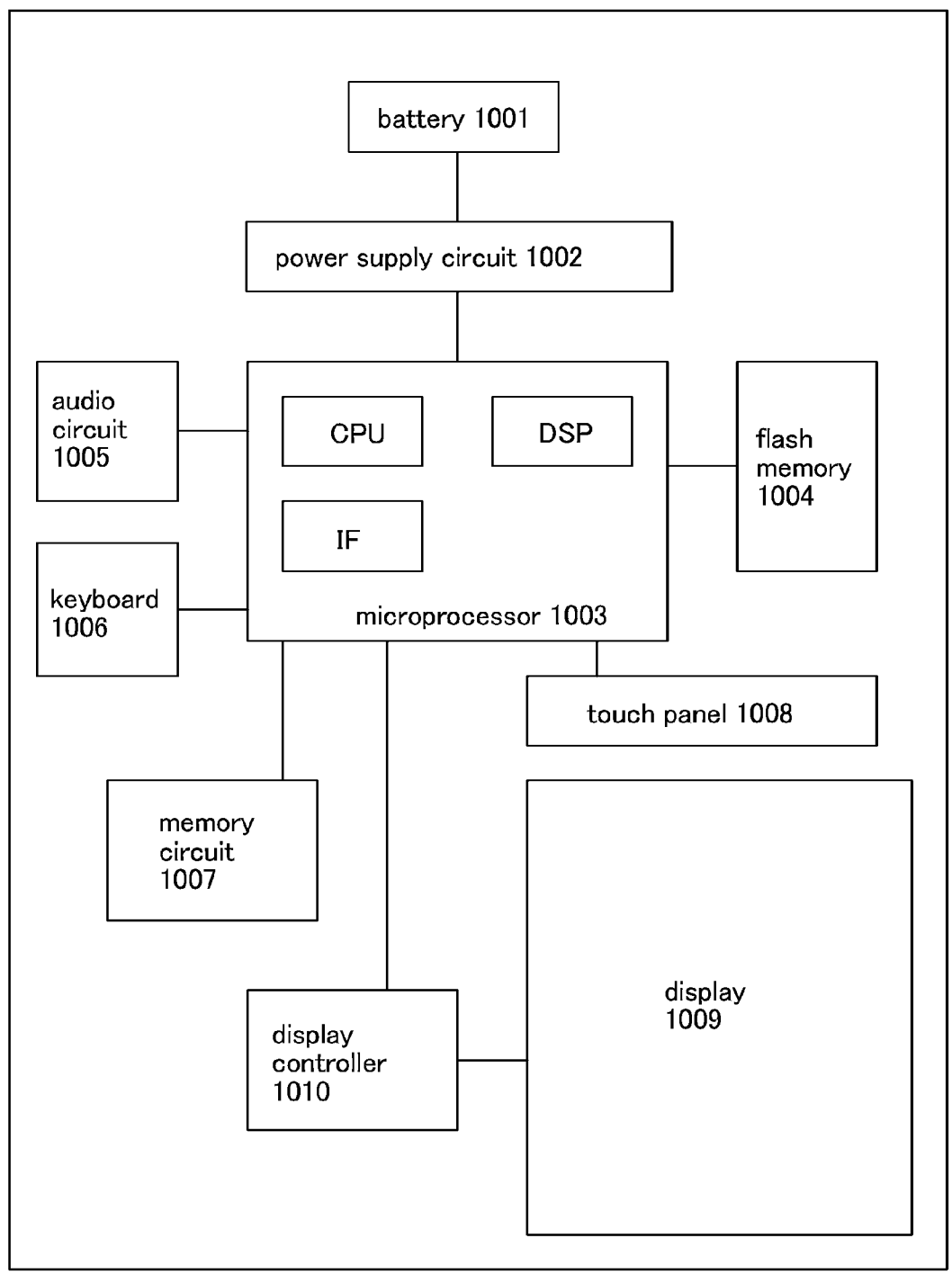
FIG. 47 is a block diagram illustrating a semiconductor device.

FIG. 47 is a block diagram of an e-book reader. FIG. 47 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 47. The memory circuit 1007 has a function of temporarily storing the contents of a book. For example, when a user uses a highlight function, the memory circuit 1007 stores and holds data of a portion specified by the user. Note that the highlight function is used to make a difference between a specific portion and the other portions while reading an e-book, by marking the specific portion, e.g., by changing the display color, underlining, making characters bold, changing the font of characters, or the like. In order to store the data for a short time, the data may be stored in the memory circuit 1007. In order to store the data for a long time, the data stored in the memory circuit 1007 may be copied to the flash memory 1004. Also in such a case, by employing the semiconductor device described in any of the above embodiments, data can be written and read at high speed and held for a long time, and power consumption can be sufficiently reduced.

As described above, the portable devices described in this embodiment each incorporate any of the semiconductor devices according to the above embodiments. Therefore, it is possible to obtain a portable device in which data is read at high speed, the data is held for a long time, and power consumption is sufficiently reduced.

This embodiment can be implemented as appropriate in combination with any of the structures described in the other embodiments.

Embodiment 15

A semiconductor device having an image sensor function of reading data of an object can be manufactured using any of the transistors described in the above embodiments.

Figure 48A:
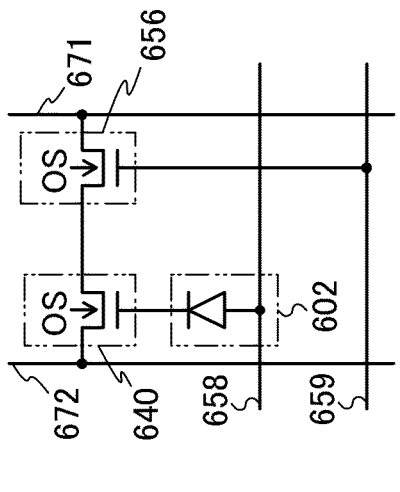
FIGS. 48A and 48B are a cross-sectional view and a circuit diagram illustrating a semiconductor device.

FIG. 48A illustrates an example of a semiconductor device having an image sensor function. FIG. 48A is an equivalent circuit diagram of a photosensor, and FIG. 48B is a cross-sectional view of part of the photosensor.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

In the circuit diagrams in this specification, a transistor including an oxide semiconductor in a semiconductor layer where a channel is formed is denoted by a symbol "OS" so that it can be clearly identified as a transistor including an oxide semiconductor in a semiconductor layer where a channel is formed. In FIG. 48A, the transistor 640 and the transistor 656 are transistors each including an oxide semiconductor in a semiconductor layer where a channel is formed, to which any of the transistors described in the above embodiments can be applied. Described in this embodiment is an example in which a transistor having a structure similar to that of the transistor 540a described in Embodiment 1 is used.

Figure 48B:
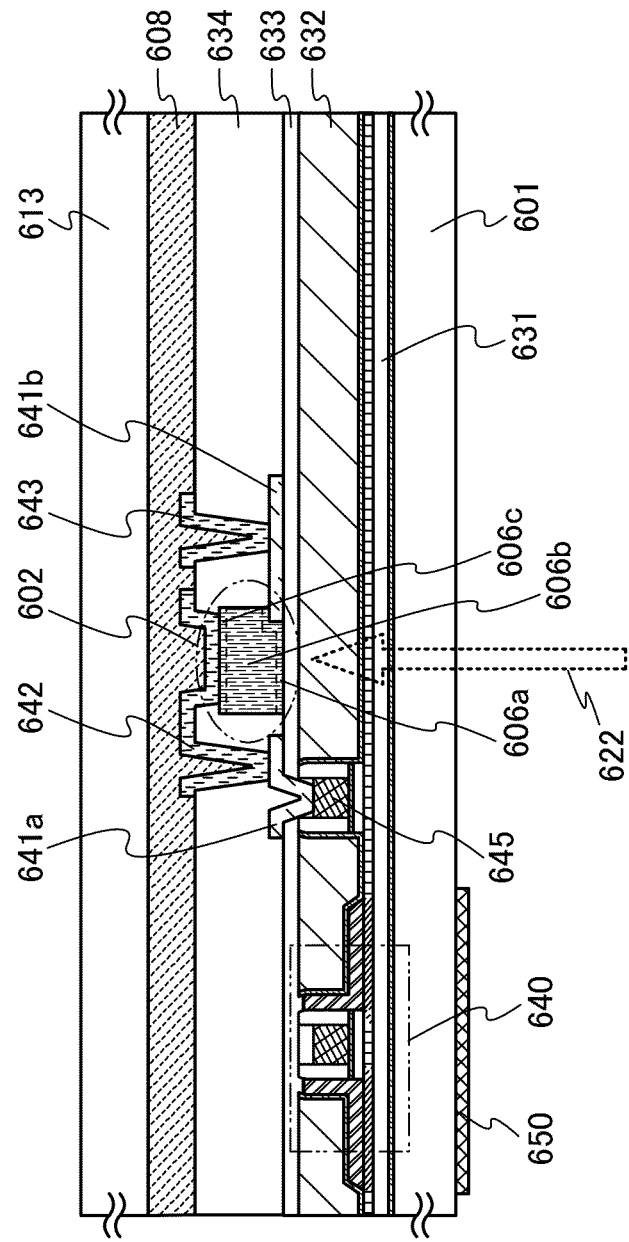

FIG. 48B is a cross-sectional view of the photodiode 602 and the transistor 640 in the photo sensor. The photodiode 602 functioning as a sensor and the transistor 640 are provided over a substrate 601 (a TFT substrate) having an insulating surface. A substrate 613 is provided over the photodiode 602 and the transistor 640 with an adhesive layer 608 interposed therebetween.

An interlayer insulating layer 632, an insulating layer 633, and an interlayer insulating layer 634 are provided over the transistor 640 provided over the insulating layer 631. The photodiode 602 is provided over the insulating layer 633. In the photodiode 602, a first semiconductor layer 606a, a second semiconductor layer 606b, and a third semiconductor layer 606c are sequentially stacked from the insulating layer 633 side, between electrodes 641a and 641b formed over the insulating layer 633 and an electrode 642 formed over the interlayer insulating layer 634.

Note that a light-blocking layer 650 is provided in a region which overlaps with the transistor 640.

The electrode 641b is electrically connected to a conductive layer 643 formed over the interlayer insulating layer 634, and the electrode 642 that is formed by the same step as the conductive layer 643 is electrically connected to a wiring 645 through the electrode 641a. The wiring 645 is electrically connected to a gate electrode of the transistor 640, and the photodiode 602 is electrically connected to the transistor 640.

Here, a PIN photodiode in which a semiconductor layer having p-type conductivity as the first semiconductor layer 606a, a high-resistance semiconductor layer (i-type semiconductor layer) as the second semiconductor layer 606b, and a semiconductor layer having n-type conductivity as the third semiconductor layer 606c are stacked is shown as an example.

The first semiconductor layer 606a is a p-type semiconductor layer and can be formed using an amorphous silicon film containing an impurity element imparting p-type conductivity. The first semiconductor layer 606a is formed by a plasma CVD method with use of a semiconductor source gas containing an impurity element belonging to Group 13 (such as boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be employed. The first semiconductor layer 606a is preferably formed to have a thickness greater than or equal to 10 nm and less than or equal to 50 nm.

The second semiconductor layer 606b is an i-type semiconductor layer (intrinsic semiconductor layer) and is formed using an amorphous silicon film. As for formation of the second semiconductor layer 606b, an amorphous silicon film is formed with use of a semiconductor source gas by a plasma CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 606b may be formed by an LPCVD method, a vapor deposition method, a sputtering method, or the like. The second semiconductor layer 606b is preferably formed to have a thickness greater than or equal to 200 nm and less than or equal to 1000 nm.

The third semiconductor layer 606c is an n-type semiconductor layer and is formed using an amorphous silicon film containing an impurity element imparting n-type conductivity. The third semiconductor layer 606c is formed by a plasma CVD method with use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion implantation method. Heating or the like may be conducted after introducing the impurity element by an ion implantation method or the like in order to diffuse the impurity element. In this case, as a method of forming the amorphous silicon film, an LPCVD method, a vapor deposition method, a sputtering method, or the like may be employed. The third semiconductor layer 606c is preferably formed to have a thickness greater than or equal to 20 nm and less than or equal to 200 nm.

The first semiconductor layer 606a, the second semiconductor layer 606b, and the third semiconductor layer 606c are not necessarily formed using an amorphous semiconductor, and they may be formed using a polycrystalline semiconductor or a microcrystalline semiconductor (a semi-amorphous semiconductor (SAS)).

The microcrystalline semiconductor belongs to a metastable state of an intermediate between amorphous and single crystal when Gibbs free energy is considered. That is, the microcrystalline semiconductor film is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 $cm^{-1}$, which represents a peak of the Raman spectrum of single crystal silicon. That is, the peak of the Raman spectrum of the microcrystalline silicon exists between 520 $cm^{-1}$ which represents single crystal silicon and 480 $cm^{-1}$ which represents amorphous silicon. In addition, microcrystalline silicon contains hydrogen or halogen of at least 1 atomic percent or more in order to terminate a dangling bond. Moreover, microcrystalline silicon contains a rare gas element such as helium, argon, krypton, or neon to further promote lattice distortion, so that stability is increased and a favorable microcrystalline semiconductor can be obtained.

This microcrystalline semiconductor can be formed by a high-frequency plasma CVD method with a frequency of several tens of megahertz to several hundreds of megahertz or using a microwave plasma CVD apparatus with a frequency of 1 GHz or more. Typically, the microcrystalline semiconductor film can be formed using a compound containing silicon such as $SiH_4$, $Si_2H_6$, $SiH_2Cl_2$, $SiHCl_3$, $SiCl_4$, or $SiF_4$, which is diluted with hydrogen. The microcrystalline semiconductor film can also be formed with dilution with one or plural kinds of rare gas elements selected from helium, argon, krypton, and neon in addition to the compound containing silicon (e.g., silicon hydride) and hydrogen. In those cases, the flow ratio of hydrogen to the compound containing silicon (e.g., silicon hydride) is 5:1 to 200:1, preferably 50:1 to 150:1, further preferably 100:1. Further, a carbide gas such as $CH_4$ or $C_2H_6$, a germanium gas such as $GeH_4$ or $GeF_4$, $F_2$, or the like may be mixed into the gas containing silicon.

Since the mobility of holes generated by the photoelectric effect is lower than that of electrons, a PIN photodiode has better characteristics when a surface on the p-type semiconductor layer side is used as a light-receiving surface. Here, an example in which light received by the photodiode 602 from a surface of the substrate 601, over which the PIN photodiode is formed, is converted into electric signals is described. Light from the semiconductor layer side having a conductivity type opposite to that of the semiconductor layer side on the light-receiving surface is disturbance light; therefore, the electrode is preferably formed from a light-blocking conductive layer. Note that a surface of the n-type semiconductor layer side can alternatively be used as the light-receiving surface.

With use of an insulating material, the insulating layer 631, the interlayer insulating layer 632, and the insulating layer 633 can be formed, depending on the material, by a method or a tool (equipment) such as a sputtering method, a plasma-enhanced CVD method, an SOG method, spin coating, dipping, spray coating, a droplet discharge method (such as an ink-jet method), a printing method (such as screen printing or offset printing), a doctor knife, a roll coater, a curtain coater, or a knife coater.

In this embodiment, an aluminum oxide layer is used as the insulating layer 633. The insulating layer 633 can be formed by a sputtering method or a plasma CVD method.

The aluminum oxide layer which is provided as the insulating layer 633 over the oxide semiconductor layer has a high shielding effect (blocking effect) of preventing penetration of both oxygen and impurities such as hydrogen and moisture.

Therefore, in and after the manufacturing process, the aluminum oxide layer functions as a protective layer for preventing entry of an impurity such as hydrogen or moisture, which causes a change in characteristics, into the oxide semiconductor and release of oxygen, which is a main component material of the oxide semiconductor, from the oxide semiconductor.

In this embodiment, in the manufacturing process of the transistor 640, a conductive layer provided over a gate electrode, an insulating layer, and a sidewall insulating layer are removed by chemical mechanical polishing treatment, so that the conductive layer is divided; thus, a source electrode and a drain electrode are formed.

Thus, a distance between the gate electrode and the region where the source electrode or the drain electrode is in contact with the oxide semiconductor layer (a contact region) can be shortened; therefore, the resistance between the gate electrode and the region where the source electrode or the drain electrode is in contact with the oxide semiconductor layer (a contact region) can be reduced, so that on-state characteristics of transistor 640 can be improved.

Precise processing can be performed accurately because etching with use of a resist mask is not performed when the conductive layer over the gate electrode is removed in a formation step of the source electrode and the drain electrode. Thus, in the manufacturing process of the semiconductor device, the miniaturized transistor 640 having little variation in shapes and characteristics can be manufactured with high yield.

An inorganic insulating material can be used for the insulating layer 631, the interlayer insulating layer 632, and the insulating layer 633. For example, a single-layer structure or a stacked-layer structure including any of oxide insulating materials such as silicon oxide, silicon oxynitride, aluminum oxide, and aluminum oxynitride; and nitride insulating materials such as silicon nitride, silicon nitride oxide layer, aluminum nitride, and aluminum nitride oxide can be used.

For a reduction in surface roughness, an insulating layer functioning as a planarization insulating layer is preferably used as the interlayer insulating layer 634. For the interlayer insulating layer 634, an organic insulating material having heat resistance such as polyimide, an acrylic resin, a benzocyclobutene-based resin, polyamide, or an epoxy resin can be used. Other than such organic insulating materials, it is possible to use a single layer or stacked layers of a low-dielectric constant material (low-k material), a siloxane-based resin, phosphosilicate glass (PSG), borophosphosilicate glass (BPSG), or the like.

With detection of light 622 that enters the photodiode 602, data on an object to be detected can be read. Note that a light source such as a backlight can be used at the time of reading data on an object.

As described above, a miniaturized and highly-integrated semiconductor device having high electric characteristics and a method for manufacturing the semiconductor device can be provided.

This embodiment can be implemented as appropriate in combination with any of the structures described in the other embodiments.

Embodiment 16

In this embodiment, a central processing unit (CPU) at least part of which includes any of the transistors disclosed in the above embodiments will be described as an example of a semiconductor device.

Figure 49A:
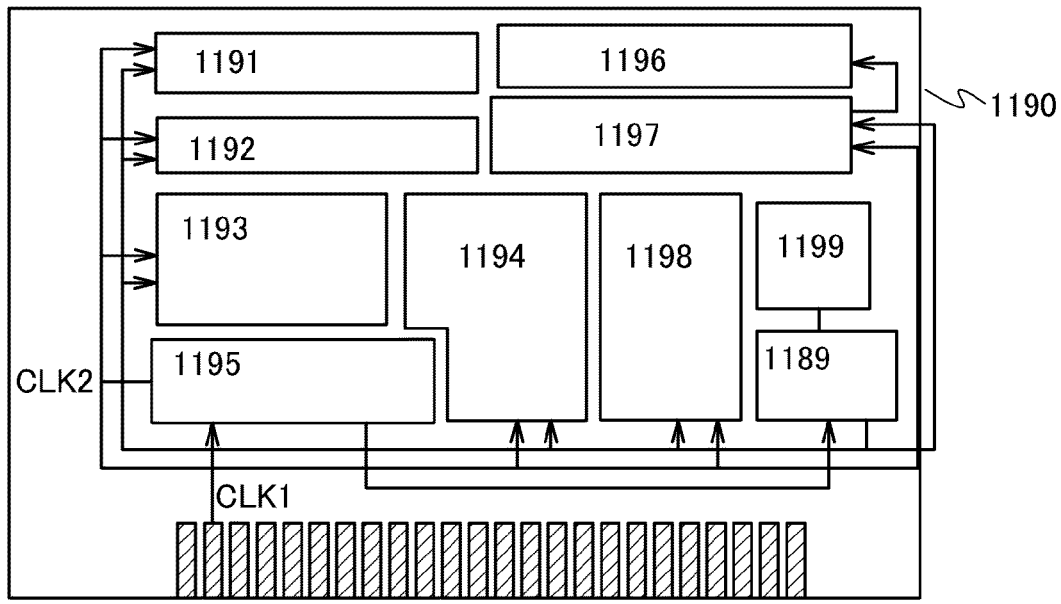
FIGS. 49A to 49C are block diagrams each illustrating a semiconductor device.

FIG. 49A is a block diagram illustrating a specific structure of a CPU. The CPU illustrated in FIG. 49A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may each be provided over a separate chip. Obviously, the CPU illustrated in FIG. 49A is only an example in which the structure is simplified, and a variety of structures is applied to an actual CPU depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 49A, a memory cell is provided in the register 1196. The memory cell disclosed in the above embodiment can be used as the memory cell in the register 1196.

In the CPU illustrated in FIG. 49A, the register controller 1197 selects operation of holding data in the register 1196 in accordance with an instruction from the ALU 1191. That is, the register controller 1197 selects whether data is held by a logic element which inverts a logic (logic level) or a capacitor in the memory cell included in the register 1196. When data holding by the logic element which inverts a logic (logic level) is selected, power supply voltage is supplied to the memory cell in the register 1196. When data holding by the capacitor is selected, the data is rewritten in the capacitor, and supply of power supply voltage to the memory cell in the register 1196 can be stopped.

Figure 49B:
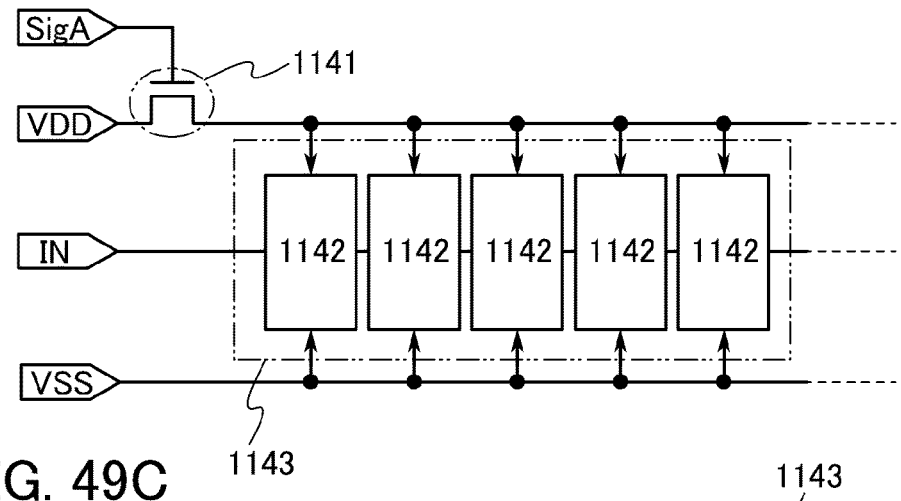
Figure 49C:
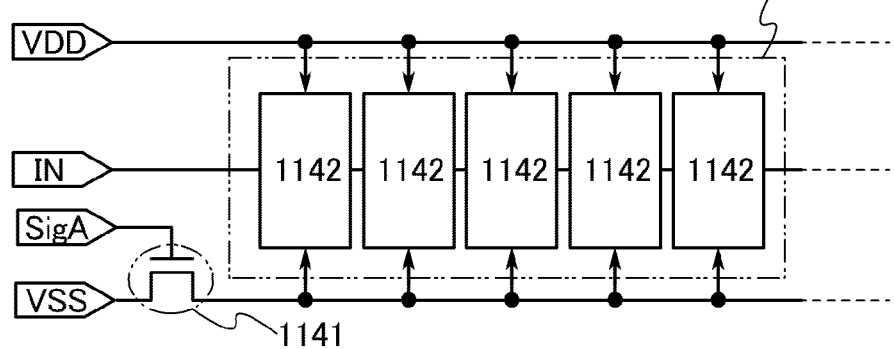

The power supply can be stopped by providing a switching element between a memory cell group and a node to which a power supply potential VDD or a power supply potential VSS is supplied, as illustrated in FIG. 49B or FIG. 49C. Circuits illustrated in FIGS. 49B and 49C are described below.

FIGS. 49B and 49C each illustrate an example of a structure of a memory circuit in which any of the transistors disclosed in the above embodiments is used as a switching element for controlling supply of a power supply potential to a memory cell.

The memory device illustrated in FIG. 49B includes a switching element 1141 and a memory cell group 1143 including a plurality of memory cells 1142. Specifically, as each of the memory cells 1142, the memory cell described in any of Embodiments 9 to 11 can be used. Each of the memory cells 1142 included in the memory cell group 1143 is supplied with the high-level power supply potential VDD through the switching element 1141. Further, each of the memory cells 1142 included in the memory cell group 1143 is supplied with a potential of a signal IN and the low-level power supply potential VSS.

In FIG. 49B, the transistor disclosed in any of the above embodiments is used as the switching element 1141, and the switching of the transistor is controlled by a signal SigA supplied to a gate electrode thereof.

FIG. 49B illustrates the structure in which the switching element 1141 includes only one transistor. Note that the structure is not limited and the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 49B, the switching element 1141 may control the supply of the low-level power supply potential VSS.

In FIG. 49C, an example of a memory device in which each of the memory cells 1142 included in the memory cell group 1143 is supplied with the low-level power supply potential VSS through the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be implemented in combination with the above embodiments as appropriate.

Embodiment 17

In this embodiment, the cases where the semiconductor device described in any of the above embodiments is applied to an electronic device will be described with reference to FIGS. 50A to 50F. In this embodiment, the semiconductor device described in any of the above embodiments is applied to electronic devices such as a computer, a mobile phone (also referred to as a cellular phone or a mobile phone device), a personal digital assistant (including a portable game machine, an audio reproducing device, and the like), a digital camera, a digital video camera, an electronic paper, and a television device (also referred to as a television or a television receiver).

Figure 50A:
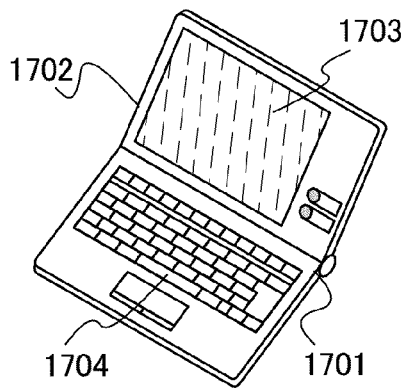
FIGS. 50A to 50F are diagrams each illustrating an electronic device.

FIG. 50A is a laptop personal computer including a housing 1701, a housing 1702, a display portion 1703, a keyboard 1704, and the like. The semiconductor devices described in any of the above embodiments are provided in the housing 1701 and the housing 1702. Thus, a highly reliable laptop personal computer in which writing and reading of data are performed at high speed and power consumption is sufficiently reduced can be achieved.

Figure 50D:
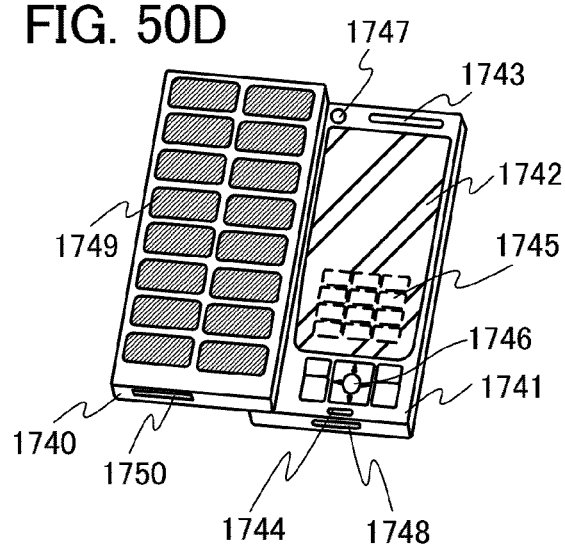
Figure 50B:
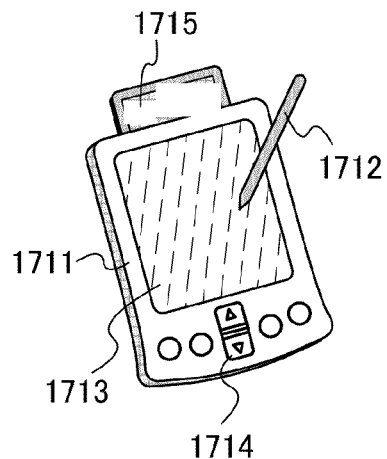

FIG. 50B illustrates a personal digital assistant (PDA) in which a main body 1711 is provided with a display portion 1713, an external interface 1715, operation buttons 1714, and the like. Further, a stylus 1712 for operation of the personal digital assistant, and the like are provided. In the main body 1711, the semiconductor device described in any of the above embodiments is provided. Therefore, a highly reliable personal digital assistant in which writing and reading of data are performed at high speed and power consumption is sufficiently reduced can be achieved.

Figure 50E:
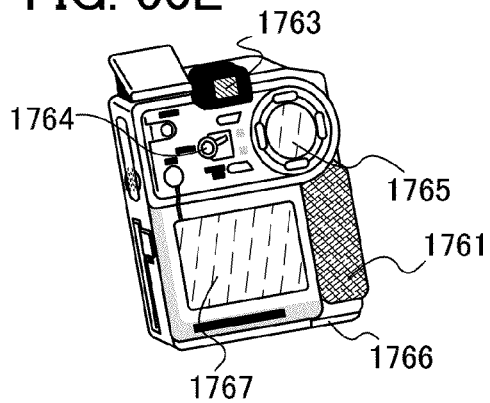
Figure 50C:
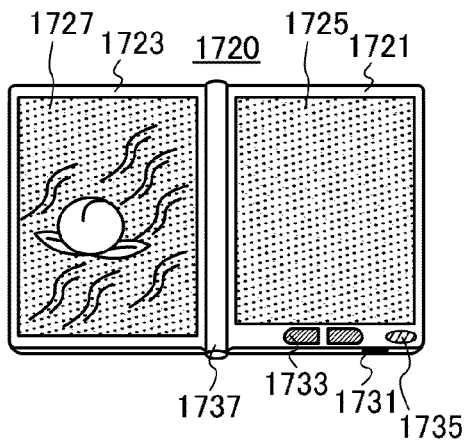

FIG. 50C is an e-book reader 1720 mounted with electronic paper, which includes two housings, a housing 1721 and a housing 1723. The housing 1721 and the housing 1723 are provided with a display portion 1725 and a display portion 1727, respectively. The housing 1721 is connected to the housing 1723 by a hinge 1737, so that the e-book reader can be opened and closed using the hinge 1737 as an axis. The housing 1721 is provided with a power switch 1731, an operation key 1733, a speaker 1735, and the like. In at least one of the housings 1721 and 1723, the semiconductor device described in any of the above embodiments is provided. Therefore, a highly reliable e-book reader in which writing and reading of data are performed at high speed and power consumption is sufficiently reduced can be achieved.

FIG. 50D is a mobile phone including two housings, a housing 1740 and a housing 1741. Further, the housings 1740 and 1741 in a state where they are developed as illustrated in FIG. 50D can shift by sliding to a state where one is lapped over the other; therefore, the size of the mobile phone can be reduced, which makes the mobile phone suitable for being carried. The housing 1741 includes a display panel 1742, a speaker 1743, a microphone 1744, a touch panel 1745, a pointing device 1746, a camera lens 1747, an external connection terminal 1748, and the like. The housing 1740 includes a solar cell 1749 for charging the mobile phone, an external memory slot 1750, and the like. In addition, an antenna is incorporated in the housing 1741. The semiconductor device described in any of the above embodiments is provided in at least one of the housings 1740 and 1741. Therefore, a highly reliable mobile phone in which data writing and data reading are performed at high speed and power consumption is sufficiently reduced can be achieved.

FIG. 50E is a digital camera including a main body 1761, a display portion 1767, an eyepiece 1763, an operation switch 1764, a display portion 1765, a battery 1766, and the like. The semiconductor device described in any of the above embodiments is provided in the main body 1761. Therefore, a highly reliable digital camera in which data writing and data reading are performed at high speed and power consumption is sufficiently reduced can be achieved.

Figure 50F:
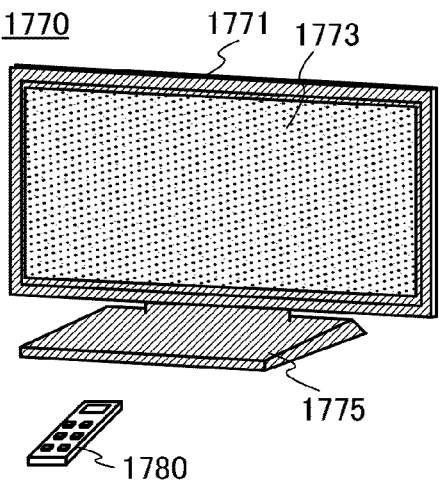

FIG. 50F is a television device 1770 including a housing 1771, a display portion 1773, a stand 1775, and the like. The television device 1770 can be operated by an operation switch of the housing 1771 or a remote controller 1780. The semiconductor device described in any of the above embodiments is mounted in the housing 1771 and the remote controller 1780. Therefore, a highly reliable television device in which data writing and data reading are performed at high speed and power consumption is sufficiently reduced can be achieved.

As described above, the semiconductor device according to the above embodiment is mounted on the electronic devices described in this embodiment. Therefore, highly reliable electronic devices with low power consumption can be achieved.

This embodiment can be implemented as appropriate in combination with any of the structures described in the other embodiments.

Embodiment 18

A semiconductor device disclosed in this specification can be applied to a variety of electronic devices. Examples of electronic devices include a television device (also referred to as a television or a television receiver), a monitor of a computer or the like, a camera such as a digital camera or a digital video camera, a digital photo frame, a mobile phone, a portable game machine, a portable information terminal, an audio reproducing device, a game machine (such as a pachinko machine or a slot machine), and a game console, and the like.

Figure 51A:
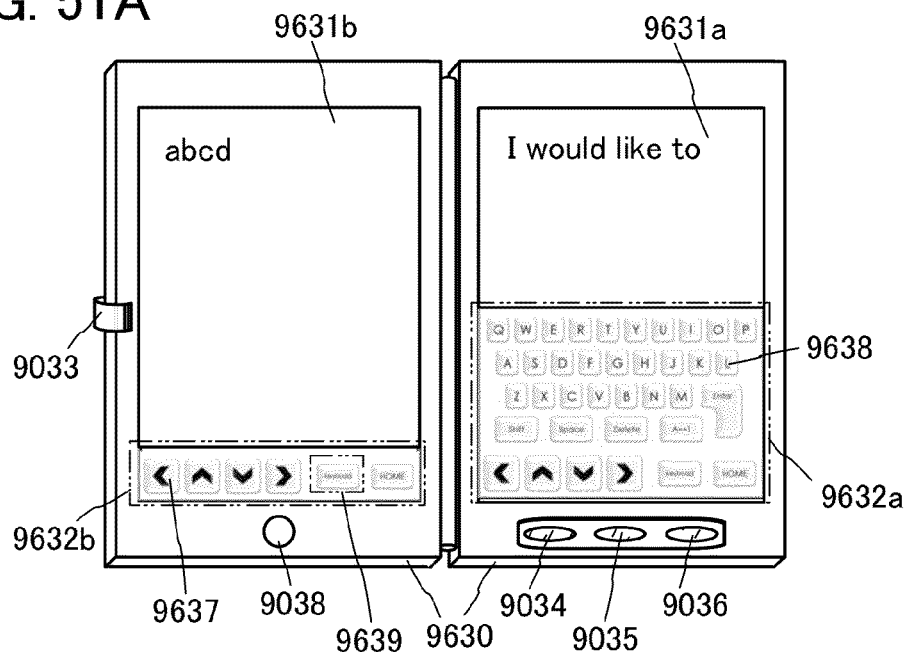
FIGS. 51A to 51C are diagrams illustrating an electronic device.
Figure 51B:
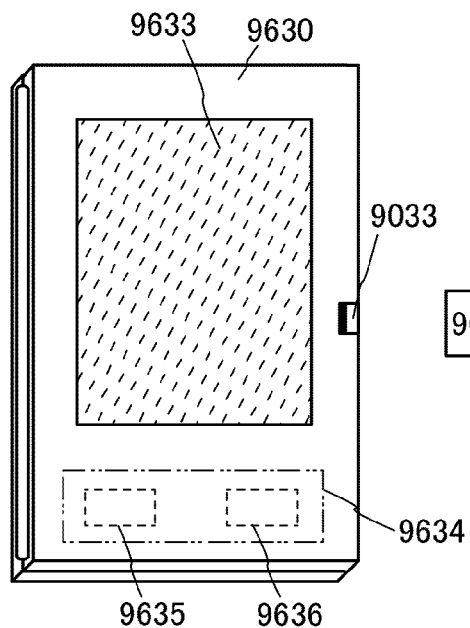
Figure 51C:
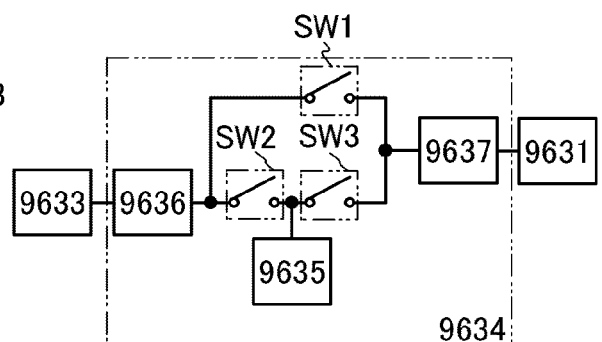

FIGS. 51A to 51C illustrate a specific example of an electronic device. FIGS. 51A and 51B illustrate a foldable tablet terminal The tablet terminal is opened in FIG. 51A. The tablet terminal includes a housing 9630, a display portion 9631a, a display portion 9631*b*, a display mode switch 9034, a power switch 9035, a power saver switch 9036, a clasp 9033, and an operation switch 9038.

The semiconductor device described in Embodiment 1 or 2 can be used for the display portion 9631*a* and the display portion 9631*b*, so that the tablet terminal can have high reliability. In addition, the semiconductor device described in Embodiment 3 or 4 may be applied to the semiconductor device of this embodiment.

Part of the display portion 9631*a* can be a touch panel region 9632*a* and data can be input when a displayed operation key 9638 is touched. Although a structure in which a half region in the display portion 9631*a* has only a display function and the other half region also has a touch panel function is shown as an example, the display portion 9631*a* is not limited to the structure. For example, the display portion 9631*a* can display keyboard buttons in the whole region to be a touch panel, and the display portion 9631*b* can be used as a display screen.

As in the display portion 9631*a*, part of the display portion 9631*b* can be a touch panel region 9632*b*. When a keyboard display switching button 9639 displayed on the touch panel is touched with a finger, a stylus, or the like, a keyboard can be displayed on the display portion 9631*b*.

Touch input can be performed in the touch panel region 9632*a* and the touch panel region 9632*b* at the same time.

The display mode switch 9034 can switch the display between portrait mode, landscape mode, and the like, and between monochrome display and color display, for example. The power saver switch 9036 can control display luminance in accordance with the amount of external light in use of the tablet terminal detected by an optical sensor incorporated in the tablet terminal. In addition to the optical sensor, another detection device including a sensor for detecting inclination, such as a gyroscope or an acceleration sensor, may be incorporated in the tablet terminal.

Although the display portion 9631*a* and the display portion 9631*b* have the same display area in FIG. 51A, one embodiment of the present invention is not limited to this structure. The display portion 9631*a* and the display portion 9631*b* may have different areas or different display quality. For example, one of them may be a display panel that can display higher-definition images than the other.

The tablet terminal is closed in FIG. 51B. The tablet terminal includes the housing 9630, a solar cell 9633, a charge and discharge control circuit 9634, a battery 9635, and a DCDC converter 9636. In FIG. 51B, a structure including the battery 9635 and the DCDC converter 9636 is illustrated as an example of the charge and discharge control circuit 9634.

Since the tablet terminal is foldable, the housing 9630 can be closed when the tablet terminal is not used. As a result, the display portion 9631*a* and the display portion 9631*b* can be protected; thus, a tablet terminal which has excellent durability and excellent reliability in terms of long-term use can be provided.

In addition, the tablet terminal illustrated in FIGS. 51A and 51B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633 provided on a surface of the tablet terminal can supply power to the touch panel, the display portion, a video signal processing portion, or the like. Note that the solar cell 9633 can be provided on one or both surfaces of the housing 9630 and the battery 9635 can be charged efficiently. The use of a lithium ion battery as the battery 9635 is advantageous in downsizing or the like.

The structure and the operation of the charge and discharge control circuit 9634 illustrated in FIG. 51B will be described with reference to a block diagram in FIG. 51C. The solar cell 9633, the battery 9635, the DCDC converter 9636, a converter 9637, switches SW1 to SW3, and a display portion 9631 are illustrated in FIG. 51C, and the battery 9635, the DCDC converter 9636, the converter 9637, and the switches SW1 to SW3 correspond to the charge and discharge control circuit 9634 illustrated in FIG. 51B.

First, an example of the operation in the case where power is generated by the solar cell 9633 using external light is described. The voltage of power generated by the solar cell is stepped up or down by the DCDC converter 9636 so that the power has a voltage for charging the battery 9635. Then, when the power from the solar cell 9633 is used for the operation of the display portion 9631, the switch SW1 is turned on and the voltage of the power is stepped up or down by the converter 9637 so as to be a voltage needed for the display portion 9631. In addition, when display on the display portion 9631 is not performed, the switch SW1 is turned off and the switch SW2 is turned on so that the battery 9635 may be charged.

Here, the solar cell 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module which is capable of charging by transmitting and receiving power wirelessly (without contact), or another charging means may be used in combination.

The methods, structures, and the like described in this embodiment can be combined as appropriate with any of the methods, structures, and the like described in the other embodiments.

Reference Example

The transistor structure disclosed in this specification is useful particularly in the case where a CAAC-OS is used for an oxide semiconductor layer in which a channel is formed. Specifically, the resistance of a region in the vicinity of a side surface of an oxide semiconductor layer formed using a CAAC-OS is easily lowered owing to release of oxygen from the side surface (end surface). On the other hand, the transistor disclosed in this specification includes an oxide semiconductor layer which is not patterned (not processed into an island shape). Thus, even in the case where the transistor disclosed in this specification includes an oxide semiconductor layer in which the resistance of a region in the vicinity of the side surface is easily lowered, a parasitic channel is not formed in the region in the vicinity of the side surface.

The matter that oxygen easily desorbs from the side surface (end surface) of the CAAC-OS will be described in detail below.

Here, as an example of the oxide semiconductor layer, ease of excess oxygen (an oxygen atom whose proportion is more than proportion of oxygen in stoichiometry) transfer and ease of oxygen vacancy transfer in an In—Ga—Zn-based oxide (hereinafter, referred to as IGZO) film which is a three-component metal oxide are described with reference to scientific computation results.

In the computation, a model (see FIGS. 52A to 52C and FIGS. 54A to 54C) in which one excess oxygen atom or oxygen vacancy exists in one In—O surface of IGZO having atomic ratio of In:Ga:Zn=3:1:2 was formed by structure optimization, and each energy of intermediate structures along a minimum energy path was calculated by a nudged elastic band (NEB) method.

The computation was performed using calculation program software "OpenMX" based on the density functional theory (DFT). Parameters are described below.

As a basis function, a pseudoatom local basis function was used. The basis function is classified as polarization basis sets STO (slater type orbital).

As a functional, generalized-gradient-approximation/Perdew-Burke-Ernzerhof (GGA/PBE) was used.

The cut-off energy was 200 Ry.

The sampling point k was 5×5×3.

In the computation of ease of excess oxygen transfer, the number of atoms which existed in the computation model was set to 85. In the computation of ease of oxygen vacancy transfer, the number of atoms which existed in the computation model was set to 83.

Ease of excess oxygen transfer and ease of oxygen vacancy transfer are evaluated by calculation of a height of energy barrier Eb which is required to go over in moving to respective sites. That is, when the height of energy barrier Eb which is gone over in moving is high, excess oxygen or oxygen vacancy hardly moves, and when the height of the energy barrier Eb is low, excess oxygen or oxygen vacancy easily moves.

Figure 53:
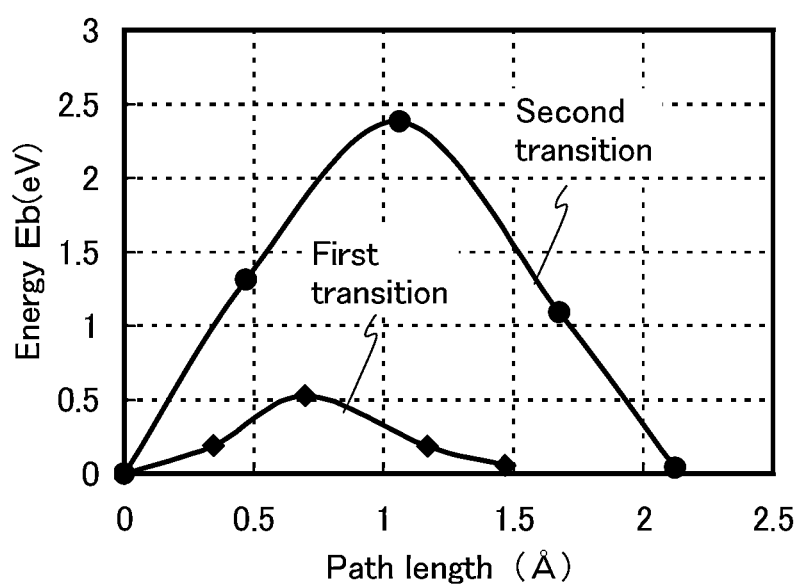
FIG. 53 shows calculation results of models illustrated in FIGS. 52A to 52C.

First, excess oxygen transfer is described. FIGS. 52A to 52C show models used for computation of excess oxygen transfer. The computations of two transition forms described below were performed. FIG. 53 shows the computations results. In FIG. 53, the horizontal axis indicates a path length of excess oxygen transfer, and the vertical axis indicates energy required for excess oxygen transfer based on energy (0 eV) in a state of a model A in FIG. 52A.

In the two transition forms of the excess oxygen transfer, a first transition is a transition from the model A to a model B and a second transition is a transition from the model A to a model C.

In FIGS. 52A to 52C, an oxygen atom denoted by "1" is referred to as a first oxygen atom of the model A; an oxygen atom denoted by "2" is referred to as a second oxygen atom of the model A; and an oxygen atom denoted by "3" is referred to as a third oxygen atom of the model A.

As seen from FIG. 53, the maximum value ($Eb_{max}$) of the height Eb of the energy barrier in the first transition is 0.53 eV, and that of the second transition is 2.38 eV. That is, the maximum value ($Eb_{max}$) of the height Eb of the energy bather in the first transition is lower than that of the second transition. Therefore, energy required for the first transition is smaller than energy required for the second transition, and the first transition occurs more easily than the second transition.

That is, the first oxygen atom of the model A moves in the direction in which the second oxygen atom of the model A is pushed more easily than in the direction in which the third oxygen atom of the model A is pushed. Therefore, this shows that the oxygen atom moves along the layer of indium atoms more easily than across the layer of indium atoms.

Figure 55:
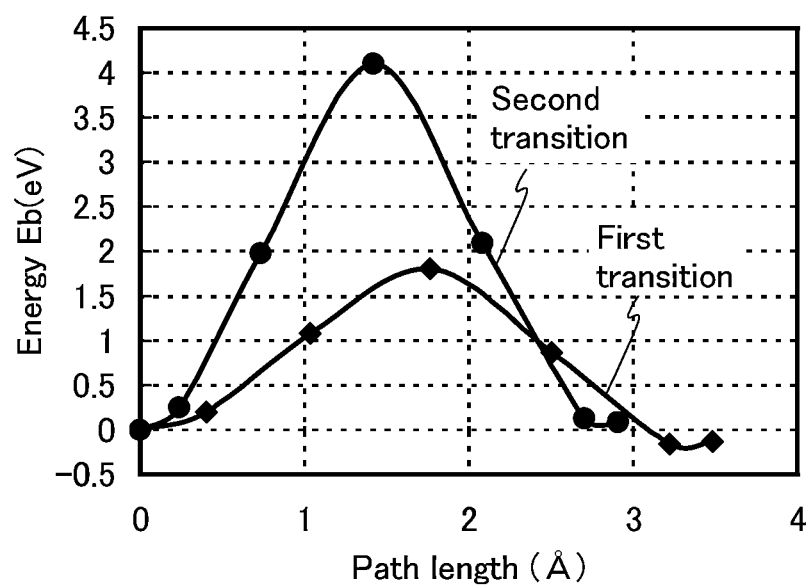
FIG. 55 shows calculation results of models illustrated in FIGS. 54A to 54C.

Next, oxygen vacancy transfer is described. FIGS. 54A to 54C show models used for computation of oxygen vacancy transfer. The computations of two transition forms described below were performed. FIG. 55 shows the computations results. In FIG. 55, the horizontal axis indicates a path length of oxygen vacancy transfer, and the vertical axis indicates energy required for oxygen vacancy transfer based on energy (0 eV) in a state of a model A in FIG. 54A.

In the two transition forms of the oxygen vacancy transfer, a first transition is a transition from the model A to a model B and a second transition is a transition from the model A to a model C.

Note that dashed circles in FIGS. 54A to 54C represent oxygen vacancy.

As seen from FIG. 55, the maximum value ($Eb_{max}$) of the height Eb of the energy barrier in the first transition is 1.81 eV, and that of the second transition is 4.10 eV. That is, the maximum value ($Eb_{max}$) of the height Eb of the energy barrier in the first transition is lower than that of the second transition. Therefore, energy required for the first transition is smaller than energy required for the second transition, and the first transition occurs more easily than the second transition.

That is, the oxygen vacancy of the model A moves to the position of oxygen vacancy of the model B more easily than to the position of oxygen vacancy of the model C. Therefore, this shows that the oxygen vacancy also moves along the layer of indium atoms more easily than across the layer of indium atoms.

Next, in order to compare probabilities of occurrence of the above-described four transition forms from another side, temperature dependence of these transitions is described. The above-described four transition forms are (1) the first transition of excess oxygen, (2) the second transition of excess oxygen, (3) the first transition of oxygen vacancy, and (4) the second transition of oxygen vacancy.

Temperature dependence of these transitions is compared with each other based on movement frequency per unit time. Here, movement frequency Z (per second) at certain temperature T (K) is represented by the following formula (2) when the number of vibrations Zo (per second) of an oxygen atom in the chemically stable position is used.

[FORMULA 2]

$$Z = Zo \cdot \exp\left(-\frac{Eb_{max}}{kT}\right) \quad (2)$$

Note that in the formula (2), $Eb_{max}$ represents a maximum value of a height Eb of an energy barrier of each transition, and k represents a Boltzmann constant. Further, $Zo=1.0\times10^{13}$ (per second) is used for the calculation.

In the case where excess oxygen or oxygen vacancy moves beyond the maximum value ($Eb_{max}$) of the height Eb of the energy bather once per one second (in the case of Z=1 (per second)), when the formula (2) is solved for T, the following formulas are obtained.

(1) In the first transition of excess oxygen of Z=1, T=206K (−67° C.).

(2) In the second transition of excess oxygen of Z=1, T=923K (650° C.).

(3) In the first transition of oxygen vacancy of Z=1, T=701K (428° C.).

(4) In the second transition of oxygen vacancy of Z=1, T=1590K (1317° C.).

On the other hand, Z in the case of T=300K (27° C.) is represented by the following formulas.

(1) In the first transition of excess oxygen of T=300K, $Z=1.2\times10^4$ per second).

(2) In the second transition of excess oxygen of T=300K, $Z=1.0\times10^{-27}$ (per second).

(3) In the first transition of oxygen vacancy of T=300K, $Z=4.3\times10^{-18}$ (per second).

(4) In the second transition of oxygen vacancy of T=300K, $Z=1.4\times10^{-56}$ (per second).

Further, Z in the case of T=723K (450° C.) is represented by the following formulas.
(1) In the first transition of excess oxygen of T=723K, Z=2.0×$10^9$ (per second).
(2) In the second transition of excess oxygen of T=723K, Z=2.5×$10^{-4}$ (per second).
(3) In the first transition of excess oxygen of T=723K, Z=2.5 (per second).
(4) In the second transition of excess oxygen of T=723K, Z=2.5×$10^{-16}$ (per second)

In view of the above-described calculation, excess oxygen, in the case of either T=300K or T=723K, moves along the layer of indium atoms more easily than across the layer of indium atoms. Moreover, oxygen vacancy also, in the case where either T=300K or T=723K, moves along the layer of indium atoms more easily than across the layer of indium atoms.

Further, in the case of T=300K, the movement of the excess oxygen along the layer of indium atoms occurs extremely easily; however, the other transitions do not occur easily. In the case of T=723K, not only the movement of the excess oxygen along the layer of indium atoms but the movement of the oxygen vacancy along the layer of indium atoms occurs easily; however, it is difficult for either the excess oxygen or the oxygen vacancy to move across the layer of indium atoms.

That is, it can be said that in the case where the layer of indium atoms exists over a surface parallel to a surface where a layer is formed or a surface of the layer (e.g., the case of CAAC-OS), excess oxygen and oxygen vacancy easily move in a parallel direction to the surface where the layer is formed or the surface of the layer.

As described above, in the oxide semiconductor layer formed of the CAAC-OS, excess oxygen and oxygen vacancy easily move along the surface where the layer is formed or a surface of the layer. Therefore, there is a problem about release of oxygen from the side surface of the layer. When oxygen is released, excess oxygen is decreased, so that it is difficult to fill oxygen vacancy. If there is oxygen vacancy, the conductivity of the oxide semiconductor layer formed of the CAAC-OS might be high up to a level at which the film is not preferable used for a switching element.

Note that the case where the excess oxygen or the oxygen vacancy moves across the layer of indium atoms is described above; however, the present invention is not limited thereto, and the same applies to metals other than indium which are contained in an oxide semiconductor layer.

The above release of oxygen is particularly remarkable in the case where the oxide semiconductor layer formed of the CAAC-OS is processed into an island shape. This is because an area of the side surface of the oxide semiconductor layer increases in the case where the oxide semiconductor layer is processed into an island shape.

This application is based on Japanese Patent Application serial no. 2012-010427 filed with Japan Patent Office on Jan. 20, 2012, Japanese Patent Application serial no. 2012-010421 filed with Japan Patent Office on Jan. 20, 2012, and Japanese Patent Application serial no. 2012-010422 filed with Japan Patent Office on Jan. 20, 2012, the entire contents of which are hereby incorporated by reference.

What is claimed is:

1. A semiconductor device comprising:
a first insulating layer;
an oxide semiconductor layer over the first insulating layer, the oxide semiconductor layer including a first channel formation region and a second channel formation region;
a first gate insulating layer over the first channel formation region;
a second gate insulating layer over the second channel formation region;
a first gate electrode layer over the first channel formation region with the first gate insulating layer therebetween;
a second gate electrode layer over the second channel formation region with the second gate insulating layer therebetween;
a first source electrode layer and a first drain electrode layer with the first channel formation region therebetween; and
a second source electrode layer and a second drain electrode layer with the second channel formation region therebetween,
wherein the first source electrode layer, the first drain electrode layer, the second source electrode layer, and the second drain electrode layer are provided over the oxide semiconductor layer,
wherein the first source electrode layer and the first drain electrode layer are electrically isolated from the second source electrode layer and the second drain electrode layer, and
wherein the oxide semiconductor layer is provided over an entire surface of the first insulating layer.

2. The semiconductor device according to claim 1,
wherein the first channel formation region, the first gate insulating layer, the first gate electrode layer, the first source electrode layer, and the first drain electrode layer are included in a first transistor,
wherein the second channel formation region, the second gate insulating layer, the second gate electrode layer, the second source electrode layer, and the second drain electrode layer are included in a second transistor, and
wherein the first channel formation region is electrically isolated from the second channel formation region.

3. The semiconductor device according to claim 1, further comprising a first sidewall insulating layer on a side surface of the first gate electrode layer,
wherein at least one of the first source electrode layer and the first drain electrode layer is in contact with a side surface of the first sidewall insulating layer, a side surface of the first gate insulating layer, and the oxide semiconductor layer.

4. The semiconductor device according to claim 3,
wherein a top surface of the first source electrode layer and a top surface of the first drain electrode layer are lower than a top surface of the first sidewall insulating layer, and
wherein the top surface of the first source electrode layer and the top surface of the first drain electrode layer are higher than a top surface of the first gate electrode layer.

5. The semiconductor device according to claim 1, further comprising:
a second insulating layer over the first gate electrode layer, the second insulating layer comprising a first opening and a second opening;
a first source wiring layer on and in contact with the first source electrode layer; and
a first drain wiring layer on and in contact with the first drain electrode layer,
wherein the first gate insulating layer comprises the first opening and the second opening,
wherein the first source electrode layer is electrically connected to the oxide semiconductor layer through the first opening, wherein the first drain electrode layer is electrically connected to the oxide semiconductor layer through the second opening, and wherein a distance in a channel formation region length direction between the first source electrode layer and the first drain electrode layer is shorter than a distance in a channel length direction between the first source wiring layer and the first drain wiring layer.

6. The semiconductor device according to claim 1, wherein the first source electrode layer, the first drain electrode layer, the second source electrode layer, and the second drain electrode layer are in contact with the oxide semiconductor layer.

7. The semiconductor device according to claim 1, wherein the first insulating layer comprises aluminum oxide.

8. The semiconductor device according to claim 1, wherein the first gate electrode layer and the second gate electrode layer comprise aluminum oxide.

9. The semiconductor device according to claim 1, wherein the oxide semiconductor layer is a stack of a crystalline oxide semiconductor and an amorphous oxide semiconductor.

* * * * *